US011980045B1

(12) United States Patent
Jin et al.

(10) Patent No.: US 11,980,045 B1
(45) Date of Patent: May 7, 2024

(54) ORGANIC ELECTRIC ELEMENT INCLUDING COMPOUND FOR ORGANIC ELECTRIC ELEMENT, AND ELECTRONIC DEVICE THEREOF

(71) Applicant: DUK SAN NEOLUX CO., LTD., Cheonan-si (KR)

(72) Inventors: Hyo Min Jin, Cheonan-si (KR); Bu Yong Yun, Cheonan-si (KR); Jae Ho Kim, Cheonan-si (KR); Hyung Dong Lee, Cheonan-si (KR); Chi Hyun Park, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 0 days.

(21) Appl. No.: 18/557,179

(22) PCT Filed: Mar. 15, 2023

(86) PCT No.: PCT/KR2023/003481
§ 371 (c)(1),
(2) Date: Oct. 25, 2023

(87) PCT Pub. No.: WO2023/177216
PCT Pub. Date: Sep. 21, 2023

(30) Foreign Application Priority Data

Mar. 16, 2022 (KR) ........................ 10-2022-0032823

(51) Int. Cl.

| | |
|---|---|
| ***H01L 51/50*** | (2006.01) |
| ***H10K 50/12*** | (2023.01) |
| ***H10K 85/60*** | (2023.01) |
| *H10K 101/00* | (2023.01) |

(52) U.S. Cl.
CPC ........... *H10K 50/12* (2023.02); *H10K 85/633* (2023.02); *H10K 85/636* (2023.02); *H10K 85/654* (2023.02); *H10K 85/657* (2023.02); *H10K 85/615* (2023.02); *H10K 85/626* (2023.02); *H10K 85/6572* (2023.02); *H10K 85/6574* (2023.02); *H10K 85/6576* (2023.02); *H10K 2101/90* (2023.02)

(58) Field of Classification Search
CPC ..... H10K 50/12; H10K 85/633; H10K 85/636
See application file for complete search history.

(56) References Cited

FOREIGN PATENT DOCUMENTS

| | | | |
|---|---|---|---|
| KR | 10-2018-0096444 | A | 8/2018 |
| KR | 10-2020-0081300 | A | 7/2020 |
| KR | 10-2020-0119039 | A | 10/2020 |
| KR | 10-2020-0141385 | A | 12/2020 |

(Continued)

OTHER PUBLICATIONS

International Search Report for corresponding PCT/KR2023/003481, dated Jun. 15, 2023, 5 pages, with translation.

(Continued)

*Primary Examiner* — Anthony Ho
(74) *Attorney, Agent, or Firm* — Vorys, Sater, Seymour and Pease LLP; Mih Suhn Koh

(57) ABSTRACT

Provided are an organic electronic element comprising an anode, a cathode, and an organic material layer between the anode and the cathode, and an electronic device comprising the organic electronic element, wherein the organic material layer comprises each compound represented by Formula 1, Formula 2, or Formula 3, thereby the driving voltage of the organic electronic element can be lowered and the luminous efficiency and lifespan can be improved.

20 Claims, 2 Drawing Sheets

(56) References Cited

FOREIGN PATENT DOCUMENTS

| | | | |
|---|---|---|---|
| KR | 10-2021-0156913 | A | 12/2021 |
| KR | 10-2478386 | B1 | 12/2022 |

OTHER PUBLICATIONS

Notice of Allowance for corresponding KR 10-2022-0032823, dated Dec. 3, 2022, 5 pages, with translation.
Notice of Result of Preliminary Examination for corresponding KR 10-2022-0032823, dated May 5, 2022, 4 pages, with translation.

[FIG. 1]
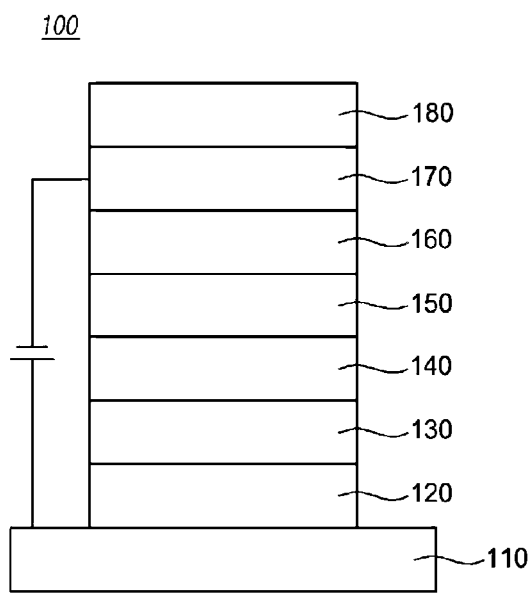
[FIG. 2]
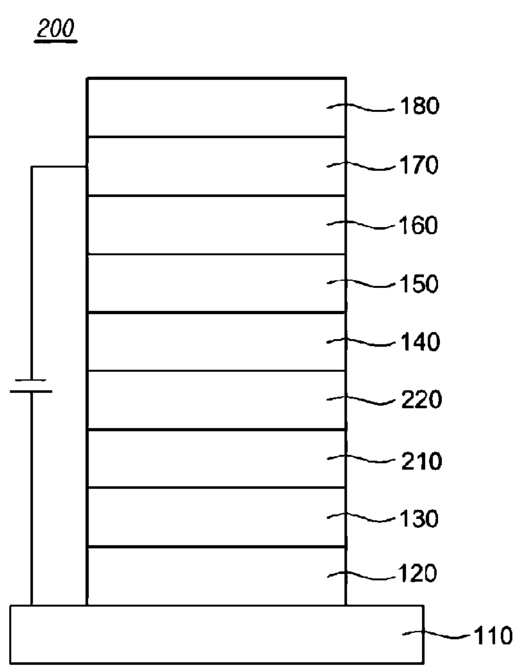

[FIG. 3]
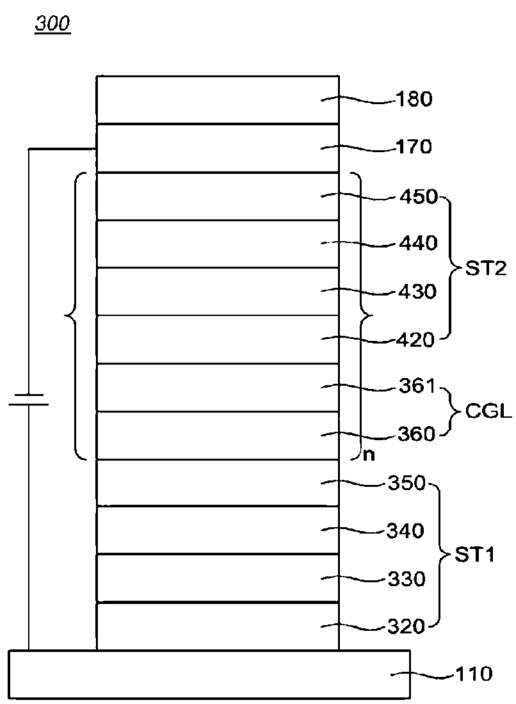

ORGANIC ELECTRIC ELEMENT INCLUDING COMPOUND FOR ORGANIC ELECTRIC ELEMENT, AND ELECTRONIC DEVICE THEREOF

BACKGROUND

Technical Field

The present invention relates to an organic electronic element comprising compound for organic electronic element and an electronic device thereof.

Background Art

In general, organic light emitting phenomenon refers to a phenomenon that converts electric energy into light energy by using an organic material. An organic electronic element using an organic light emitting phenomenon usually has a structure including an anode, a cathode, and an organic material layer interposed therebetween. Here, in order to increase the efficiency and stability of the organic electronic element, the organic material layer is often composed of a multi-layered structure composed of different materials, and for example, may include a hole injection layer, a hole transport layer, an emitting layer, an electron transport layer, an electron injection layer and the like.

A material used as an organic material layer in an organic electronic element may be classified into a light emitting material and a charge transport material, such as a hole injection material, a hole transport material, an electron transport material, an electron injection material and the like depending on its function. And the light emitting material can be classified into a high molecular weight type and a low molecular weight type according to the molecular weight, and according to the light emission mechanism, it can be classified into a fluorescent material derived from a singlet excited state of an electron and a phosphorescent material derived from a triplet excited state of an electron. Also, the light emitting material may be divided into blue, green, and red light emitting materials and yellow and orange light emitting materials necessary for realizing a better natural color according to the emission color.

However, when only one material is used as a light emitting material, due to intermolecular interaction, the maximum emission wavelength shifts to a longer wavelength, and there are problems in that the color purity is lowered or the device efficiency is reduced due to the emission attenuation effect, therefore in order to increase color purity and increase luminous efficiency through energy transfer, a host/dopant system may be used as a light emitting material. The principle is that when a small amount of a dopant having a smaller energy band gap than that of the host forming the emitting layer is mixed in the emitting layer, excitons generated in the emitting layer are transported to the dopant to emit light with high efficiency. At this time, since the wavelength of the host moves to the wavelength band of the dopant, light having a desired wavelength can be obtained according to the type of dopant used.

Lifespan and efficiency are the most problematic issues in organic light emitting diodes, and as displays become larger, these efficiency and lifespan problems must be solved. Efficiency, lifespan, and driving voltage are related to each other, and when the efficiency is increased, the driving voltage is relatively decreased, and as the driving voltage is decreased, crystallization of organic materials due to Joule heating generated during driving decreases, and consequently the lifespan tends to increase. Short-wavelength dopants are used as a method to increase maximum luminous efficiency. Short-wavelength dopants have higher maximum luminous efficiency than existing long-wavelength dopants, so they can be used to increase the overall device efficiency. However, the x color coordinate is very low, which is a disadvantage in terms of color purity. To solve these shortcomings, a host whose maximum emission wavelength is shifted to a longer wavelength is needed, and such a host affects not only the maximum emission efficiency but also the lifespan.

However, the efficiency cannot be maximized simply by improving the organic material layer. This is because, when the energy level and T1 value between each organic material layer, and the intrinsic properties (mobility, interfacial properties, etc.) of materials are optimally combined, long lifespan and high efficiency can be achieved at the same time. Therefore, it is necessary to develop a material that has high thermal stability and can efficiently balance charge in the emitting layer. That is, in order to fully exhibit the excellent characteristics of an organic electronic element, it should be preceded that the material constituting the organic material layer in the device, such as a hole injection material, a hole transport material, a light emitting material, an electron transport material, an electron injection material, etc., is supported by a stable and efficient material. But the development of a stable and efficient organic material layer material for an organic electronic element has not yet been sufficiently made. Therefore, the development of new materials is continuously required, and in particular, the development of a host material for the emitting layer is urgently required.

DETAILED DESCRIPTION OF THE INVENTION

Summary

The purpose of the present invention is to provide an organic electronic element and an electronic device thereof comprising a compound that can lower the driving voltage of the element and improve the luminous efficiency, color purity, stability, and lifespan of the element.

Technical Solution

In one aspect, the present invention provides an organic electronic element comprising a first electrode; a second electrode; and an organic material layer formed between the first electrode and the second electrode, wherein the organic material layer includes an emitting layer, wherein the emitting layer comprises a compound represented by Formula 1; and a compound represented by Formula 2 or Formula 3;

<Formula 1>

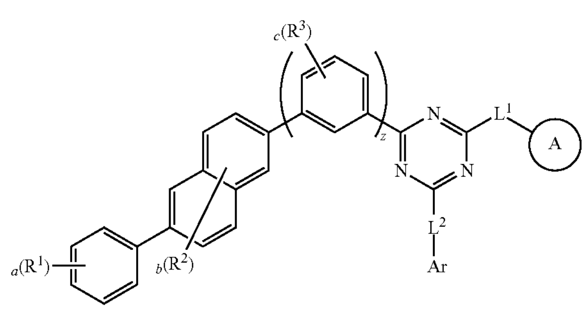

-continued

<Formula 2>

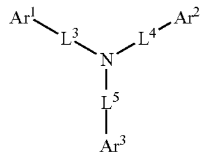

<Formula 3>

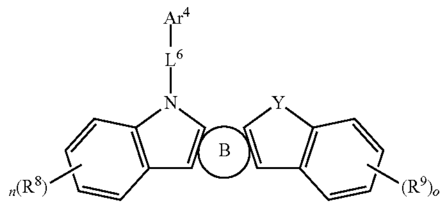

In another aspect, the present invention provides an electronic device comprising the organic electronic element.

Effects of the Invention

By using the compound according to the present invention, high luminous efficiency, low driving voltage and high heat resistance of the element can be achieved, and color purity and lifespan of the element can be greatly improved.

BRIEF DESCRIPTION OF THE DRAWINGS

FIG. 1 to FIG. 3 are exemplary views of an organic electroluminescent device according to the present invention.

DETAILED DESCRIPTION

| | |
|---|---|
| 100, 200, 300: | organic electronic element |
| 110: | the first electrode |
| 120: | hole injection layer |
| 130: | hole transport layer |
| 140: | emitting layer |
| 150: | electron transport layer |
| 160: | electron injection layer |
| 170: | second electrode |
| 180: | light efficiency enhancing Layer |
| 210: | buffer layer |
| 220: | emitting auxiliary layer |
| 320: | first hole injection layer |
| 330: | first hole transport layer |
| 340: | first emitting layer |
| 350: | first electron transport layer |
| 360: | first charge generation layer |
| 361: | second charge generation layer |
| 420: | second hole injection layer |
| 430: | second hole transport layer |
| 440: | second emitting layer |
| 450: | second electron transport layer |
| CGL: | charge generation layer |
| ST1: | first stack |
| ST2: | second stack |

Hereinafter, some embodiments of the present invention will be described in detail. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if a component is described as being "connected", "coupled", or "connected" to another component, the component may be directly connected or connected to the other component, but another component may be "connected","coupled" or "connected" between each component.

As used in the specification and the accompanying claims, unless otherwise stated, the following is the meaning of the term as follows.

Unless otherwise stated, the term "halo" or "halogen", as used herein, includes fluorine, bromine, chlorine, or iodine.

Unless otherwise stated, the term "alkyl" or "alkyl group", as used herein, has a single bond of 1 to 60 carbon atoms, and means saturated aliphatic functional radicals including a linear alkyl group, a branched chain alkyl group, a cycloalkyl group (alicyclic), an cycloalkyl group substituted with a alkyl or an alkyl group substituted with a cycloalkyl.

Unless otherwise stated, the term "alkenyl" or "alkynyl", as used herein, has double or triple bonds of 2 to 60 carbon atoms, but is not limited thereto, and includes a linear or a branched chain group.

Unless otherwise stated, the term "cycloalkyl", as used herein, means alkyl forming a ring having 3 to 60 carbon atoms, but is not limited thereto.

Unless otherwise stated, the term "alkoxyl group", "alkoxy group" or "alkyloxy group", as used herein, means an alkyl group bonded to oxygen radical, but is not limited thereto, and has 1 to 60 carbon atoms.

Unless otherwise stated, the term "aryloxyl group" or "aryloxy group", as used herein, means an aryl group bonded to oxygen radical, but is not limited thereto, and has 6 to 60 carbon atoms.

The terms "aryl group" and "arylene group" used in the present invention have 6 to 60 carbon atoms, respectively, unless otherwise specified, but are not limited thereto. In the present invention, an aryl group or an arylene group means a single ring or multiple ring aromatic, and includes an aromatic ring formed by an adjacent substituent joining or participating in a reaction.

For example, the aryl group may be a phenyl group, a biphenyl group, a fluorene group, or a spirofluorene group.

The prefix "aryl" or "ar" means a radical substituted with an aryl group. For example, an arylalkyl may be an alkyl substituted with an aryl, and an arylalkenyl may be an alkenyl substituted with aryl, and a radical substituted with an aryl has a number of carbon atoms as defined herein.

Also, when prefixes are named subsequently, it means that substituents are listed in the order described first. For example, an arylalkoxy means an alkoxy substituted with an aryl, an alkoxylcarbonyl means a carbonyl substituted with an alkoxyl, and an arylcarbonylalkenyl also means an alkenyl substituted with an arylcarbonyl, wherein the arylcarbonyl may be a carbonyl substituted with an aryl.

Unless otherwise stated, the term "heterocyclic group", as used herein, contains one or more heteroatoms, but is not limited thereto, has 2 to 60 carbon atoms, includes any one of a single ring or multiple ring, and may include heteroaliphadic ring and heteroaromatic ring. Also, the heterocyclic group may also be formed in conjunction with an adjacent group.

Unless otherwise stated, the term "heteroatom", as used herein, represents at least one of N, O, S, P, or Si.

Also, the term "heterocyclic group" may include a ring including $SO_2$ instead of carbon consisting of cycle. For example, "heterocyclic group" includes the following compound.

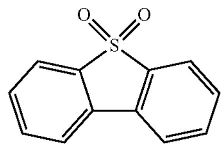 [SMILES: O=S1(=O)c2ccccc2-c2ccccc21]

Unless otherwise stated, the term "fluorenyl group" or "fluorenylene group", as used herein, means a monovalent or divalent functional group, in which R, R' and R" are all hydrogen in the following structures, and the term "substituted fluorenyl group" or "substituted fluorenylene group" means that at least one of the substituents R, R', R" is a substituent other than hydrogen, and include those in which R and R' are bonded to each other to form a spiro compound together with the carbon to which they are bonded.

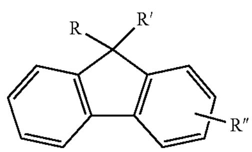

The term "spiro compound", as used herein, has a 'spiro union', and a spiro union means a connection in which two rings share only one atom. At this time, atoms shared in the two rings are called 'spiro atoms', and these compounds are called 'monospiro-', 'di-spiro' and 'tri-spiro', respectively, depending on the number of spiro atoms in a compound.

Unless otherwise stated, the term "aliphatic", as used herein, means an aliphatic hydrocarbon having 1 to 60 carbon atoms, and the term "aliphatic ring", as used herein, means an aliphatic hydrocarbon ring having 3 to 60 carbon atoms.

Unless otherwise stated, the term "ring", as used herein, means an aliphatic ring having 3 to 60 carbon atoms, or an aromatic ring having 6 to 60 carbon atoms, or a hetero ring having 2 to 60 carbon atoms, or a fused ring formed by the combination of them, and includes a saturated or unsaturated ring.

Other hetero compounds or hetero radicals other than the above-mentioned hetero compounds include, but are not limited thereto, one or more heteroatoms.

Also, unless expressly stated, as used herein, "substituted" in the term "substituted or unsubstituted" means substituted with one or more substituents selected from the group consisting of deuterium, halogen, an amino group, a nitrile group, a nitro group, a $C_1$-$C_{20}$ alkyl group, a $C_1$-$C_{20}$ alkoxyl group, a $C_1$-$C_{20}$ alkylamine group, a $C_1$-$C_{20}$ alkylthiopen group, a $C_6$-$C_{20}$ arylthiopen group, a $C_2$-$C_{20}$ alkenyl group, a $C_2$-$C_{20}$ alkynyl group, a $C_3$-$C_{20}$ cycloalkyl group, a $C_6$-$C_{20}$ aryl group, a $C_6$-$C_{20}$ aryl group substituted by deuterium, a $C_8$-$C_{20}$ arylalkenyl group, a silane group, a boron group, a germanium group, and a $C_2$-$C_{20}$ heterocyclic group, but is not limited to these substituents.

Also, unless there is an explicit explanation, the formula used in the present invention is the same as the definition of the substituent by the exponent definition of the following formula.

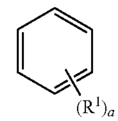

Here, when a is an integer of 0, the substituent $R^1$ is absent, when a is an integer of 1, the sole substituent $R^1$ is linked to any one of the carbon constituting the benzene ring, when a is an integer of 2 or 3, each is combined as follows, where $R^1$ may be the same or different from each other, when a is an integer of 4 to 6, it is bonded to the carbon of the benzene ring in a similar manner, while the indication of the hydrogen bonded to the carbon forming the benzene ring is omitted.

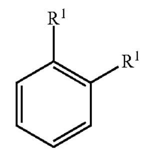

(a = 2)

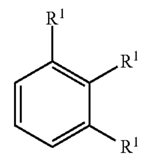

(a = 3)

Hereinafter, a layered structure of an organic electronic element including the compound of the present invention will be described with reference to FIGS. 1 to 3. In adding reference numerals to the components of each figures, it should be noted that the same components have the same numerals as much as possible even if they are displayed on different figures. In addition, in describing the present invention, if it is determined that a detailed description of a related known configuration or function may obscure the gist of the present invention, the detailed description will be omitted. FIGS. 1 to 3 are exemplary views of an organic electronic element according to an embodiment of the present invention.

Referring to FIG. 1, an organic electronic element (100) according to an embodiment of the present invention comprises a first electrode (110), a second electrode (170) formed on a substrate (not shown), and an organic layer formed between a first electrode (110) and the second electrode (170).

The first electrode (110) may be an anode, the second electrode (170) may be a cathode, and in the case of an inverted type, the first electrode may be a cathode and the second electrode may be an anode.

The organic material layer may include a hole injection layer (120), a hole transport layer (130), an emitting layer (140), an electron transport layer (150), and an electron injection layer (160). Specifically, a hole injection layer (120), a hole transport layer (130), an emitting layer (140), an electron transport layer (150), and an electron injection layer (160) may be sequentially formed on the first electrode (110).

Preferably, a light efficiency enhancing layer (180) may be formed on at least one surface of the first electrode (110) and the second electrode (170), the surface not being contacted to the organic material layer, and when the light efficiency enhancing layer (180) is formed, the light efficiency of the organic electronic element may be improved.

For example, the light efficiency enhancing layer (180) may be formed on the second electrode (170), and in the case of a top emission organic light emitting device, the light efficiency enhancing layer (180) is formed, thereby reducing optical energy loss due to surface plasmon polaritons (SPPs) in the second electrode (170), and in the case of a bottom emission organic light emitting device, the light efficiency enhancing layer (180) may function as a buffer for the second electrode (170).

A buffer layer (210) or an emitting auxiliary layer (220) may be further formed between the hole transport layer (130) and the emitting layer (140), which will be described with reference to FIG. 2.

Referring to FIG. 2, an organic electric device (200) according to another embodiment of the present invention includes a hole injection layer (120), a hole transport layer (130), a buffer layer (210), an emitting auxiliary layer (220), an emitting layer (140), an electron transport layer (150), an electron injection layer (160), a second electrode (170), sequentially formed on the first electrode (110), and a light efficiency enhancing layer (180) formed on the second electrode.

Although not shown in FIG. 2, an electron transport auxiliary layer may be further formed between the emitting layer (140) and the electron transport layer (150).

Also, according to another embodiment of the present invention, the organic material layer may have a plurality of stacks including a hole transport layer, an emitting layer, and an electron transport layer. This will be described with reference to FIG. 3.

Referring to FIG. 3, in the organic electronic element (300) according to another embodiment of the present invention, 2 or more sets of stacks (ST1 and ST2) made of a multi-layered organic material layer may be formed between the first electrode (110) and the second electrode (170), and a charge generation layer (CGL) may be formed between the stacks of organic material layers.

Specifically, the organic electronic element according to an embodiment of the present invention includes a first electrode (110), a first stack (ST1), a charge generation layer (CGL), a second stack (ST2), and a second electrode (170) and a light efficiency enhancing layer (180) may be included.

The first stack (ST1) is an organic material layer formed on the first electrode (110) and may include a first hole injection layer (320), a first hole transport layer (330), a first emitting layer (340), and a first electron transport layer (350), and the second stack (ST2) may include a second hole injection layer (420), a second hole transport layer (430), a second emitting layer (440), and a second electron transport layer (450). As described above, the first stack and the second stack may be organic material layers having the same laminated structure, but may be organic material layers having different laminated structures.

A charge generation layer (CGL) may be formed between the first stack (ST1) and the second stack (ST2). The charge generation layer (CGL) may include a first charge generation layer (360) and a second charge generation layer (361). The charge generation layer (CGL) is formed between the first emitting layer (340) and the second emitting layer (440) to increase the current efficiency generated in each emitting layer and smoothly distribute charge.

When a plurality of emitting layers is formed by the multilayer stack structure method as shown in FIG. 3, an organic electronic element that emits white light by a mixing effect of light emitted from each emitting layer can be manufactured, as well as an organic electronic element that emits light of various colors.

The compounds represented by Formula 1, Formula 2 and 3 of the present invention may be used as a material for a hole injection layer (120, 320, 420), a hole transport layer (130, 330, 430), a buffer layer (210), an emitting auxiliary layer (220), and an electron transport layer (150, 350, 450), the electron injection layer (160), the emitting layer (140, 340, 440), or the light efficiency enhancing layer (180), but preferably, as a host of the emitting layers (140, 340, 440).

Otherwise, even if the same or similar core is used, the band gap, the electrical characteristics, the interface characteristics, and the like may vary depending on which substituent is bonded at which position, therefore It is necessary to study the selection of the core and the combination of sub-substituents bonded thereto, and in particular, when the optimal combination of energy levels and T1 values of each organic material layer and unique properties of materials(mobility, interfacial characteristics, etc.) is achieved, a long lifespan and high efficiency can be achieved at the same time. The organic electronic element according to an embodiment of the present invention may be manufactured using various deposition methods. It can be manufactured using a vapor deposition method such as PVD or CVD. For example, an anode (110) is formed by depositing a metal or a conductive metal oxide or an alloy thereof on a substrate, and after forming an organic material layer including the hole injection layer(120), the hole transport layer(130), the emitting layer(140), the electron transport layer(150) and the electron injection layer(160) thereon, the organic electroluminescent device according to an embodiment of the present invention can be manufactured by depositing a material that can be used as a cathode (170) thereon. Also, an emitting auxiliary layer (220) may be further formed between the hole transport layer (130) and the emitting layer(140), and an electron transport auxiliary layer (not shown) may be further formed between the emitting layer(140) and the electron transport layer (150), and as described above, may be formed in a stack structure.

Also, the organic material layer may be manufactured with a smaller number of layers by using various polymer materials and not by a deposition method, but by a solution process, a solvent process, such as a spin coating process, a nozzle printing process, an inkjet printing process, a slot coating process, a dip coating process or a roll-to-roll process, doctor blading process, screen printing process, or a thermal transfer method. Since the organic material layer according to the present invention can be formed by various methods, the scope of the present invention is not limited by the forming method.

Further, the organic electronic element according to an embodiment of the present invention may be selected from the group consisting of an organic electroluminescent device, an organic solar cell, an organic photoreceptor, an organic transistor, a monochromatic lighting device, and a quantum dot display device.

Another embodiment of the present invention may comprise an electronic device comprising a display device including the organic electronic element; and a control unit for driving the display device. At this time, the electronic device may be a current or future wired/wireless communication terminal, and covers all kinds of electronic devices including a mobile communication terminal such as a cellular phone, a personal digital assistant(PDA), an electronic dictionary, a point-to-multipoint(PMP), a remote controller, a navigation unit, a game player, various kinds of TVs, and various kinds of computers.

Hereinafter, an organic electronic element according to an aspect of the present invention will be described.

An organic electronic element according to the present invention comprises a first electrode, a second electrode, and an organic material layer formed between the first electrode and the second electrode, wherein the organic material layer comprises an emitting layer, wherein the emitting layer comprises a compound represented by Formula 1 and a compound represented by Formula 2 or Formula 3.

<Formula 1>

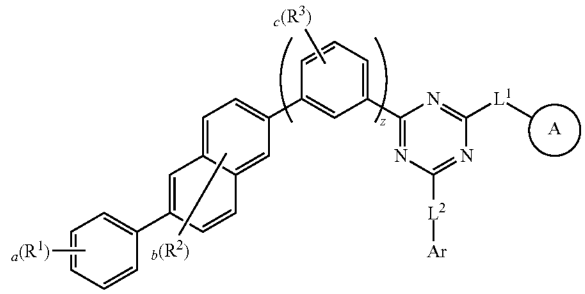

<Formula 2>

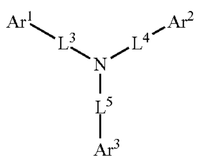

<Formula 3>

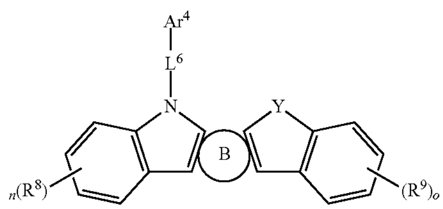

In Formulas 1 to 3, each symbol may be defined as follows.

1) $L^1$ is a substituent represented by any of Formulas L-1 to L-4,

<Formula L-1>

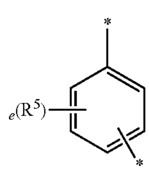

<Formula L-2>

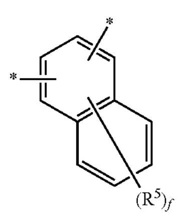

<Formula L-3>

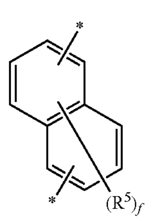

-continued

<Formula L-4>

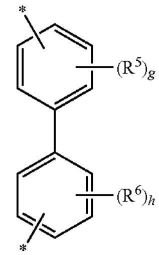

2) $L^2$ is a single bond; or a $C_6$-$C_{60}$ arylene group; wherein in case $L^2$ is an arylene group, it is preferably an $C_6$-$C_{30}$ arylene group, more preferably an $C_6$-$C_{24}$ arylene group, for example, it may be phenylene, biphenyl, naphthylene, phenanthrene, and the like.

3) $L^3$, $L^4$, $L^5$ and $L^6$ are each independently selected from a group consisting of a single bond; or a $C_6$-$C_{60}$ arylene group; fluorenylene group; a $C_2$-$C_{60}$ heterocyclic group including at least one hetero atom of O, N, S, Si or a fused ring group of a $C_3$-$C_{60}$ aliphatic ring and a $C_6$-$C_{60}$ aromatic ring;

Wherein in case $L^3$, $L^4$, $L^5$ and $L^6$ are an arylene group, it is preferably an $C_6$-$C_{30}$ arylene group, more preferably an $C_6$-$C_{24}$ arylene group, for example, it may be phenylene, biphenyl, naphthylene, terphenyl and the like.

Wherein in case $L^3$, $L^4$, $L^5$ and $L^6$ are a heterocyclic group, it is preferably a $C_2$-$C_{30}$ heterocyclic group, and more preferably a $C_2$-$C_{24}$ heterocyclic group, for example, it may be pyrazine, thiophene, pyridine, pyrimidoindole, 5-phenyl-5H-pyrimido[5,4-b]indole, quinazoline, benzoquinazoline, carbazole, dibenzoquinazoline, dibenzofuran, dibenzothiophene, benzothienopyrimidine, benzofuropyrimidine, phenothiazine, phenylphenothiazine, etc.

Wherein in case $L^3$, $L^4$, $L^5$ and $L^6$ are a fused ring group, it is preferably a fused ring group of an $C_3$-$C_{30}$ aliphatic ring and an $C_6$-$C_{30}$ aromatic ring, and more preferably a fused ring group of an $C_3$-$C_{24}$ aliphatic ring and an $C_6$-$C_{24}$ aromatic ring.

4) Ar is an $C_6$-$C_{60}$ aryl group, preferably an $C_6$-$C_{30}$ aryl group, more preferably an $C_6$-$C_{25}$ aryl group, for example, it may be phenylene, biphenyl, naphthalene, phenanthrene, and the like.

5) $Ar^1$, $Ar^2$ and Ara are each independently selected from a group consisting of a $C_6$-$C_{60}$ aryl group; a fluorenyl group; a $C_2$-$C_{60}$ heterocyclic group including at least one hetero atom of O, N, S, Si or P; and a fused ring group of a $C_3$-$C_{60}$ aliphatic ring and a $C_6$-$C_{60}$ aromatic ring;

Wherein in case $Ar^1$, $Ar^2$ and $Ar^3$ are an aryl group, it is preferably an $C_6$-$C_{30}$ aryl group, more preferably an $C_6$-$C_{25}$ aryl group, for example, it may be phenylene, biphenyl, naphthalene, terphenyl and the like.

Wherein in case $Ar^1$, $Ar^2$ and $Ar^3$ are a heterocyclic group, it is preferably a $C_2$-$C_{30}$ heterocyclic group, and more preferably a $C_2$-$C_{24}$ heterocyclic group, for example, it may be pyrazine, thiophene, pyridine, pyrimidoindole, 5-phenyl-5H-pyrimido[5,4-b]indole, quinazoline, benzoquinazoline, carbazole, dibenzoquinazoline, dibenzofuran, dibenzothiophene, benzothienopyrimidine, benzofuropyrimidine, phenothiazine, phenylphenothiazine, etc.

Wherein in case $Ar^1$, $Ar^2$ and $Ar^3$ are a fused ring group, it is preferably a fused ring group of an $C_3$-$C_{30}$ aliphatic ring and an $C_6$-$C_{30}$ aromatic ring, and more preferably a fused ring group of an $C_3$-$C_{24}$ aliphatic ring and an $C_6$-$C_{24}$ aromatic ring.

6) $Ar^4$ is each independently selected from a group consisting of a $C_6$-$C_{60}$ aryl group; a fluorenyl group; a $C_2$-$C_{60}$ heterocyclic group including at least one hetero atom of 0, N, S, Si or 1=', and a fused ring group of a $C_3$-$C_{60}$ aliphatic ring and a $C_6$-$C_{60}$ aromatic ring; and -L'-$NR^bR^c$, Wherein in case $Ar^4$ is an aryl group, it is preferably an $C_6$-$C_{30}$ aryl group, more preferably an $C_6$-$C_{25}$ aryl group, for example, it may be phenylene, biphenyl, naphthalene, terphenyl and the like.

Wherein in case $Ar^4$ is a heterocyclic group, it is preferably a $C_2$-$C_{30}$ heterocyclic group, and more preferably a $C_2$-$C_{24}$ heterocyclic group, for example, it may be pyrazine, thiophene, pyridine, pyrimidoindole, 5-phenyl-5H-pyrimido[5,4-b]indole, quinazoline, benzoquinazoline, carbazole, dibenzoquinazoline, dibenzofuran, dibenzothiophene, benzothienopyrimidine, benzofuropyrimidine, phenothiazine, phenylphenothiazine, etc.

Wherein in case $Ar^4$ is a fused ring group, it is preferably a fused ring group of an $C_3$-$C_{30}$ aliphatic ring and an $C_6$-$C_{30}$ aromatic ring, and more preferably a fused ring group of an $C_3$-$C_{24}$ aliphatic ring and an $C_6$-$C_{24}$ aromatic ring.

7) L' is each independently selected from a group consisting of a single bond; and a $C_6$-$C_{60}$ arylene group; a $C_2$-$C_{60}$ heterocyclic group including at least one hetero atom of O, N, S, Si or ID, Wherein in case L' is an arylene group, it is preferably an $C_6$-$C_{30}$ arylene group, more preferably an $C_6$-$C_{24}$ arylene group, for example, it may be phenylene, biphenyl, naphthylene, terphenyl and the like.

Wherein in case L' is a heterocyclic group, it is preferably a $C_2$-$C_{30}$ heterocyclic group, and more preferably a $C_2$-$C_{24}$ heterocyclic group, for example, it may be pyrazine, thiophene, pyridine, pyrimidoindole, 5-phenyl-5H-pyrimido[5,4-b]indole, quinazoline, benzoquinazoline, carbazole, dibenzoquinazoline, dibenzofuran, dibenzothiophene, benzothienopyrimidine, benzofuropyrimidine, phenothiazine, phenylphenothiazine, etc.

8) $R^a$ and $R^b$ are each independently selected from a group consisting of a $C_6$-$C_{60}$ aryl group; a fluorenyl group; a fused ring group of a $C_3$-$C_{60}$ aliphatic ring and a $C_6$-$C_{60}$ aromatic ring; a $C_2$-$C_{60}$ heterocyclic group including at least one hetero atom of 0, N, S, Si or P, a $C_1$-$C_{50}$ alkyl group; a $C_2$-$C_{20}$ alkenyl group; a $C_2$-$C_{20}$ alkynyl group; a $C_1$-$C_{30}$ alkoxy group; and a $C_6$-$C_{30}$ aryloxy group;

Wherein in case $R^a$ and $R^b$ are an aryl group, it is preferably an $C_6$-$C_{30}$ aryl group, more preferably an $C_6$-$C_{25}$ aryl group, for example, it may be phenylene, biphenyl, naphthalene, terphenyl and the like.

Wherein in case $R^a$ and $R^b$ are a fused ring group, it is preferably a fused ring group of an $C_3$-$C_{30}$ aliphatic ring and an $C_6$-$C_{30}$ aromatic ring, and more preferably a fused ring group of an $C_3$-$C_{24}$ aliphatic ring and an $C_6$-$C_{24}$ aromatic ring.

Wherein in case $R^a$ and $R^b$ are a heterocyclic group, it is preferably a $C_2$-$C_{30}$ heterocyclic group, and more preferably a $C_2$-$C_{24}$ heterocyclic group, for example, it may be pyrazine, thiophene, pyridine, pyrimidoindole, 5-phenyl-5H-pyrimido[5,4-b]indole, quinazoline, benzoquinazoline, carbazole, dibenzoquinazoline, dibenzofuran, dibenzothiophene, benzothienopyrimidine, benzofuropyrimidine, phenothiazine, phenylphenothiazine, etc.

Wherein in case $R^a$ and $R^b$ are an alkyl group, it is preferably a $C_1$-$C_{30}$ alkyl group, and more preferably a $C_1$-$C_{24}$ alkyl group.

Wherein in case $R^a$ and $R^b$ are an alkoxy group, it is preferably a $C_1$-$C_{24}$ alkoxy group.

Wherein in case $R^a$ and $R^b$ are an aryloxy group, it is preferably a $C_6$-$C_{24}$ aryloxy group.

9) Ring A is a substituent represented by the following Formula a; or Formula b;

<Formula a>

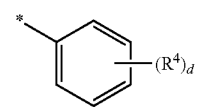

<Formula b>

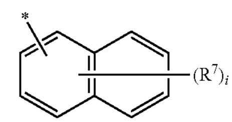

10) Ring B is a $C_6$-$C_{20}$ aryl group;

11) $R^1$, $R^2$, $R^3$, $R^4$, $R^5$, $R^6$ and $R^7$ are each same or different, and each independently hydrogen; or deuterium;

12) $R^8$ and $R^9$ are each the same or different, and each independently selected from the group consisting of hydrogen; deuterium; halogen; cyano group; nitro group; a $C_6$-$C_{60}$ aryl group; fluorenyl group; a $C_2$-$C_{60}$ heterocyclic group including at least one heteroatom of O, N, S, Si or a fused ring group of a $C_3$-$C_{60}$ aliphatic ring and a $C_6$-$C_{60}$ aromatic ring; a $C_1$-$C_{60}$ alkyl group; a $C_2$-$C_{60}$ alkenyl group; a $C_2$-$C_{60}$ alkynyl group; a $C_1$-$C_{60}$ alkoxy group; and a $C_6$-$C_{60}$ aryloxy group; or an adjacent plurality of $R^8$ or a plurality of $R^9$ may be bonded to each other to form a ring, Wherein in case $R^8$ and $R^9$ are an aryl group, it is preferably an $C_6$-$C_{30}$ aryl group, more preferably an $C_6$-$C_{25}$ aryl group, for example, it may be phenylene, biphenyl, naphthalene, terphenyl and the like, Wherein in case $R^8$ and $R^9$ are a heterocyclic group, it is preferably a $C_2$-$C_{30}$ heterocyclic group, and more preferably a $C_2$-$C_{24}$ heterocyclic group, for example, it may be pyrazine, thiophene, pyridine, pyrimidoindole, 5-phenyl-5H-pyrimido[5,4-b]indole, quinazoline, benzoquinazoline, carbazole, dibenzoquinazoline, dibenzofuran, dibenzothiophene, benzothienopyrimidine, benzofuropyrimidine, phenothiazine, phenylphenothiazine, etc., Wherein in case $R^8$ and $R^9$ are a fused ring group, it is preferably a fused ring group of an $C_3$-$C_{30}$ aliphatic ring and an $C_6$-$C_{30}$ aromatic ring, and more preferably a fused ring group of an $C_3$-$C_{24}$ aliphatic ring and an $C_6$-$C_{24}$ aromatic ring, Wherein in case $R^8$ and $R^9$ are an alkyl group, it is preferably a $C_1$-$C_{30}$ alkyl group, and more preferably a $C_1$-$C_{24}$ alkyl group, Wherein in case $R^8$ and $R^9$ are an alkenyl group, it is preferably a $C_2$-$C_{30}$ alkenyl group, and more preferably a $C_2$-$C_{24}$ alkenyl group.

Wherein in case $R^8$ and $R^9$ are an alkynyl group, it is preferably a $C_2$-$C_{30}$ alkynyl group, and more preferably a $C_2$-$C_{24}$ alkynyl group.

Wherein in case $R^8$ and $R^9$ are an alkoxy group, it is preferably a $C_1$-$C_{30}$ alkoxy group, and more preferably a $C_1$-$C_{24}$ alkoxy group, Wherein in case $R^8$ and $R^9$ are an aryloxy group, it is preferably a $C_6$-$C_{30}$ aryloxy group, and more preferably a $C_6$-$C_{24}$ aryloxy group, 13) a and d are each independently an integer of 0 to 5, b and f are each independently an integer of 0 to 6, c, e, g, h, n and o are each independently an integer of 0 to 4, i is an integer of 0 to 7, 14) z is 0 or 1, provided that when z is 0, $L^1$ is a substituent represented by Formula L-4, 15) Y is O, S, CR'R" or $NR^a$, 16) wherein R' and R" are each independently selected from a group consisting of hydrogen; deuterium; a $C_6$-$C_{60}$ aryl group; fluorenyl group; a $C_2$-$C_{60}$ heterocyclic group including at least one heteroatom of O, N, S, Si or P, a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$alkynyl group; a $C_1$-$C_{30}$alkoxy group; and a $C_6$-$C_{30}$aryloxy group; alternatively, R' and R" may be bonded to each other to form a spiro, Wherein in case R' and R" are an aryl group, it is preferably an $C_6$-$C_{30}$ aryl group, more preferably an $C_6$-$C_{25}$ aryl group, for example, it may be phenylene, biphenyl, naphthalene, terphenyl and the like.

Wherein in case R' and R" are a heterocyclic group, it is preferably a $C_2$-$C_{30}$ heterocyclic group, and more preferably a $C_2$-$C_{24}$ heterocyclic group, for example, it may be pyrazine, thiophene, pyridine, pyrimidoindole, 5-phenyl-5H-pyrimido[5,4-b]indole, quinazoline, benzoquinazoline, carbazole, dibenzoquinazoline, dibenzofuran, dibenzothiophene, benzothienopyrimidine, benzofuropyrimidine, phenothiazine, phenylphenothiazine, etc.

Wherein in case R' and R" are a fused ring group, it is preferably a fused ring group of an $C_3$-$C_{30}$ aliphatic ring and an $C_6$-$C_{30}$ aromatic ring, and more preferably a fused ring group of an $C_3$-$C_{24}$ aliphatic ring and an $C_6$-$C_{24}$ aromatic ring.

Wherein in case R' and R" are an alkyl group, it is preferably a $C_1$-$C_{30}$ alkyl group, and more preferably a $C_1$-$C_{24}$ alkyl group, Wherein in case R' and R" are an alkoxy group, it is preferably a $C_1$-$C_{24}$ alkoxy group.

Wherein in case R' and R" are an aryloxy group, it is preferably a $C_6$-$C_{24}$ aryloxy group, 17) $R^a$ is a $C_6$-$C_{60}$ aryl group; or a $C_2$-$C_{60}$ heterocyclic group including at least one hetero atom of O, N, S, Si or P, Wherein in case $R^a$ is an aryl group, it is preferably an $C_6$-$C_{30}$ aryl group, more preferably an $C_6$-$C_{25}$ aryl group, for example, it may be phenylene, biphenyl, naphthalene, terphenyl and the like.

Wherein in case $R^a$ is a heterocyclic group, it is preferably a $C_2$-$C_{30}$ heterocyclic group, and more preferably a $C_2$-$C_{24}$ heterocyclic group, for example, it may be pyrazine, thiophene, pyridine, pyrimidoindole, 5-phenyl-5H-pyrimido[5,4-b]indole, quinazoline, benzoquinazoline, carbazole, dibenzoquinazoline, dibenzofuran, dibenzothiophene, benzothienopyrimidine, benzofuropyrimidine, phenothiazine, phenylphenothiazine, etc.

18) * denotes a position to be bonded, 19) wherein the aryl group, arylene group, heterocyclic group, fluorenyl group, fluorenylene group, fused ring group, alkyl group, alkenyl group, alkynyl group, alkoxy group and aryloxy group may be substituted with one or more substituents selected from the group consisting of deuterium; halogen; silane group; siloxane group; boron group; germanium group; cyano group; nitro group; $C_1$-$C_{20}$ alkylthio group; $C_1$-$C_{20}$ alkoxyl group; $C_1$-$C_{20}$ alkyl group; $C_2$-$C_{20}$ alkenyl group; $C_2$-$C_{20}$ alkynyl group; $C_6$-$C_{20}$ aryl group; $C_6$-$C_{20}$ aryl group substituted with deuterium; a fluorenyl group; $C_2$-$C_{20}$ heterocyclic group; $C_3$-$C_{20}$ cycloalkyl group; $C_7$-$C_{20}$ arylalkyl group; and $C_8$-$C_{20}$ arylalkenyl group; also the substituents may be bonded to each other to form a saturated or unsaturated ring, wherein the term 'ring' means a $C_3$-$C_{60}$ aliphatic ring or a $C_6$-$C_{60}$ aromatic ring or a $C_2$-$C_{60}$ heterocyclic group or a fused ring formed by the combination thereof.

The $L^2$ may be represented by any one of the following Formulas a-1 to a-20.

<Formula a-1>

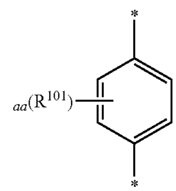

<Formula a-2>

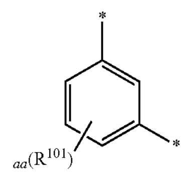

<Formula a-3>

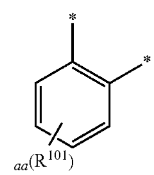

<Formula a-4>

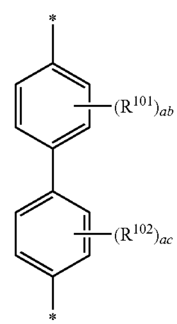

<Formula a-5>

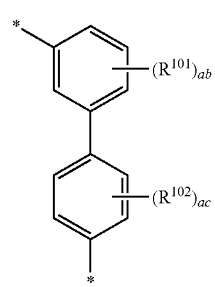

-continued
<Formula a-6>
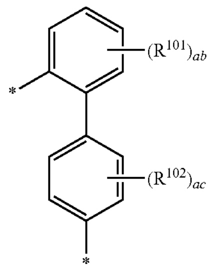
<Formula a-7>
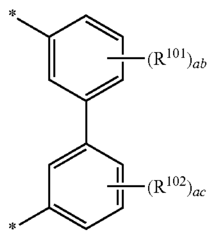
<Formula a-8>
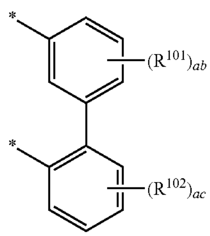
<Formula a-9>
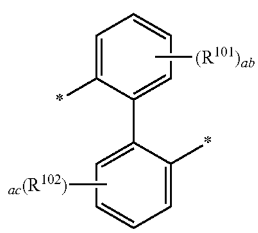
<Formula a-10>
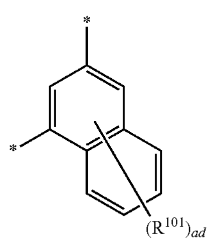
<Formula a-11>
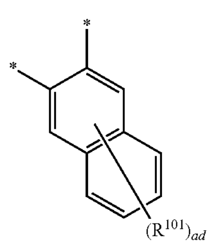
-continued
<Formula a-12>
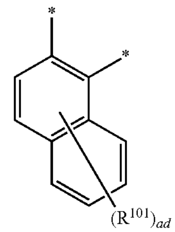
<Formula a-13>
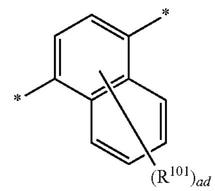
<Formula a-14>
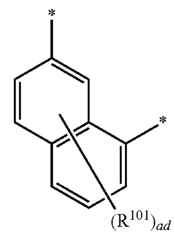
<Formula a-15>
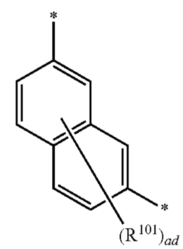
<Formula a-16>
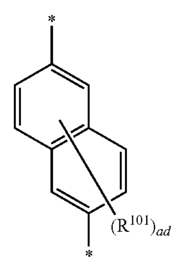
<Formula a-17>
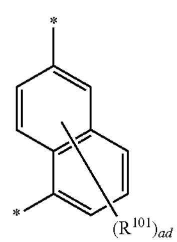
<Formula a-18>
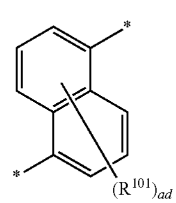

-continued

<Formula a-19>

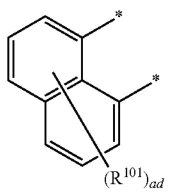

<Formula a-20>

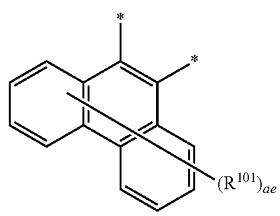

In the above Formulas a-1 to a-20, each symbol may be defined as follows.

1) $R^{101}$ and $R^{102}$ are the same or different from each other, and each independently represent hydrogen; deuterium; $C_6$-$C_{20}$ aryl group; $C_6$-$C_{20}$ aryl group substituted with deuterium; Wherein in case $R^{101}$ and $R^{102}$ are an aryl group, they may be phenylene, biphenyl, naphthalene, terphenyl and the like.

2) aa, ab and ac are each independently integers from 0 to 4, ad is an integer from 0 to 6, ae is an integer from 0 to 8, 3) * * denotes a position to be bonded.

The Ar may be represented by any one of the following formulas b-1 to b-8.

<Formula b-1>

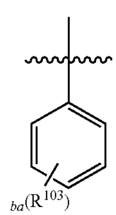

<Formula b-2>

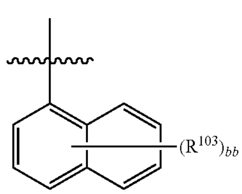

<Formula b-3>

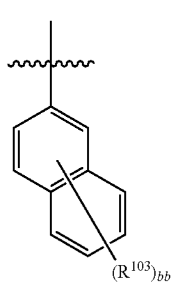

-continued

<Formula b-4>

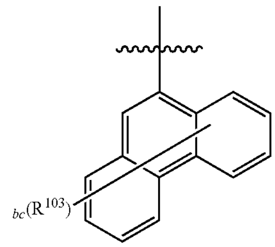

<Formula b-5>

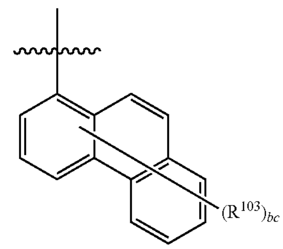

<Formula b-6>

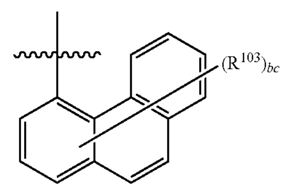

<Formula b-7>

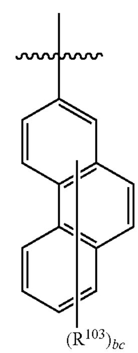

<Formula b-8>

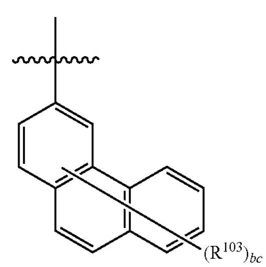

In Formulas b-1 to b-8, each symbol may be defined as follows.

1) $R^{103}$ is hydrogen; deuterium; $C_6$-$C_{20}$ aryl group; $C_6$-$C_{20}$ aryl group substituted with deuterium; Wherein in case $R^{103}$ is an aryl group, it may be phenylene, biphenyl, naphthalene, terphenyl and the like.

2) ba is an integer from 0 to 5, bb is an integer from 0 to 7, be is an integer from 0 to 9, 3) 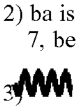 means the position to be bonded to L.

Formula L-1 may preferably be represented by any one of the following Formulas L-1-1 to Formula L-1-3.

<Formula L-1-1>

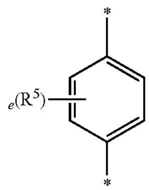

<Formula L-1-2>

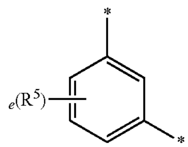

<Formula L-1-3>

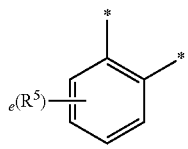

Wherein, $R^5$, e and * are as defined above.

Formula L-2 may preferably be represented by any one of the following Formulas L-2-1 to L-2-4.

<Formula L-2-1>

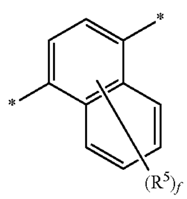

<Formula L-2-2>

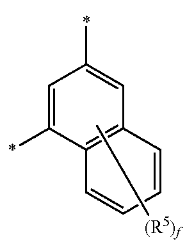

<Formula L-2-3>

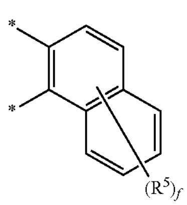

<Formula L-2-4>

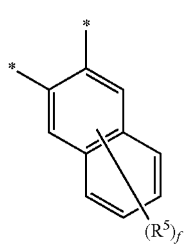

Wherein, $R^5$, f and * are as defined above.

Formula L-3 may preferably be represented by any one of the following Formulas L-3-1 to L-3-8.

<Formula L-3-1>

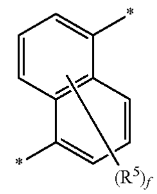

<Formula L-3-2>

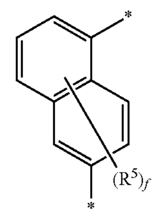

<Formula L-3-3>

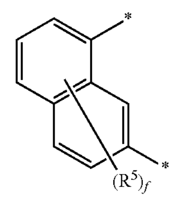

<Formula L-3-4>

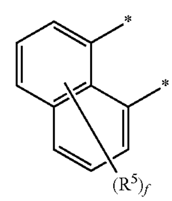

<Formula L-3-5>

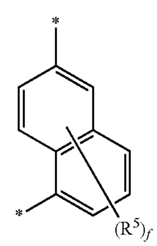

<Formula L-3-6>

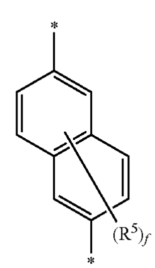

<Formula L-3-7>

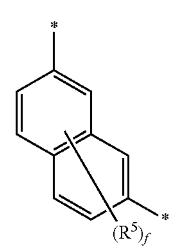

-continued

<Formula L-3-8>

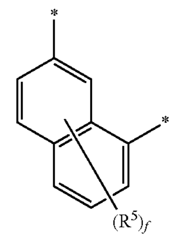

Wherein, $R^5$, f and * are as defined above.

Formula L-4 may preferably be represented by any one of the following Formulas L-4-1 to L-4-6.

<Formula L-4-1>

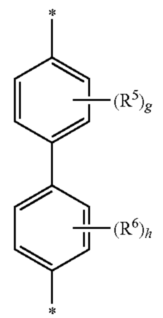

<Formula L-4-2>

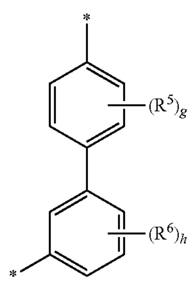

<Formula L-4-3>

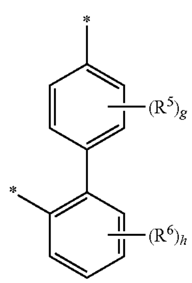

<Formula L-4-4>

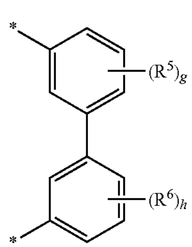

-continued

<Formula L-4-5>

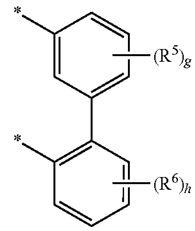

<Formula L-4-6>

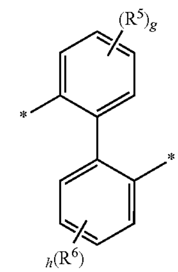

Wherein, $R^5$, $R^6$, g, h and * are as defined above.

Also, the compound represented by Formula 1 is represented by Formula 1-1 or Formula 1-2.

<Formula 1-1>

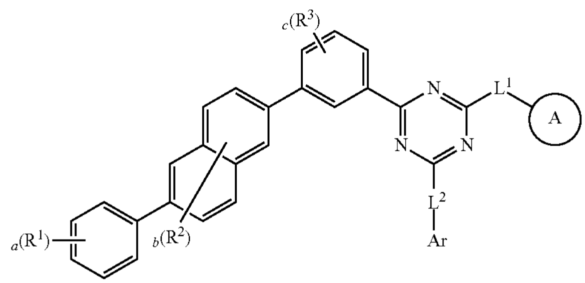

<Formula 1-2>

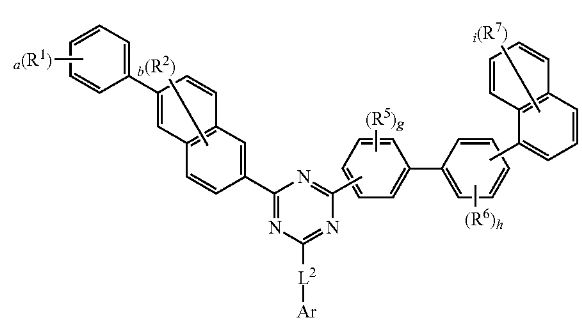

Wherein, $R^1$, $R^2$, $R^3$, $R^4$, $R^5$, $R^6$, $R^7$, $L^1$, $L^2$, Ar, a, b, c, d, g, h and i are as defined above.

The compound represented by Formula 1 is represented by Formula 1-1-a or Formula 1-1-b.

<Formula 1-1-a>
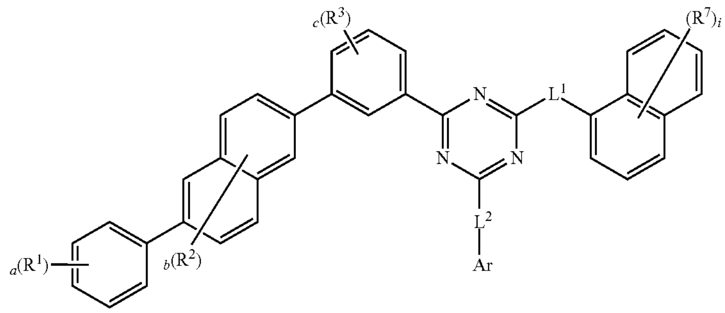
<Formula 1-1-b>
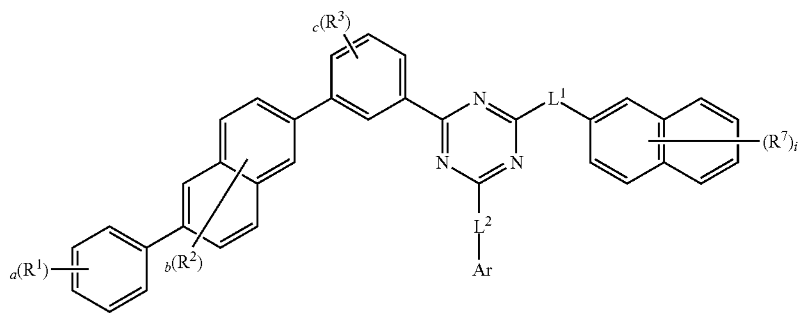
Wherein, $R^1$, $R^2$, $R^3$, $R^7$, $L^1$, $L^2$, Ar, a, b, c and i are as defined above.
The compound represented by Formula 1 is represented by any of the following Formulas 1-1-1 to 1-1-5.
<Formula 1-1-1>
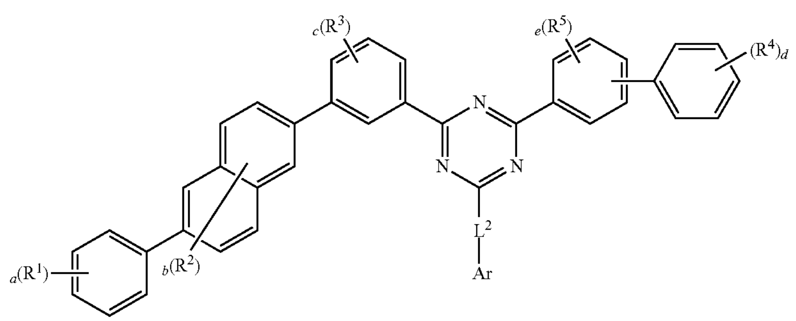
<Formula 1-1-2>
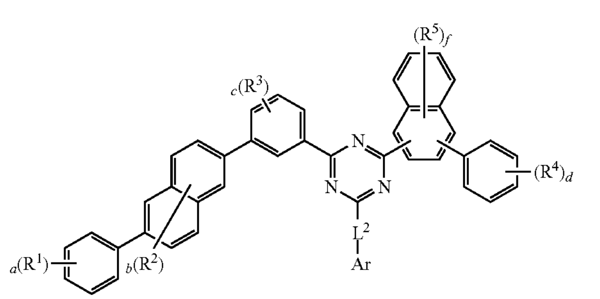
<Formula 1-1-3>
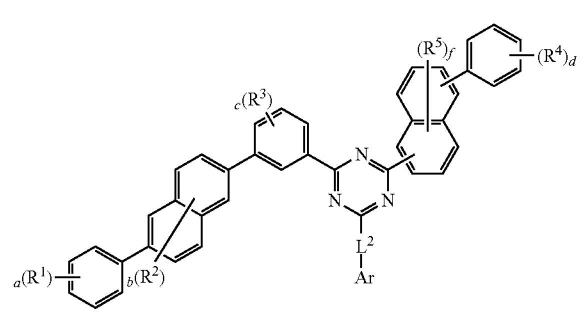

-continued
<Formula 1-1-4>
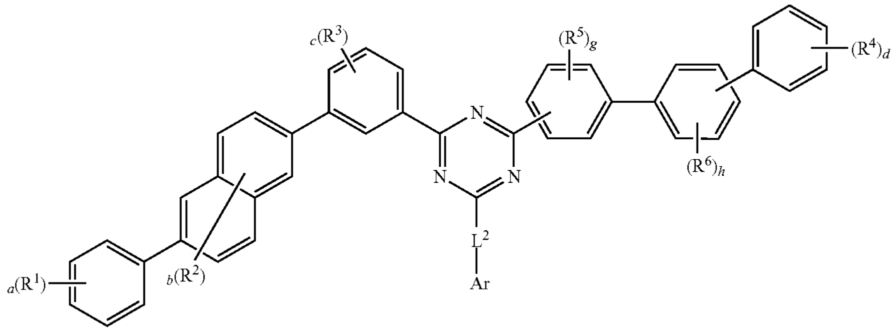
<Formula 1-1-5>
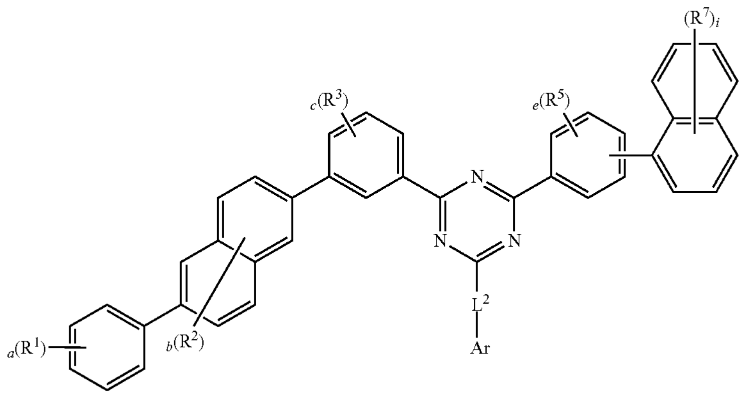
Wherein, $R^1$, $R^2$, $R^3$, $R^4$, $R^5$, $R^6$, $R^7$, $L^2$, Ar, a, b, c, d, e, f, g, h and i are as defined above.
The compound represented by Formula 1-1-1 is preferably represented by any of the following Formulas 1-1-1-a to 1-1-1-c.
<Formula 1-1-1-a>
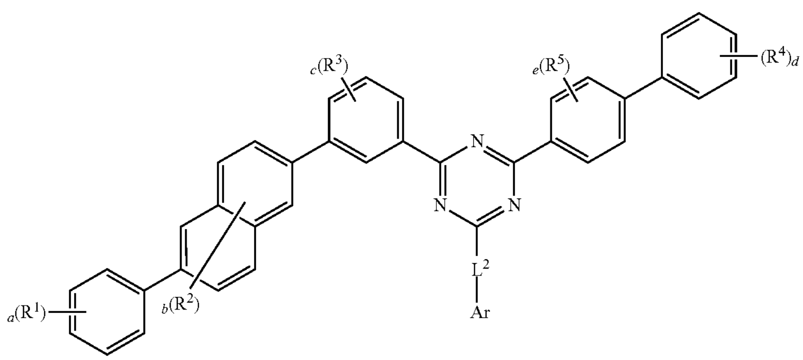
<Formula 1-1-1-b>
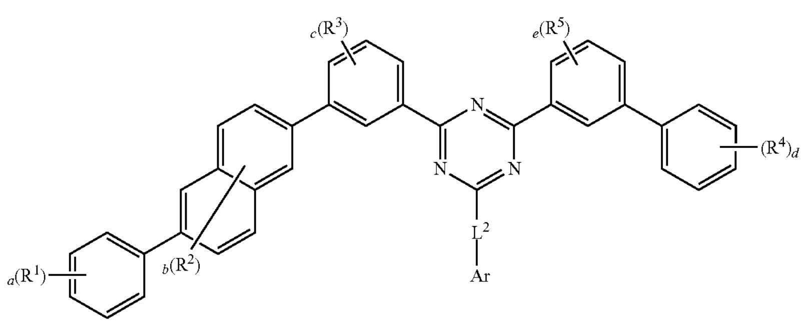

-continued
<Formula 1-1-1-c>
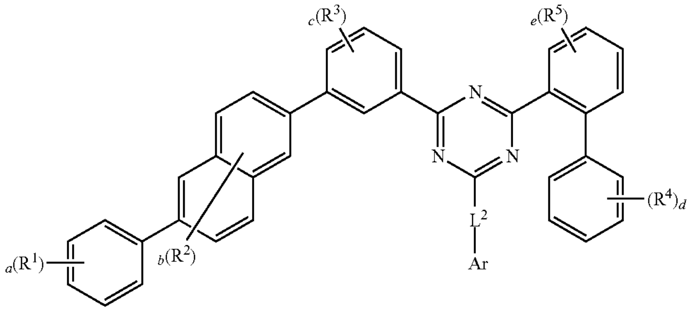
Wherein, $R^1$, $R^2$, $R^3$, $R^4$, $R^5$, $L^2$, Ar, a, b, c, d and e are as defined above.
The Formula 1-1-2 may preferably be represented by any one of the following Formulas 1-1-2-a to 1-1-2-c.
<Formula 1-1-2-a>
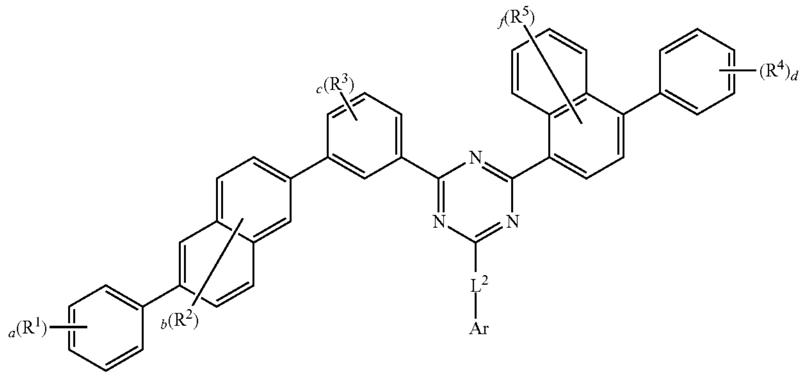
<Formula 1-1-2-b>
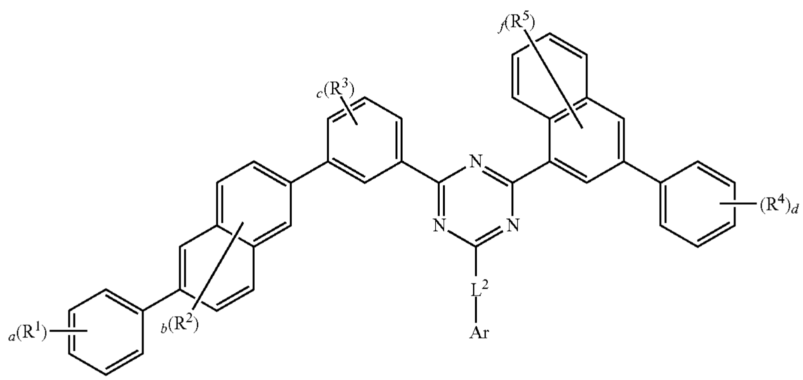
<Formula 1-1-2-c>
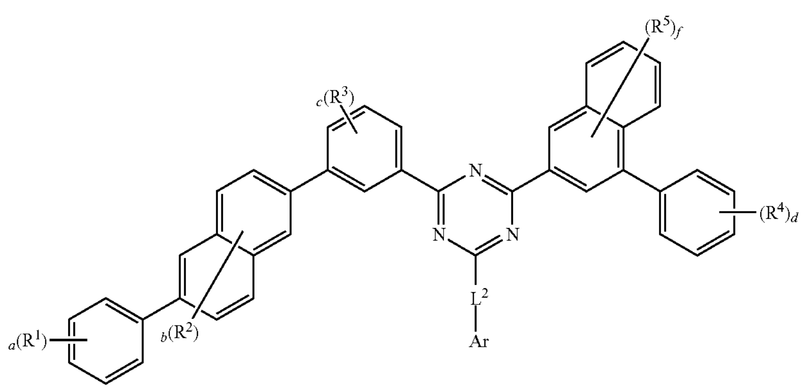

Wherein $R^1$, $R^2$, $R^3$, $R^4$, $R^5$, $L^2$, Ar, a, b, c, d and f are as defined above.

The Formula 1-1-3 may preferably be represented by Formula 1-1-3-a or Formula 1-1-3-b.

<Formula 1-1-3-a>

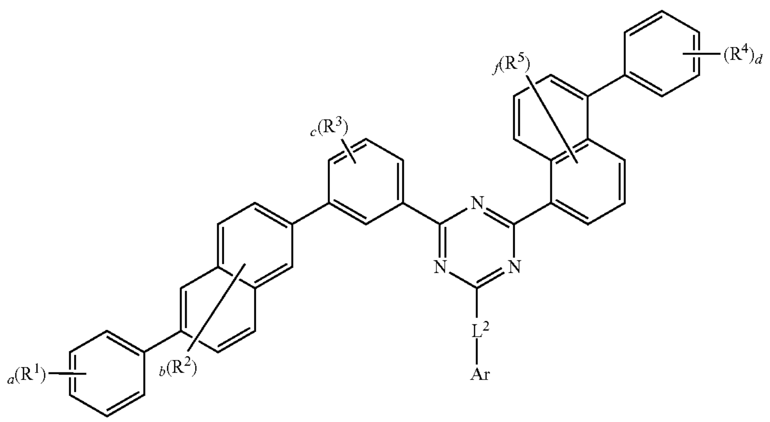

<Formula 1-1-3-b>

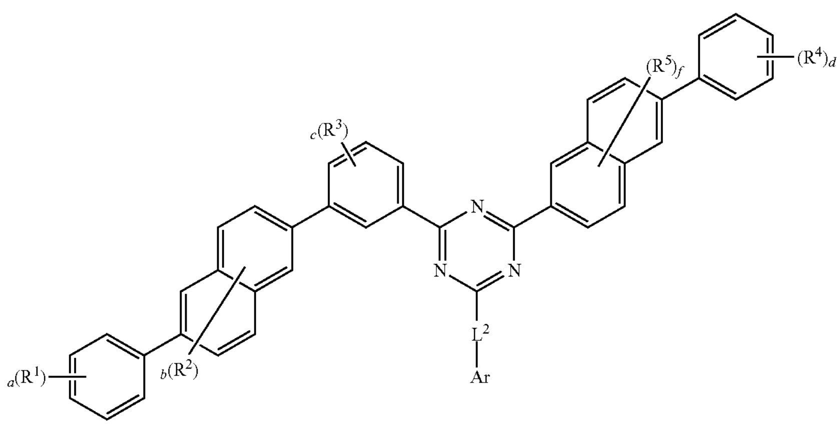

Wherein $R^1$, $R^2$, $R^3$, $R^4$, $R^5$, $L^2$, Ar, a, b, c, d and f are as defined above.

Formula 1-1-4 may preferably be represented by Formula 1-1-4-a.

<Formula 1-1-4-a>

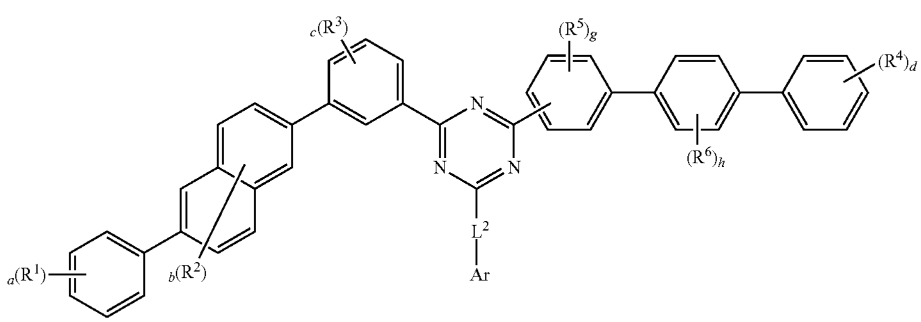

Wherein $R^1$, $R^2$, $R^3$, $R^4$, $R^5$, $R^6$, $L^2$, Ar, a, b, c, d, g and h are as defined above.

Formula 1-1-4 may be more preferably represented by Formula 1-1-4-b or Formula 1-1-4-c.

<Formula 1-1-4-b>
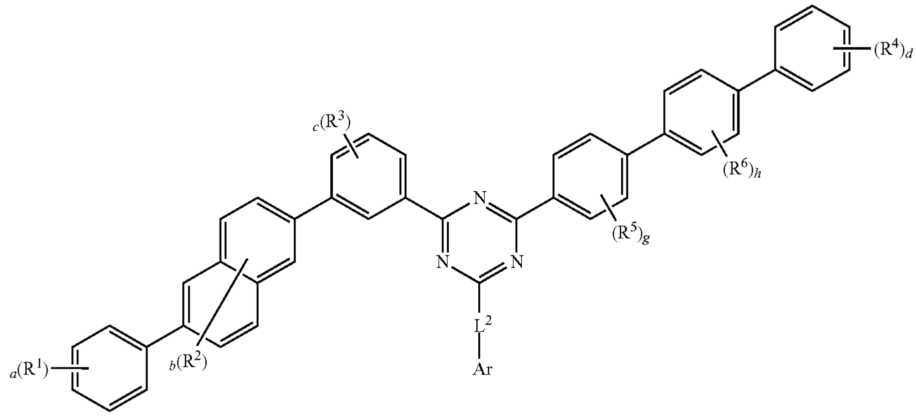
<Formula 1-1-4-c>
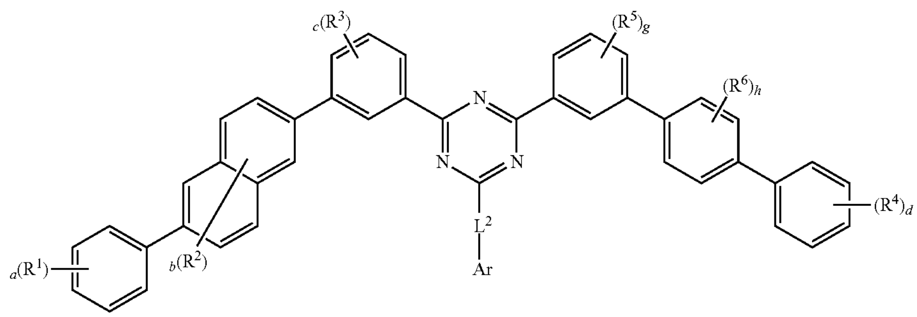
Wherein $R^1$, $R^2$, $R^3$, $R^4$, $R^5$, $R^6$, $L^2$, Ar, a, b, c, d, g and h are as defined above.
Formula 1-1-5 may preferably be represented by any one of Formulas 1-1-5-a to 1-1-5-c.
<Formula 1-1-5-a>
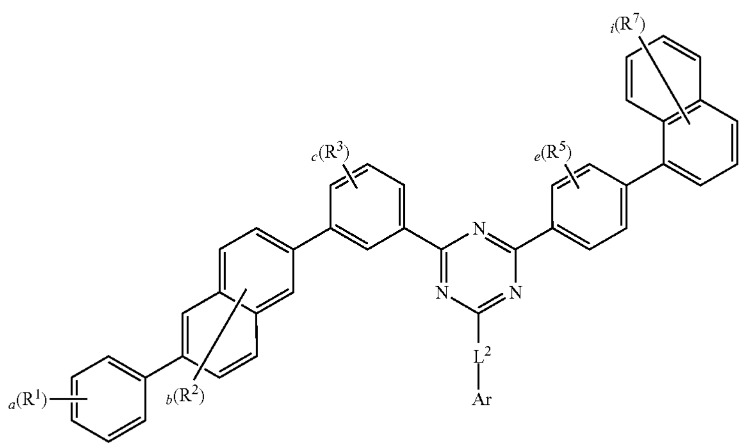
<Formula 1-1-5-b>
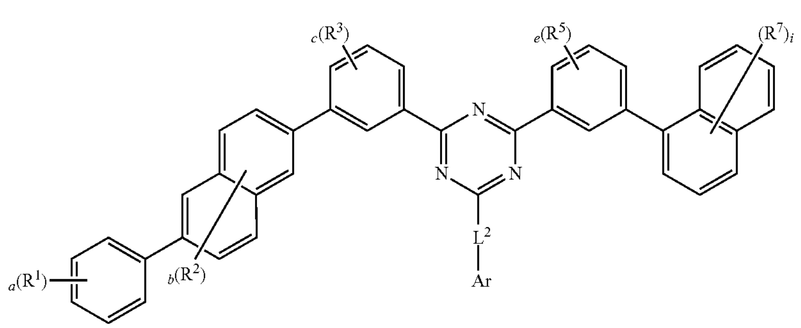

-continued
<Formula 1-1-5-c>
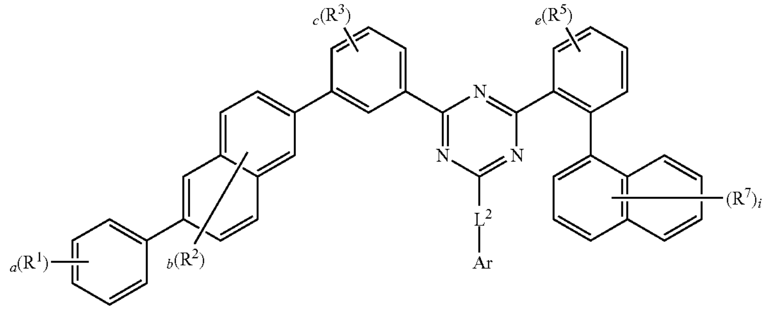
Wherein $R^1$, $R^2$, $R^3$, $R^5$, $R^7$, $L^2$, Ar, a, b, c, e and i are as defined above.
The compound represented by Formula 1 is represented by Formula 1-2-a.
<Formula 1-2-a>
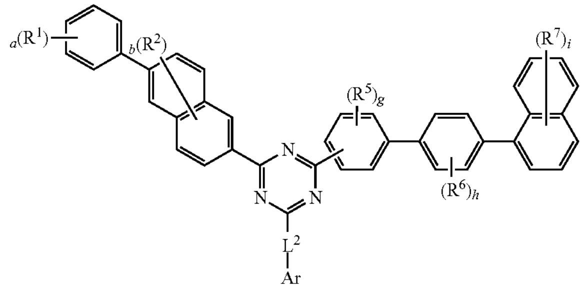
Wherein $R^1$, $R^2$, $R^5$, $R^6$, $R^7$, $L^2$, Ar, a, b, g, h and i are as defined above.
The compound represented by Formula 1 is represented by any of Formulas 1-2-b to 1-2-d.
<Formula 1-2-b>
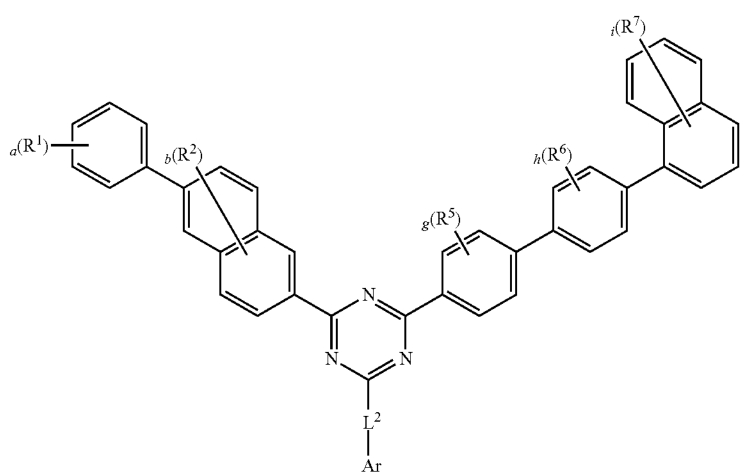

-continued

<Formula 1-2-c>

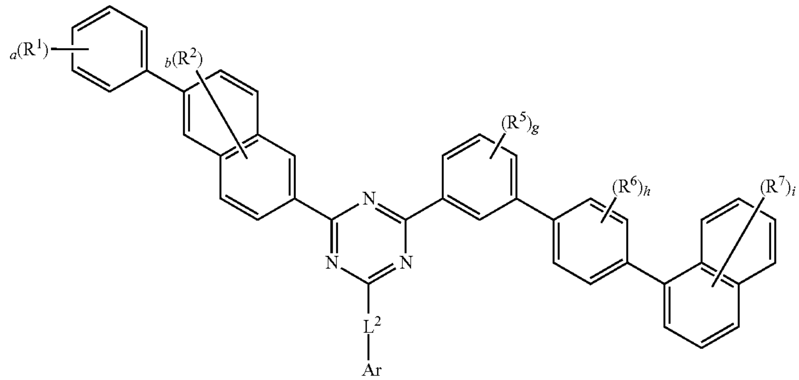

<Formula 1-2-d>

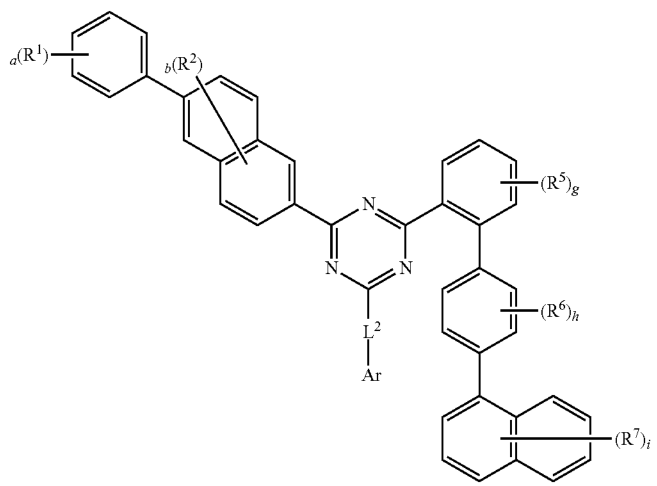

Wherein, $R^1$, $R^2$, $R^5$, $R^6$, $R^7$, $L^2$, Ar, a, b, g, h and i are as defined above.

The compound represented by Formula 2 is represented by any of Formulas 2-1 to 2-3.

<Formula 2-1>

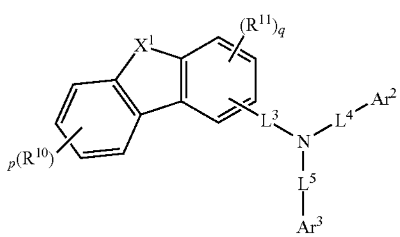

<Formula 2-2>

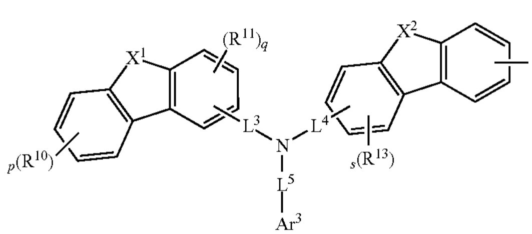

-continued

<Formula 2-3>

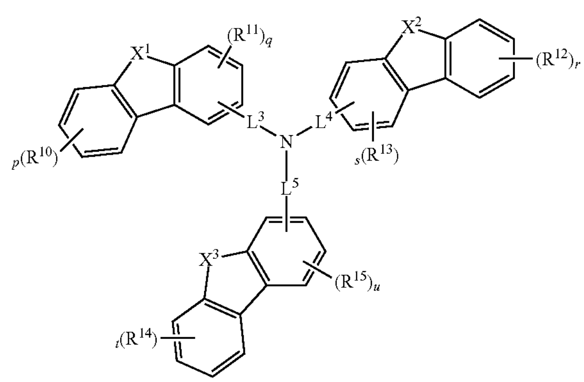

Wherein,

1) $L^3$, $L^4$, $L^5$, $Ar^2$ and $Ar^3$ are as defined above,

2) $X^1$, $X^2$ and $X^3$ are the same as the definition of Y,

3) $R^{10}$, $R^{11}$, $R^{12}$, $R^{13}$, $R^{14}$ and $R^{15}$ are the same as the definition of $R^8$, 4) p, r and t are each independently an integer of 0 to 4, 5) q, s and u are each independently an integer of 0 to 3.

The compound represented by Formula 3 is represented by any of Formulas 3-1 to 3-6.

<Formula 3-1>

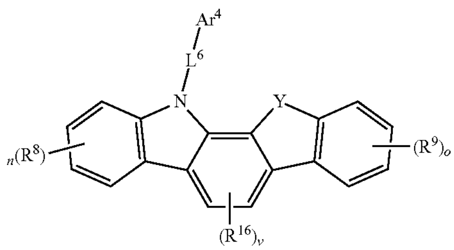

<Formula 3-2>

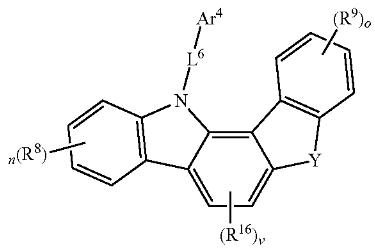

<Formula 3-3>

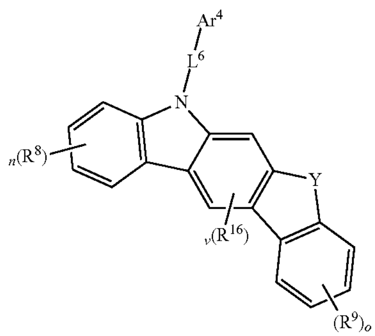

<Formula 3-4>

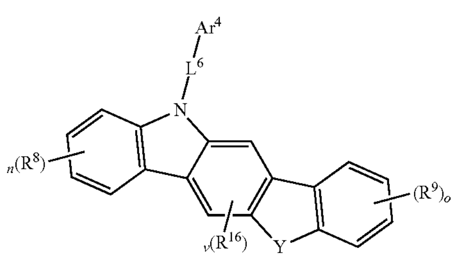

<Formula 3-5>

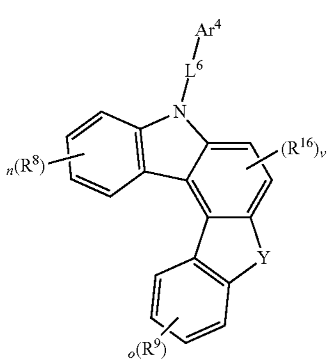

-continued

<Formula 3-6>

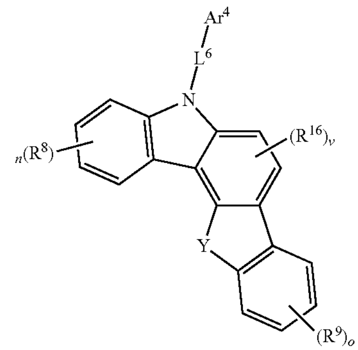

Wherein,

1) Y, $R^8$, $R^9$, $L^6$, $Ar^4$, n and o are as defined above,

2) $R^{16}$ is the same as the definition of $R^8$, 3) v is an integer of 0 to 2.

The compound represented by Formula 3 is represented by any of Formulas 3-7 to 3-9.

<Formula 3-7>

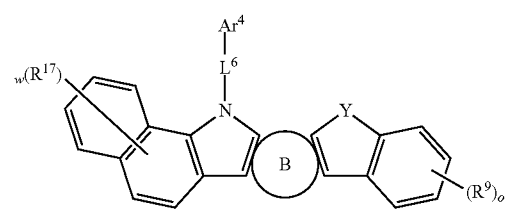

<Formula 3-8>

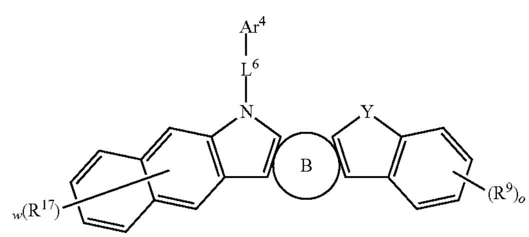

<Formula 3-9>

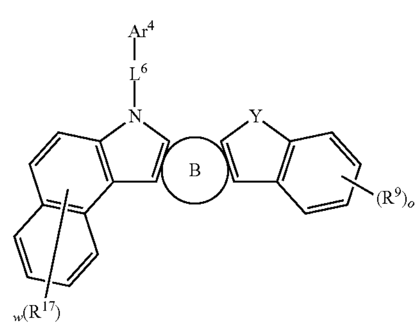

Wherein, each symbol can be defined as follows.

1) Y, Ring B, $R^9$, $L^6$, $Ar^4$ and o are as defined above,

2) $R^{17}$ is selected from the group consisting of hydrogen; deuterium; halogen; cyano group; nitro group; a $C_6$-$C_{60}$ aryl group; fluorenyl group; a $C_2$-$C_{60}$ heterocyclic group including at least one heteroatom of O, N, S, Si or ID, a fused ring group of a $C_3$-$C_{60}$ aliphatic ring and a $C_6$-$C_{60}$ aromatic ring; a $C_1$-$C_{60}$ alkyl group; a $C_2$-$C_{60}$ alkenyl group; a $C_2$-$C_{60}$ alkynyl group; a $C_1$-$C_{60}$ alkoxy group; and a $C_6$-$C_{60}$ aryloxy group;

Wherein in case $R^{17}$ is an aryl group, it is preferably an $C_6$-$C_{30}$ aryl group, more preferably an $C_6$-$C_{25}$ aryl group, for example, it may be phenylene, biphenyl, naphthalene, terphenyl and the like, Wherein in case $R^{17}$ is a heterocyclic group, it is preferably a $C_2$-$C_{30}$ heterocyclic group, and more preferably a $C_2$-$C_{24}$ heterocyclic group, for example, it may be pyrazine, thiophene, pyridine, pyrimidoindole, 5-phenyl-5H-pyrimido [5,4-b]indole, quinazoline, benzoquinazoline, carbazole, dibenzoquinazoline, dibenzofuran, dibenzothiophene, benzothienopyrimidine, benzofuropyrimidine, phenothiazine, phenylphenothiazine, etc., Wherein in case $R^{17}$ is a fused ring group, it is preferably a fused ring group of an $C_3$-$C_{30}$ aliphatic ring and an $C_6$-$C_{30}$ aromatic ring, and more preferably a fused ring group of an $C_3$-$C_{24}$ aliphatic ring and an $C_6$-$C_{24}$ aromatic ring, Wherein in case $R^{17}$ is an alkyl group, it is preferably a $C_1$-$C_{30}$ alkyl group, and more preferably a $C_1$-$C_{24}$ alkyl group, Wherein in case $R^{17}$ is an alkenyl group, it is preferably a $C_2$-$C_{30}$ alkenyl group, and more preferably a $C_2$-$C_{24}$ alkenyl group.

Wherein in case $R^{17}$ is an alkynyl group, it is preferably a $C_2$-$C_{30}$ alkynyl group, and more preferably a $C_2$-$C_{24}$ alkynyl group.

Wherein in case $R^{17}$ is an alkoxy group, it is preferably a $C_1$-$C_{30}$ alkoxy group, and more preferably a $C_1$-$C_{24}$ alkoxy group, Wherein in case $R^{17}$ is an aryloxy group, it is preferably a $C_6$-$C_{30}$ aryloxy group, and more preferably a $C_2$-$C_{24}$ aryloxy group, 3) w is an integer of 0 to 6.

Also, the compound represented by Formula 3 is represented by any of the following Formulas 3-10 to 3-12.

<Formula 3-10>

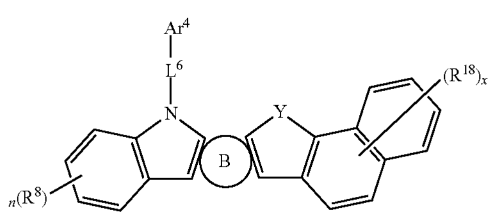

<Formula 3-11>

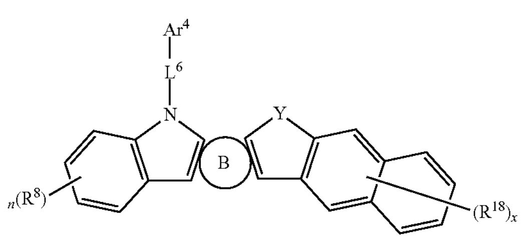

-continued

<Formula 3-12>

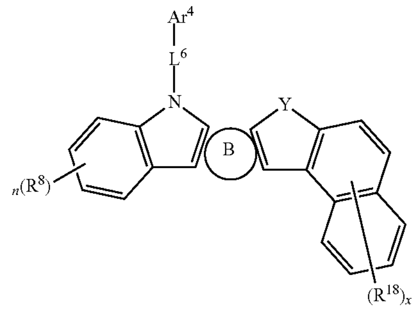

Wherein,

1) Y, Ring B, $R^8$, $L^6$, $Ar^4$ and n are as defined above,

2) $R^{18}$ is the same as the definition of $R^{17}$, 3) x is an integer of 0 to 6.

Also, the compound represented by Formula 3 is represented by any of the following Formulas 3-13 to 3-18.

<Formula 3-13>

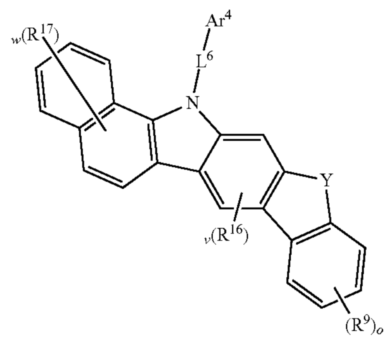

<Formula 3-14>

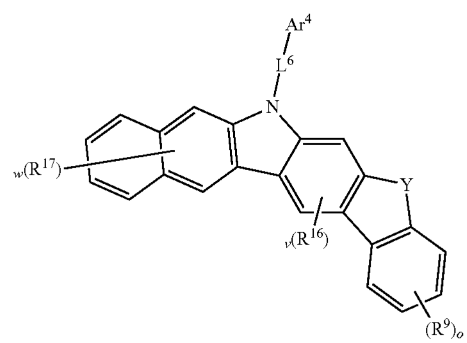

<Formula 3-15>

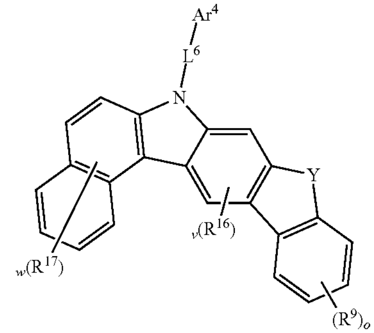

-continued

<Formula 3-16>

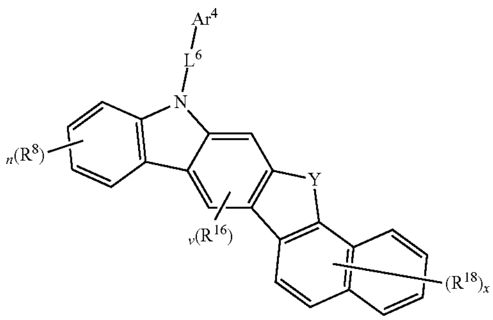

<Formula 3-17>

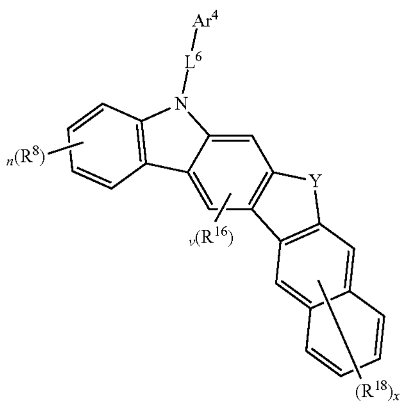

<Formula 3-18>

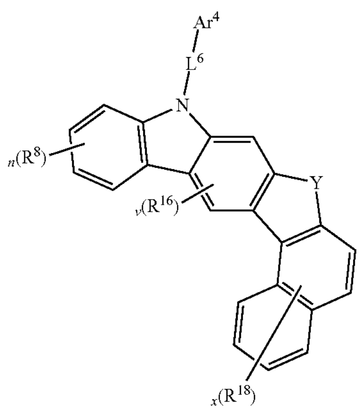

Wherein,

1) Y, $L^6$, $Ar^1$, $R^8$, $R^9$, $R^{17}$, $R^{18}$, n and o are as defined above, 2) $R^{16}$ is the same as the definition of $R^8$, 3) v is an integer of 0 to 2, w and x are each independently an integer of 0 to 6, The compound represented by Formula 3 is represented by Formula 19.

<Formula 19>

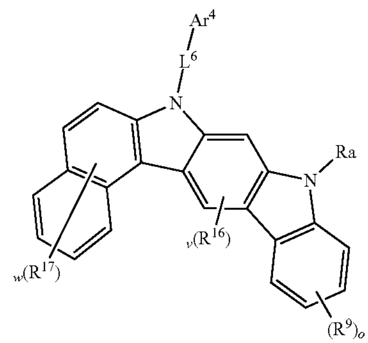

Wherein

1) $L^6$, $Ar^4$, $R^a$, $R^9$, $R^{17}$ and o are as defined above,

2) $R^{16}$ is the same as the definition of $R^8$, 3) v is an integer of 0 to 2, w is an integer of 0 to 6, Specifically, the compound represented by Formula 1 may be any one of the following compounds P-1 to P-100.

P-1

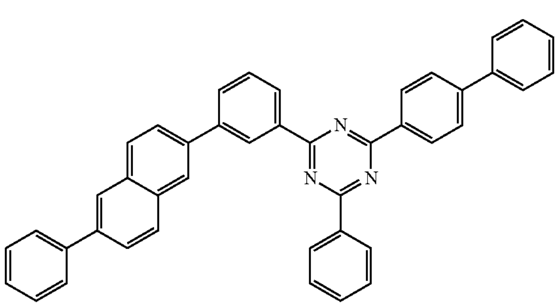

P-2

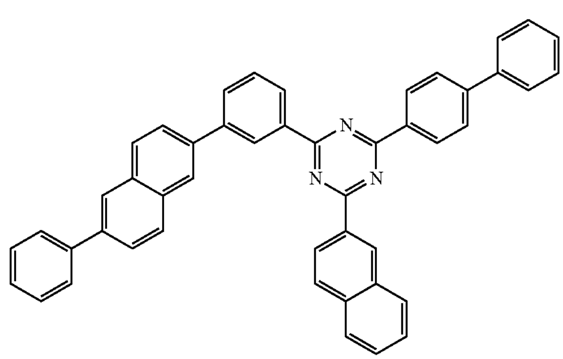

-continued
P-3
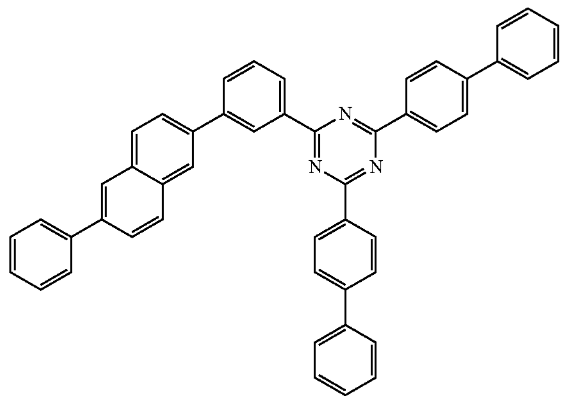
P-4
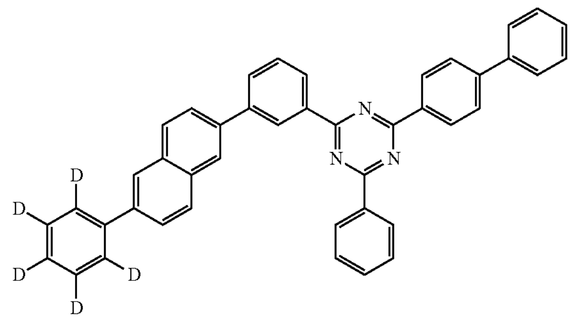
P-5
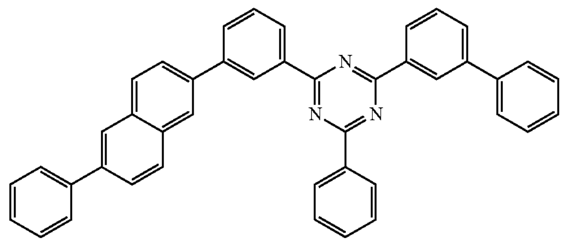
P-6
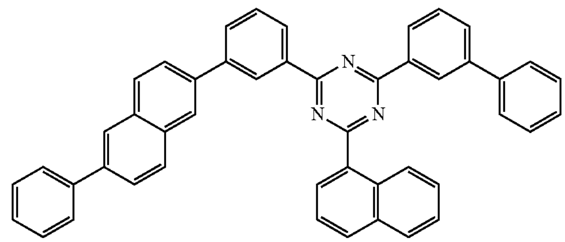
P-7
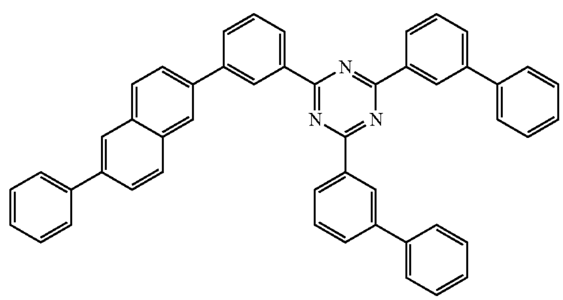
P-8
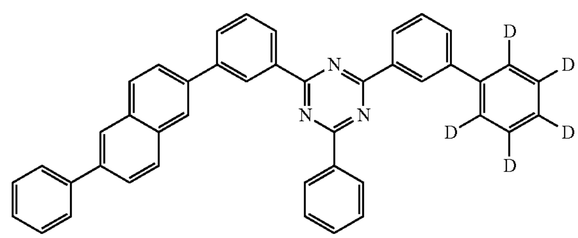
P-9
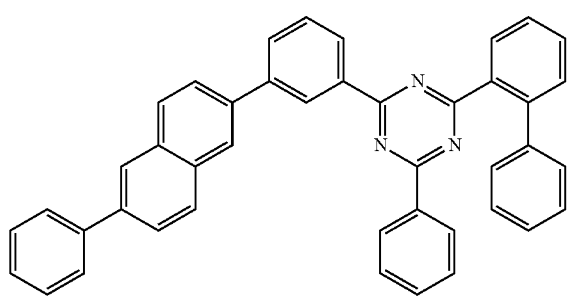
P-10
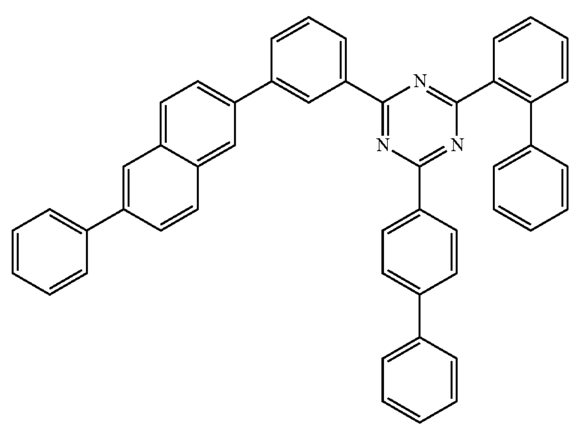

-continued
P-11
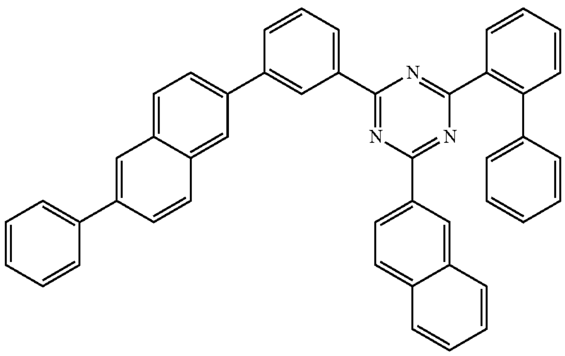
P-12
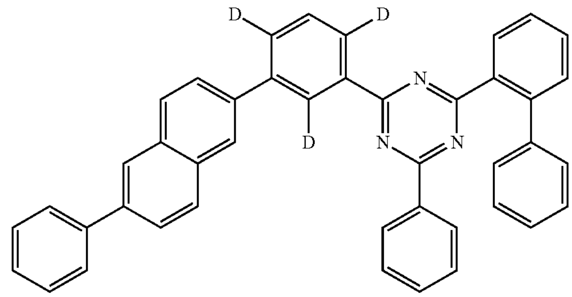
P-13
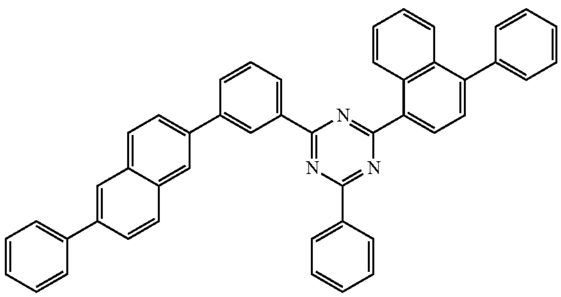
P-14
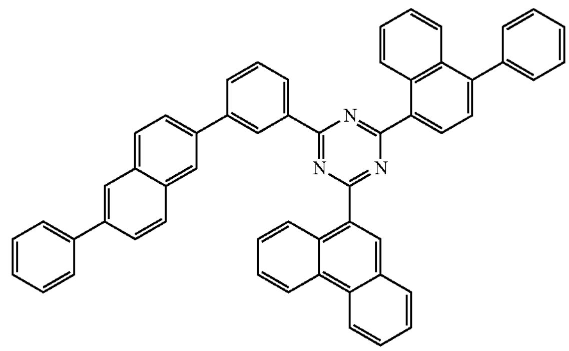
P-15
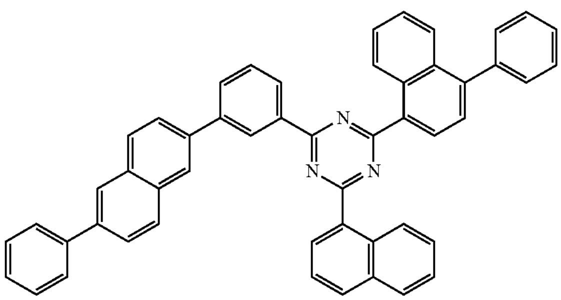
P-16
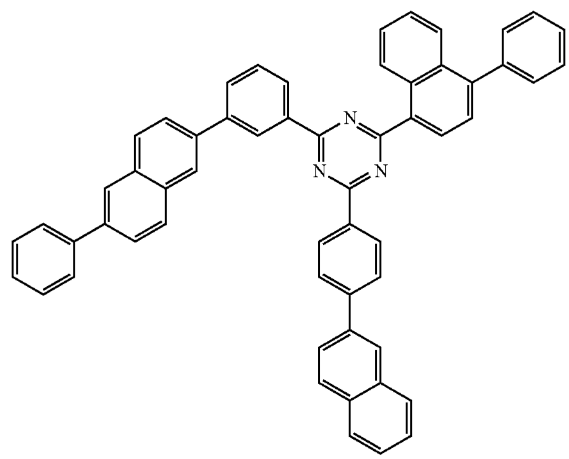
P-17
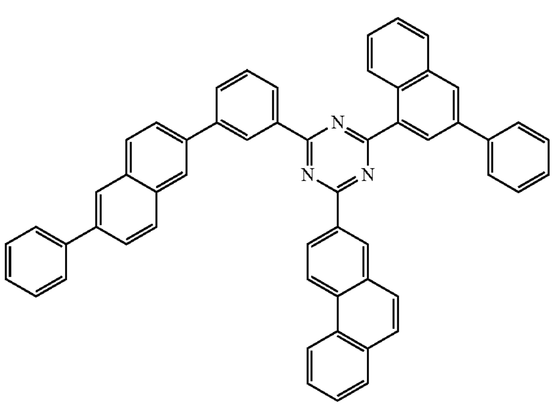
P-18
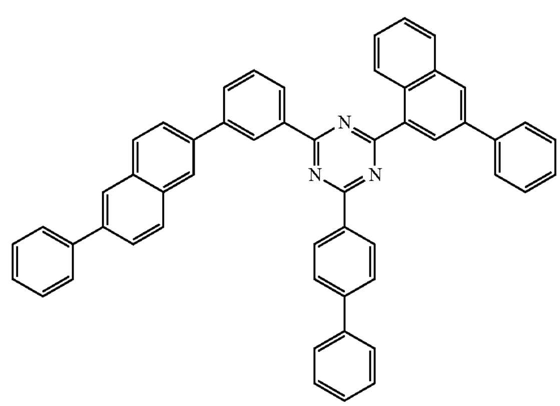

-continued
P-19
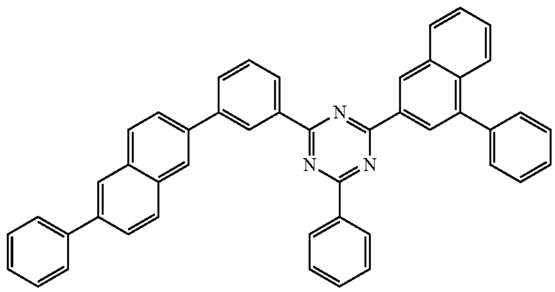
P-20
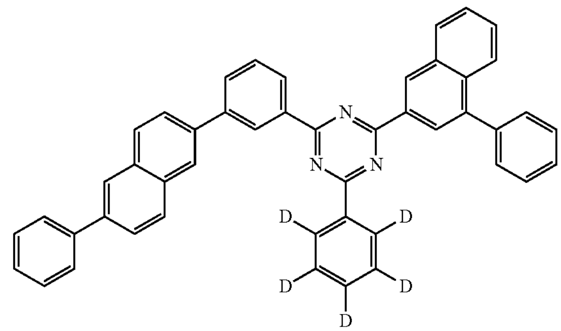
P-21
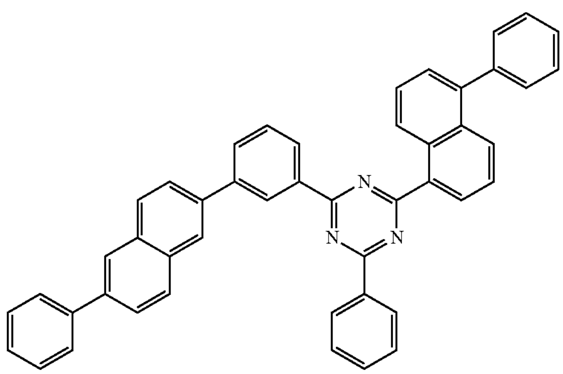
P-22
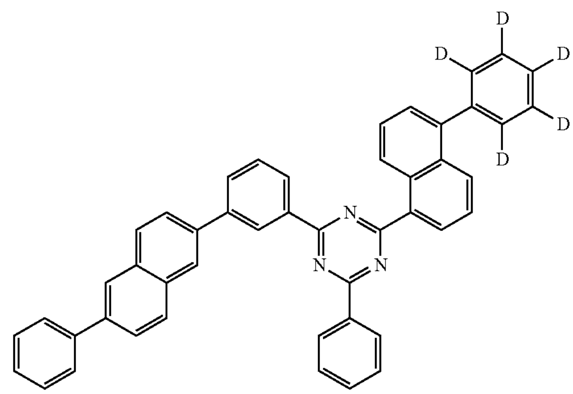
P-23
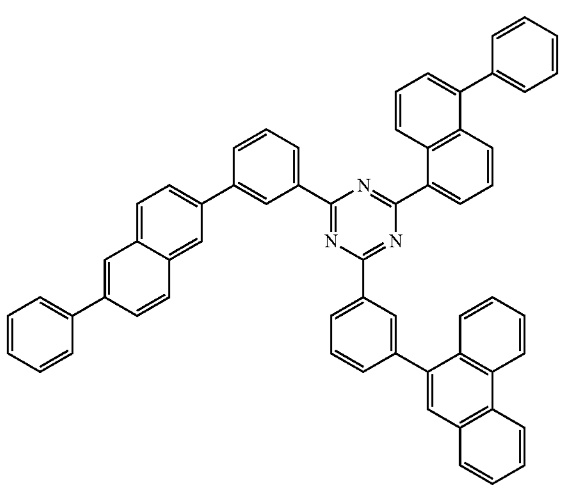
P-24
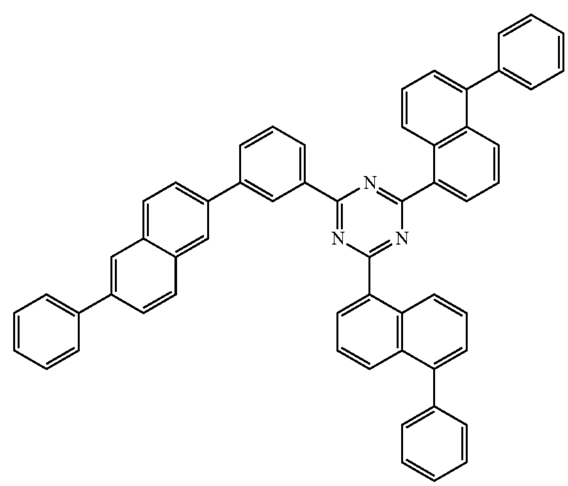
P-25
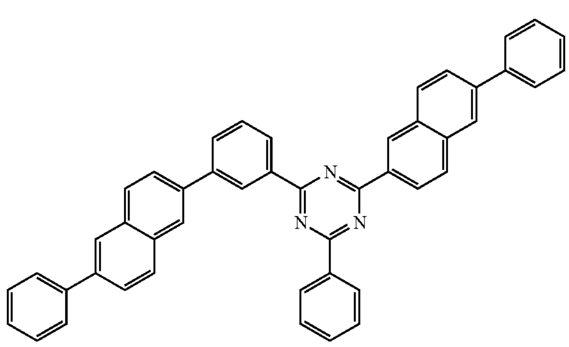
P-26
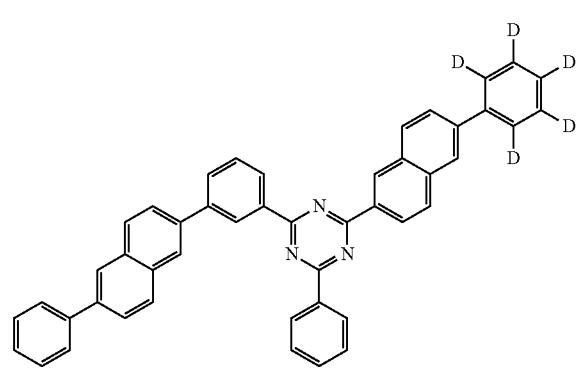

-continued
P-27
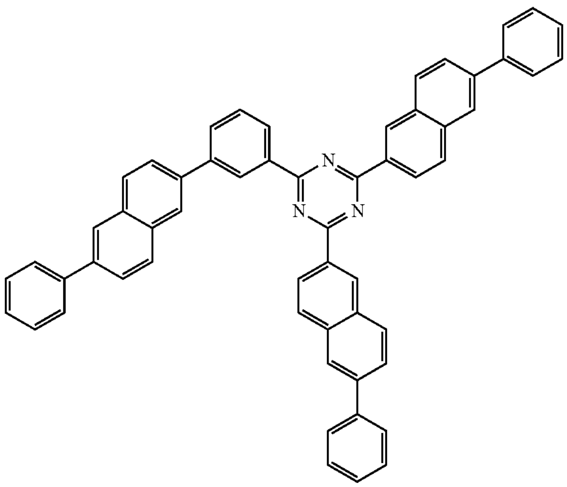
P-28
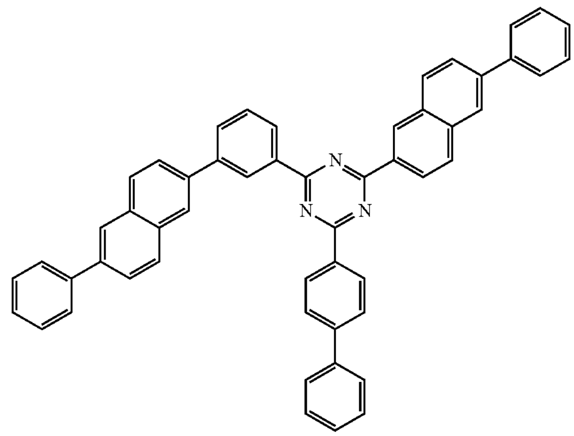
P-29
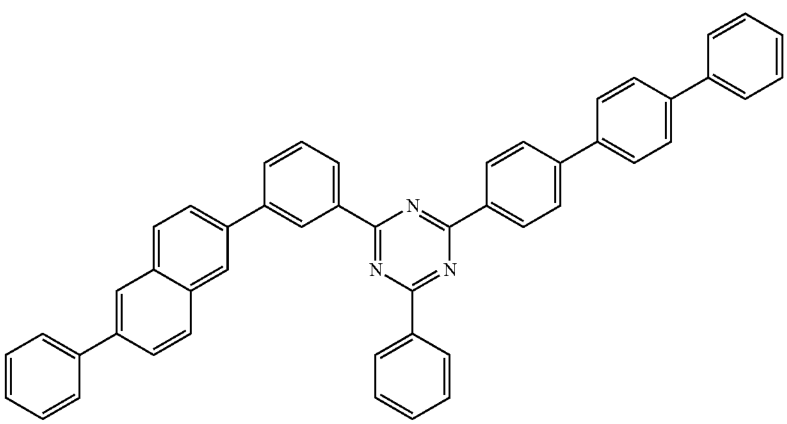
P-30
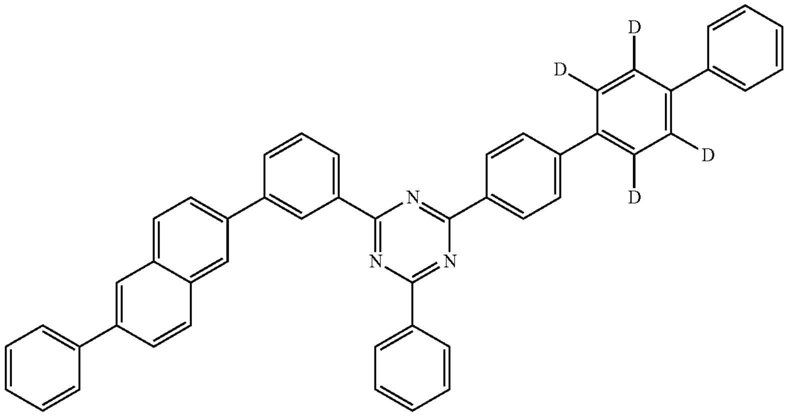

-continued
P-31
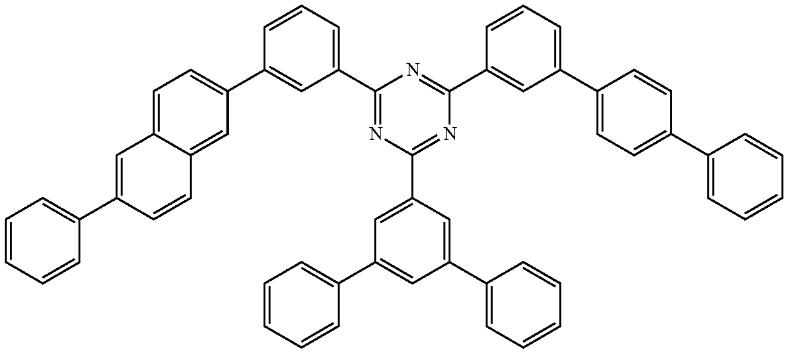
P-32
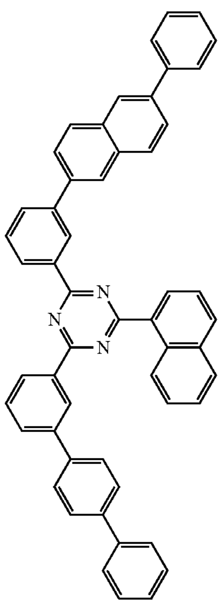
P-33
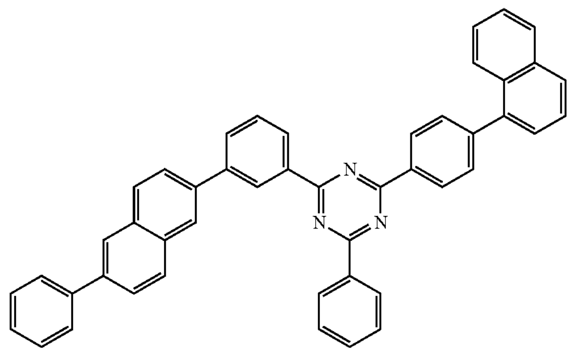
P-34
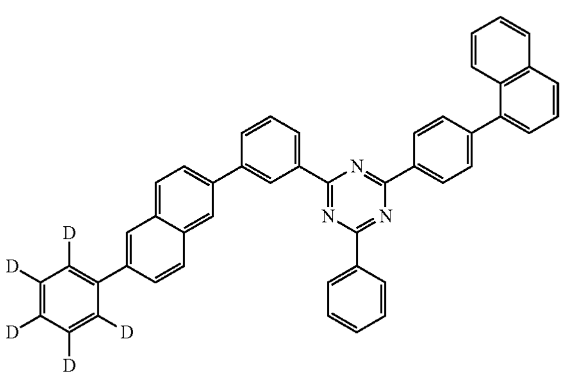
P-35
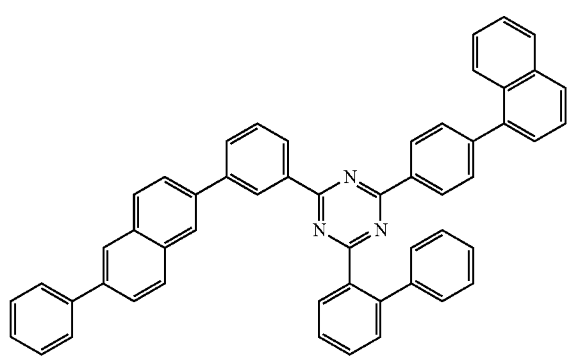

-continued
P-36
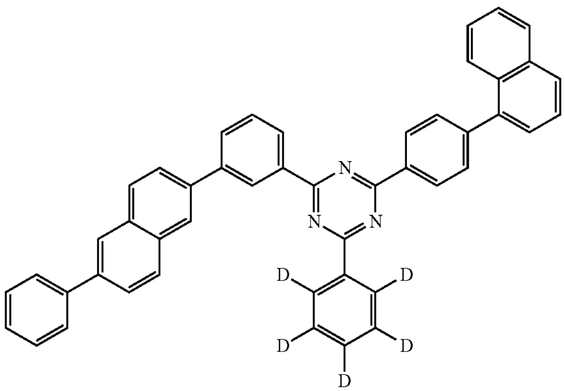
P-37
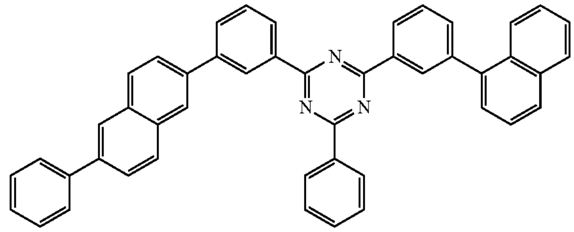
P-38
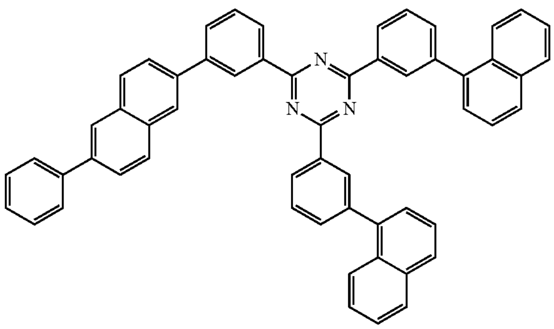
P-39
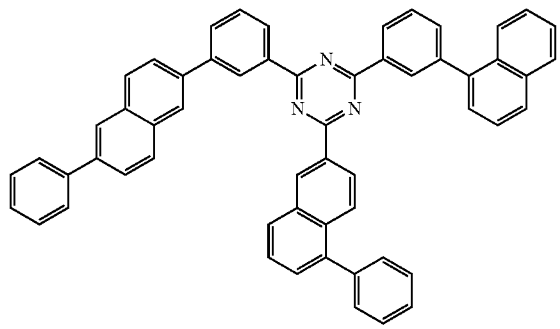
P-40
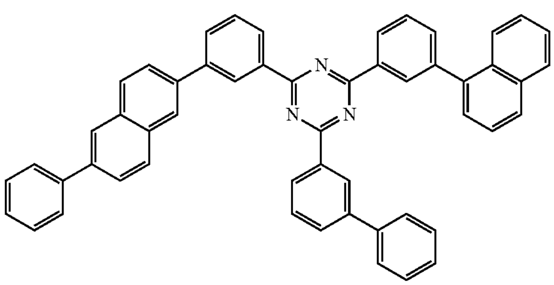
P-41
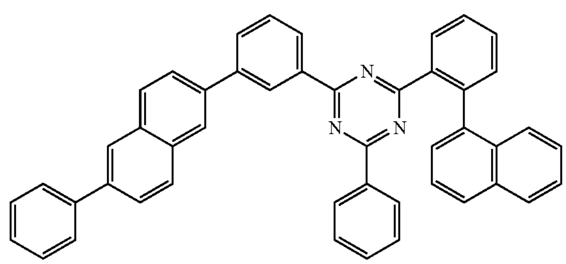
P-42
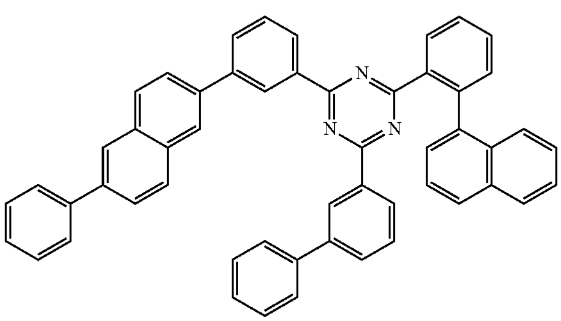
P-43
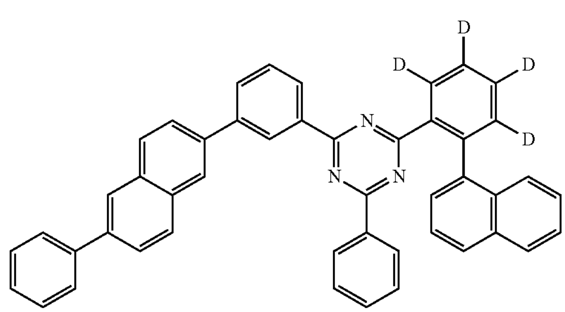

-continued
P-44
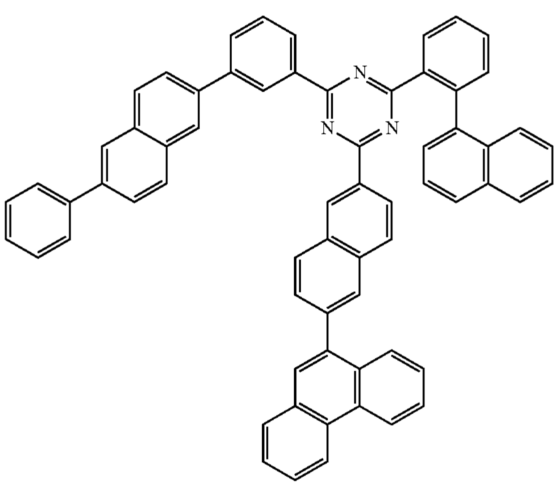
P-45
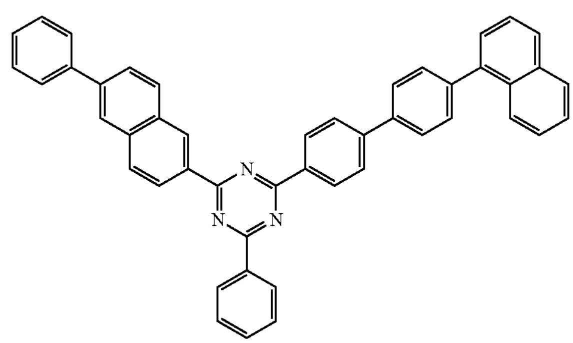
P-46
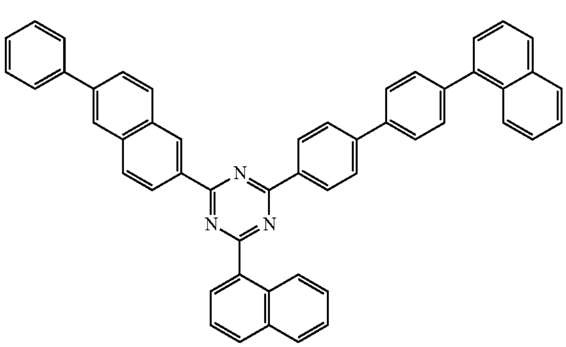
P-47
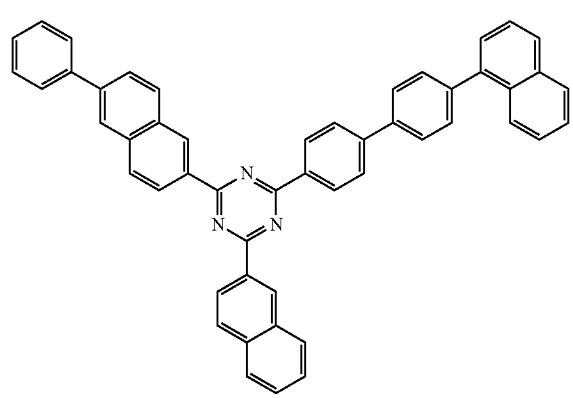
P-48
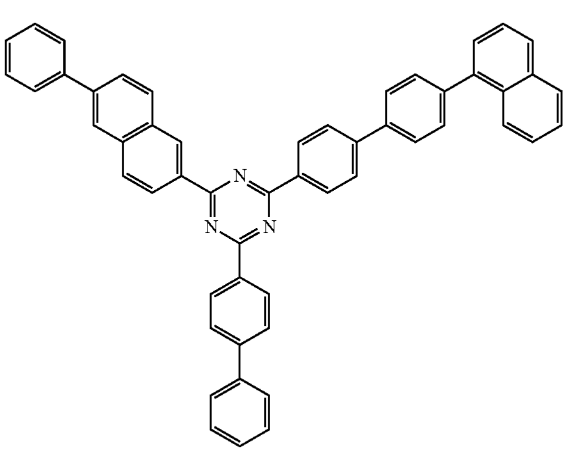
P-49
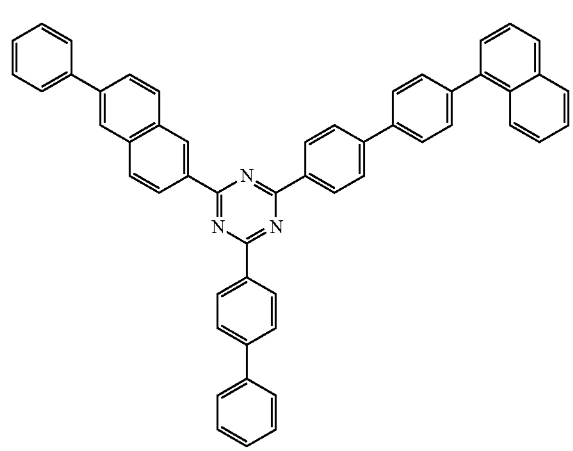

-continued
P-50
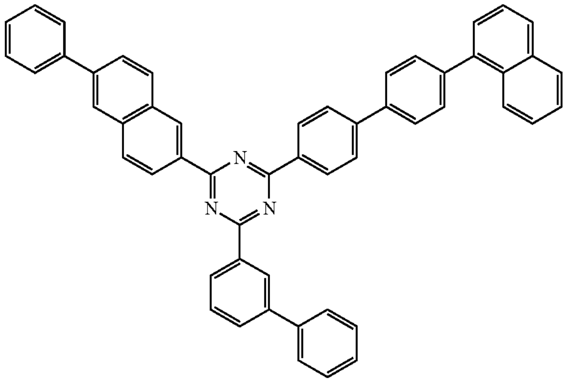
P-51
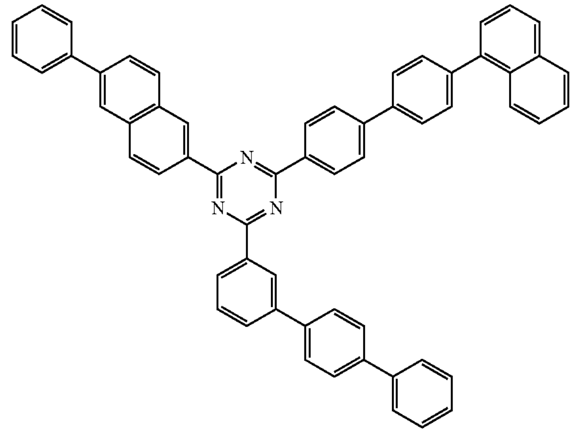
P-52
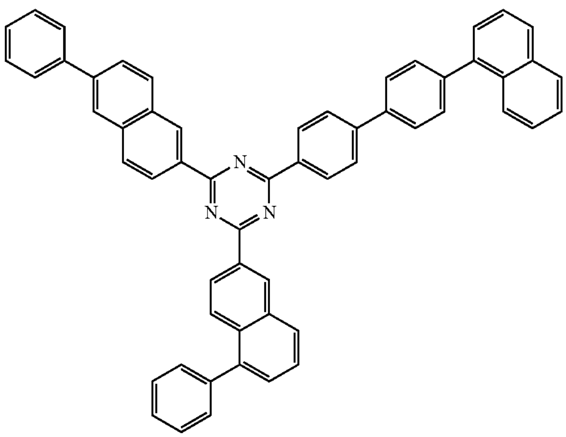
P-53
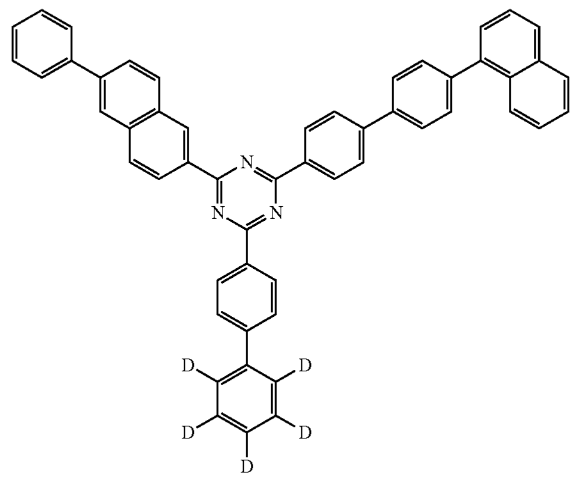
P-54
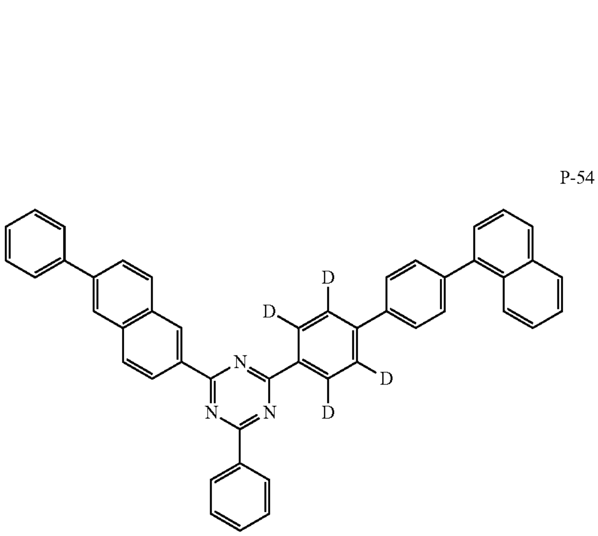
P-55
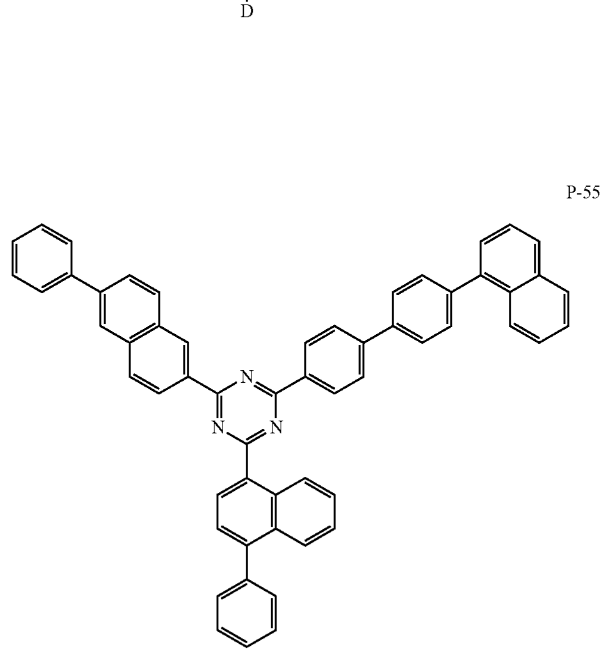

-continued
P-56
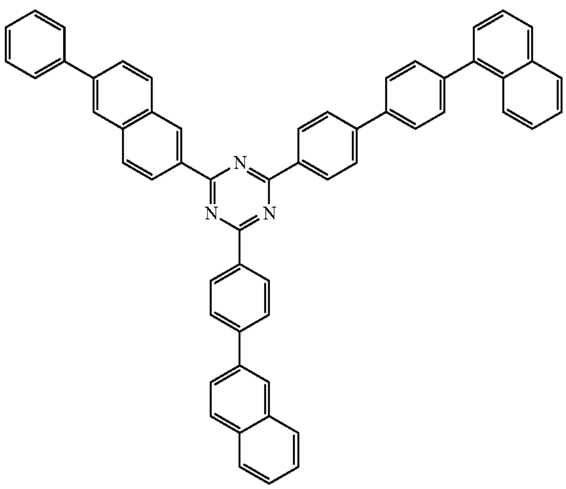
P-57
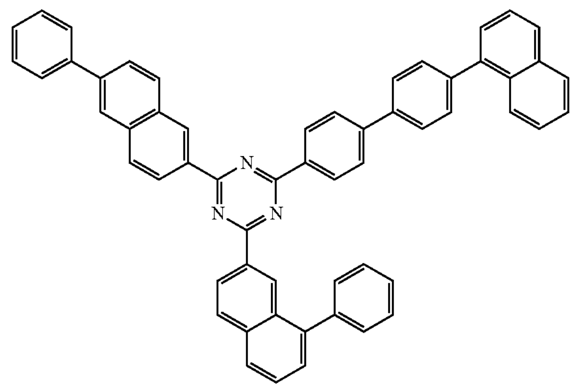
P-58
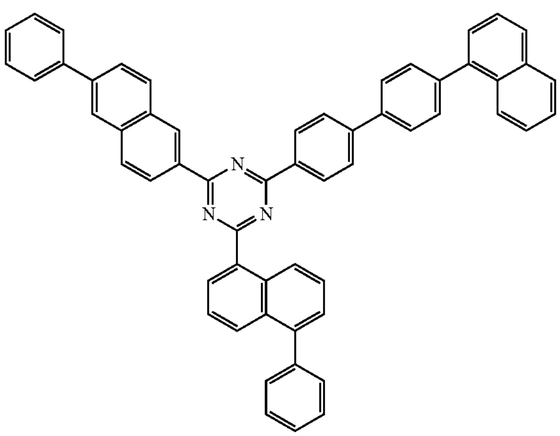
P-59
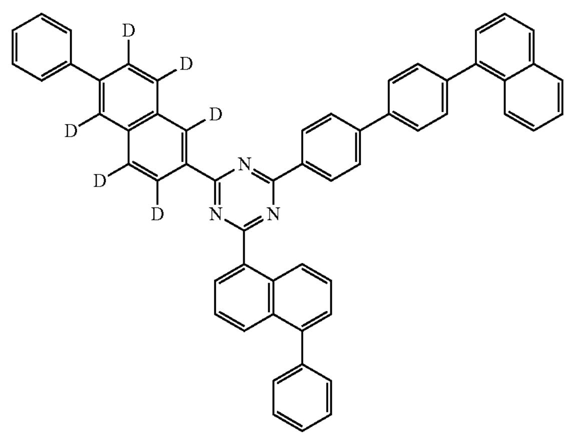
P-60
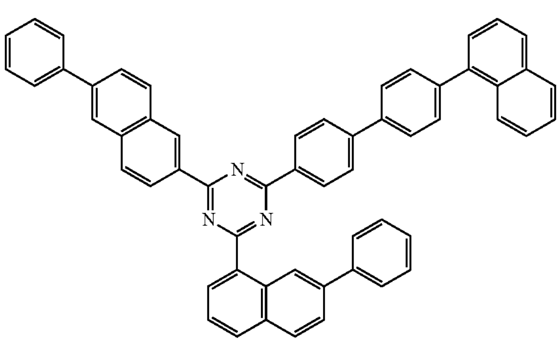
P-61
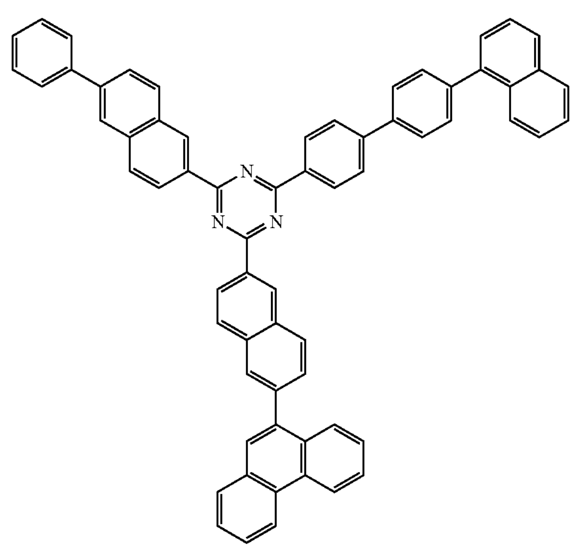

-continued
P-62
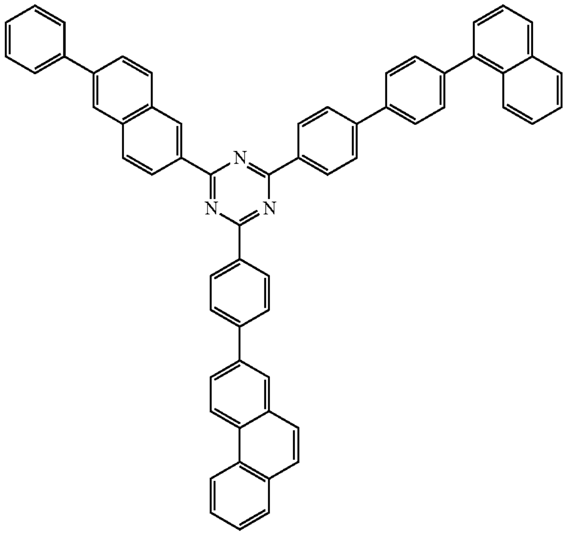
P-63
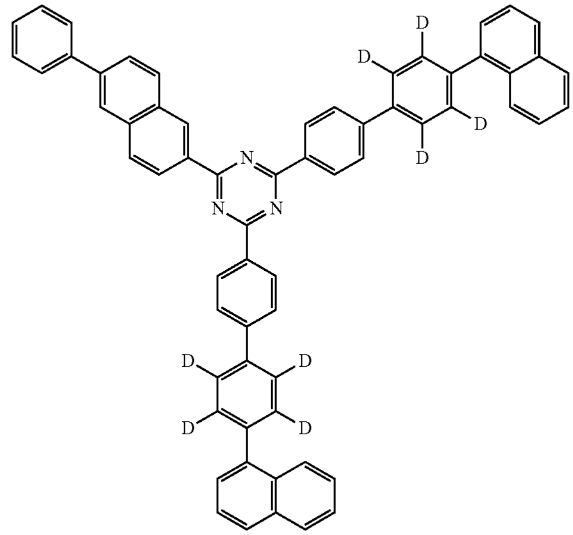
P-64
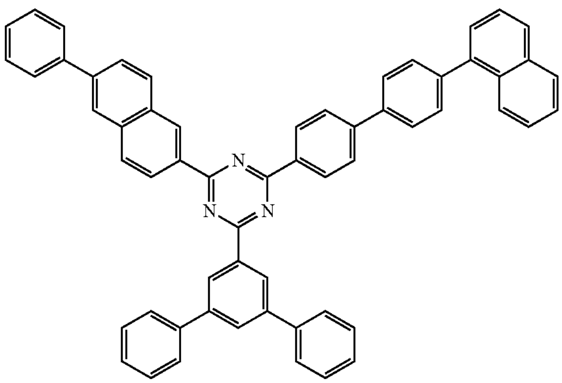
P-65
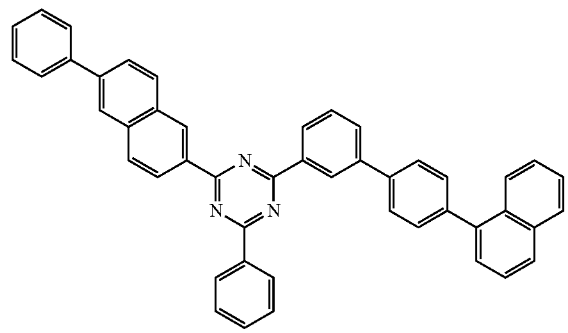
P-66
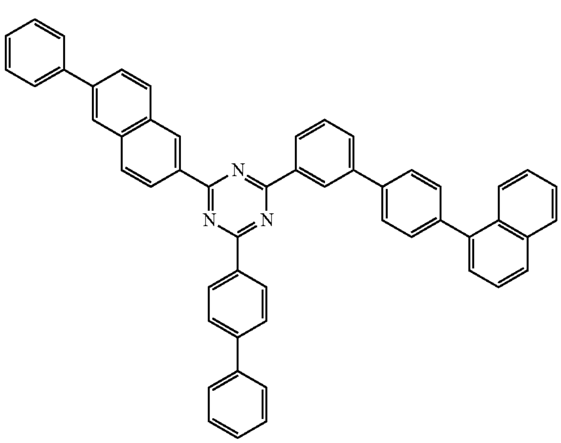
P-67
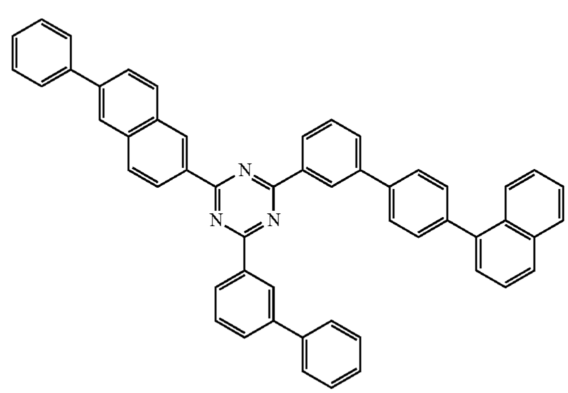

-continued
P-68
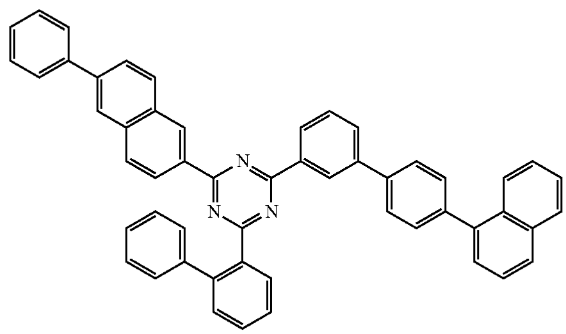
P-69
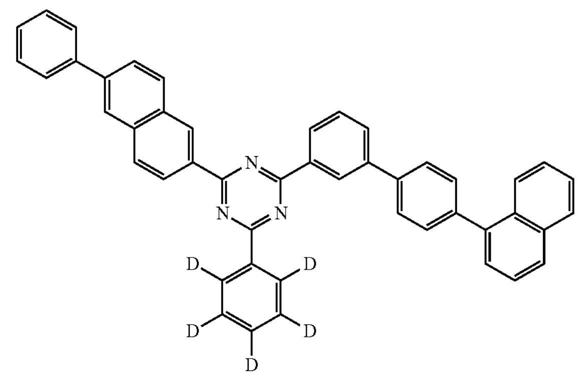
P-70
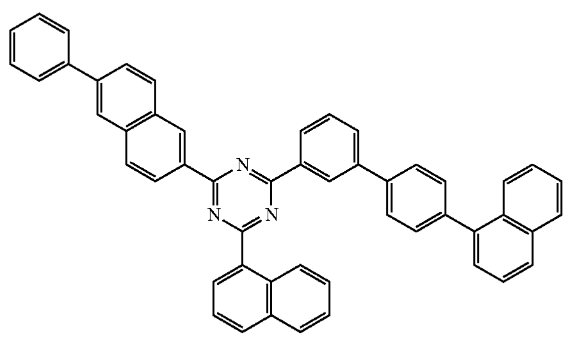
P-71
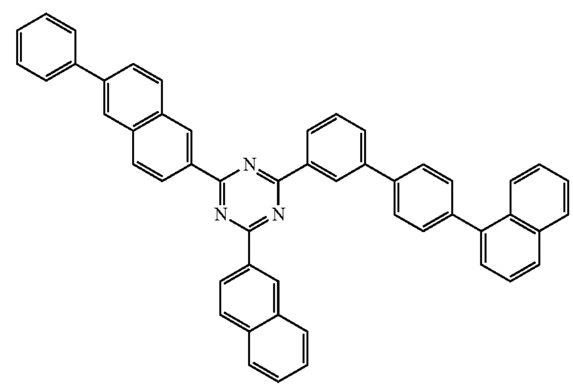
P-72
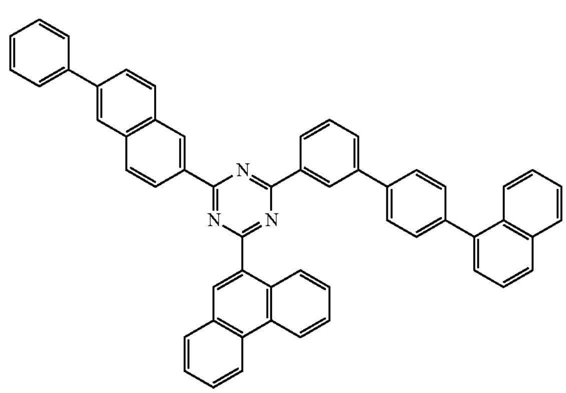
P-73
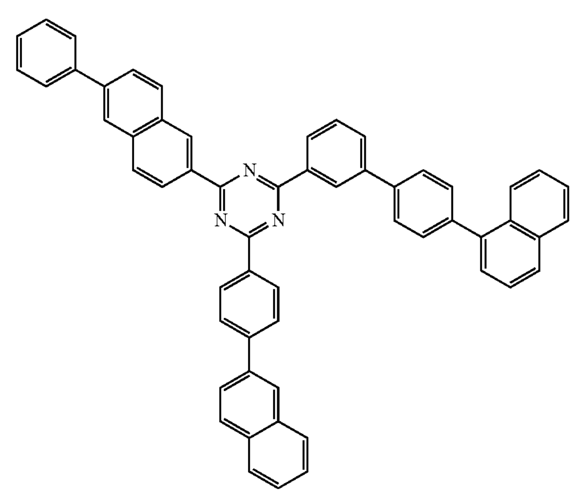

-continued
P-74
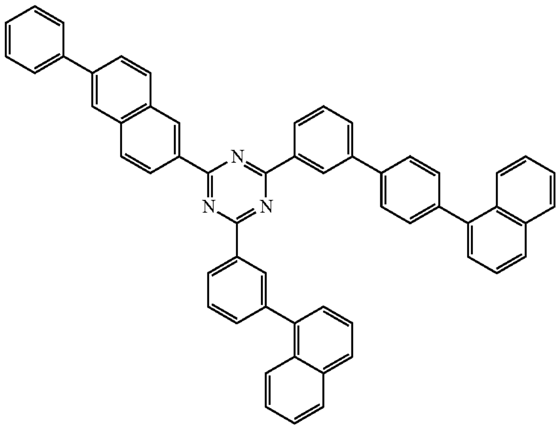
P-75
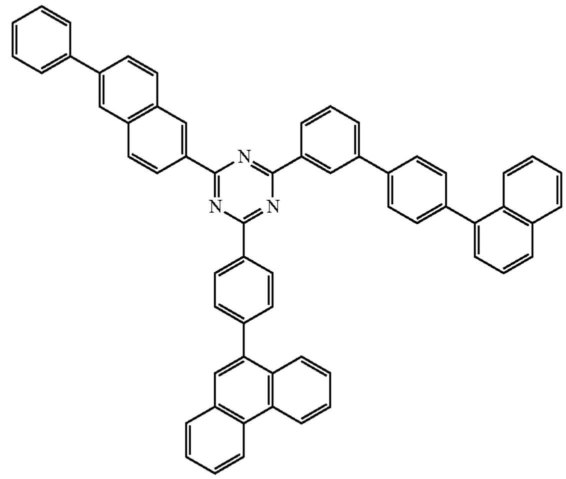
P-76
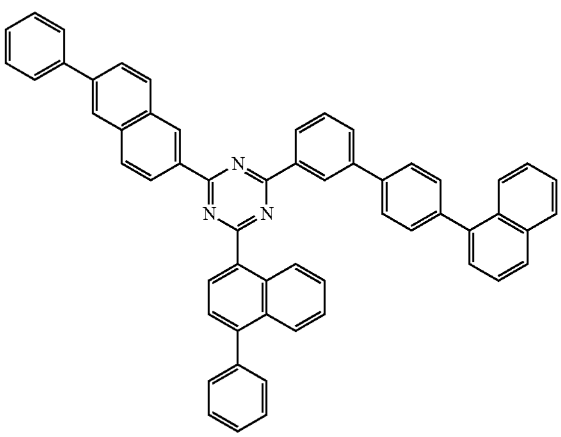
P-77
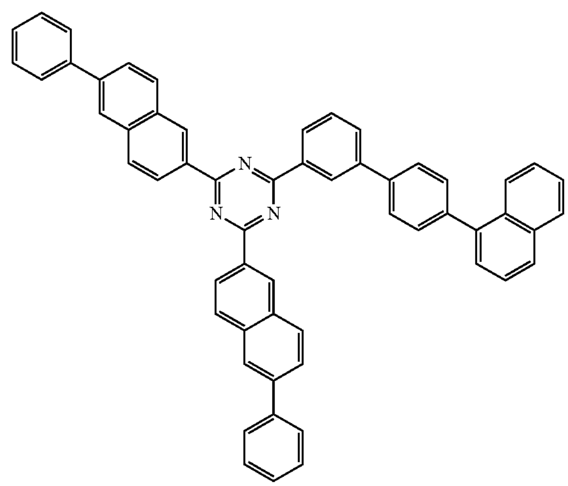
P-78
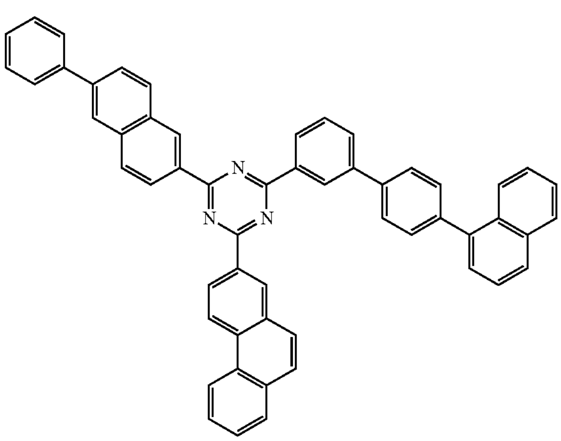
P-79
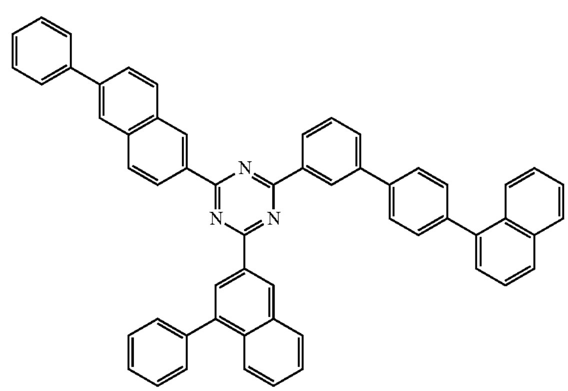

-continued
P-80
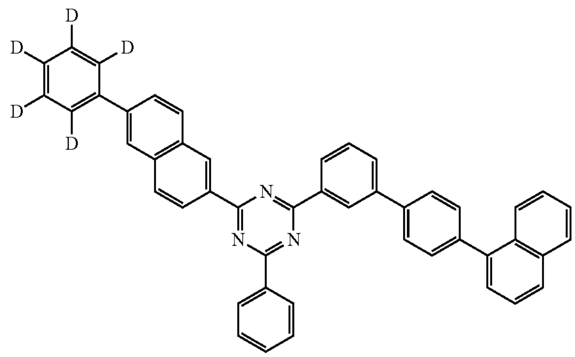
P-81
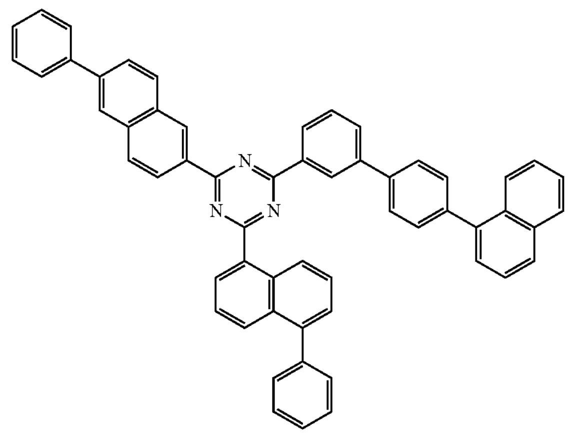
P-82
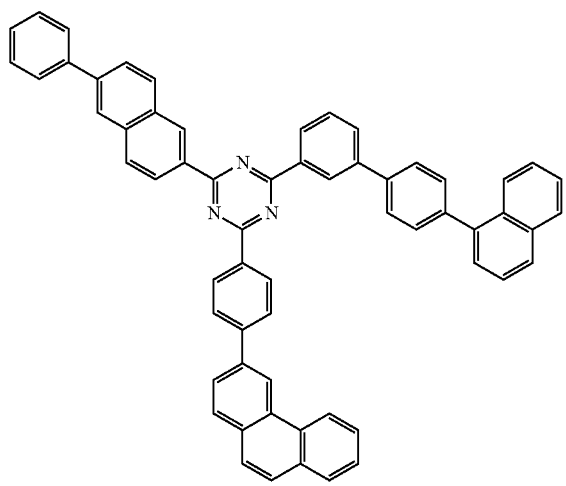
P-83
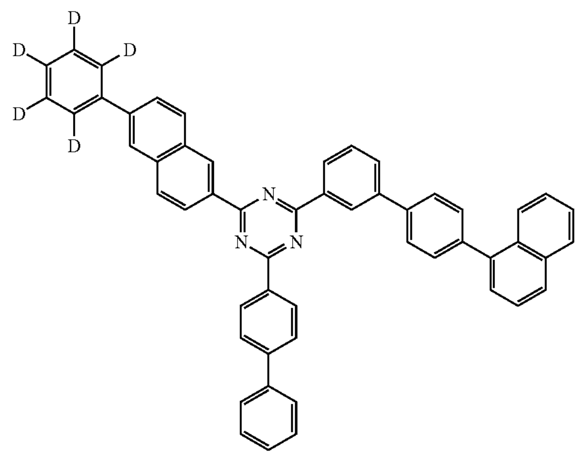
P-84
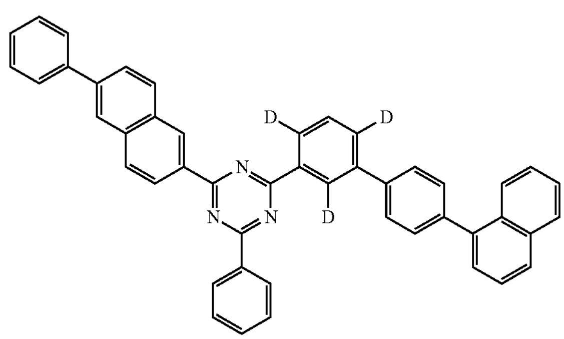
P-85
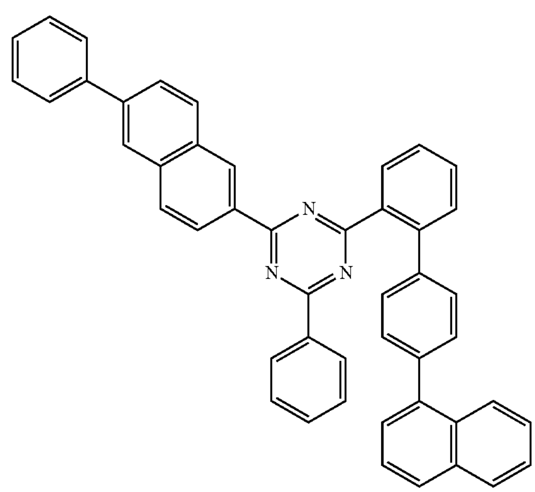

-continued
P-86
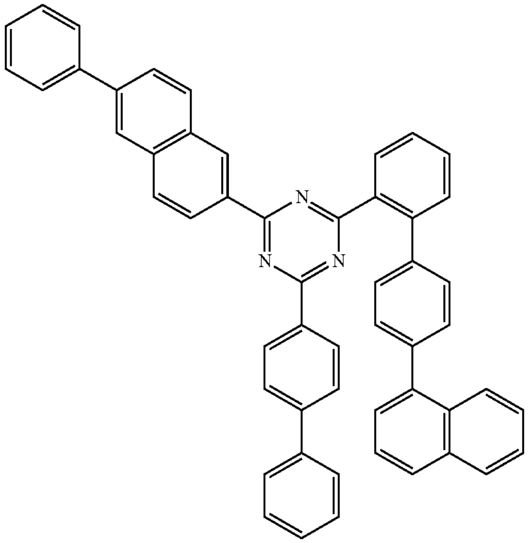
P-87
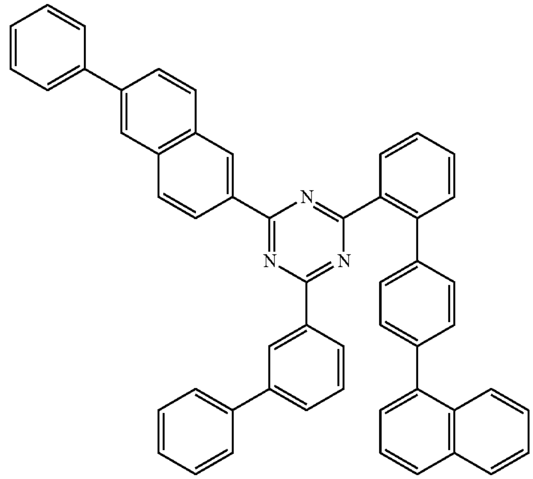
P-88
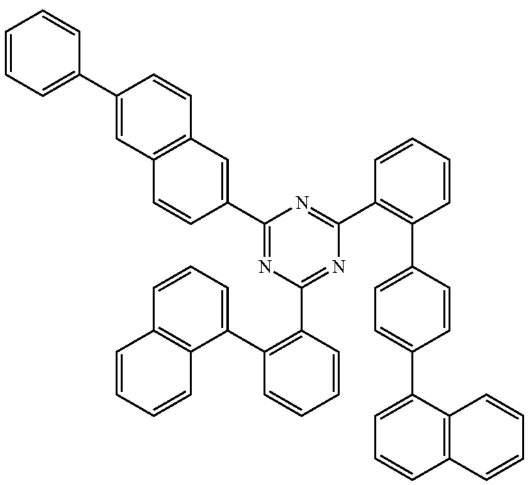
P-89
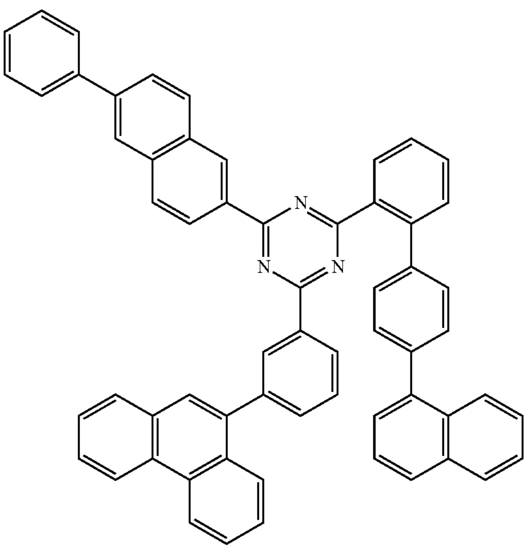
P-90
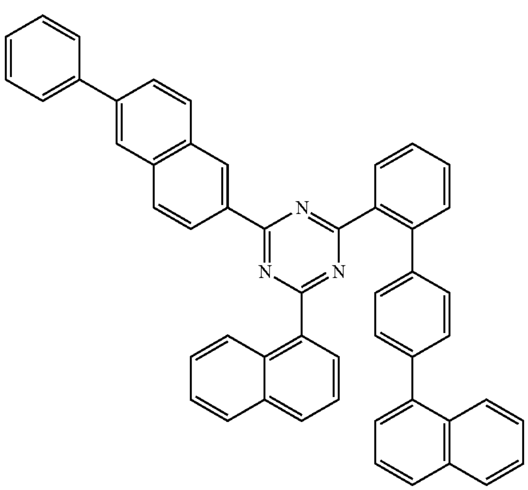
P-91
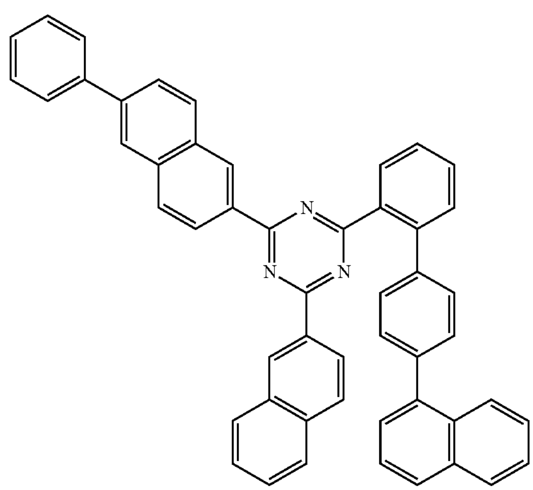

-continued
P-92
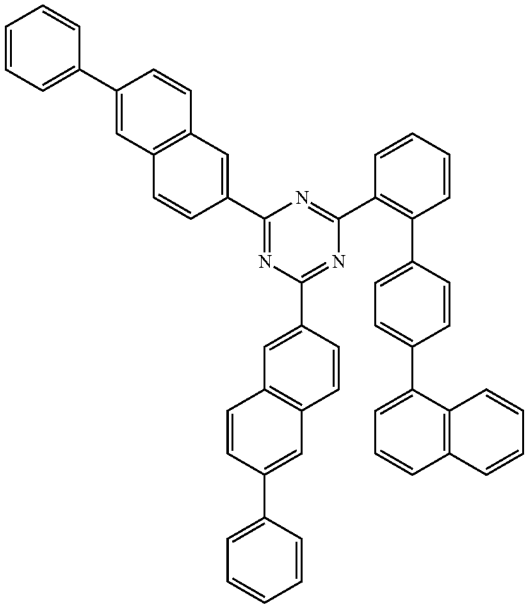
P-93
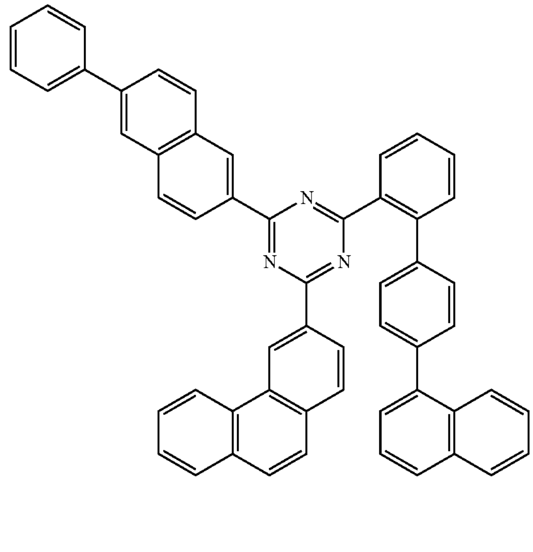
P-94
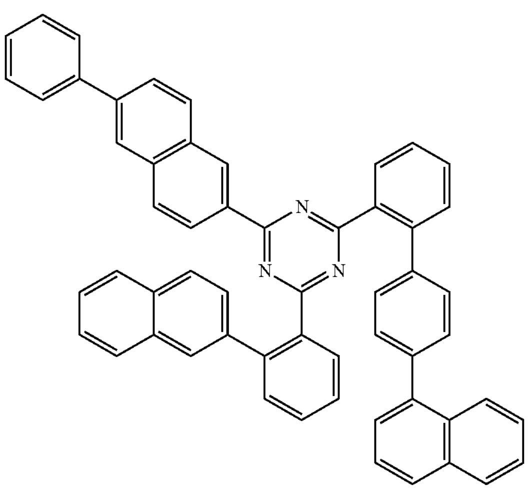
P-95
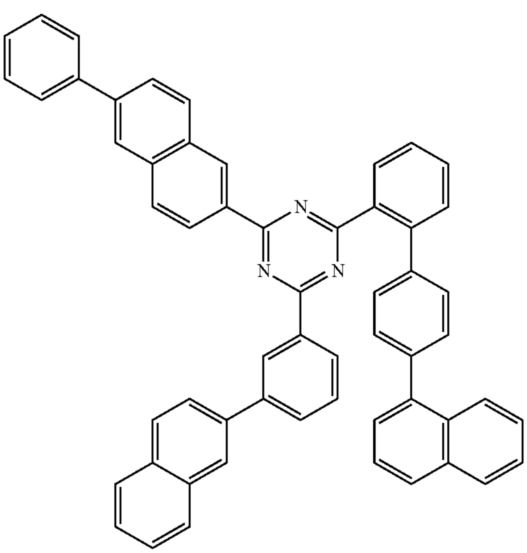

-continued
P-96
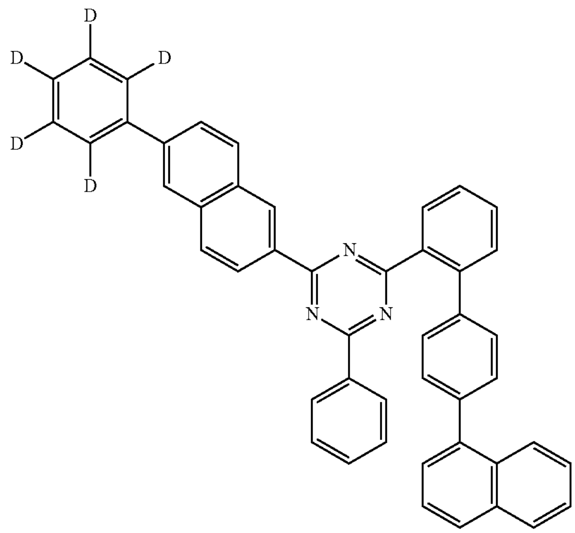
P-97
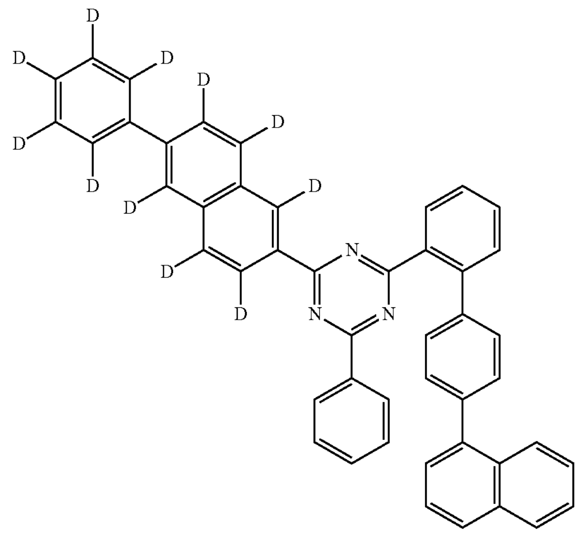
P-98
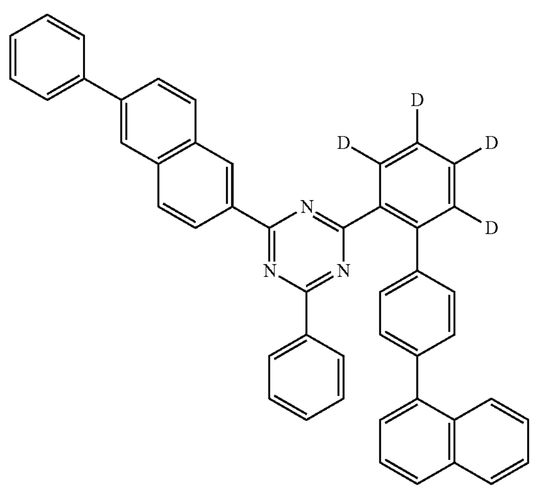
P-99
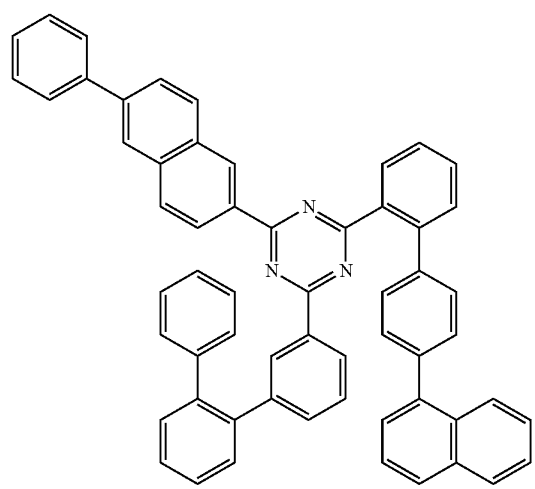
P-100
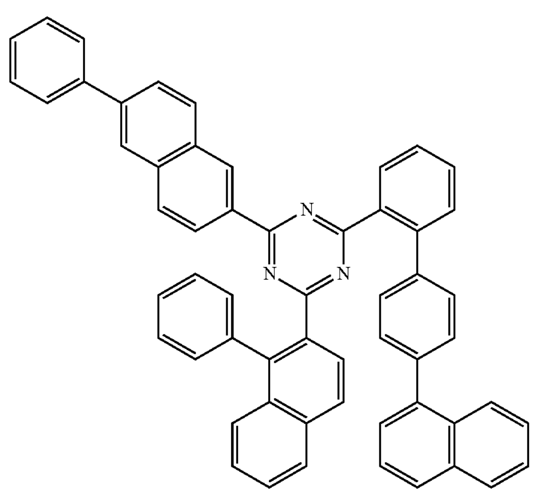

Specifically, the compound represented by Formula 2 may be any one of the following compounds N-1 to N-96.
N-1
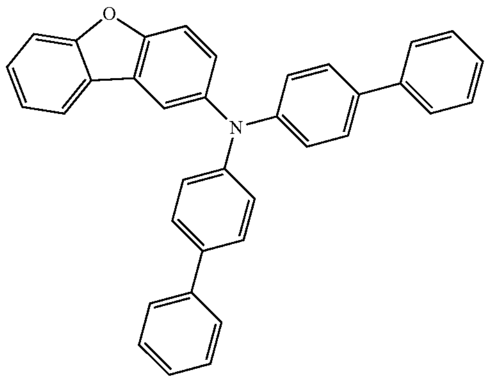
N-2
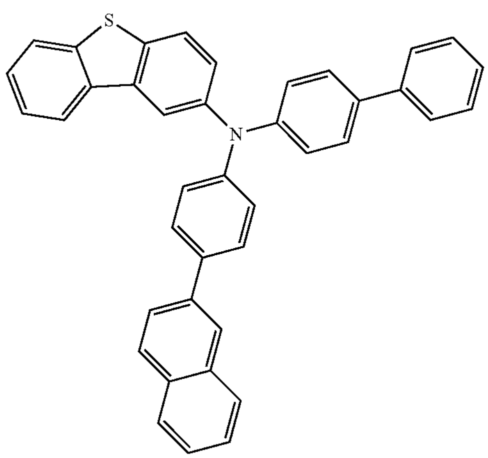
N-3
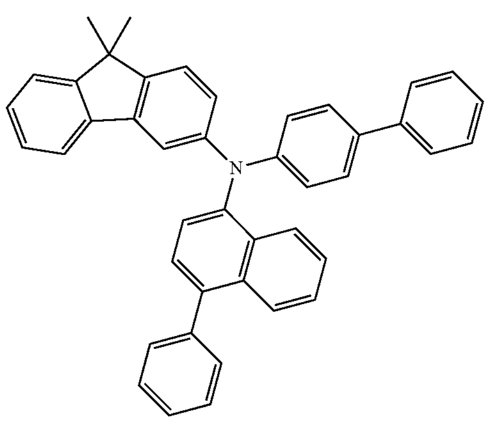
-continued
N-4
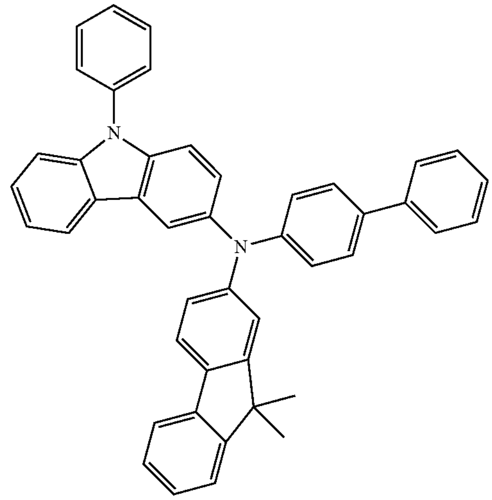
N-5
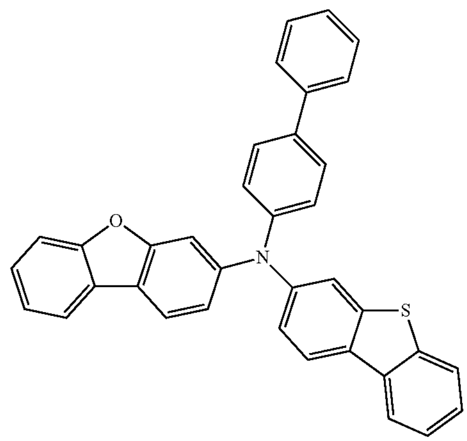
N-6
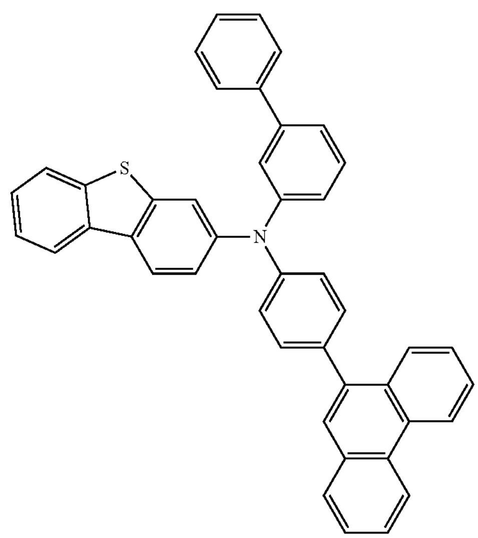

-continued
N-7
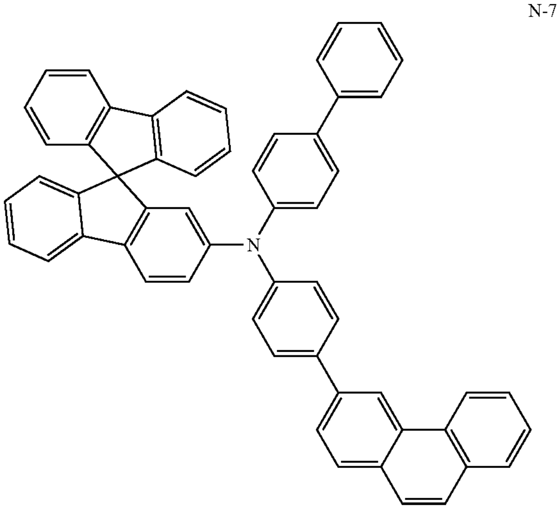
N-8
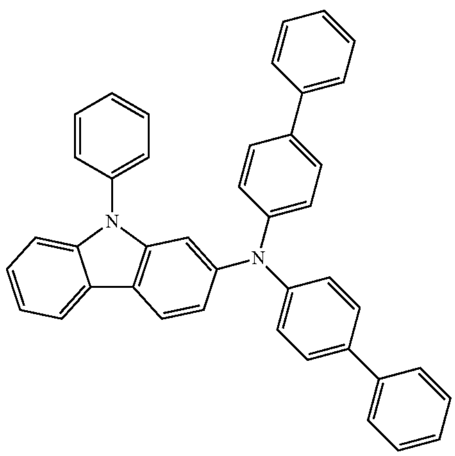
N-9
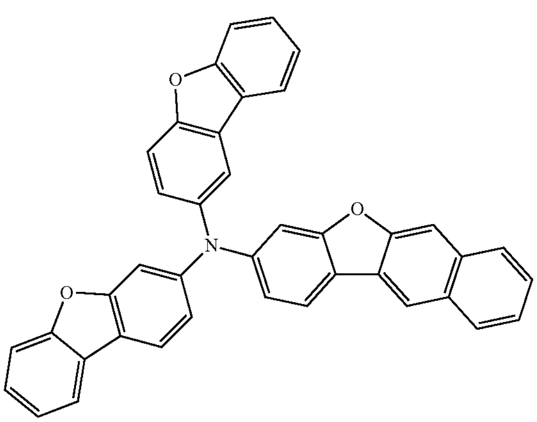
-continued
N-10
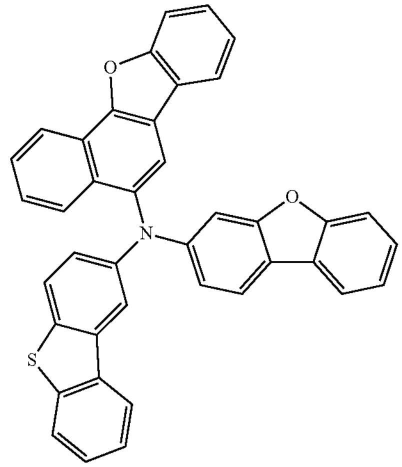
N-11
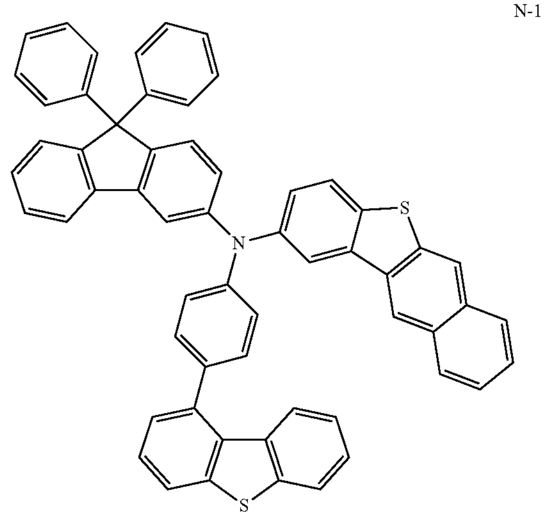
N-12
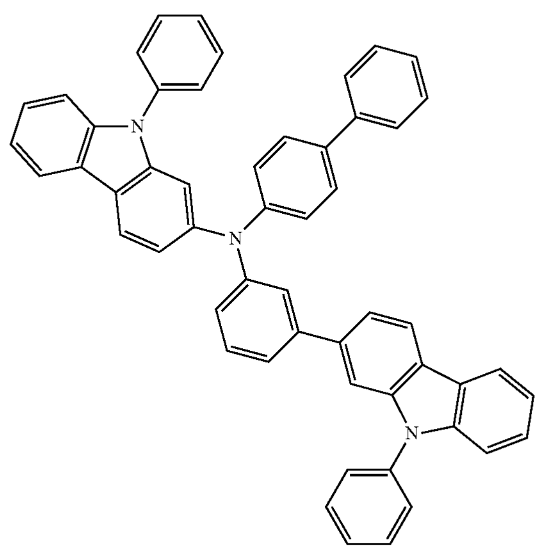

-continued
N-13
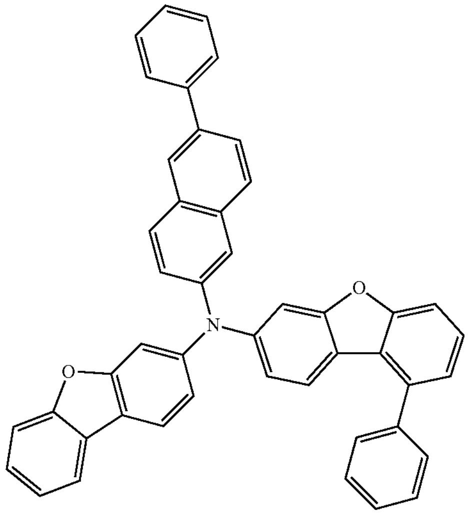
N-14
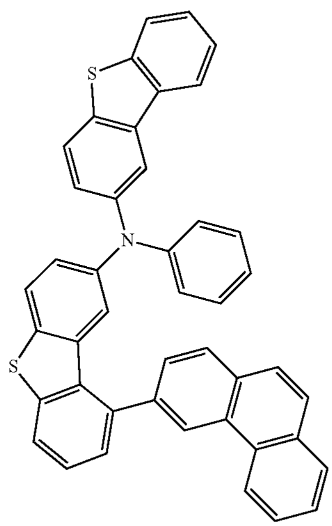
N-15
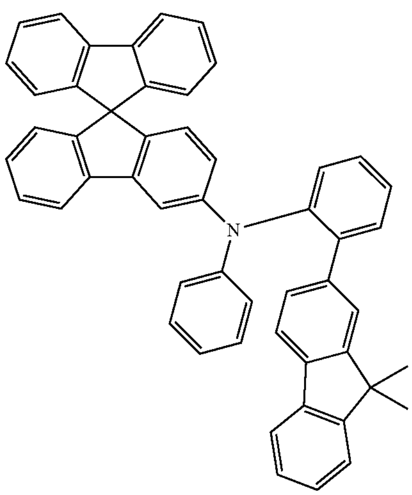
-continued
N-16
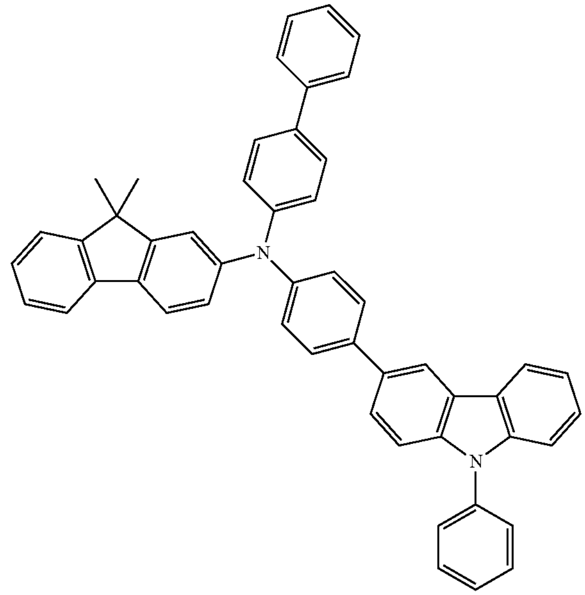
N-17
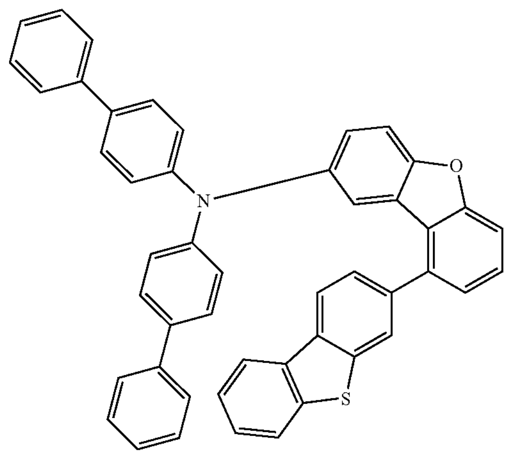
N-18
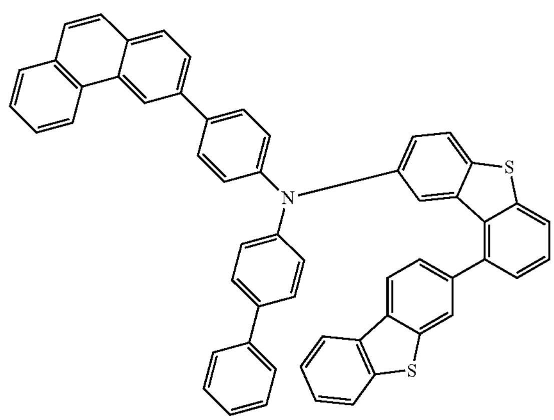

-continued
N-19
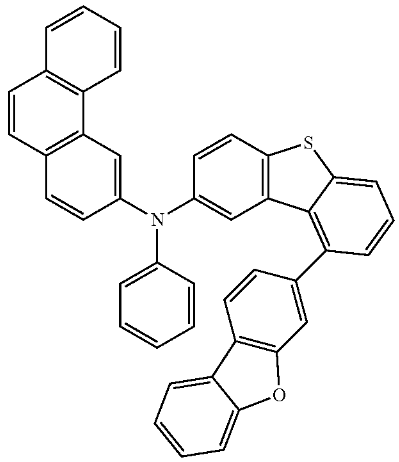
N-20
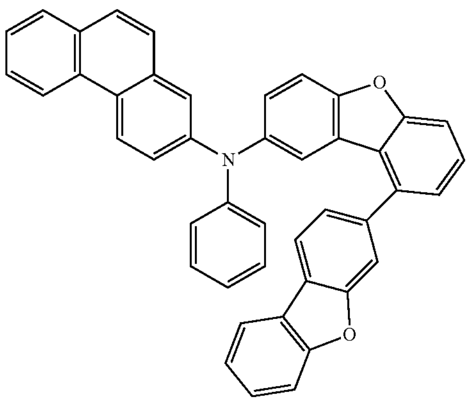
N-21
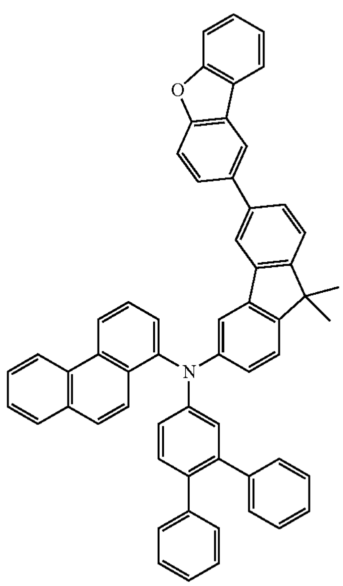
-continued
N-22
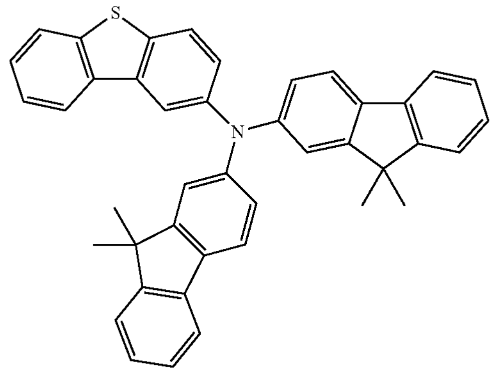
N-23
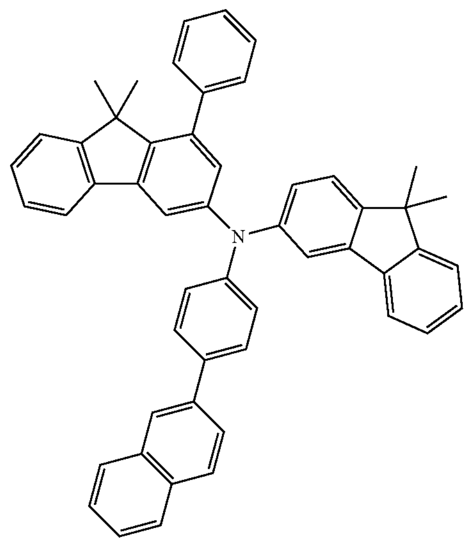
N-24
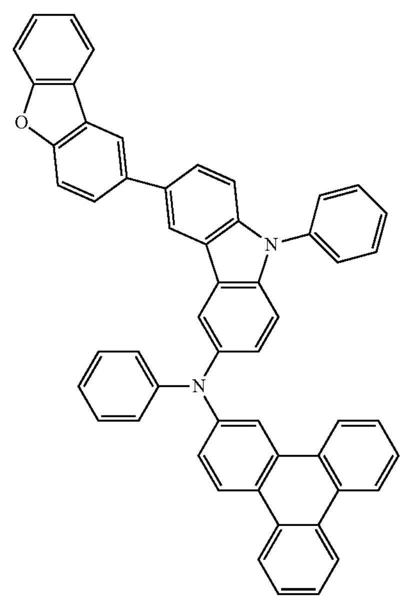

N-25
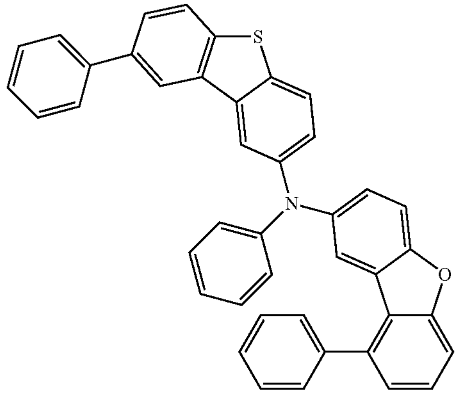
N-26
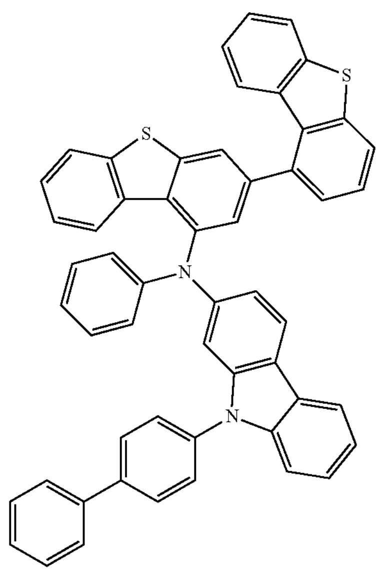
N-27
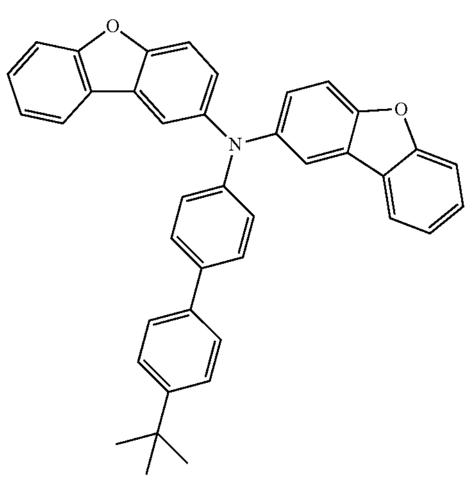
N-28
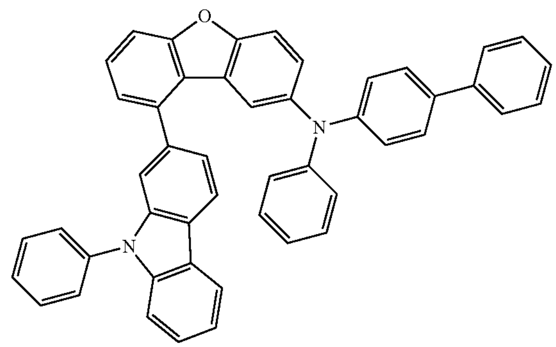
N-29
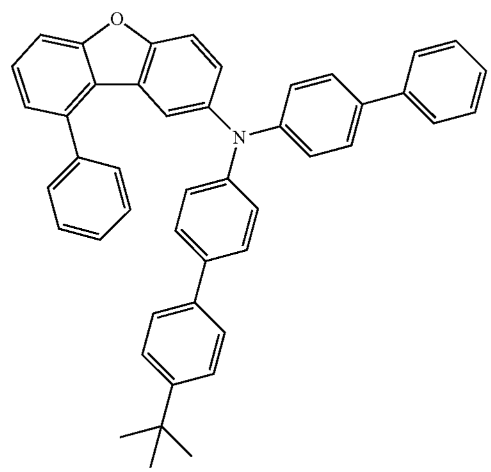
N-30
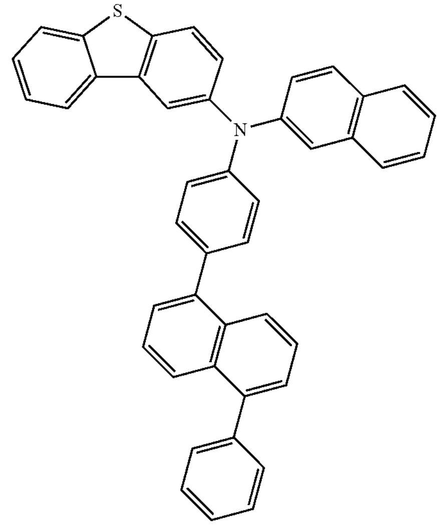

-continued
N-31
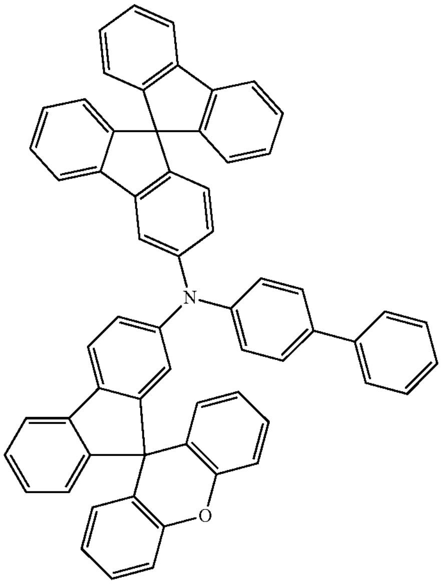
N-32
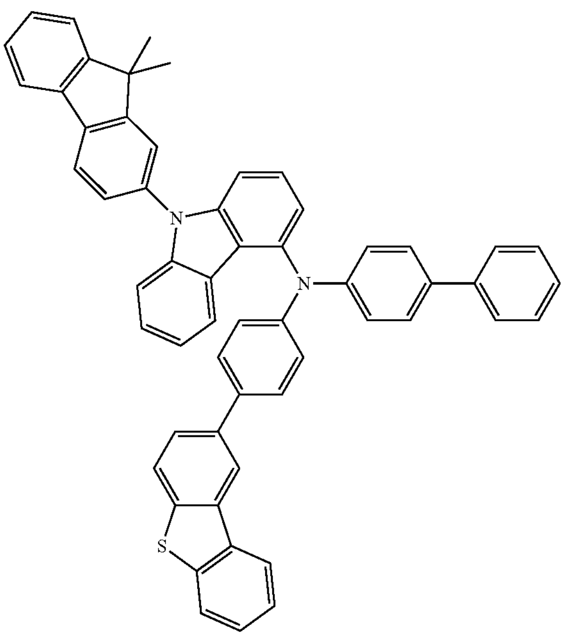
N-33
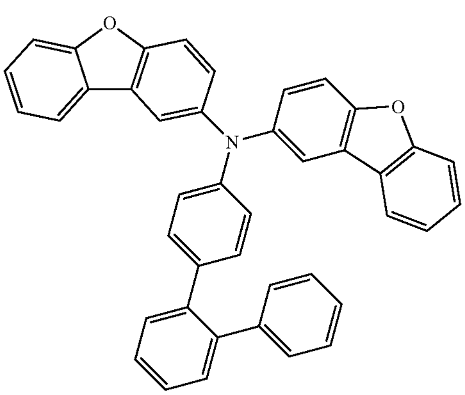
-continued
N-34
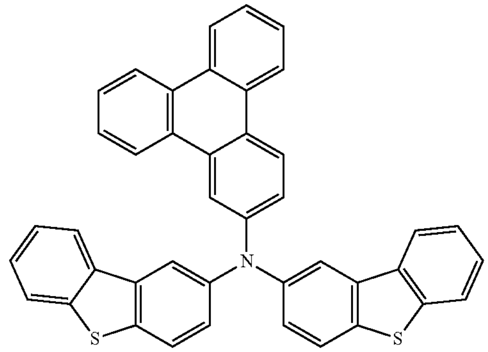
N-35
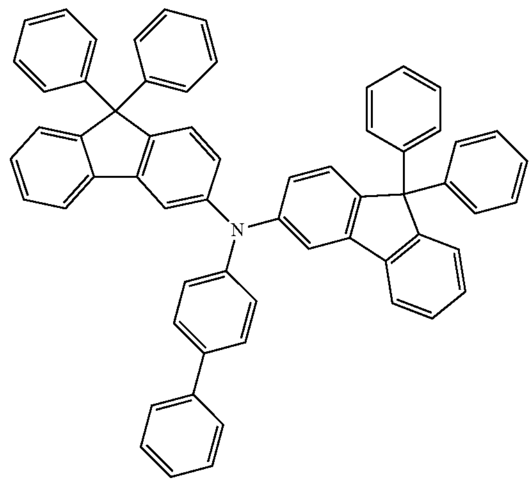
N-36
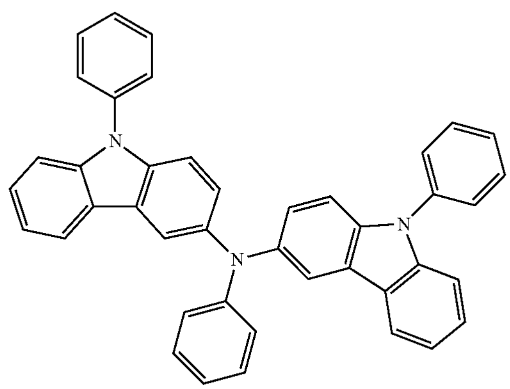
N-37
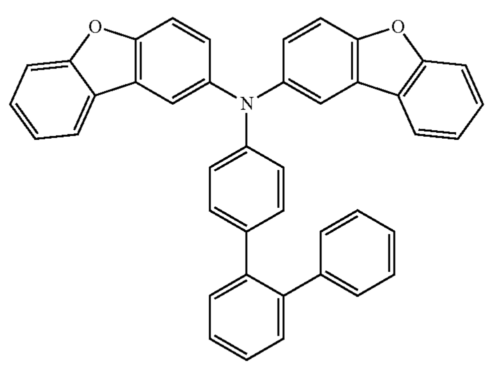

-continued
N-38
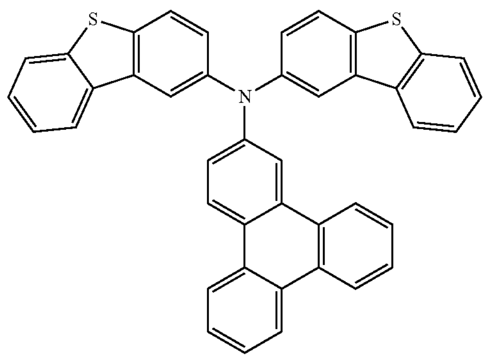
N-39
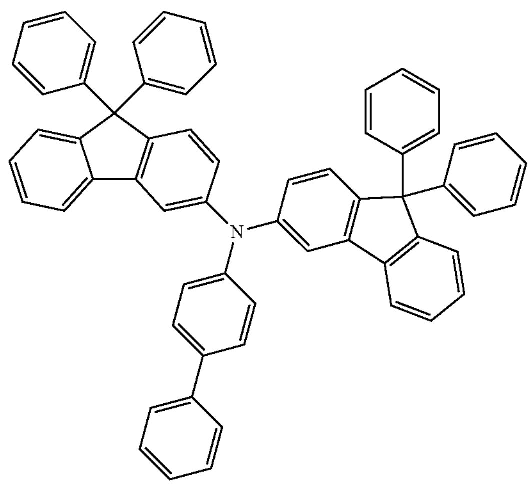
N-40
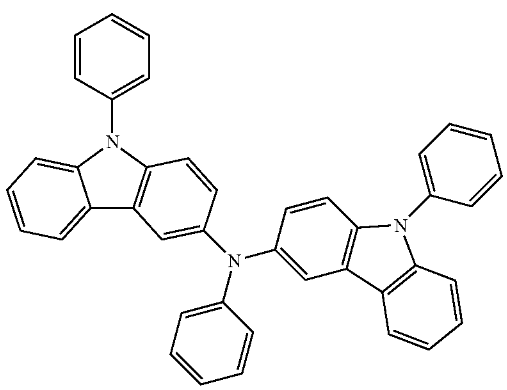
-continued
N-41
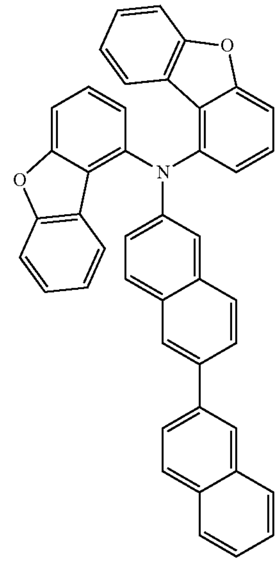
N-42
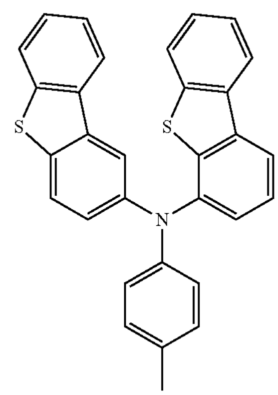
N-43
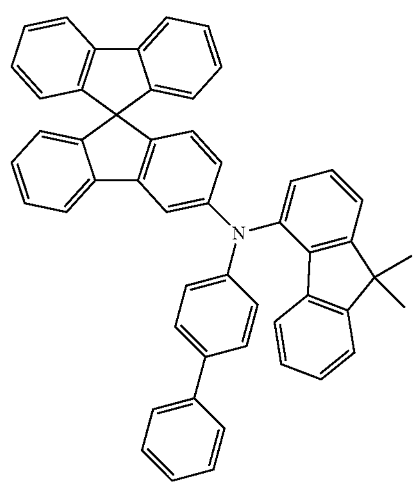

-continued
N-44
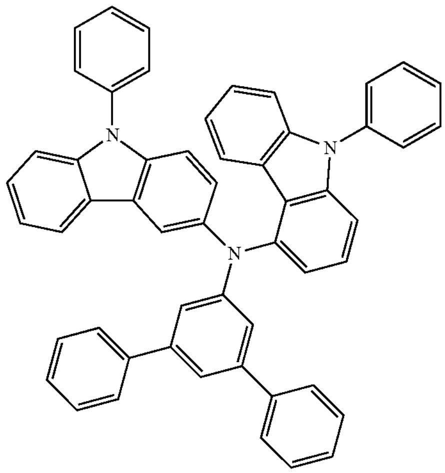
N-45
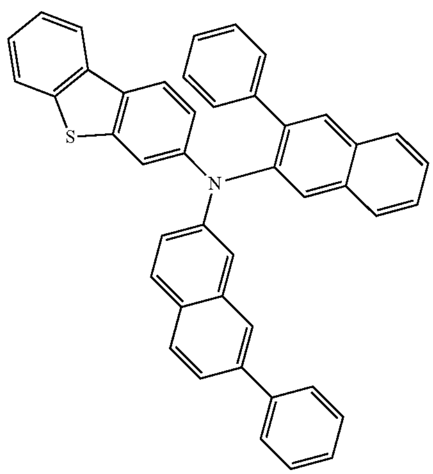
N-46
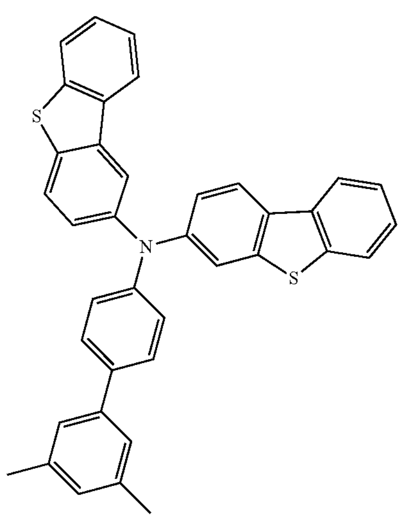
-continued
N-47
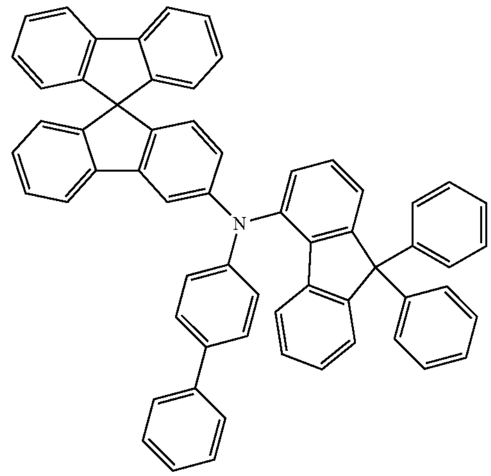
N-48
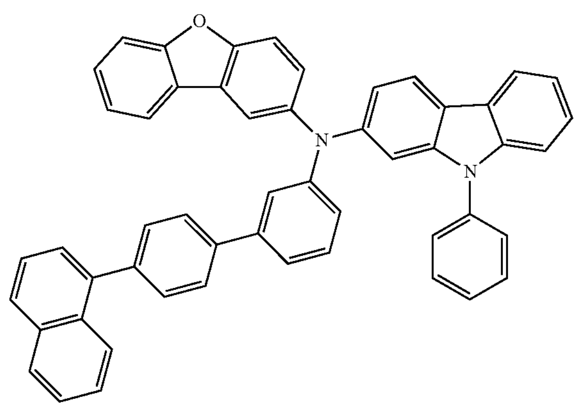
N-49
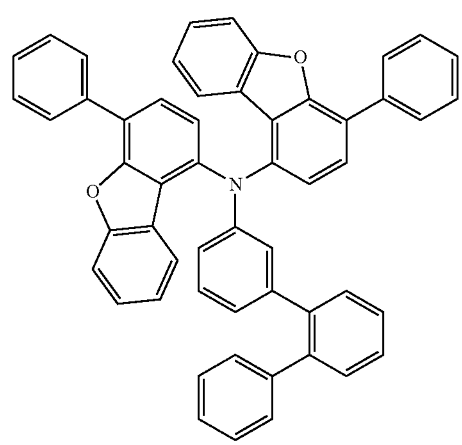

-continued
N-50
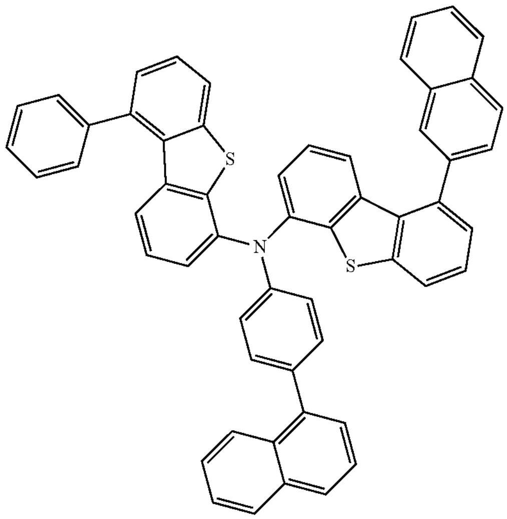
N-51
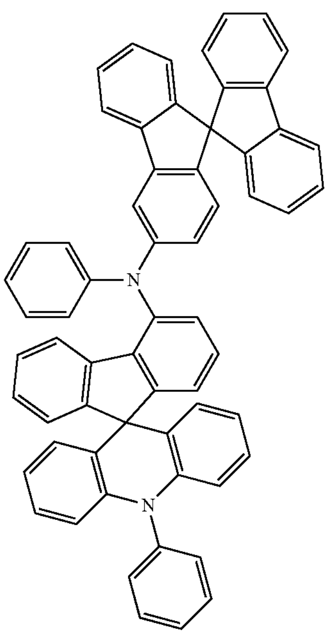
-continued
N-52
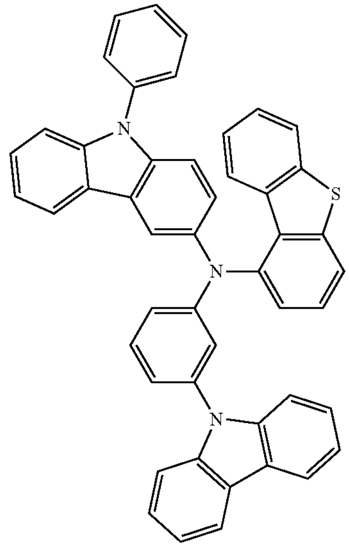
N-53
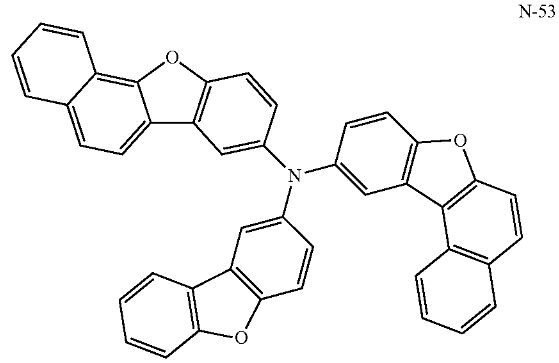
N-54
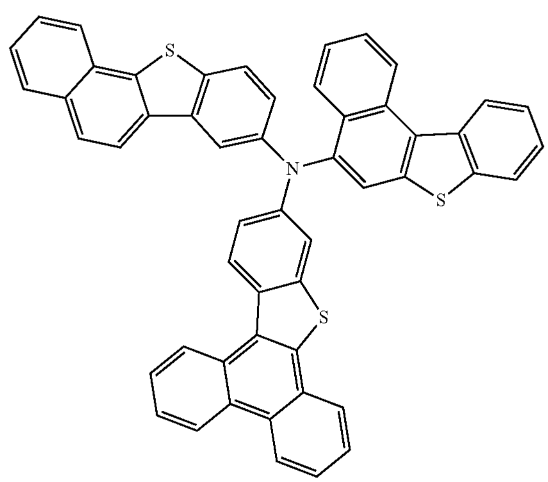

-continued
N-55
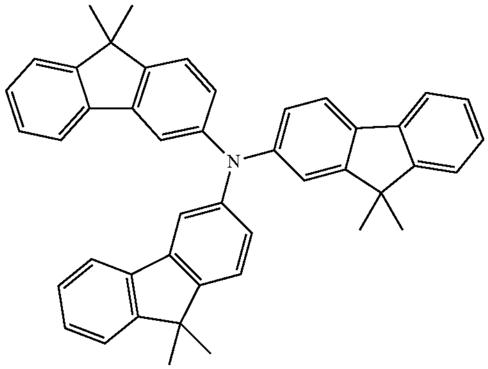
N-56
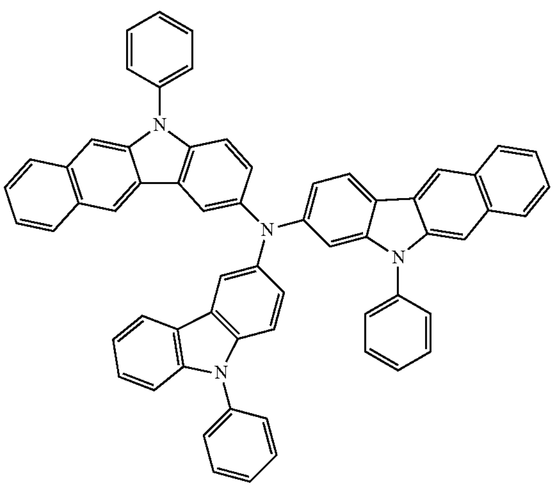
N-57
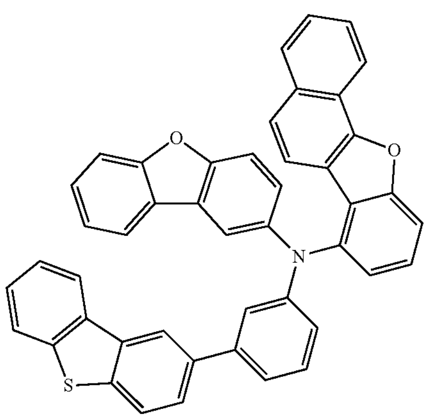
-continued
N-58
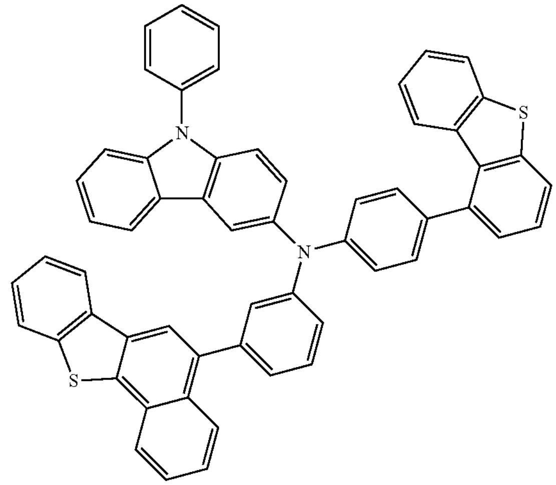
N-59
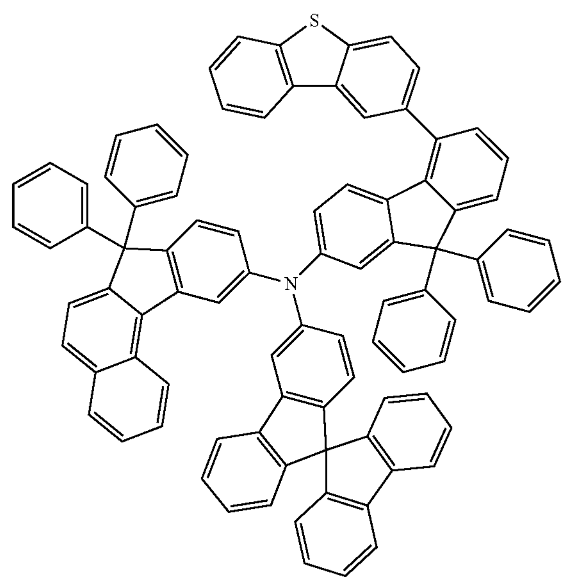
N-60
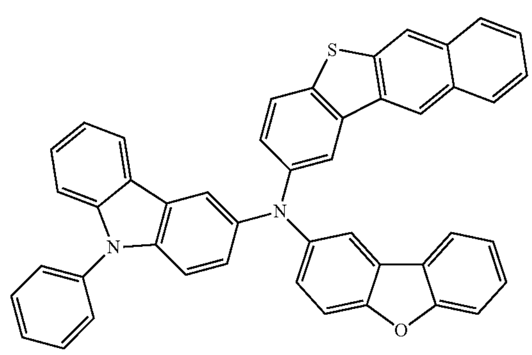

-continued
N-61
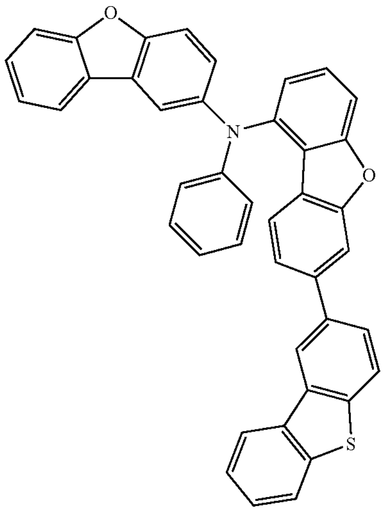
N-62
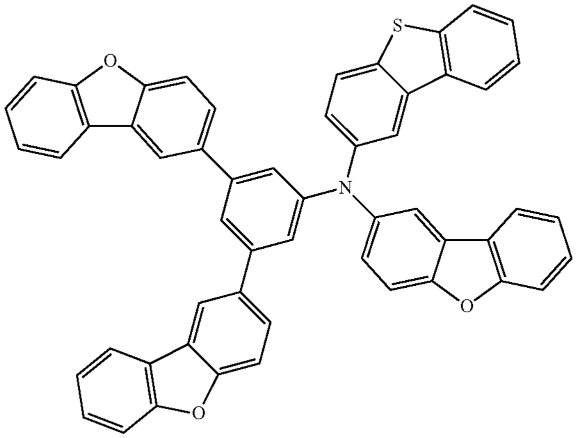
N-63
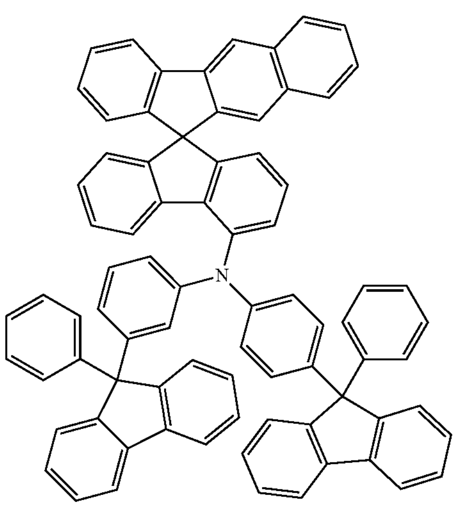
-continued
N-64
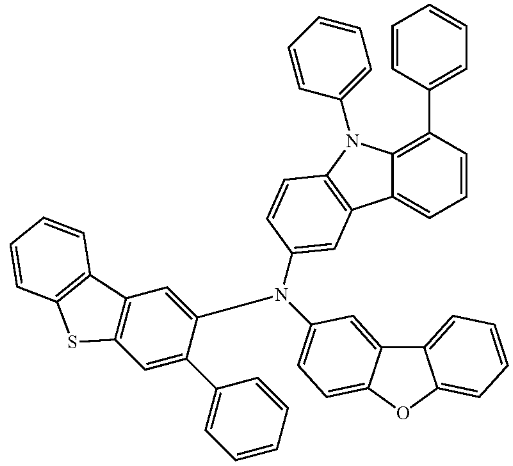
N-65
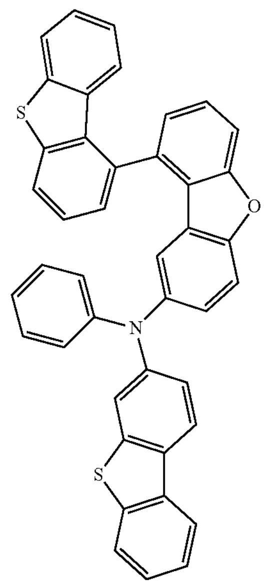
N-66
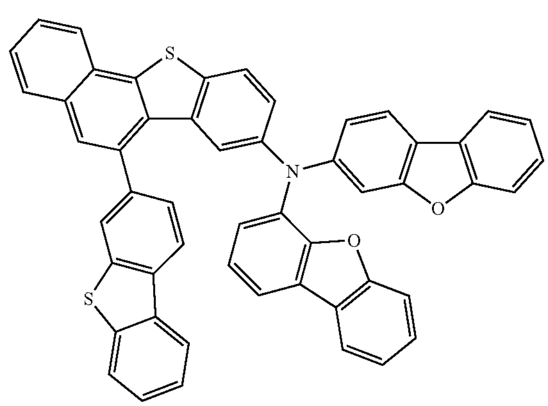

N-67
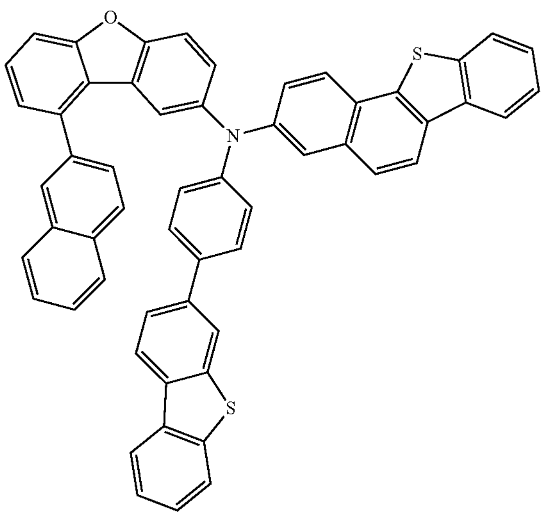
N-68
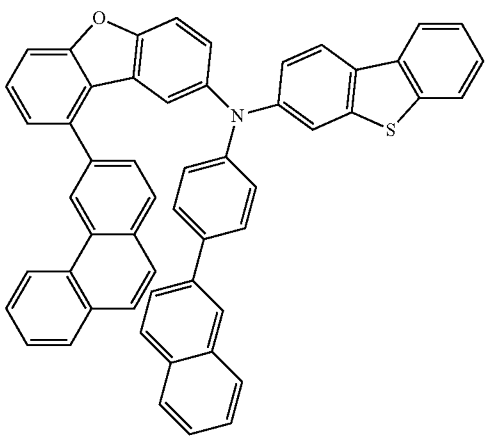
N-69
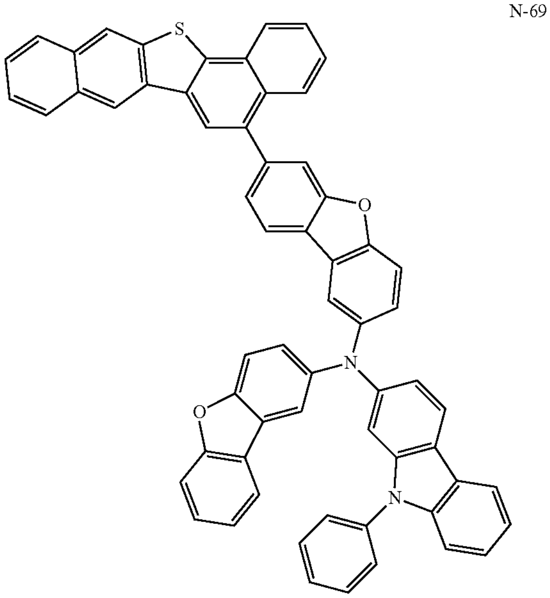
N-70
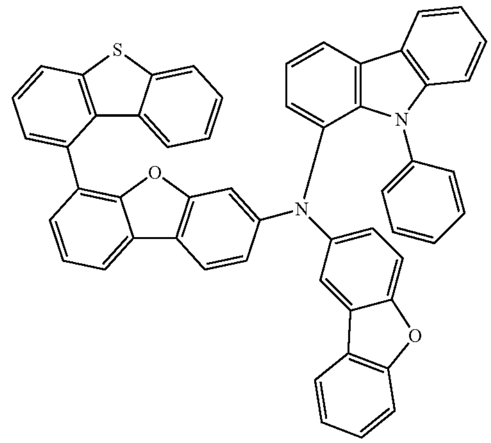
N-71
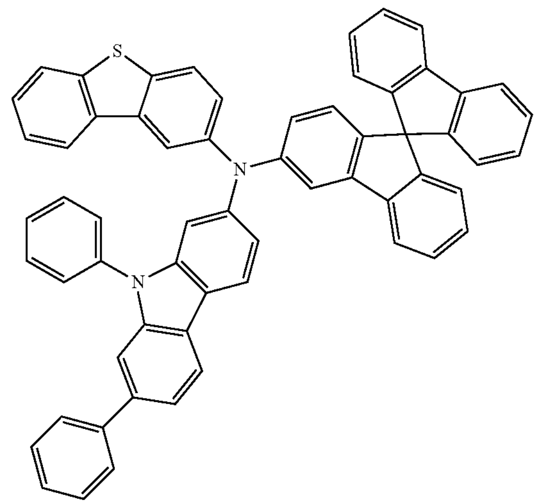
N-72
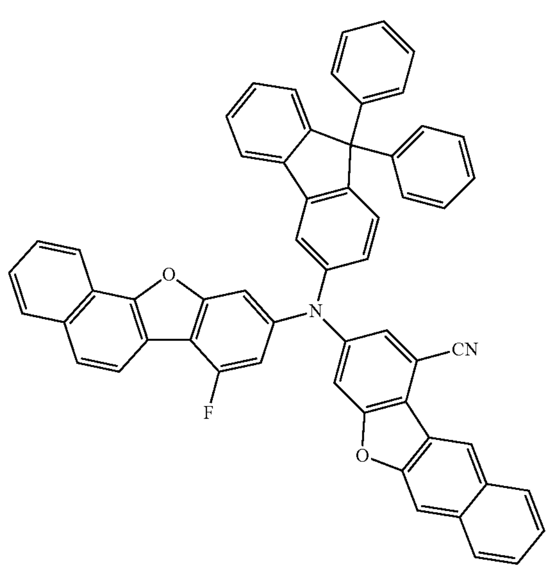

-continued
N-73
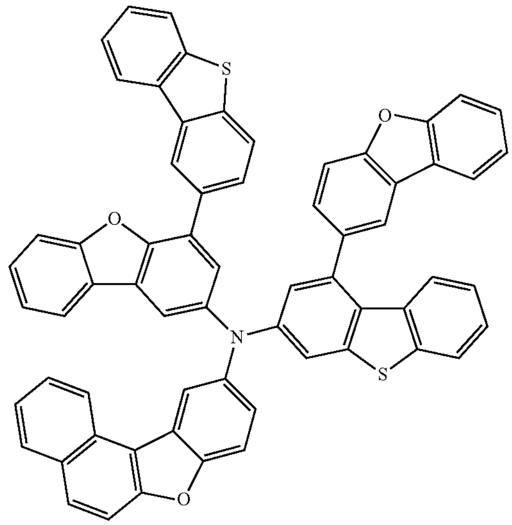
N-74
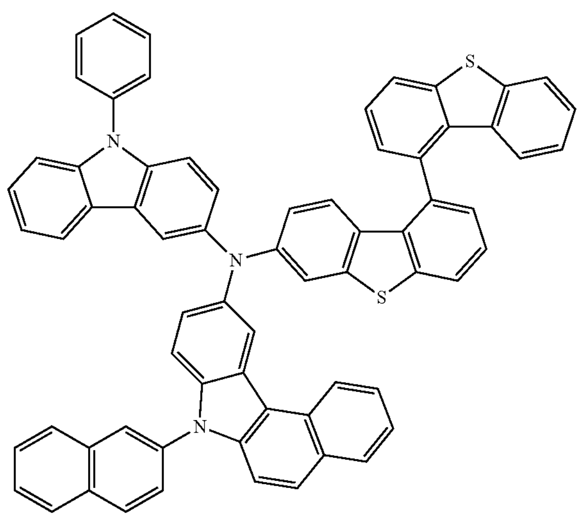
N-75
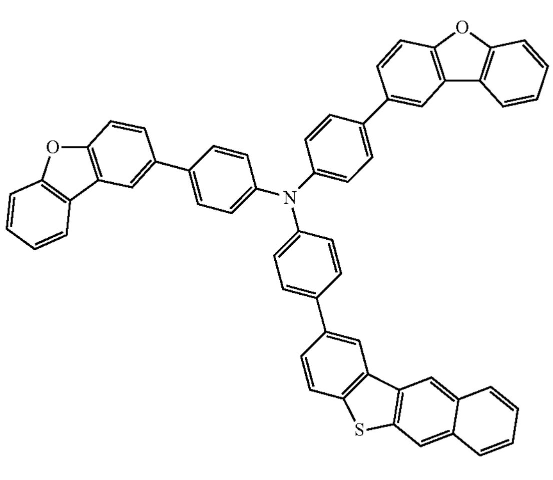
-continued
N-76
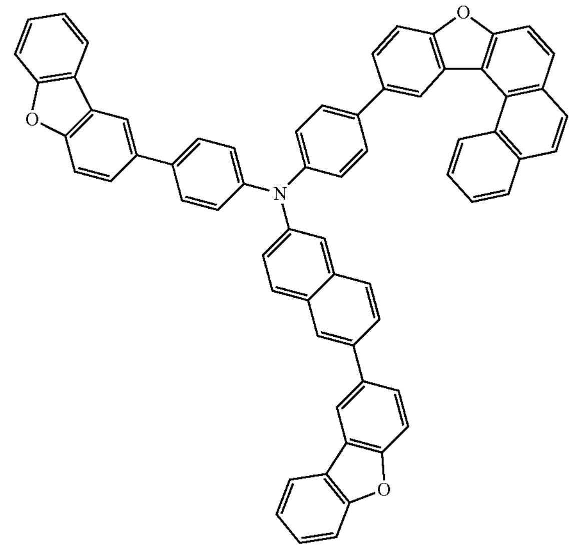
N-77
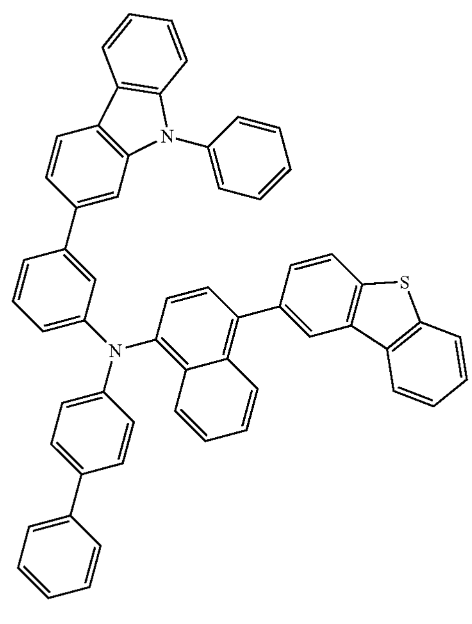

-continued
N-78
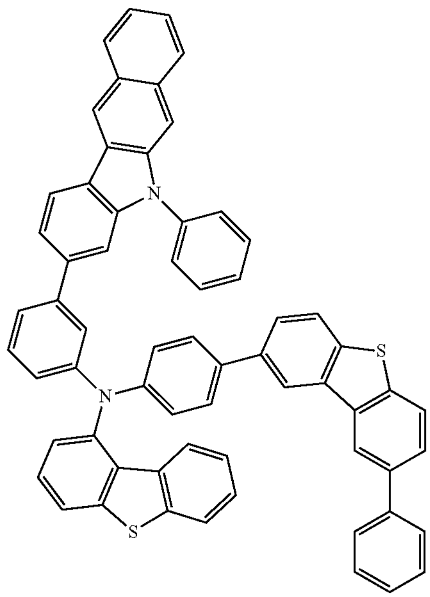
N-79
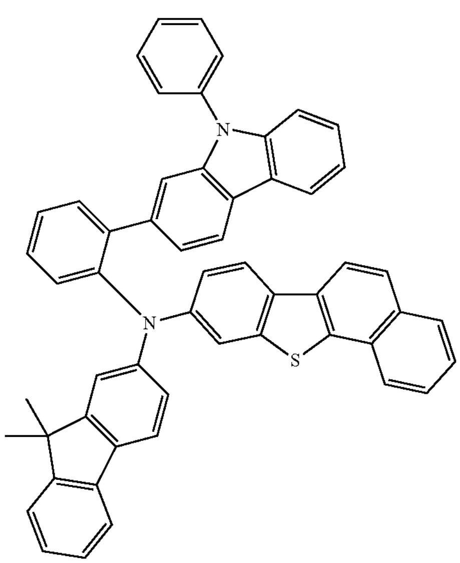
-continued
N-80
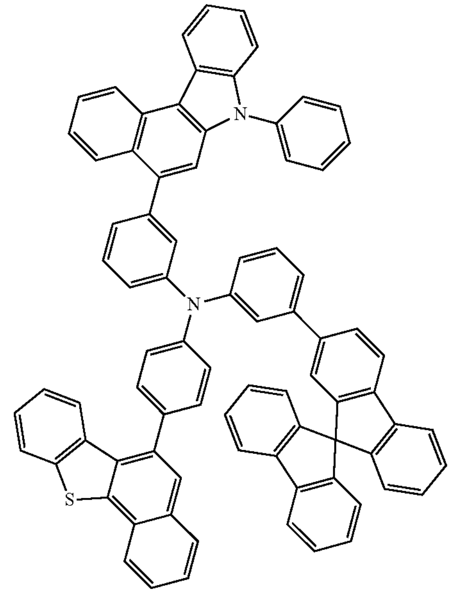
N-81
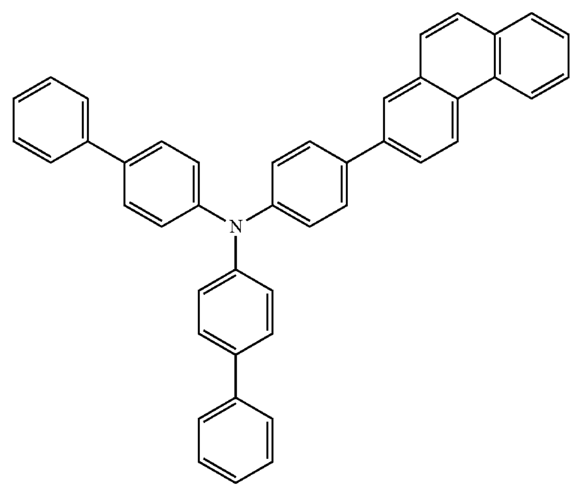
N-82
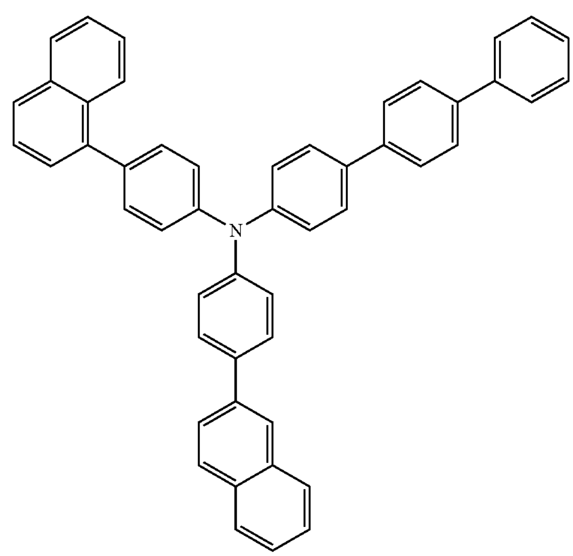

N-83
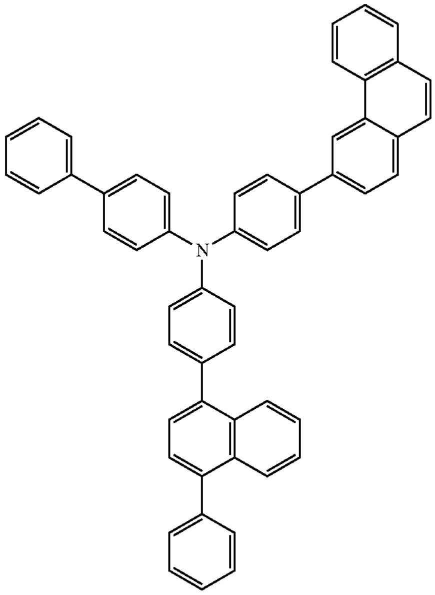
N-84
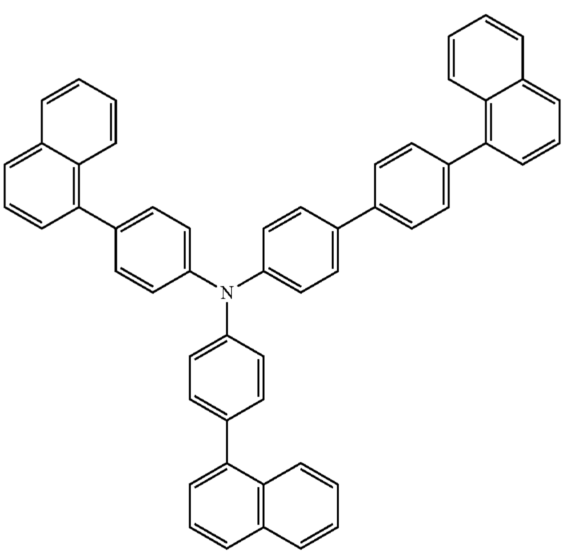
N-85
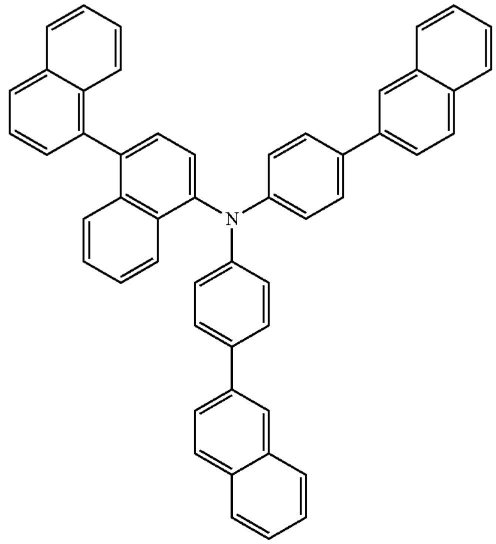
N-86
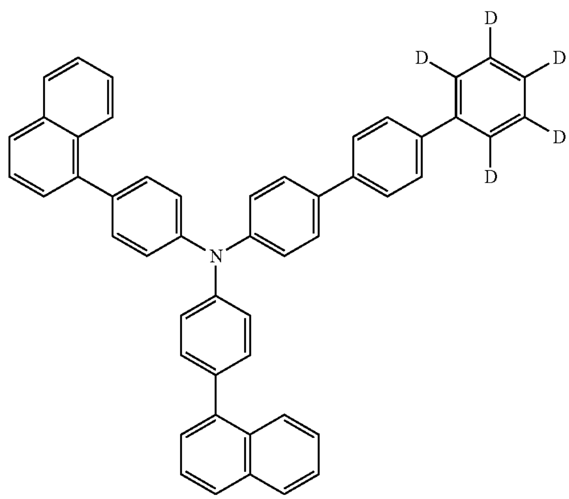
N-87
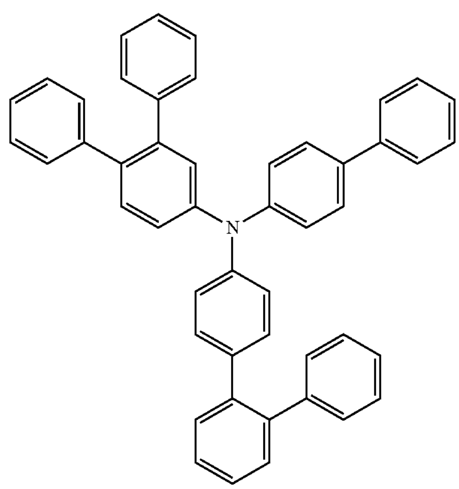

-continued
N-88
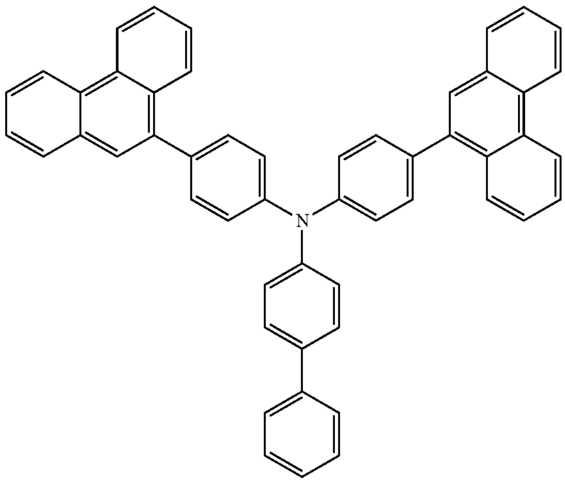
N-89
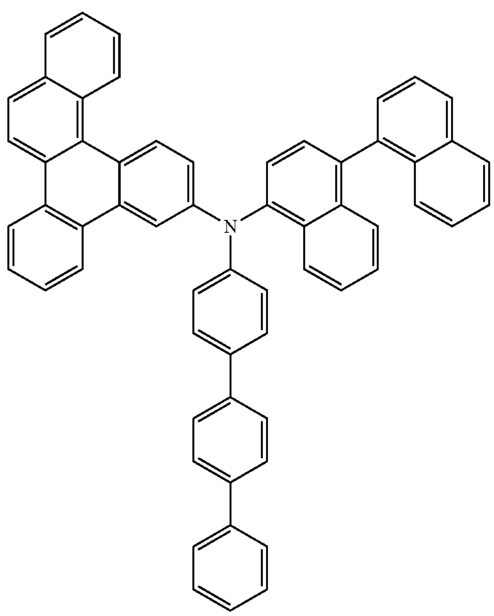
N-90
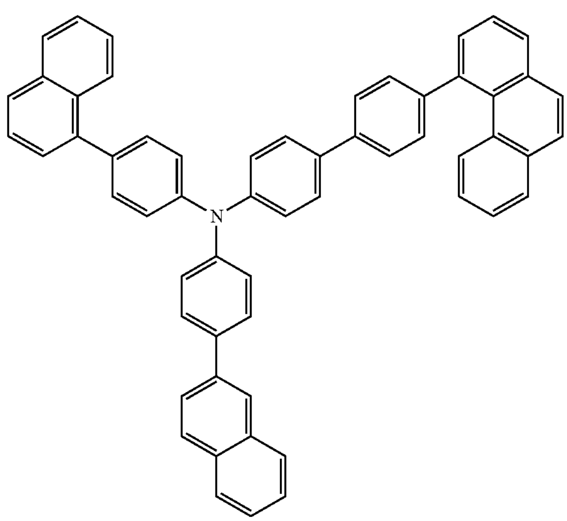
-continued
N-91
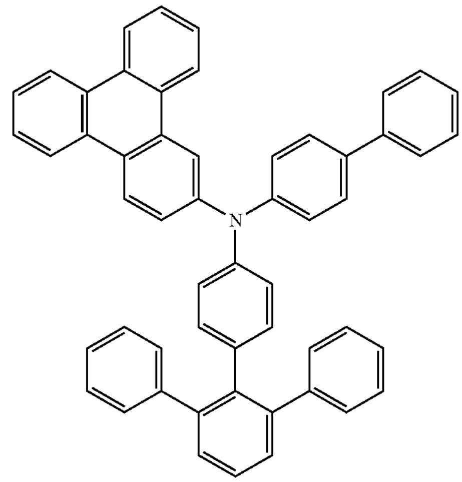
N-92
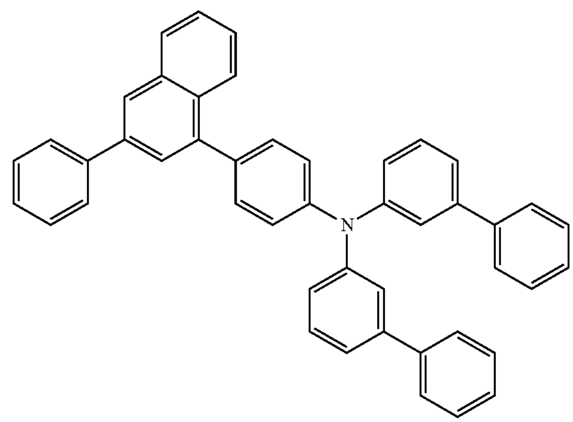
N-93
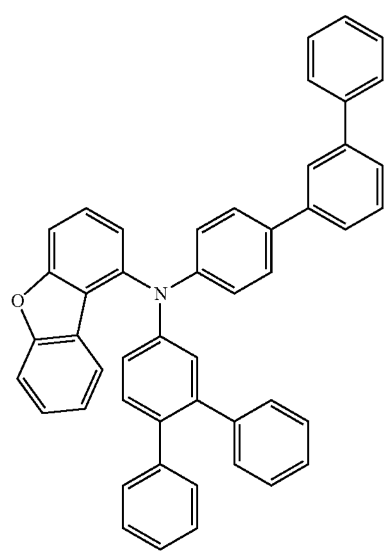

-continued
N-94
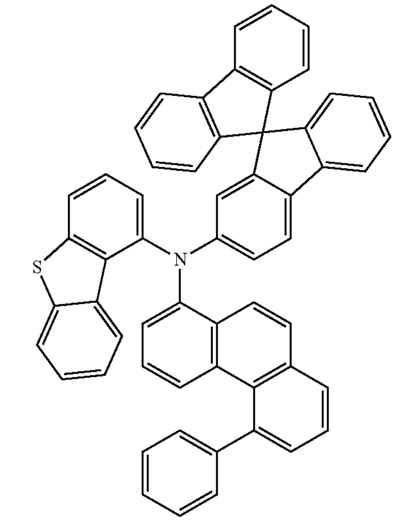
N-95
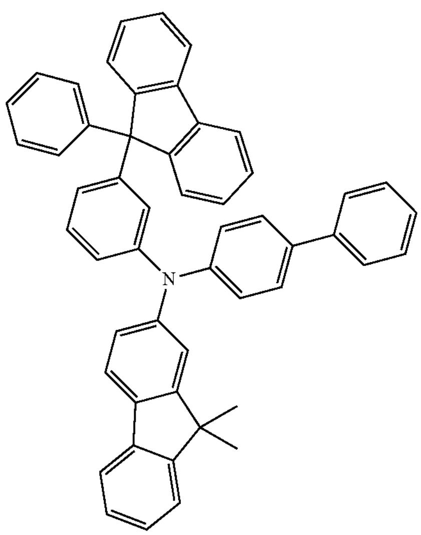
N-96
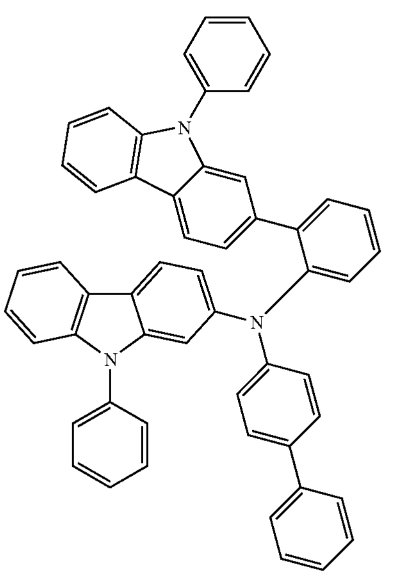
Specifically, the compound represented by Formula 3 may be any one of the following compounds S-1 to S-108.
S-1
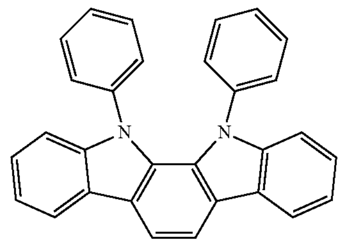
S-2
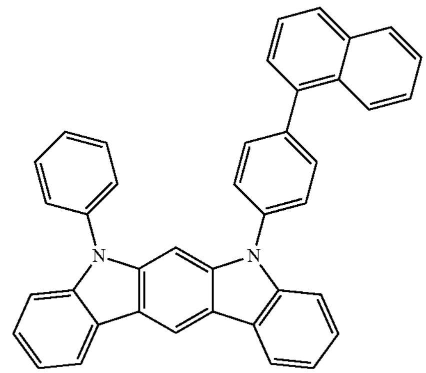
S-3
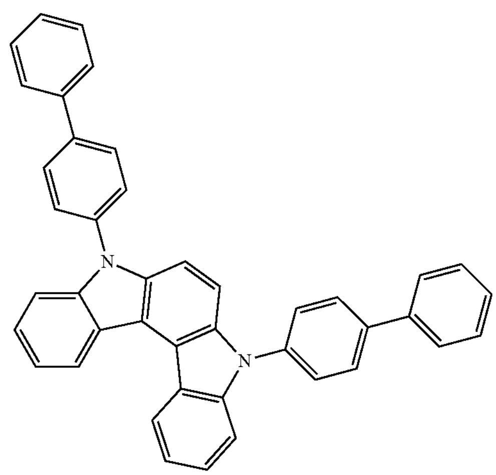
S-4
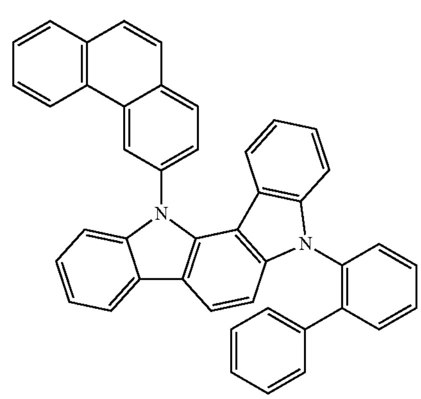

-continued
S-5
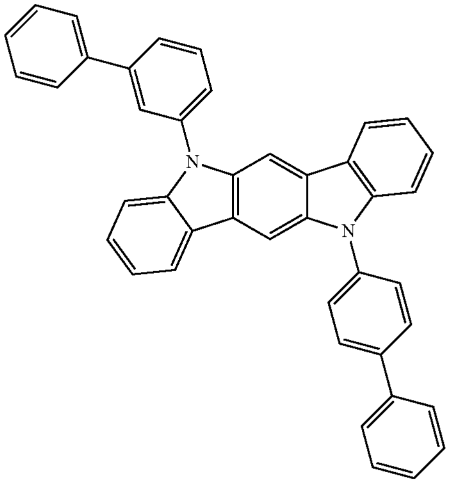
S-6
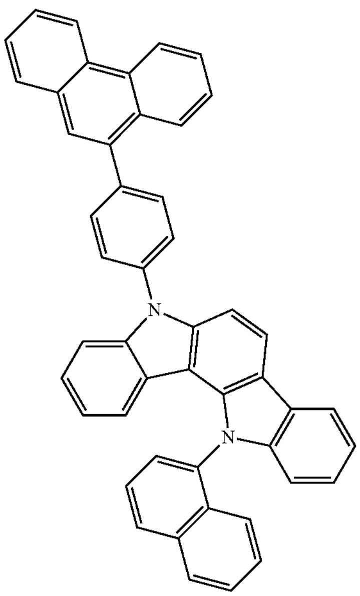
S-7
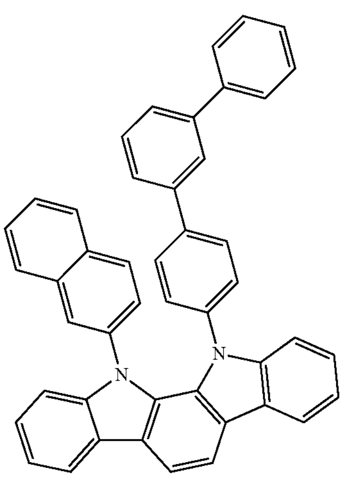
-continued
S-8
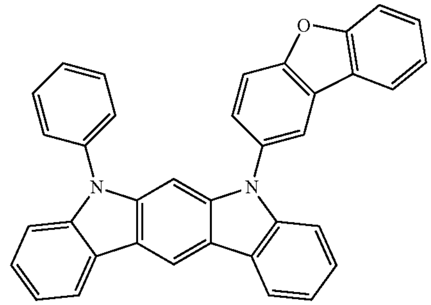
S-9
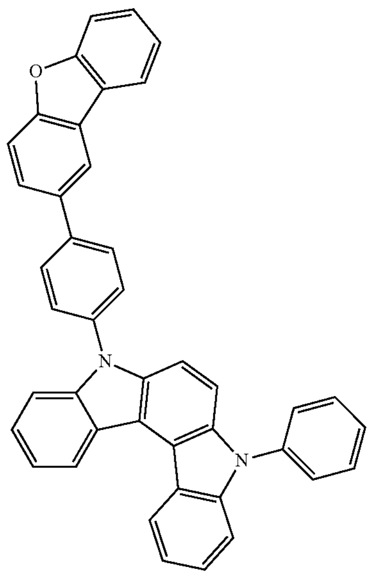
S-10
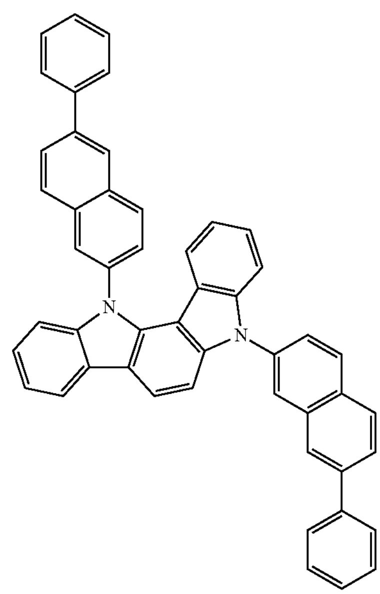

-continued
S-11
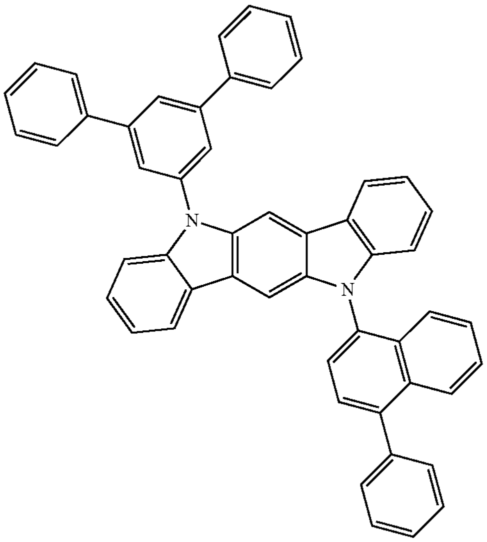
S-12
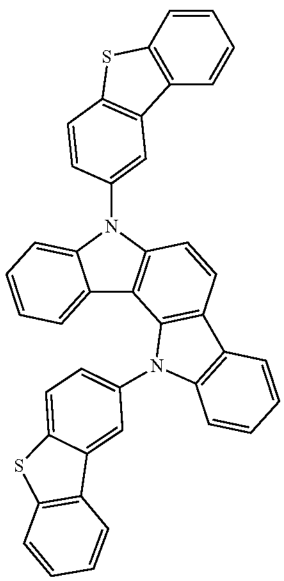
S-13
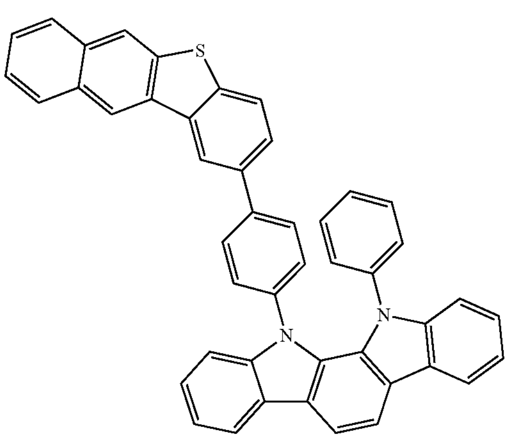
-continued
S-14
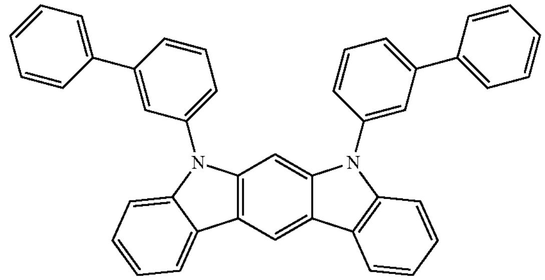
S-15
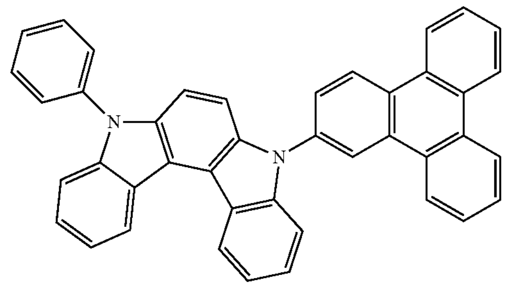
S-16
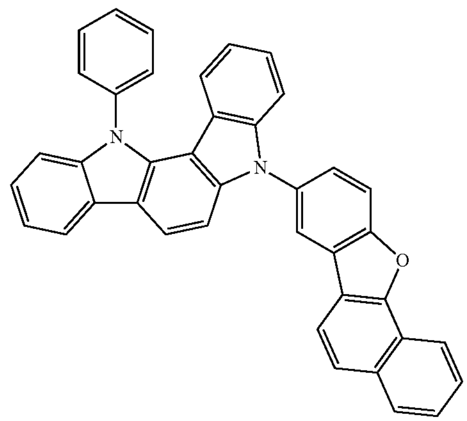
S-17
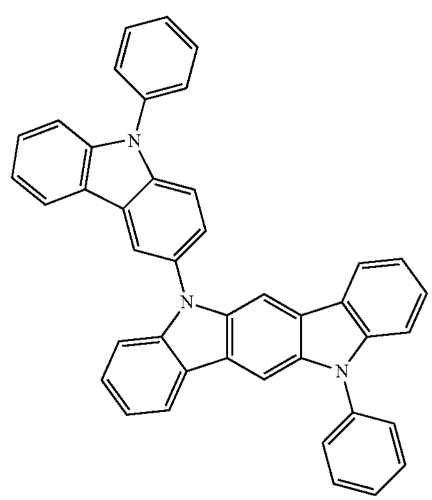

-continued
S-18
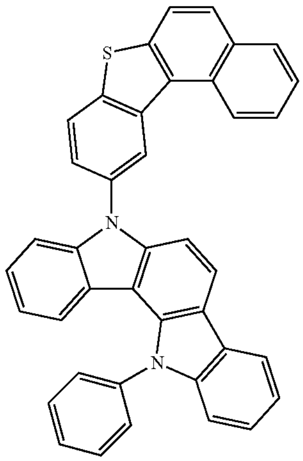
S-19
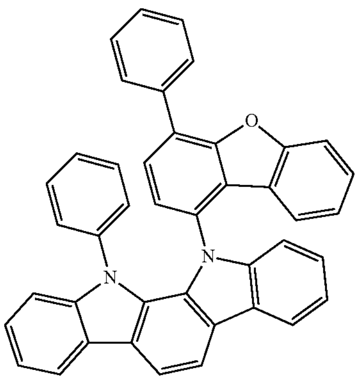
S-20
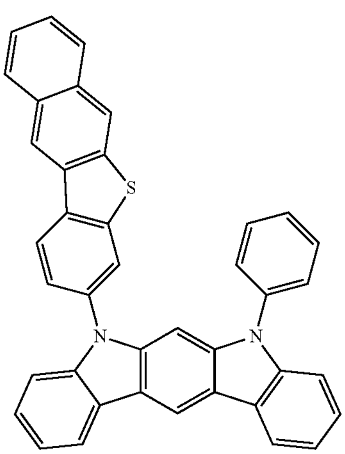
-continued
S-21
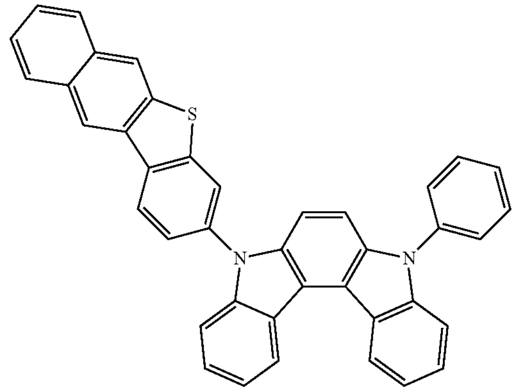
S-22
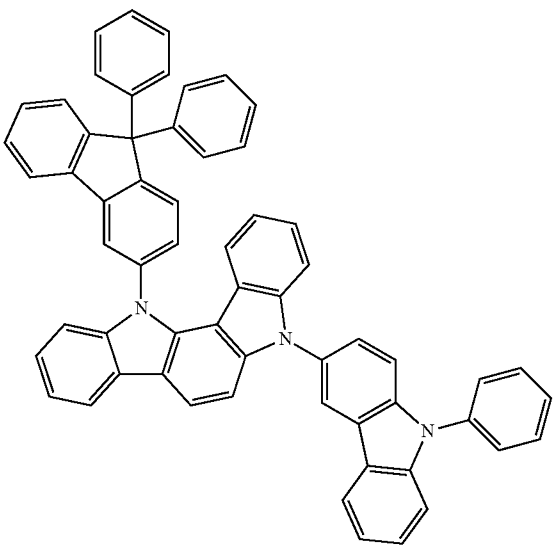
S-23
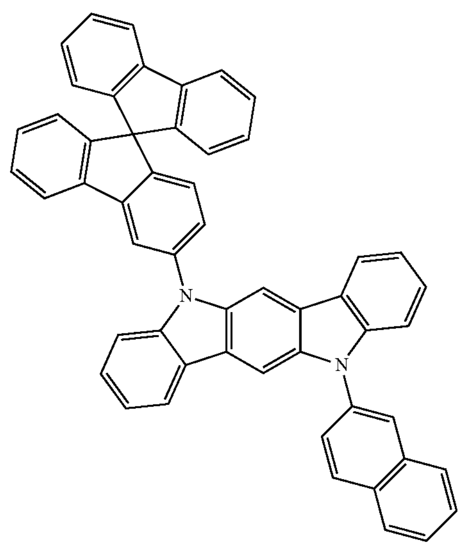

S-24
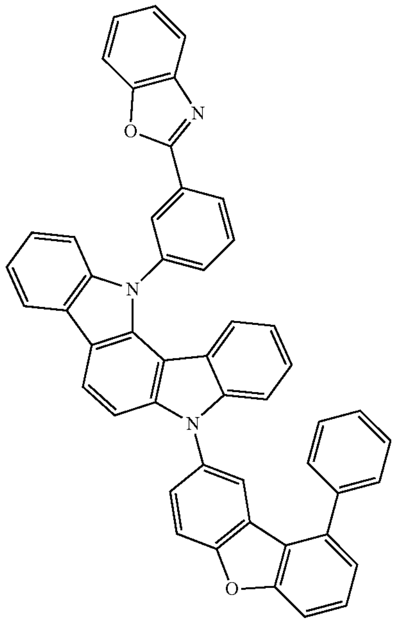
S-25
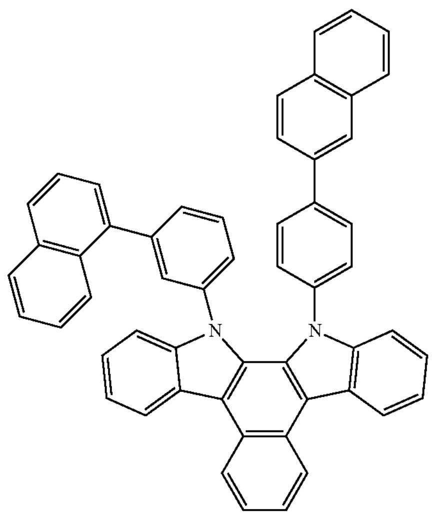
S-26
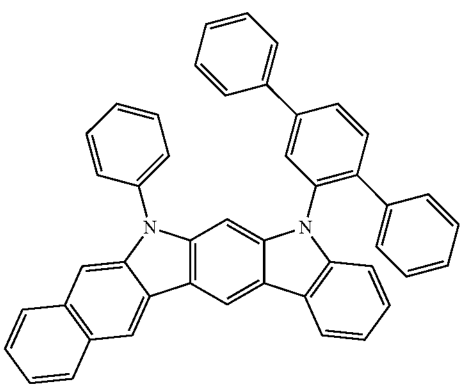
S-27
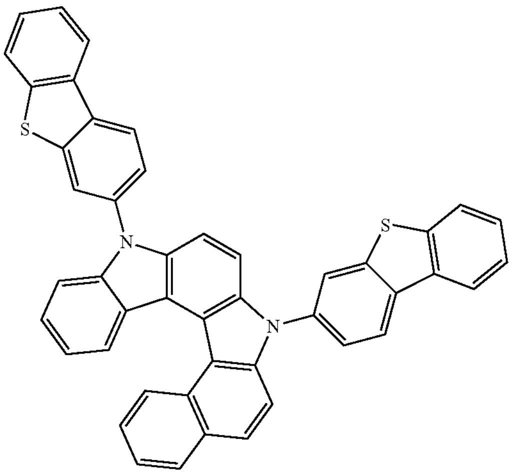
S-28
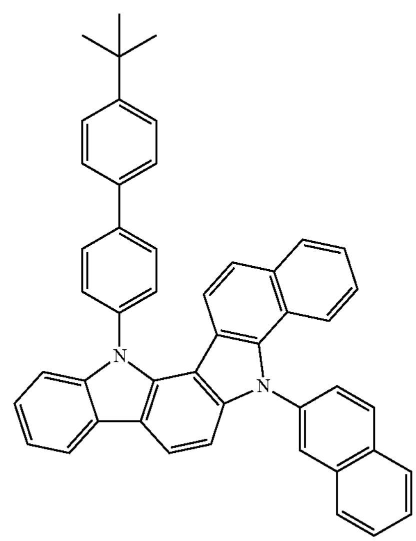
S-29
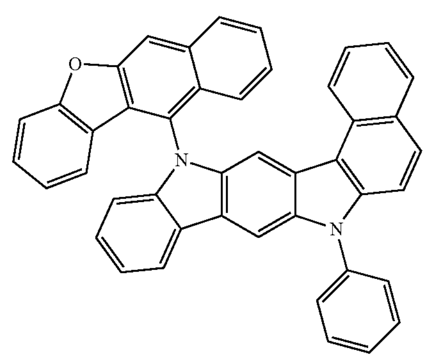

-continued
S-30
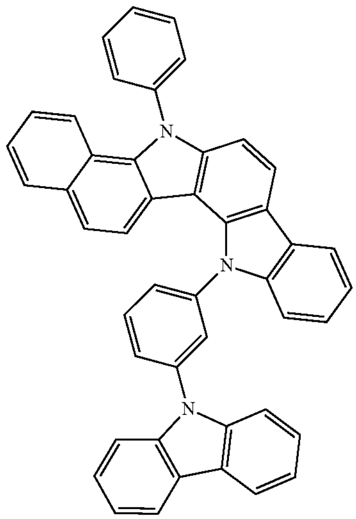
S-31
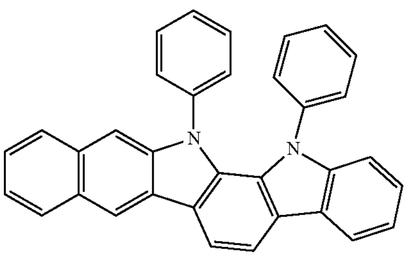
S-32
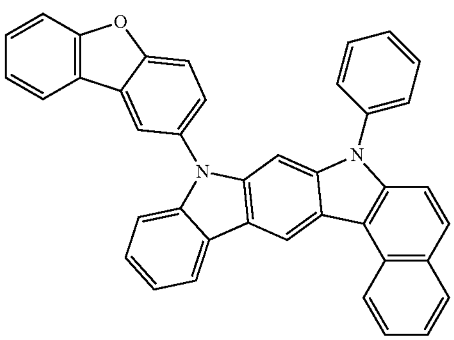
S-33
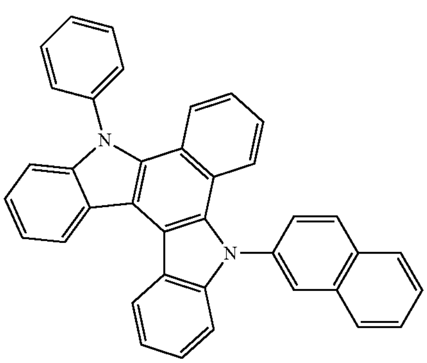
-continued
S-34
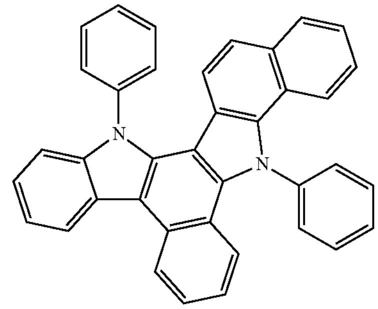
S-35
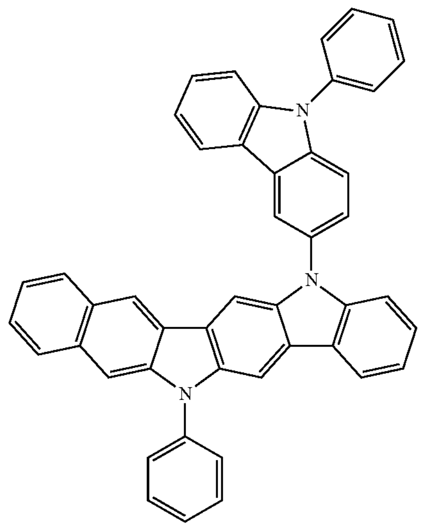
S-36
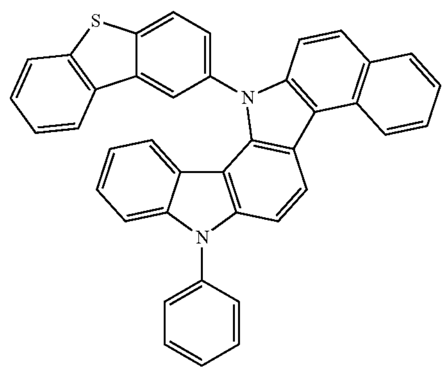
S-37
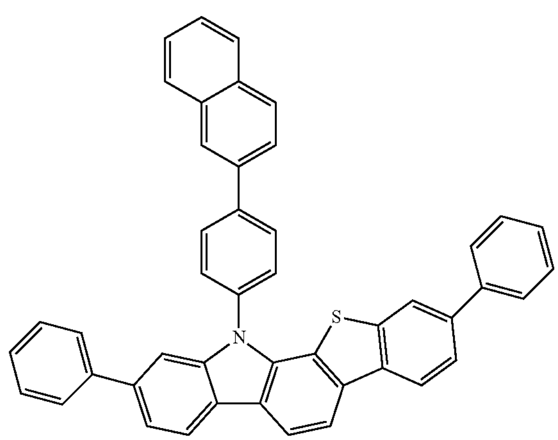

-continued
S-38
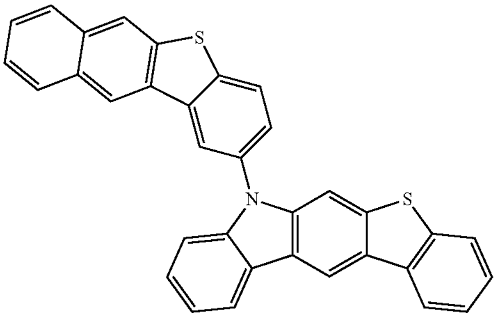
S-39
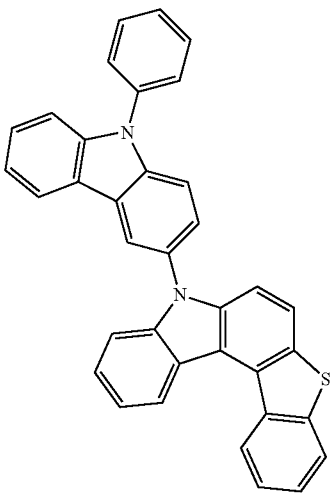
S-40
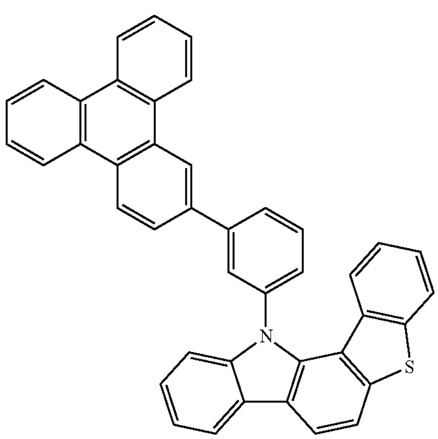
-continued
S-41
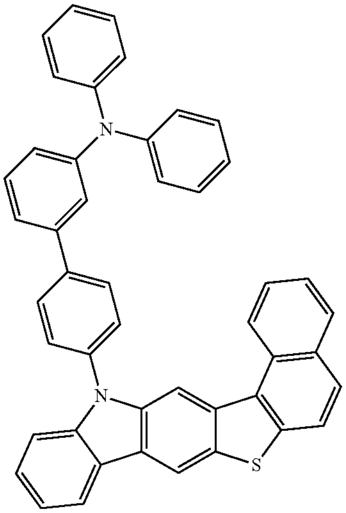
S-42
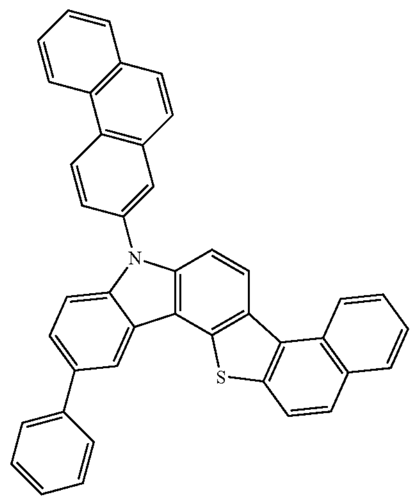
S-43
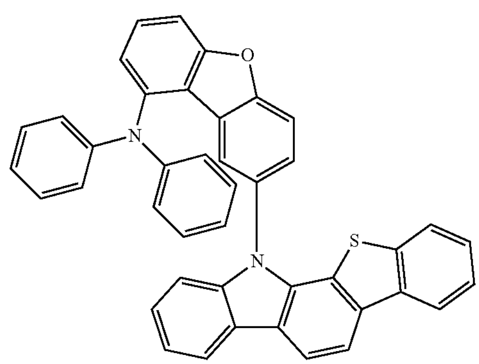

-continued
S-44
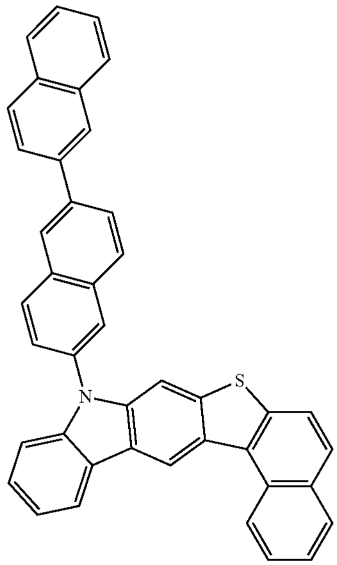
S-45
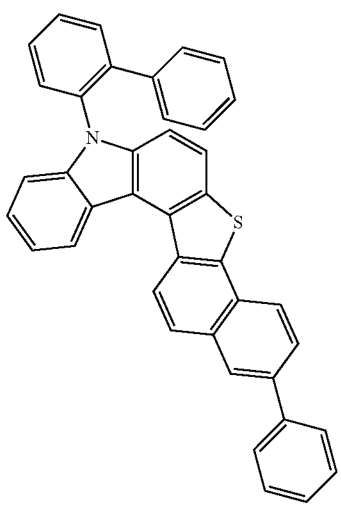
S-46
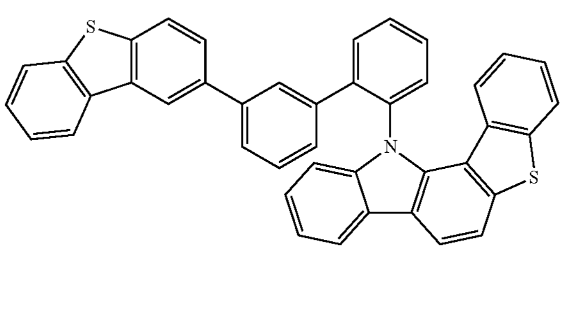
-continued
S-47
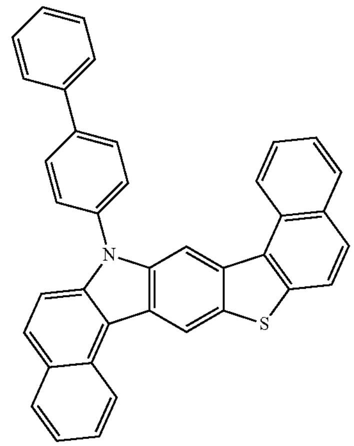
S-48
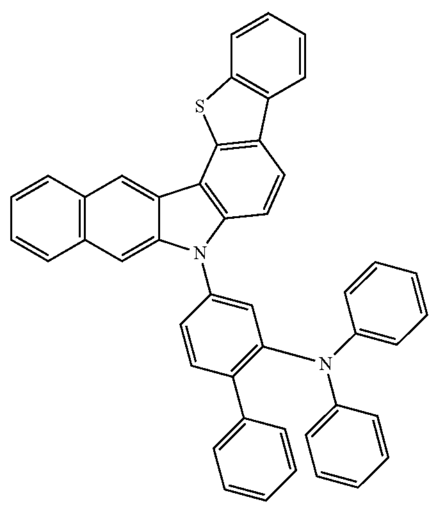
S-49
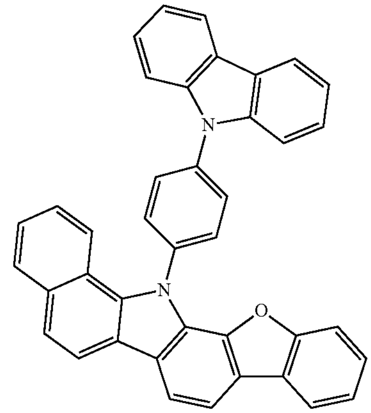

-continued
S-50
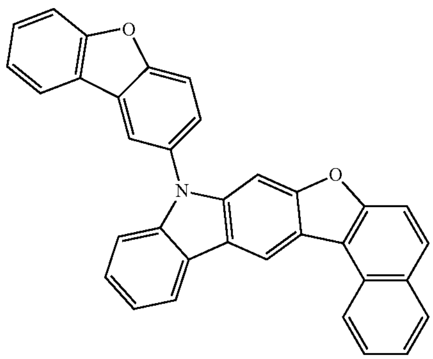
S-51
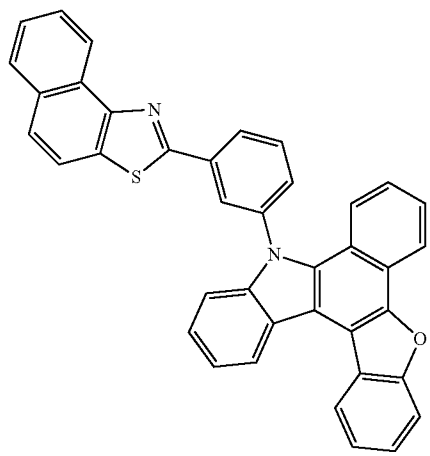
S-52
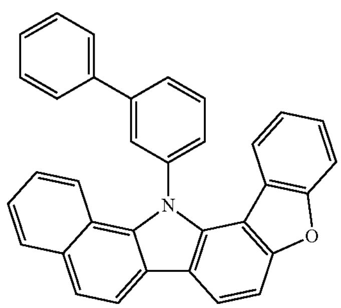
S-53
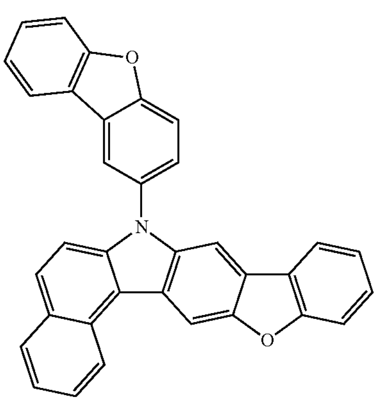
-continued
S-54
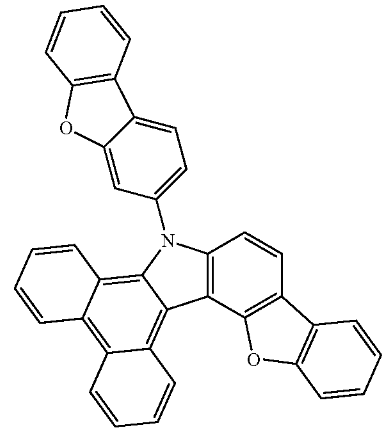
S-55
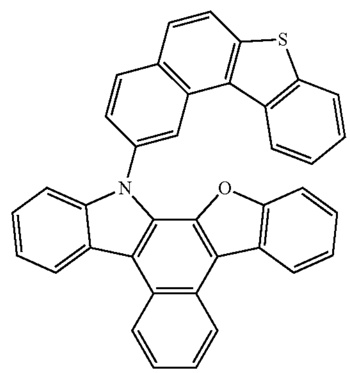
S-56
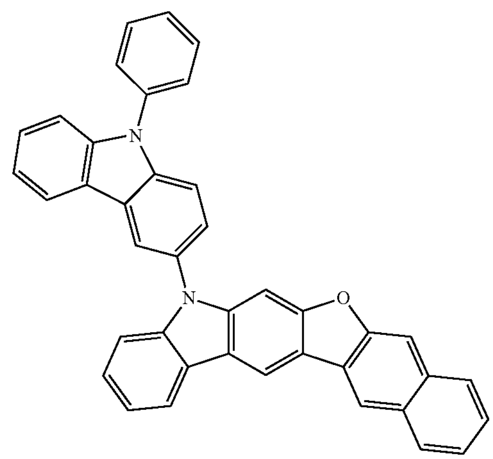
S-57
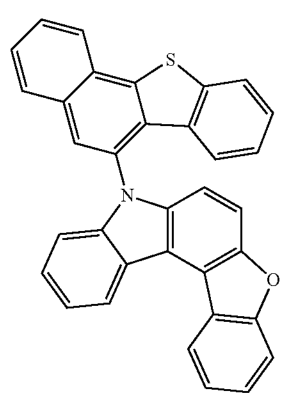

-continued
S-58
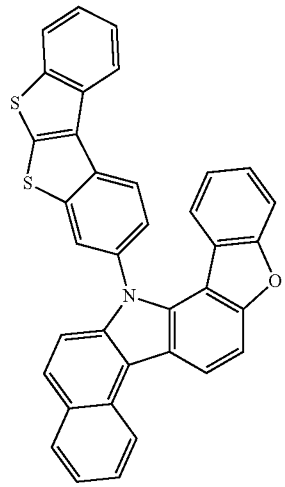
S-59
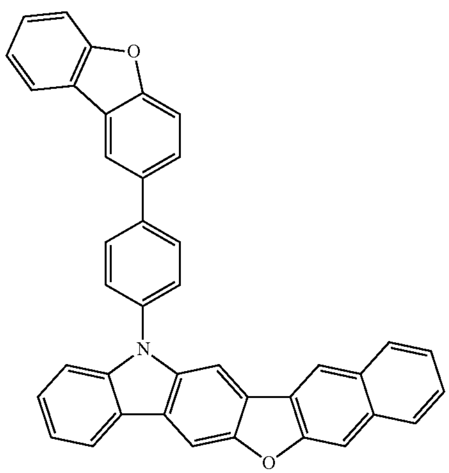
S-60
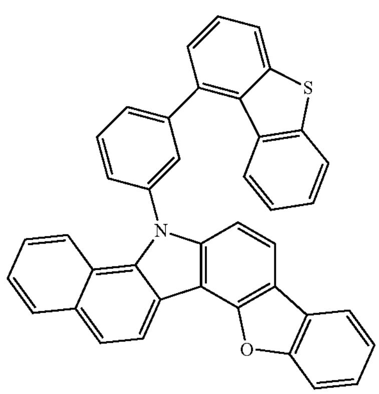
-continued
S-61
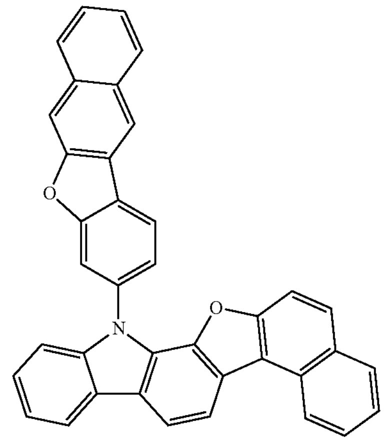
S-62
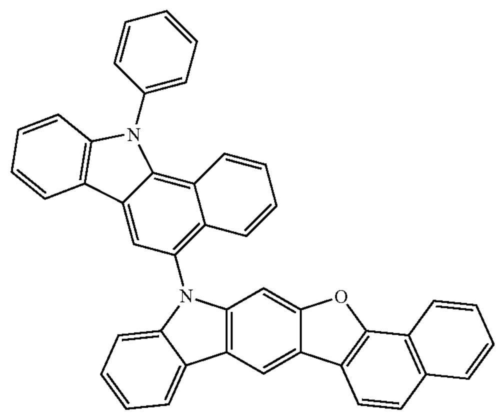
S-63
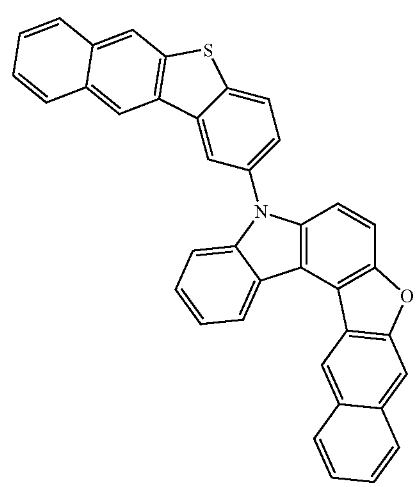

-continued
S-64
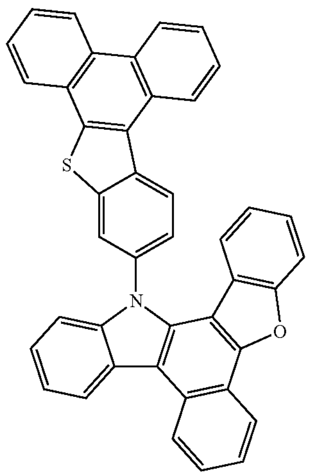
S-65
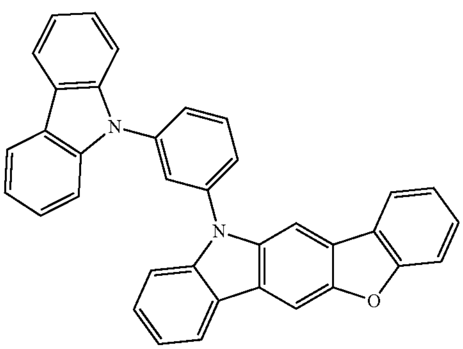
S-66
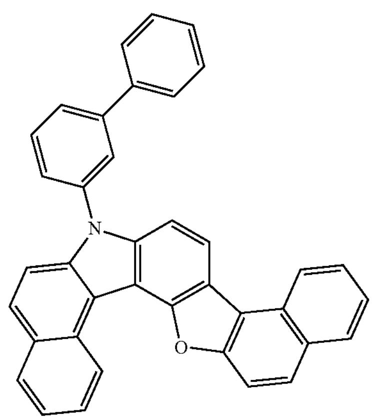
S-67
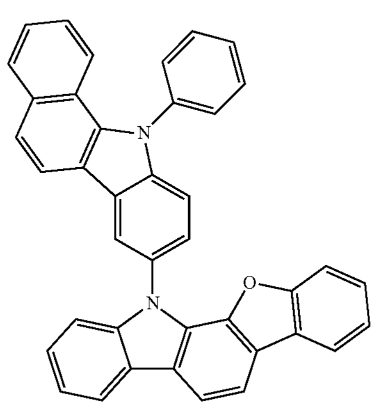
-continued
S-68
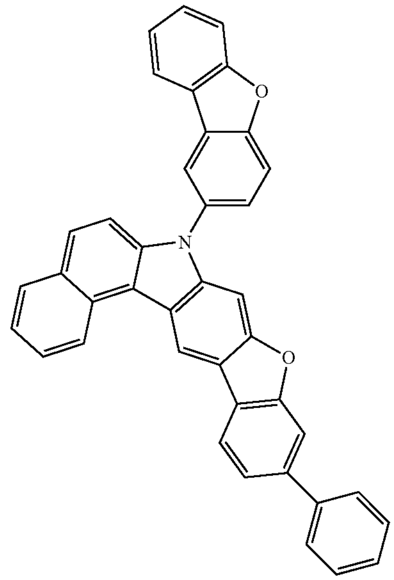
S-69
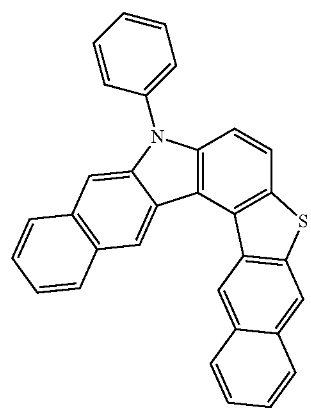
S-70
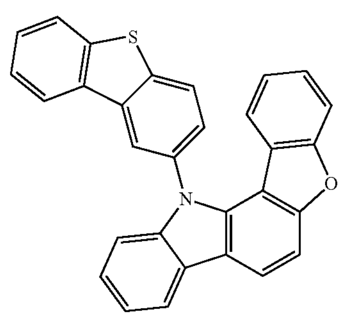

S-71
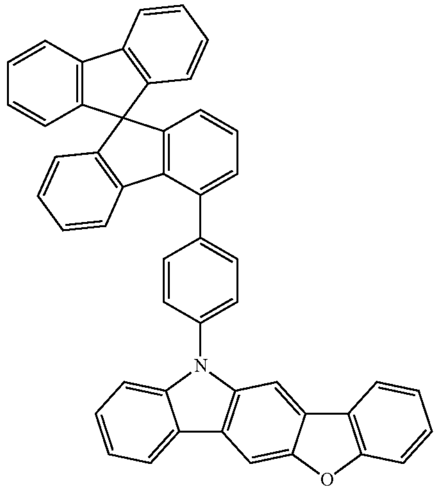
S-72
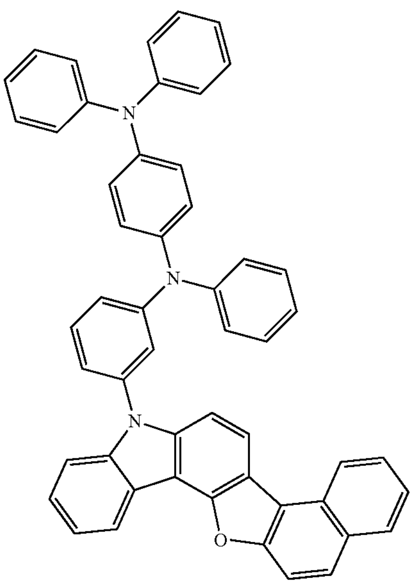
S-73
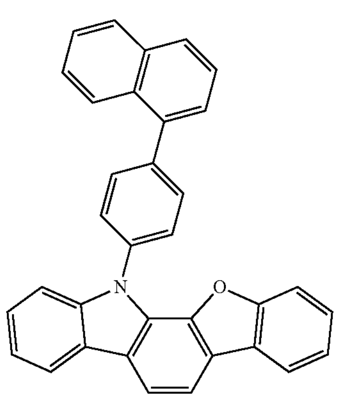
S-74
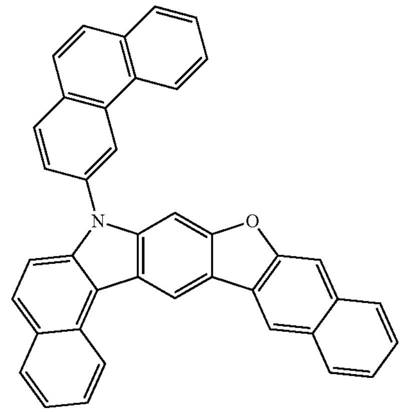
S-75
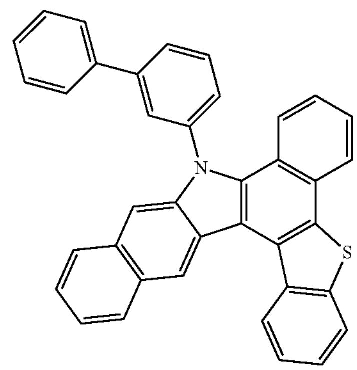
S-76
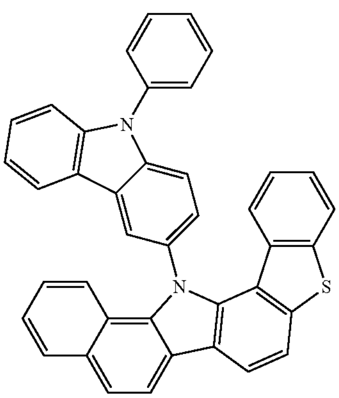
S-77
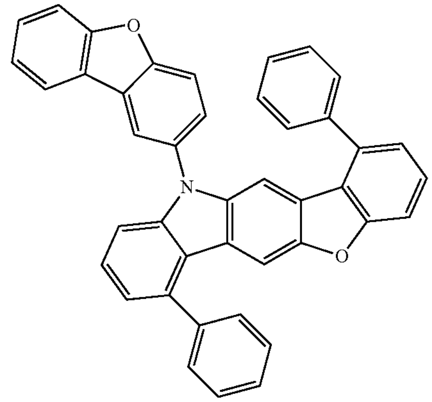

S-78
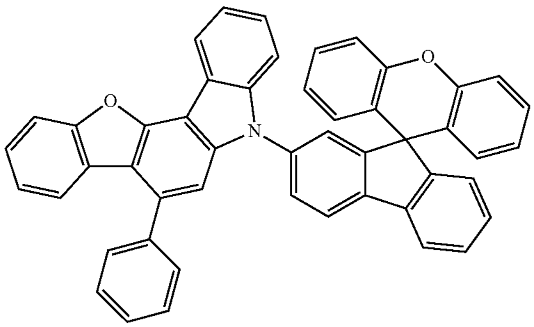
S-79
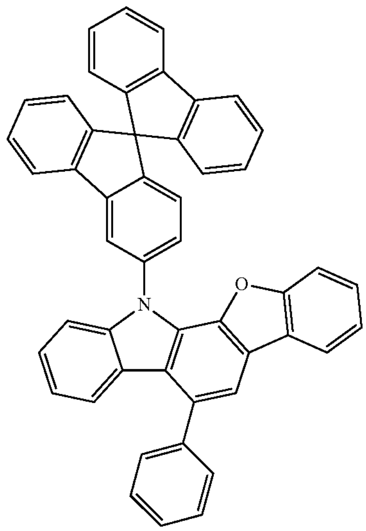
S-80
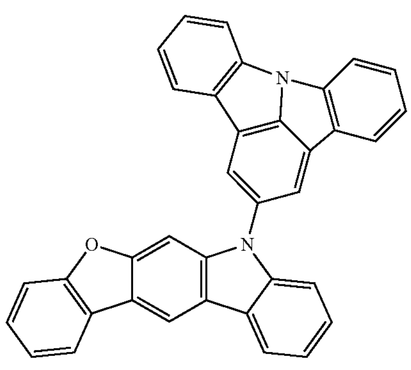
S-81
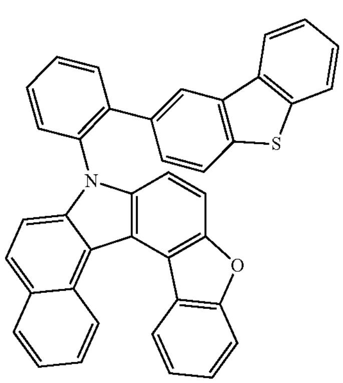
S-82
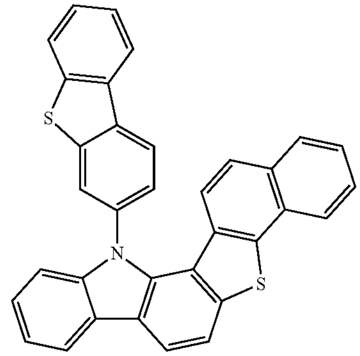
S-83
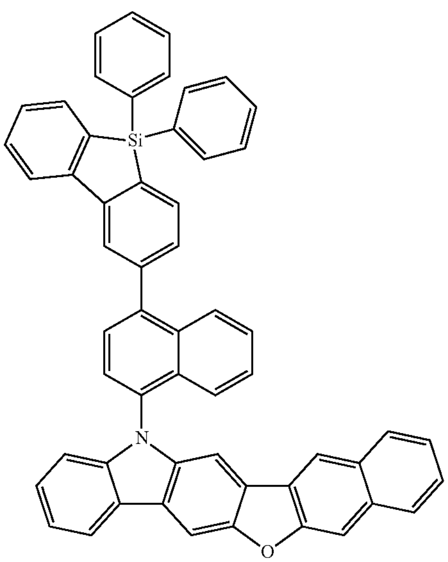
S-84
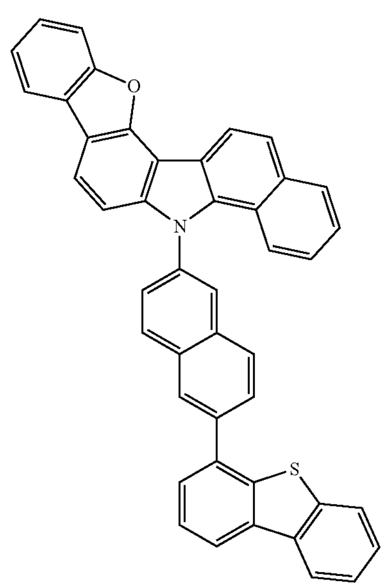

-continued
S-85
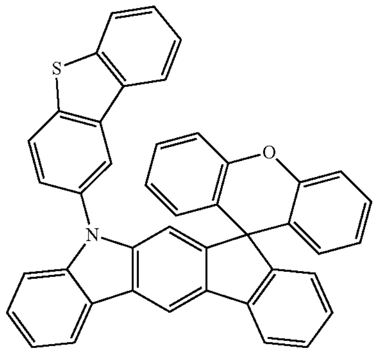
S-86
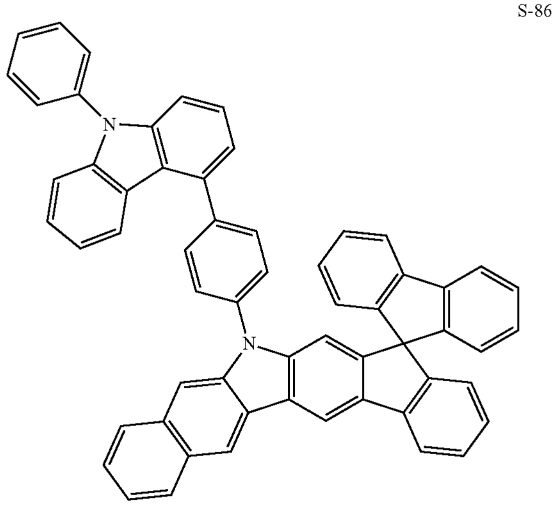
S-87
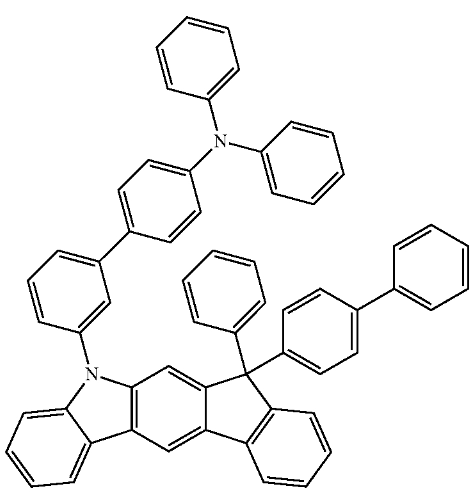
-continued
S-88
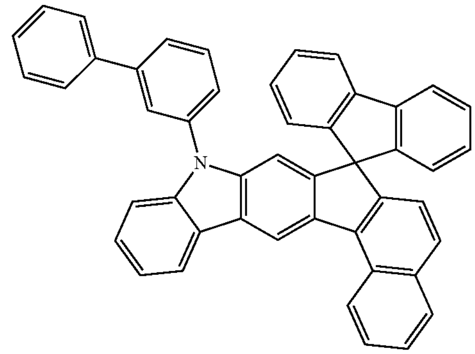
S-89
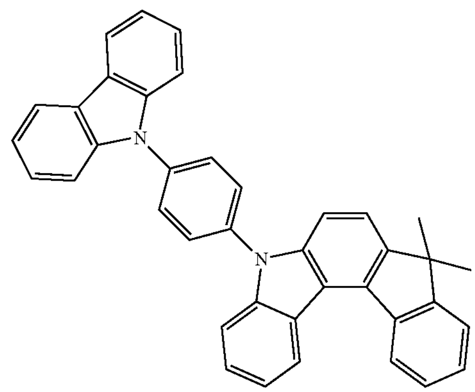
S-90
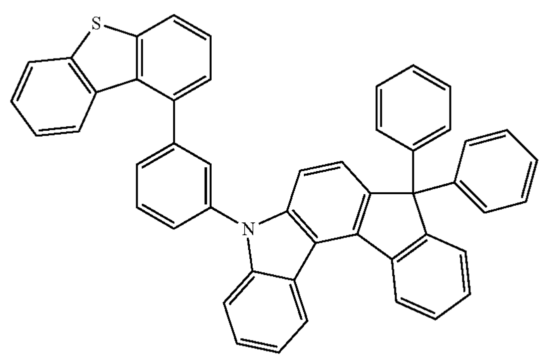
S-91
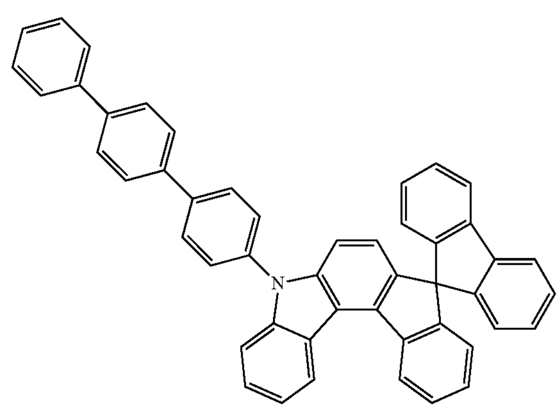

-continued
S-92
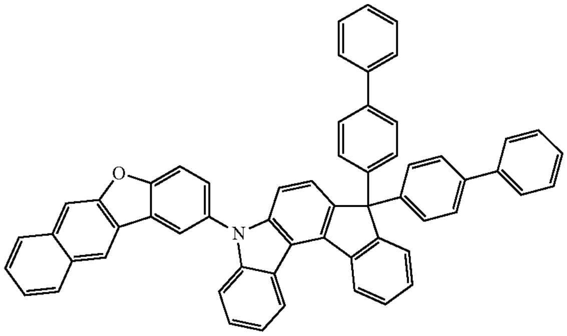
S-93
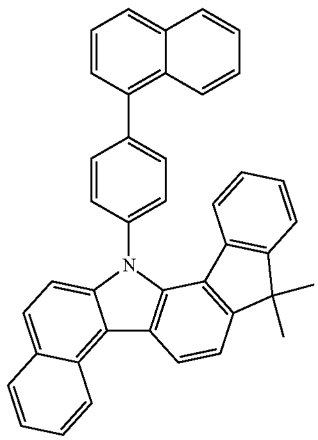
S-94
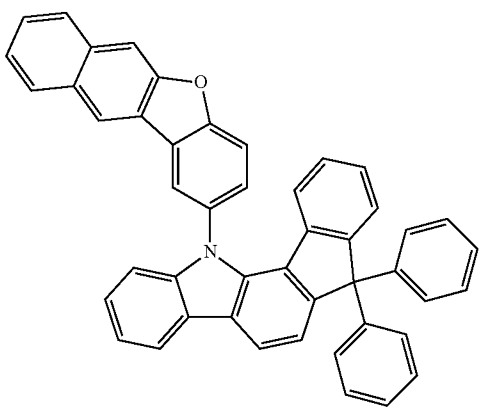
S-95
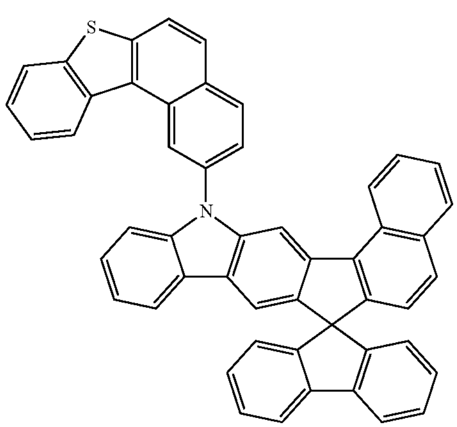
-continued
S-96
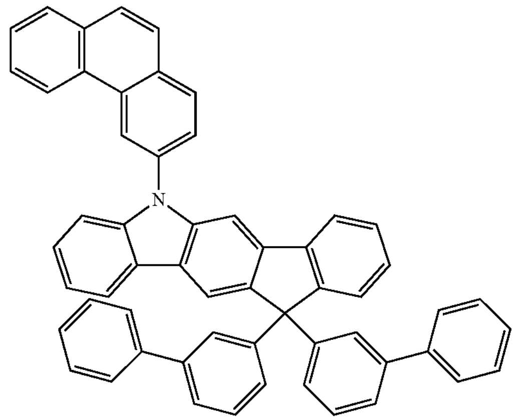
S-97
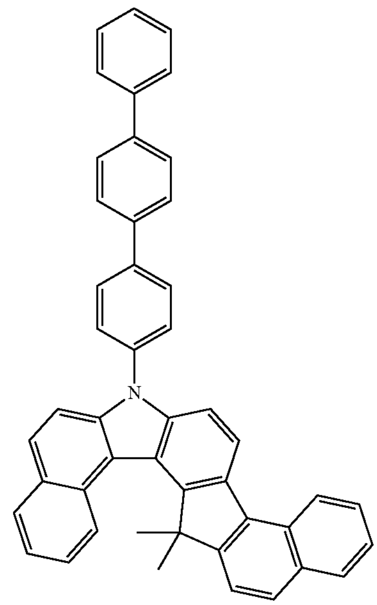
S-98
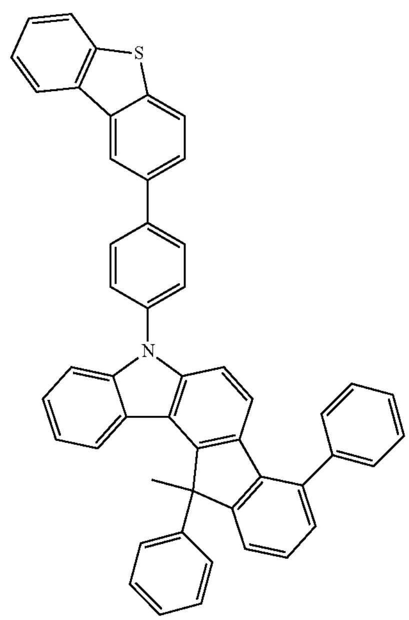

-continued
S-99
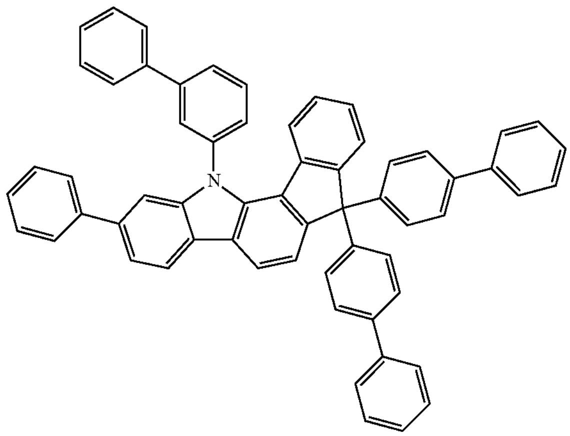
S-100
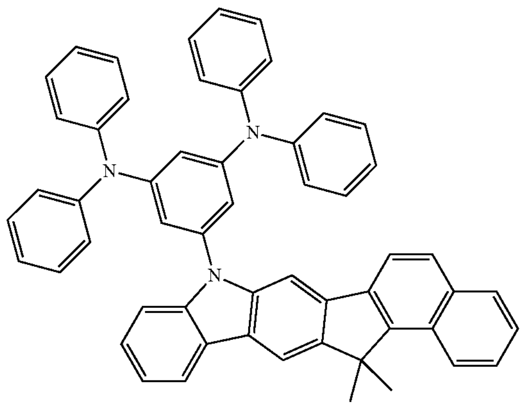
S-101
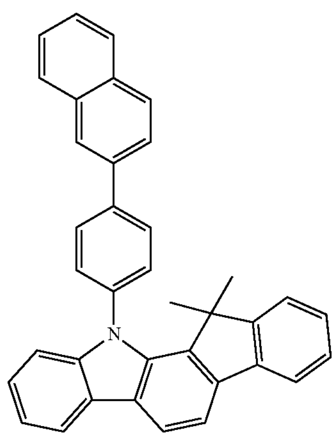
S-102
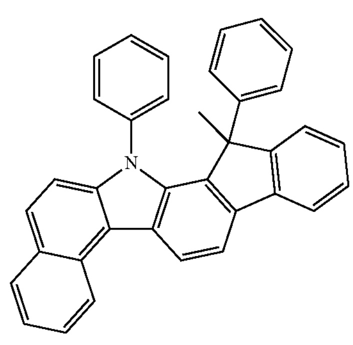
-continued
S-103
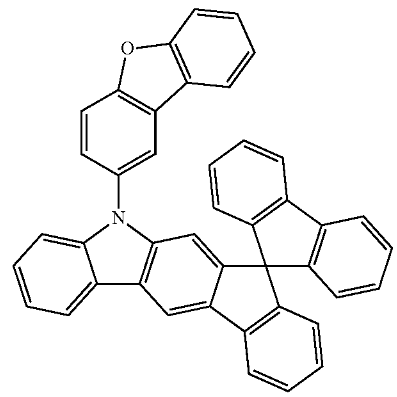
S-104
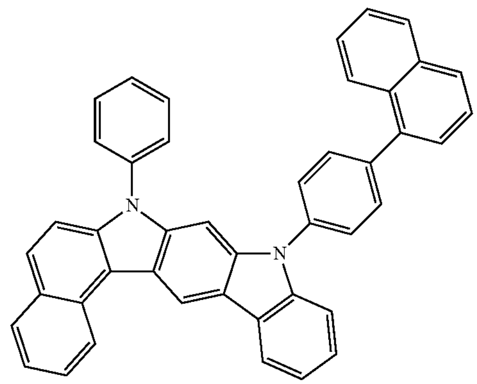
S-105
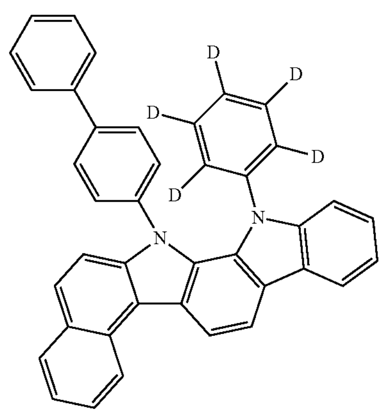
S-106
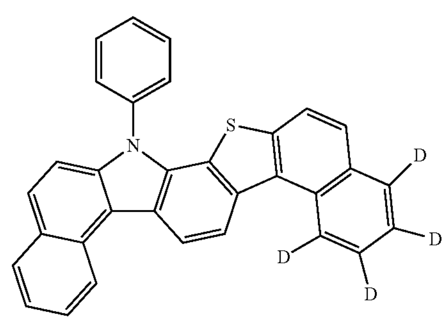

-continued

S-107

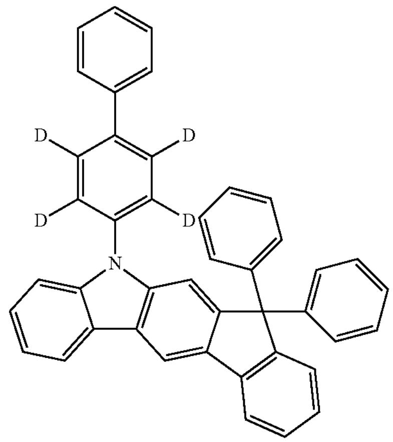

S-108

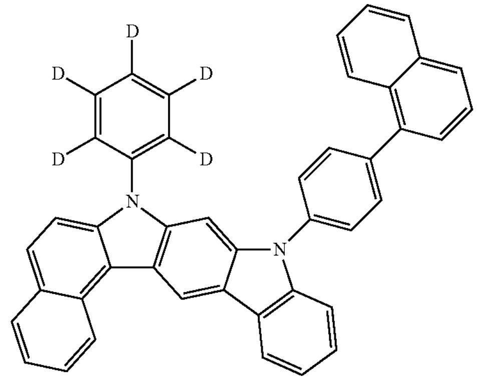

The present invention may further comprise a light efficiency enhancing layer formed on at least one surface of the first electrode and the second electrode, the surface being opposite to the organic material layer.

Also, the organic material layer may include 2 or more stacks comprising a hole transport layer, an emitting layer, and an electron transport layer sequentially formed on the anode, and may further comprise a charge generation layer formed between the 2 or more stacks.

In another aspect, the present invention also provides an electronic device comprising a display device comprising the organic electronic element; and a control unit for driving the display device; Here, the organic electronic element is at least one of an OLED, an organic solar cell, an organic photo conductor, an organic transistor (organic TFT) and an element for monochromic or white illumination.

Hereinafter, Synthesis examples of compounds represented by Formula according to the present invention and examples of manufacturing an organic electronic element will be described in detail with examples, but the present invention is not limited to the following examples.

Synthesis Example 1

The compound (final products) represented by Formula 1 according to the present invention is synthesized by reacting Sub 1 and Sub 2 as shown in Reaction Scheme 1, but is not limited thereto.

<Reaction Scheme 1>

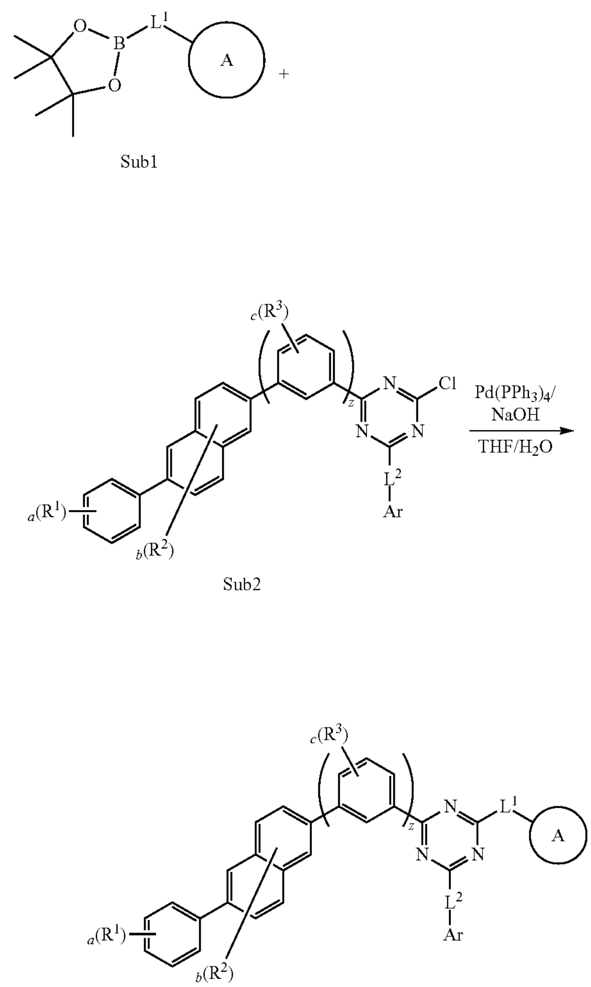

Final Products

I. The compound belonging to Sub 1 may be the following compounds, but is not limited thereto, and Table 1 shows the FD-MS (Field Desorption-Mass Spectrometry) values of the compounds belonging to Sub 1.

Sub1-1

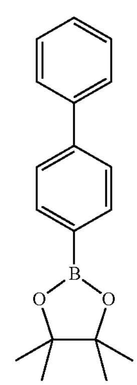

-continued
Sub1-2
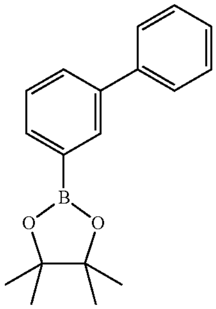
Sub1-3
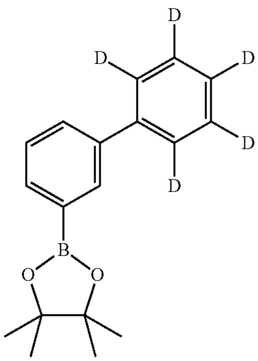
Sub1-4
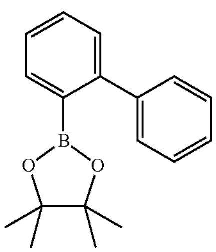
Sub1-5
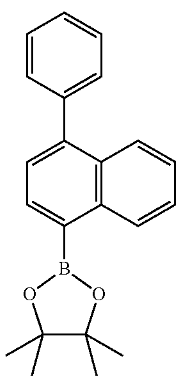
Sub1-6
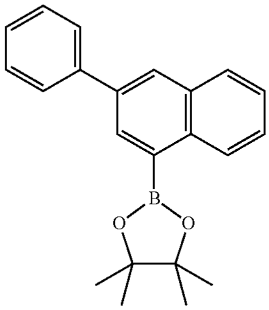
-continued
Sub1-7
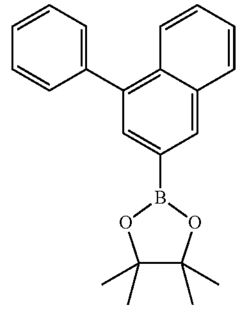
Sub1-8
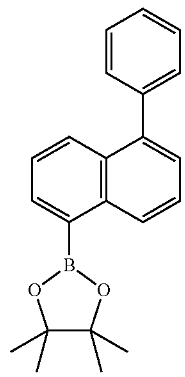
Sub1-9
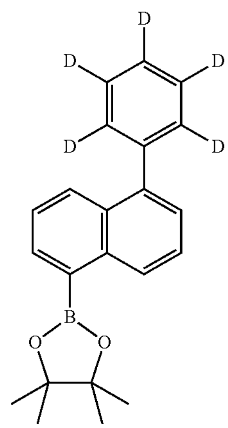
Sub1-10
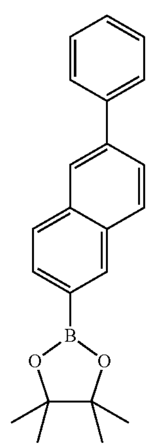

-continued
Sub1-11
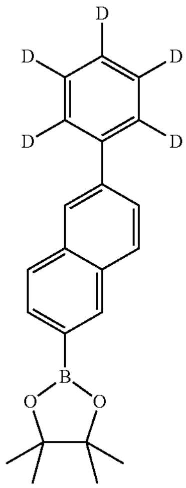
Sub1-12
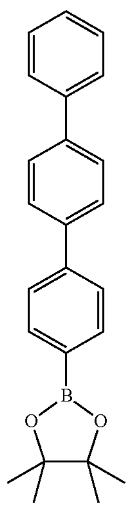
Sub1-13
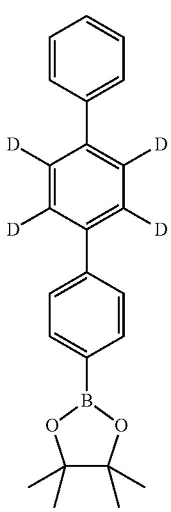
-continued
Sub1-14
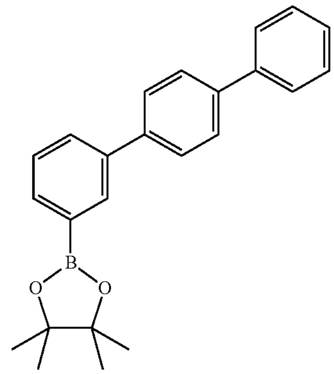
Sub1-15
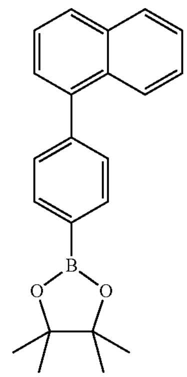
Sub1-16
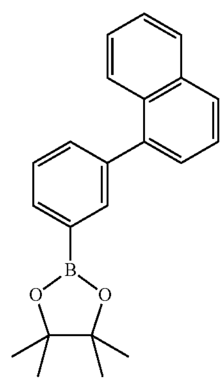
Sub1-17
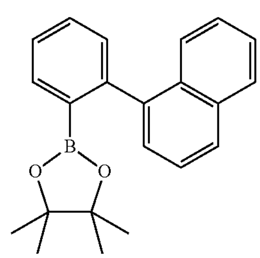

-continued
Sub1-18
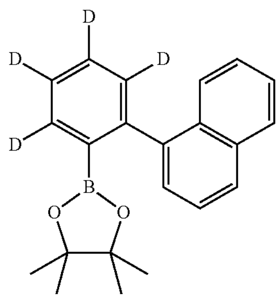
Sub1-19
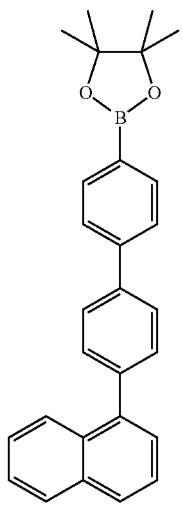
Sub1-20
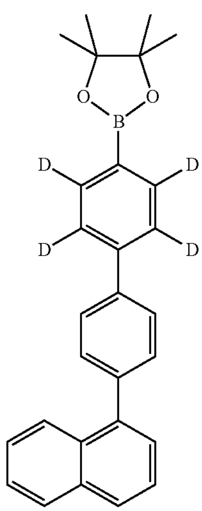
-continued
Sub1-21
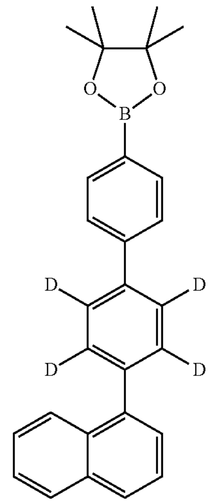
Sub1-22
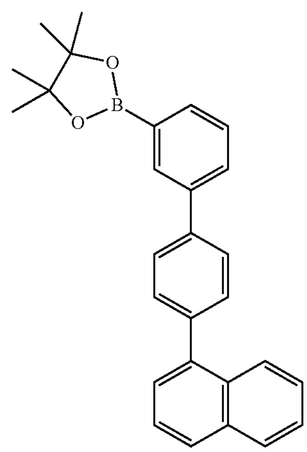
Sub1-23
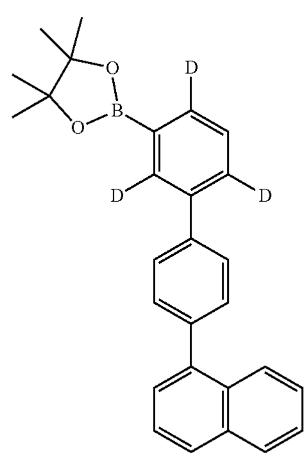

-continued

Sub1-24

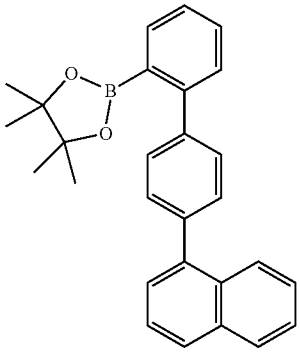

Sub1-25

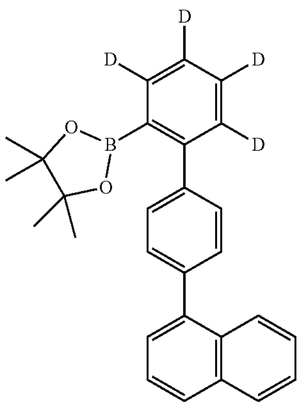

TABLE 1

| compound | FD-MS |
|---|---|
| Sub1-1 | m/z = 280.16($C_{18}H_{21}BO_2$ = 280.17) |
| Sub1-2 | m/z = 280.16($C_{18}H_{21}BO_2$ = 280.17) |
| Sub1-3 | m/z = 285.19($C_{18}H_{16}D_5BO_2$ = 285.2) |
| Sub1-4 | m/z = 280.16($C_{18}H_{21}BO_2$ = 280.17) |
| Sub1-5 | m/z = 330.18($C_{22}H_{23}BO_2$ = 330.23) |
| Sub1-6 | m/z = 330.18($C_{22}H_{23}BO_2$ = 330.23) |
| Sub1-7 | m/z = 330.18($C_{22}H_{23}BO_2$ = 330.23) |
| Sub1-8 | m/z = 330.18($C_{22}H_{23}BO_2$ = 330.23) |
| Sub1-9 | m/z = 335.21($C_{22}H_{18}D_5BO_2$ = 335.26) |
| Sub1-10 | m/z = 330.18($C_{22}H_{23}BO_2$ = 330.23) |
| Sub1-11 | m/z = 335.21($C_{22}H_{18}D_5BO_2$ = 335.26) |
| Sub1-12 | m/z = 356.19($C_{24}H_{25}BO_2$ = 356.27) |
| Sub1-13 | m/z = 360.22($C_{24}H_{21}D_4BO_2$ = 360.3) |
| Sub1-14 | m/z = 356.19($C_{24}H_{25}BO_2$ = 356.27) |
| Sub1-15 | m/z = 330.18($C_{22}H_{23}BO_2$ = 330.23) |
| Sub1-16 | m/z = 330.18($C_{22}H_{23}BO_2$ = 330.23) |
| Sub1-17 | m/z = 330.18($C_{22}H_{23}BO_2$ = 330.23) |
| Sub1-18 | m/z = 334.2($C_{22}H_{19}D_4BO_2$ = 334.26) |
| Sub1-19 | m/z = 406.21($C_{28}H_{27}BO_2$ = 406.33) |
| Sub1-20 | m/z = 410.24($C_{28}H_{23}D_4BO_2$ = 410.36) |
| Sub1-21 | m/z = 410.24($C_{28}H_{23}D_4BO_2$ = 410.36) |
| Sub1-22 | m/z = 406.21($C_{28}H_{27}BO_2$ = 406.33) |
| Sub1-23 | m/z = 409.23($C_{28}H_{24}D_3BO_2$ = 409.35) |
| Sub1-24 | m/z = 406.21($C_{28}H_{27}BO_2$ = 406.33) |
| Sub1-25 | m/z = 410.24($C_{28}H_{23}D_4BO_2$ = 410.36) |

II. Synthesis of Sub 2

Sub 2 of Reaction Scheme 1 may be synthesized by the reaction pathway of Reaction Scheme 2, but is not limited thereto.

<Reaction Scheme 2>

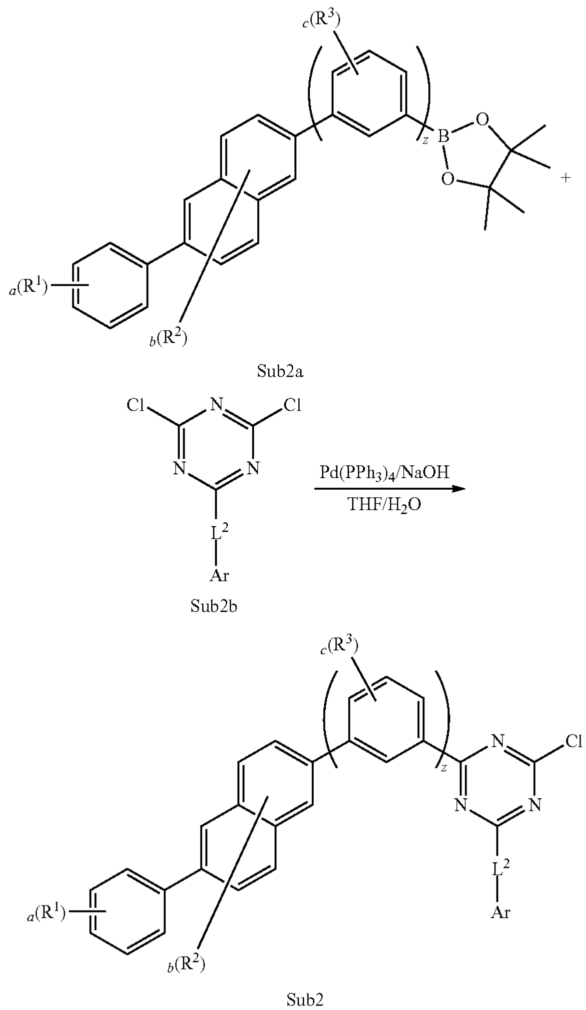

1. Synthesis Example of Sub 2-1

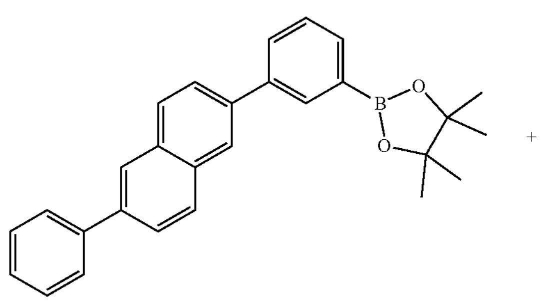

Sub2a-1

-continued

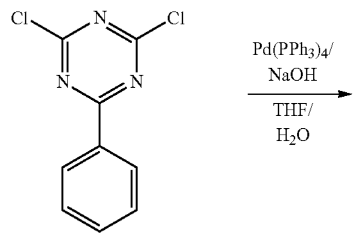

Sub2b-1

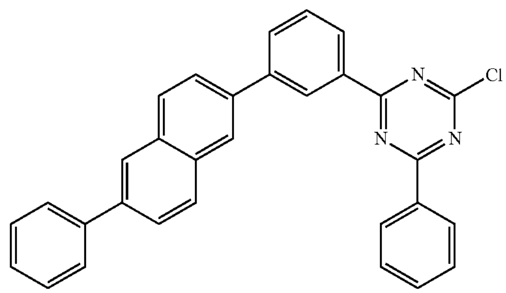

Sub2-1

After dissolving Sus2b-1 (13.9 g, 61.5 mmol) in THF (Tetrahydrofuran) (310 mL) in a round bottom flask, Sub2a-1 (25.0 g, 61.5 mmol), NaOH (7.4 g, 184.6 mmol), $Pd(PPh_3)_4$ (4.27 g, 3.69 mmol) and Water (155 mL) were added and stirred at 80° C. When the reaction was completed, the reactant was extracted with $CH_2Cl_2$ and water, the organic layer was dried over $MgSO_4$ and concentrated. Afterwards, the produced compound was recrystallized by applying a silica gel column to obtain 21.5 g of product (yield 74.5%).

2. Synthesis Example of Sub 2-2

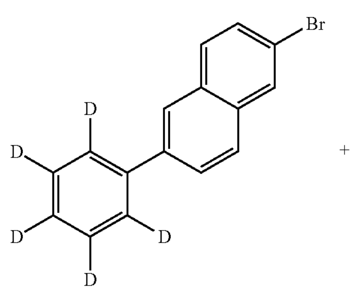

Sub2c-2

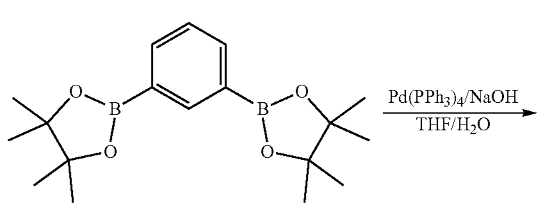

Sub2d-2

-continued

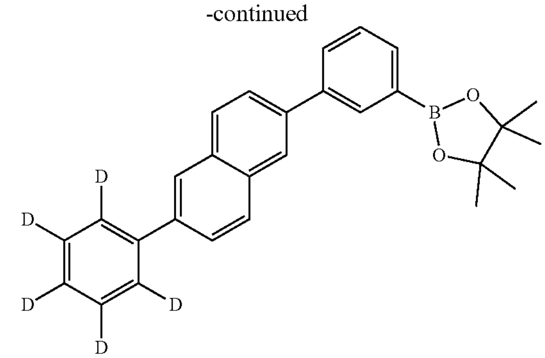

Sub2a-2

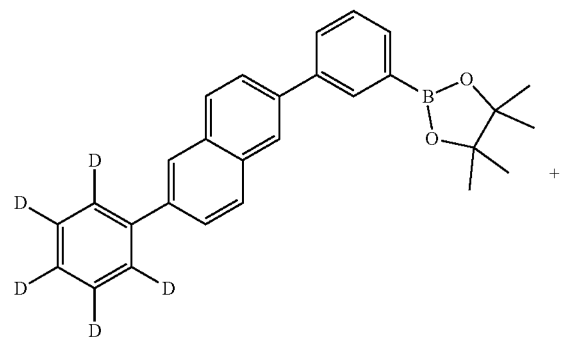

Sub2a-2

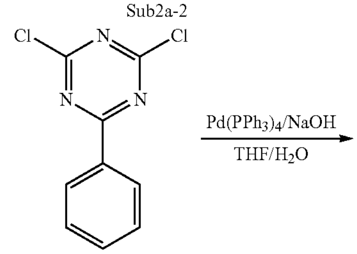

Sub2b-1

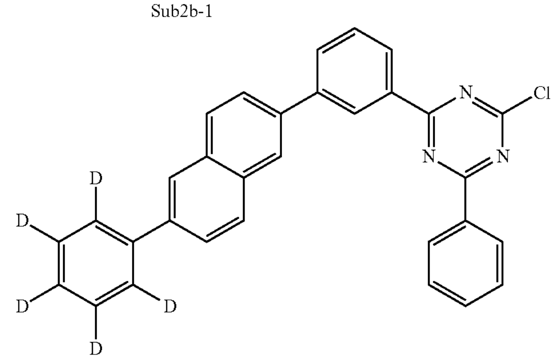

Sub2-2

(1) Synthesis Example of Sub2a-2

After dissolving Sub2d-2 (22.9 g, 69.4 mmol) in THF (350 mL) in a round bottom flask, Sub2c-2 (20.0 g, 69.4 mmol), NaOH (8.3 g, 208.2 mmol), $Pd(PPh_3)_4$ (4.81 g, 4.16 mmol), Water (175 mL) were added and 20.4 g of product (yield 71.4%) was obtained using the above synthesis method of Sub2-1.

(2) Synthesis Example of Sub2-2

After dissolving Sub2b-1 (11.2 g, 49.5 mmol) in THF (250 mL) in a round bottom flask, Sub2a-2 (20.4 g, 49.5 mmol), NaOH (5.9 g, 148.6 mmol), $Pd(PPh_3)_4$ (3.44 g, 2.97 mmol), Water (125 mL) were added and 16.9 g of product (yield 71.7%) was obtained using the above synthesis method of Sub2-1.

3. Synthesis Example of Sub 2-9

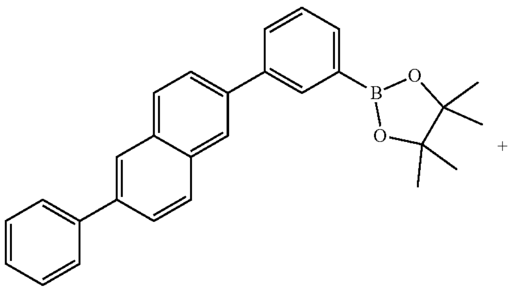

Sub2a-1

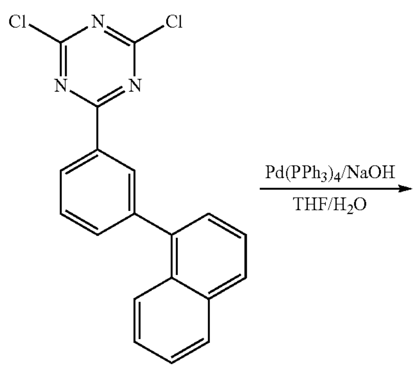

Sub2b-9

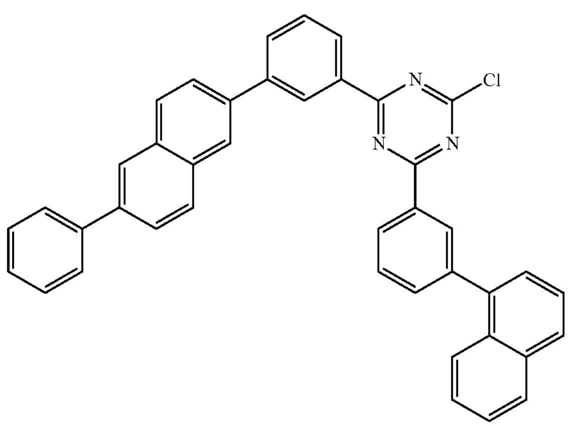

Sub2-9

After dissolving Sub2b-9 (13.0 g, 36.9 mmol) in THF (185 mL) in a round bottom flask, Sub2a-1 (15.0 g, 36.9 mmol), NaOH (4.4 g, 110.7 mmol), $Pd(PPh_3)_4$ (2.56 g, 2.21 mmol), Water (92 mL) were added and 16.1 g of product (yield 73.3%) was obtained using the above synthesis method of Sub2-1.

4. Synthesis Example of Sub 2-13

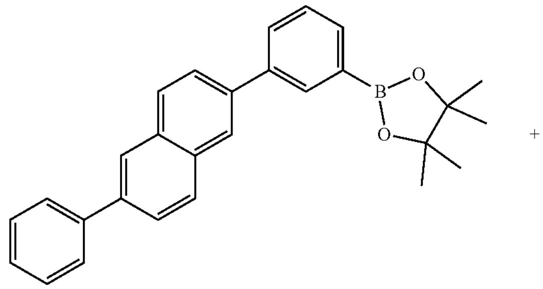

Sub2a-1

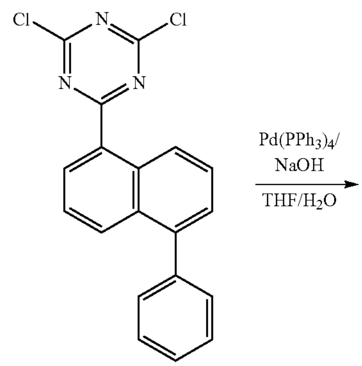

Sub2b-13

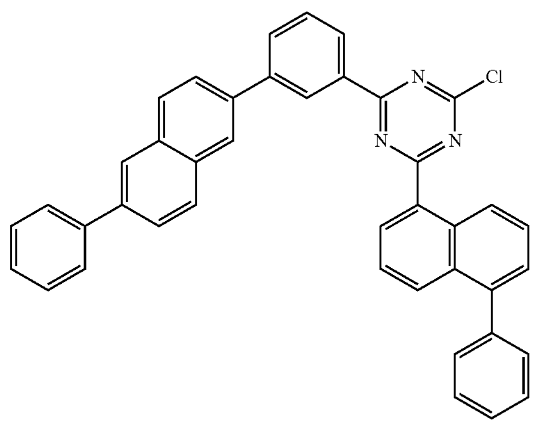

Sub2-13

After dissolving Sub2b-13 (13.0 g, 36.9 mmol) in THF (185 mL) in a round bottom flask, Sub2a-1 (15.0 g, 36.9 mmol), NaOH (4.4 g, 110.7 mmol), $Pd(PPh_3)_4$ (2.56 g, 2.21 mmol), Water (92 mL) were added and 16.0 g of product (yield 72.7%) was obtained using the above synthesis method of Sub2-1.

5. Synthesis Example of Sub 2-20
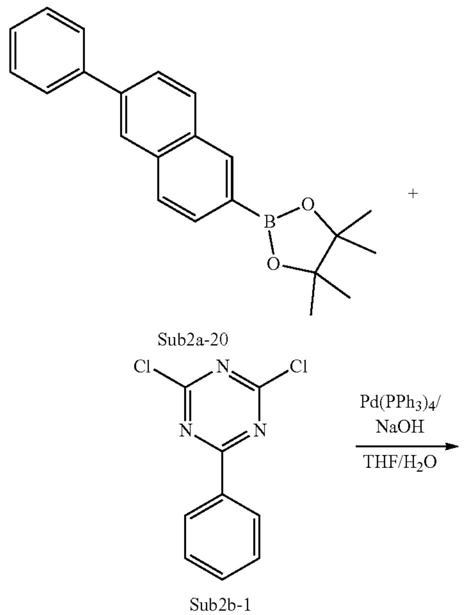
-continued
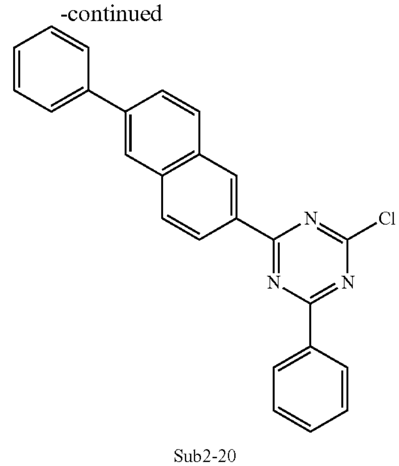
After dissolving Sub2b-1 (17.1 g, 75.7 mmol) in THF (380 mL) in a round bottom flask, Sub2a-20 (25.0 g, 75.7 mmol), NaOH (9.1 g, 227.1 mmol), $Pd(PPh_3)_4$ (5.25 g, 4.54 mmol), Water (190 mL) were added and 21.5 g of product (yield 72.1%) was obtained using the above synthesis method of Sub2-1.
6. Synthesis Example of Sub 2-36
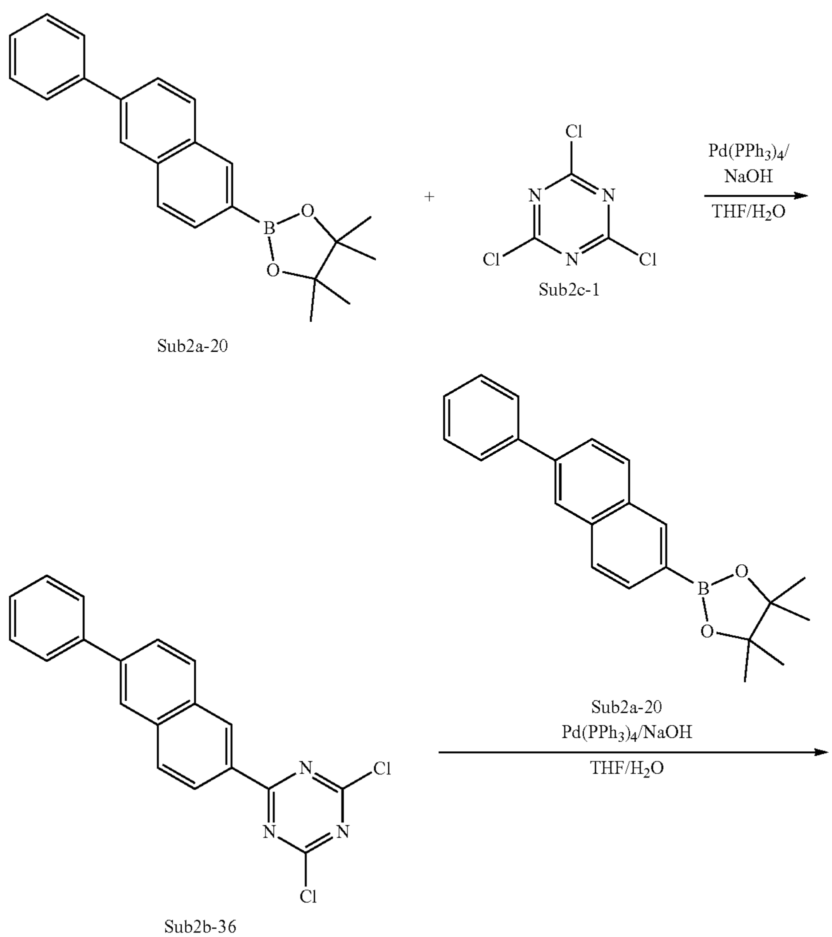

-continued

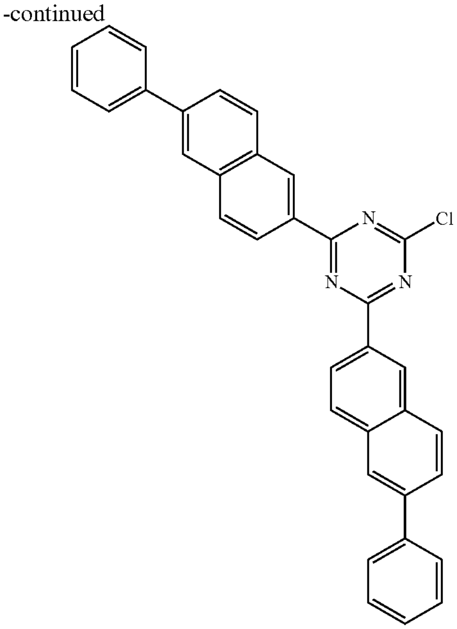

Sub2-36

(1) Synthesis Example of Sub2b-36

After dissolving Sub2c-1 (8.4 g, 45.4 mmol) in THF (230 mL) in a round bottom flask, Sub2a-20 (15.0 g, 45.4 mmol), NaOH (5.5 g, 136.3 mmol), $Pd(PPh_3)_4$ (3.15 g, 2.73 mmol), Water (115 mL) were added and 10.2 g of product (yield 63.7%) was obtained using the above synthesis method of Sub2-1.

(2) Synthesis Example of Sub2-36

After dissolving Sub2b-36 (10.2 g, 28.9 mmol) in THF (145 mL) in a round bottom flask, Sub2a-20 (9.6 g, 28.9 mmol), NaOH (3.5 g, 86.8 mmol), $Pd(PPh_3)_4$ (2.01 g, 1.74 mmol), Water (72 mL) were added and 10.7 g of product (yield 71.0%) was obtained using the above synthesis method of Sub2-1.

7. Synthesis Example of Sub 2-39

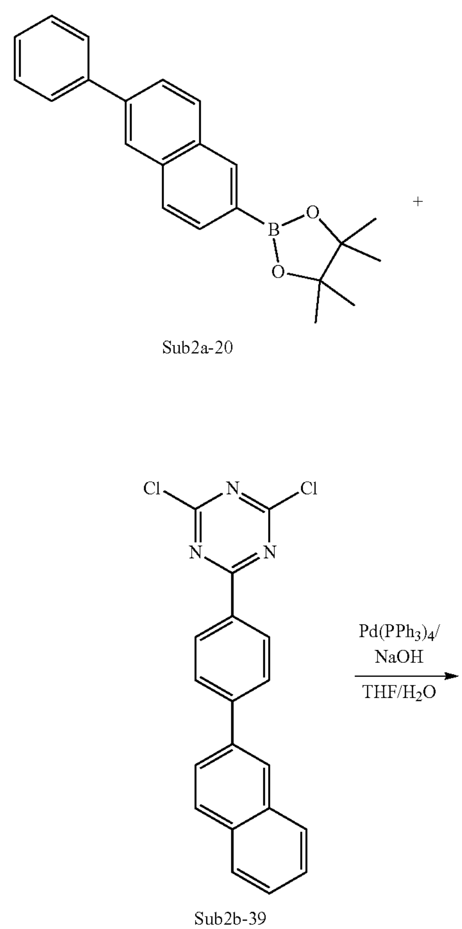

-continued

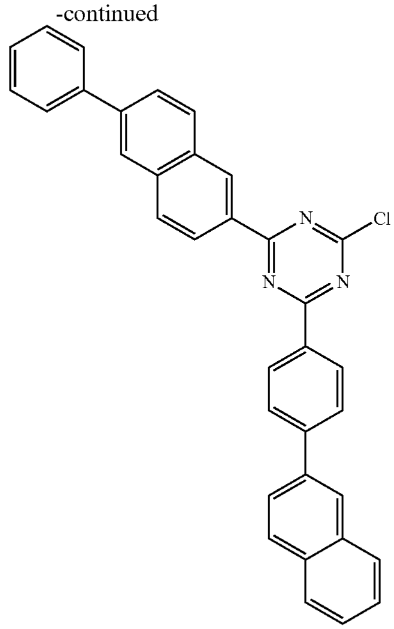

Sub2-39

After dissolving Sub2b-39 (16.0 g, 45.4 mmol) in THF (230 mL) in a round bottom flask, Sub2a-20 (15.0 g, 45.4 mmol), NaOH (5.5 g, 136.3 mmol), $Pd(PPh_3)_4$ (3.15 g, 2.73 mmol), Water (115 mL) were added and 17.1 g of product (yield 72.6%) was obtained using the above synthesis method of Sub2-1.

8. Synthesis Example of Sub 2-50

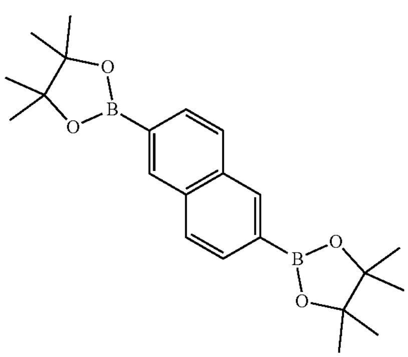

Sub2c-50

+

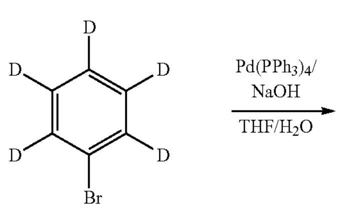

Sub2e-50

-continued

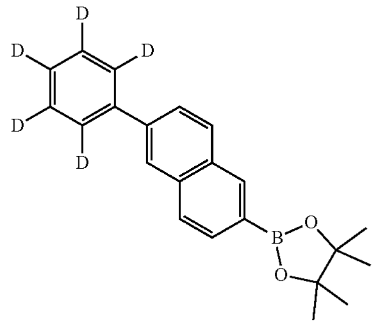

Sub2a-50

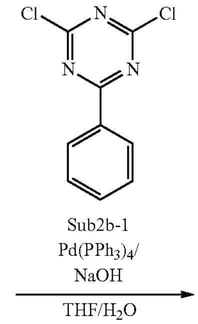

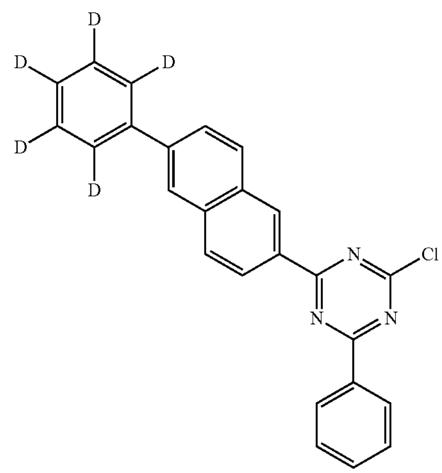

Sub2-50

(1) Synthesis Example of Sub2a-50

After dissolving Sub2e-50 (10.7 g, 65.8 mmol) in THF (330 mL) in a round bottom flask, Sub2c-50 (25.0 g, 65.8 mmol), NaOH (7.9 g, 197.3 mmol), $Pd(PPh_3)_4$ (4.56 g, 3.95 mmol), Water (165 mL) were added and 17.9 g of product (yield 81.1%) was obtained using the above synthesis method of Sub2-1.

(2) Synthesis Example of Sub2-50

After dissolving Sub2b-1 (12.1 g, 53.3 mmol) in THF (270 mL) in a round bottom flask, Sub2a-50 (17.9 g, 53.3 mmol), NaOH (6.4 g, 160.0 mmol), $Pd(PPh_3)_4$ (3.70 g, 3.20 mmol), Water (135 mL) were added and 15.8 g of product (yield 74.4%) was obtained using the above synthesis method of Sub2-1.

9. Synthesis Example of Sub 2-54

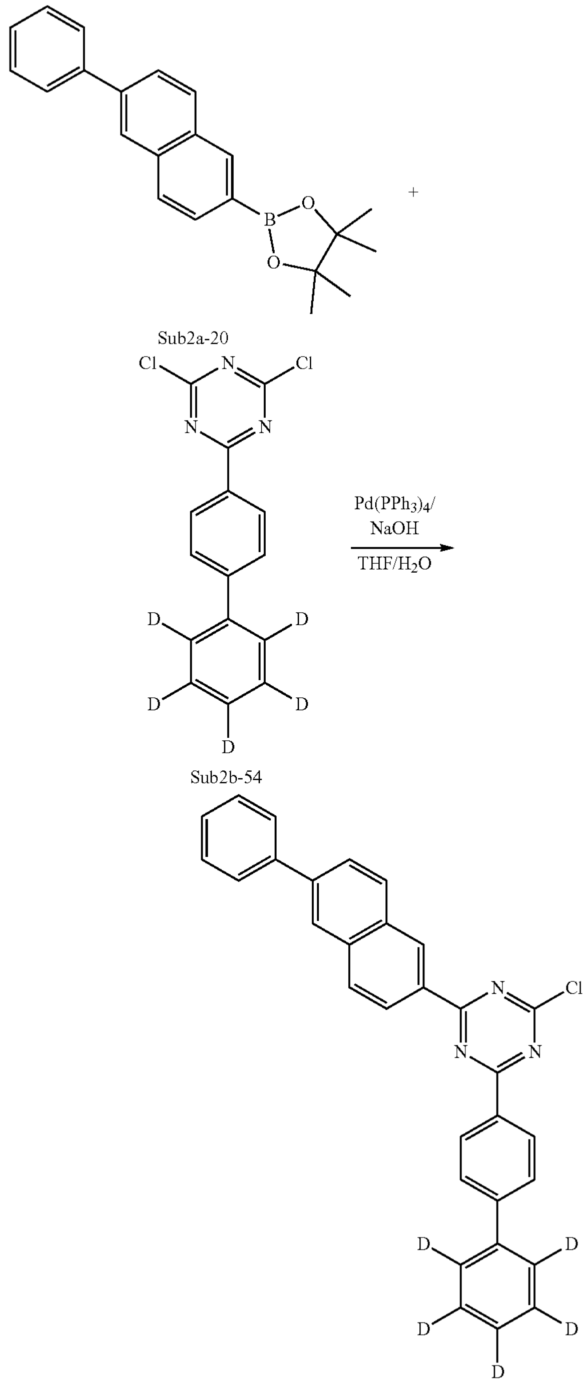

Sub2-54

After dissolving Sub2b-54 (9.3 g, 30.3 mmol) in THF (151 mL) in a round bottom flask, Sub2a-20 (10.0 g, 30.3 mmol), NaOH (3.6 g, 90.8 mmol), $Pd(PPh_3)_4$ (2.10 g, 1.82 mmol), Water (76 mL) were added and 11.0 g of product (yield 72.7%) was obtained using the above synthesis method of Sub2-1.

The compound belonging to Sub 2 may be the following compounds, but is not limited thereto, and Table 2 shows the FD-MS (Field Desorption-Mass Spectrometry) values of the compounds belonging to Sub 2.

Sub2-1

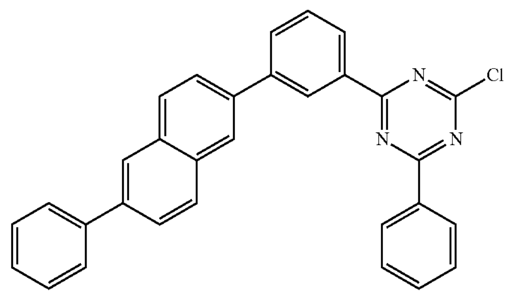

Sub2-2

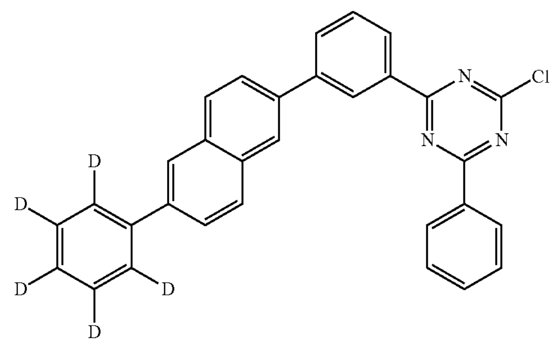

Sub2-3

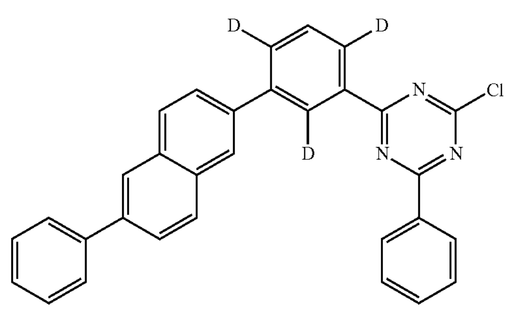

Sub2-4

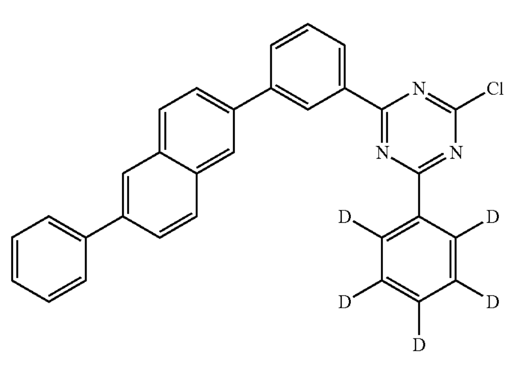

-continued
Sub2-5
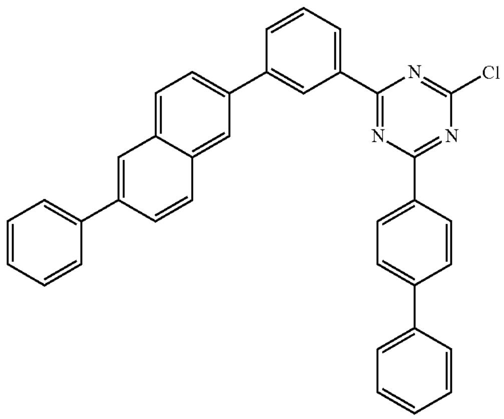
Sub2-6
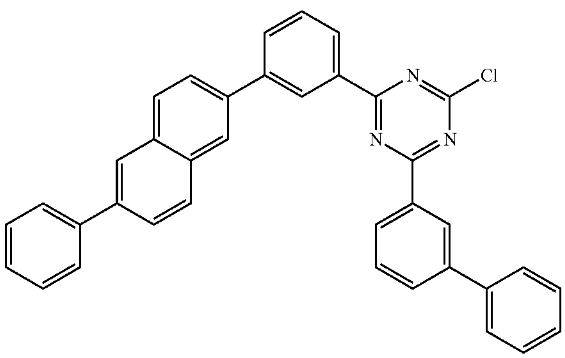
Sub2-7
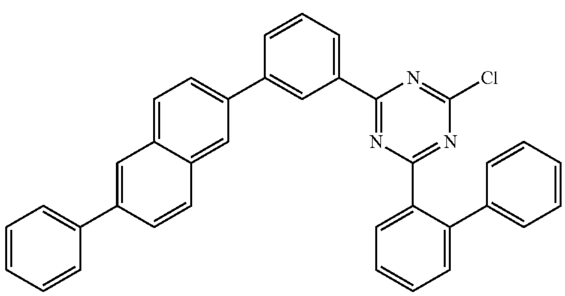
Sub2-8
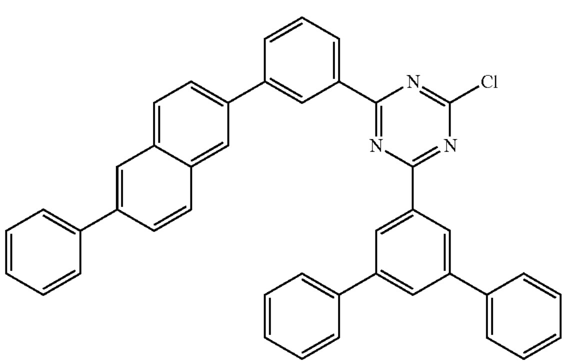
-continued
Sub2-9
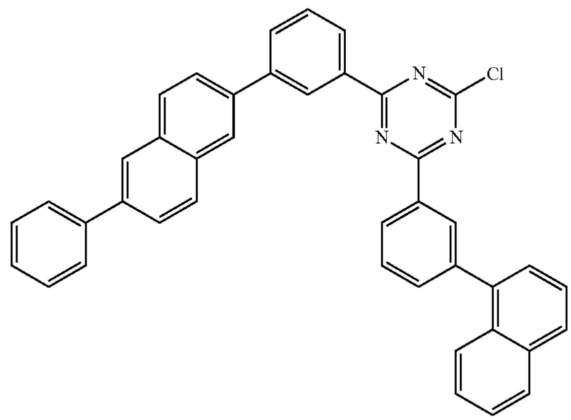
Sub2-10
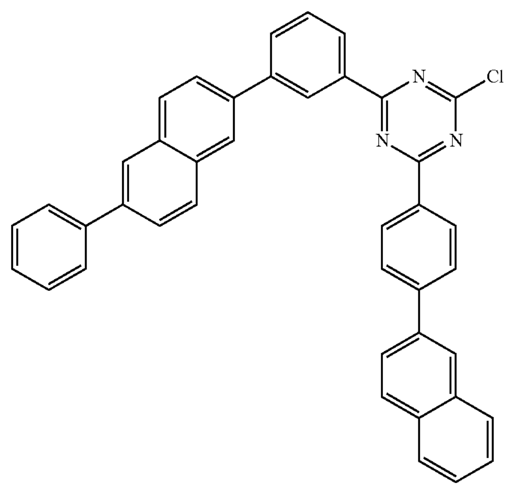
Sub2-11
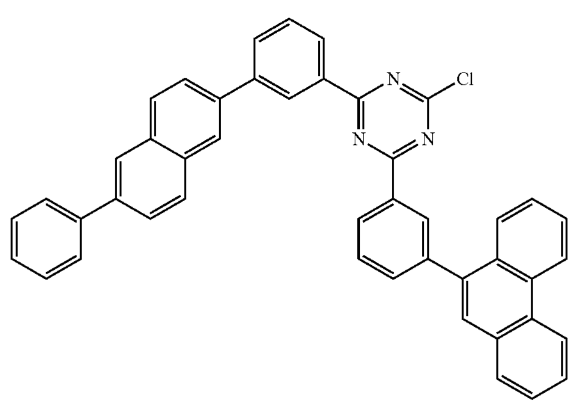

-continued
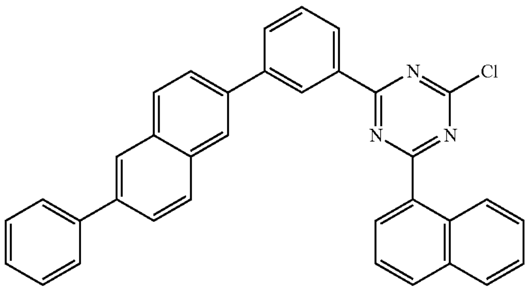
Sub2-12
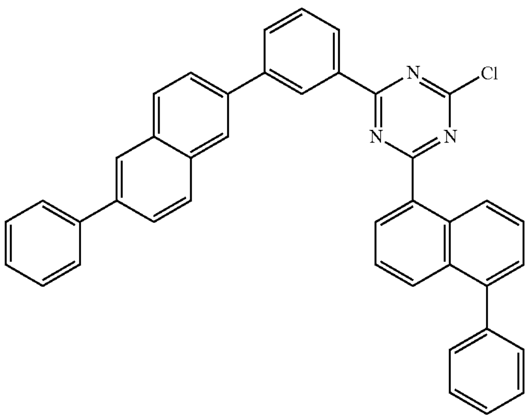
Sub2-13
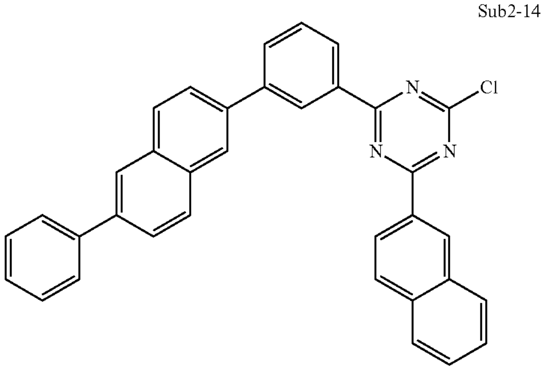
Sub2-14
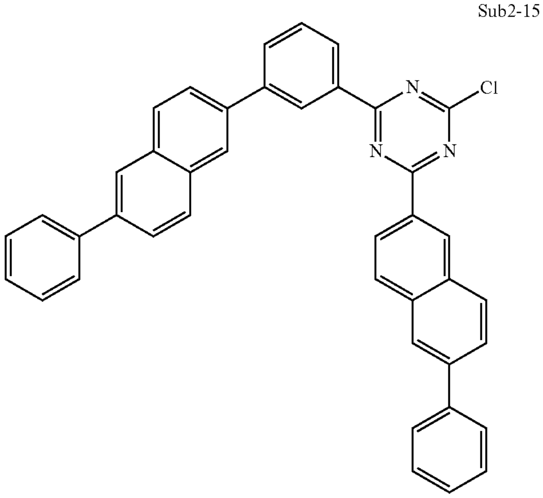
Sub2-15
-continued
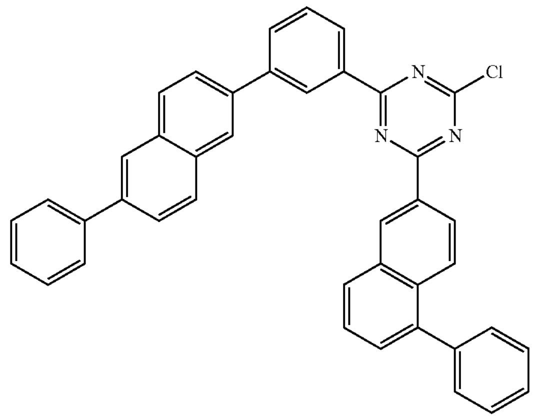
Sub2-16
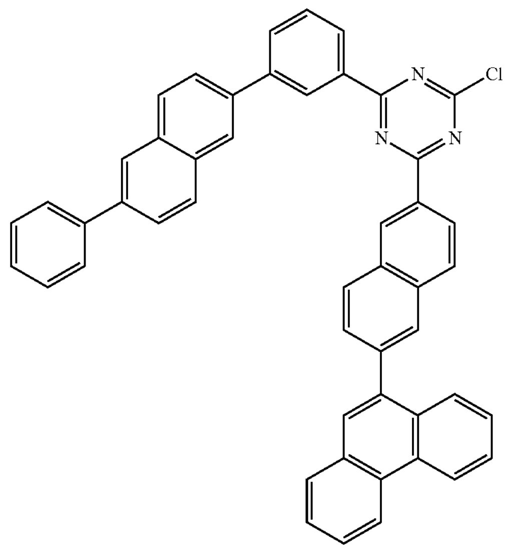
Sub2-17
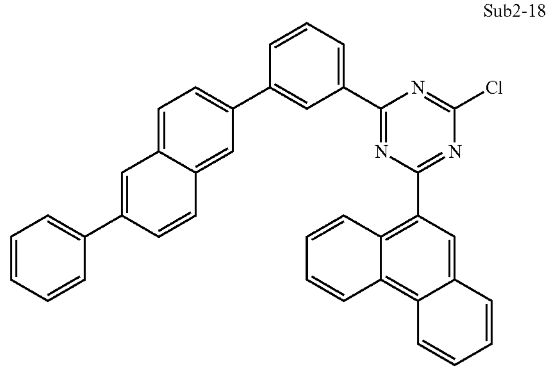
Sub2-18

-continued
Sub2-19
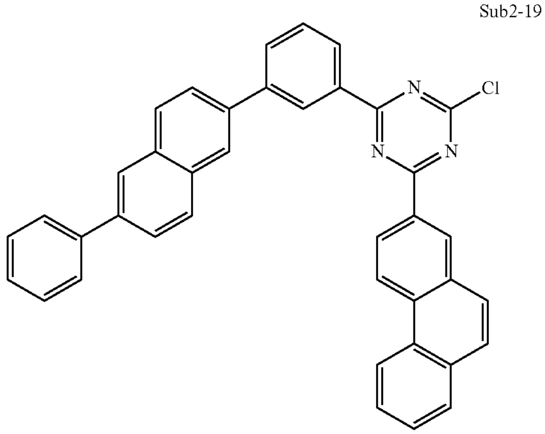
Sub2-20
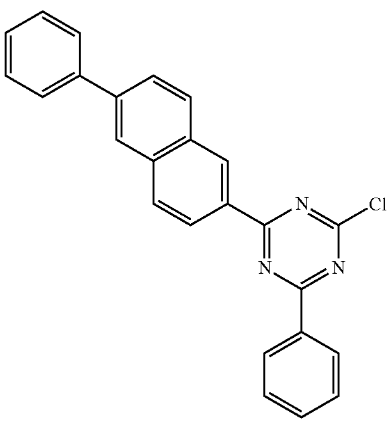
Sub2-21
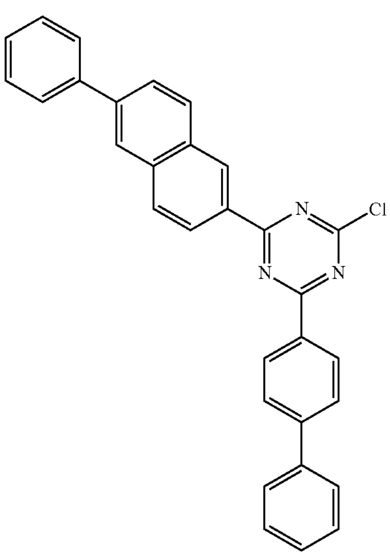
-continued
Sub2-22
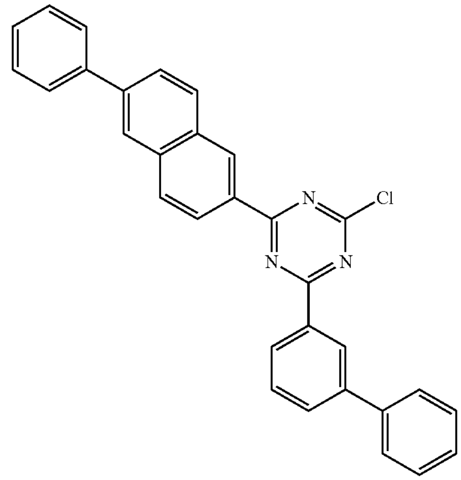
Sub2-23
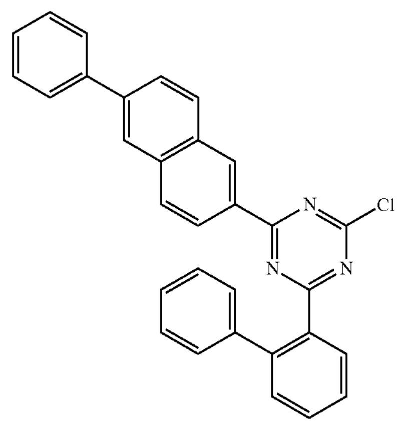
Sub2-24
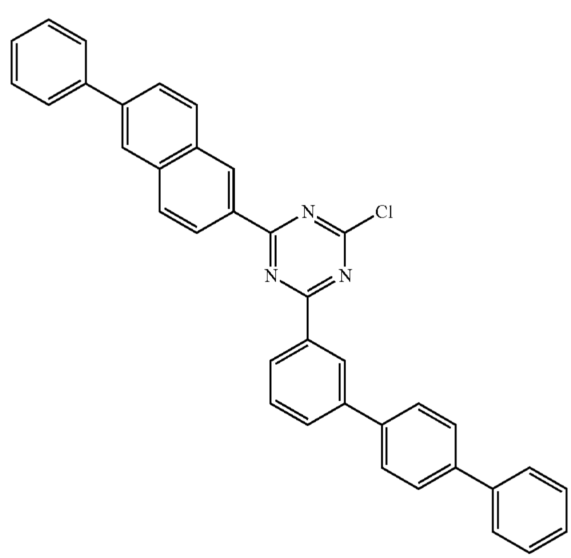

-continued
Sub2-25
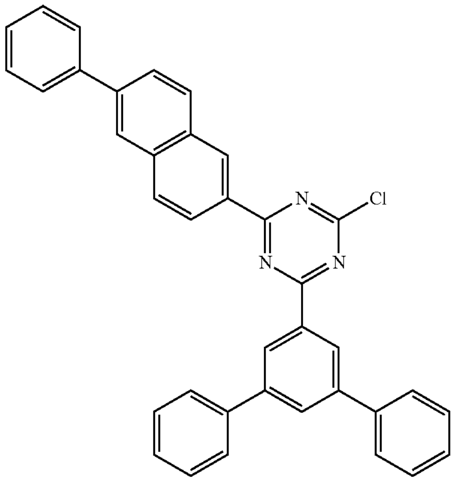
Sub2-26
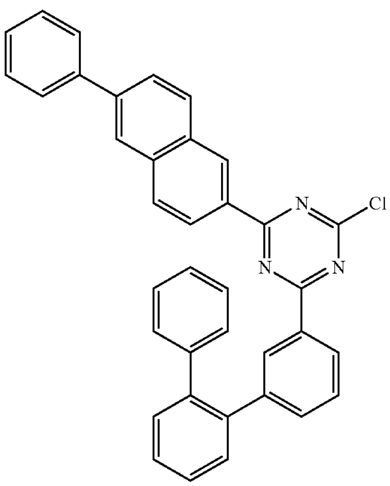
Sub2-27
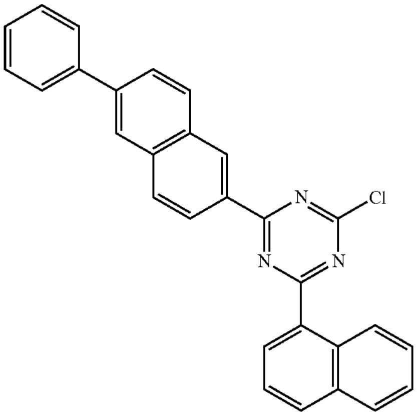
-continued
Sub2-28
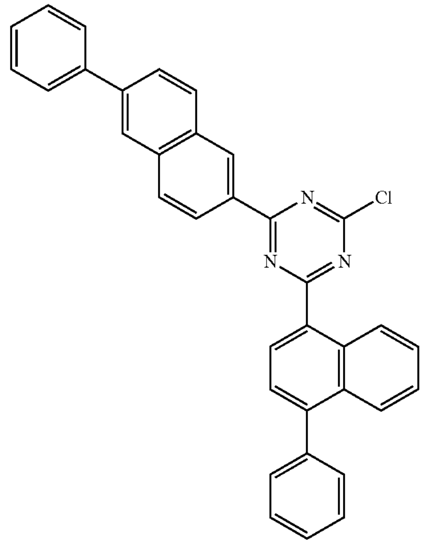
Sub2-29
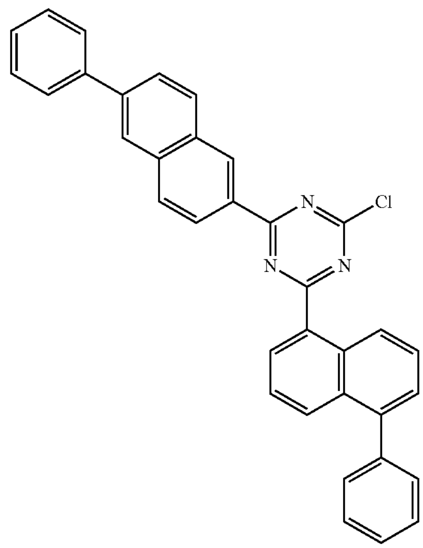
Sub2-30
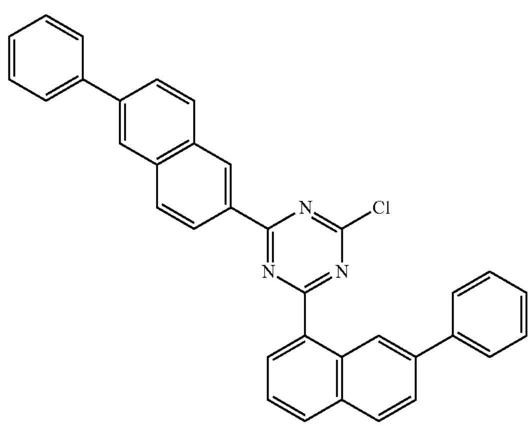

Sub2-31
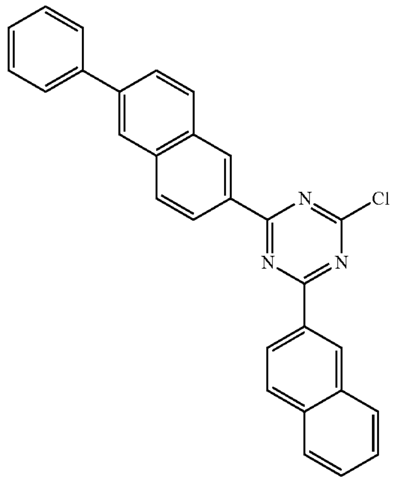
Sub2-32
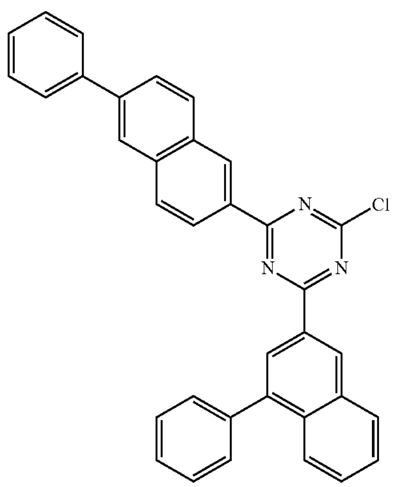
Sub2-33
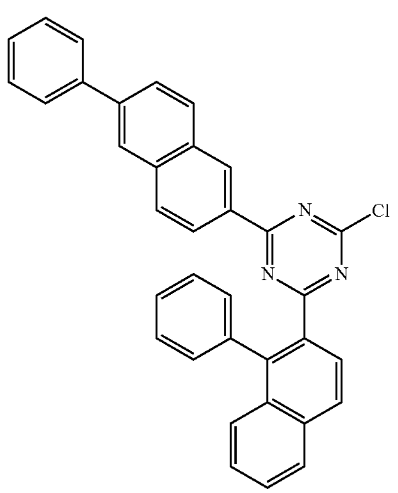
Sub2-34
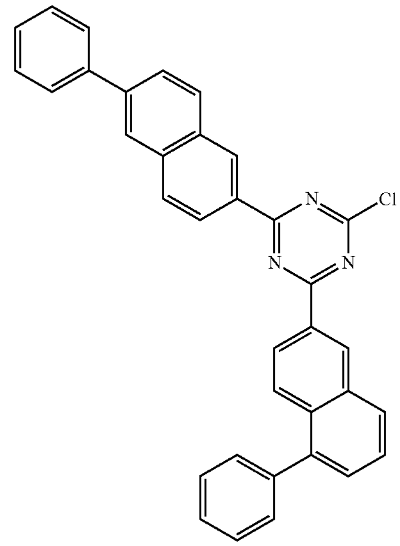
Sub2-35
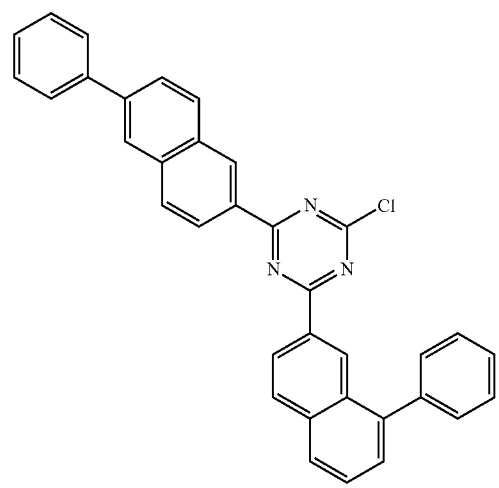
Sub2-36
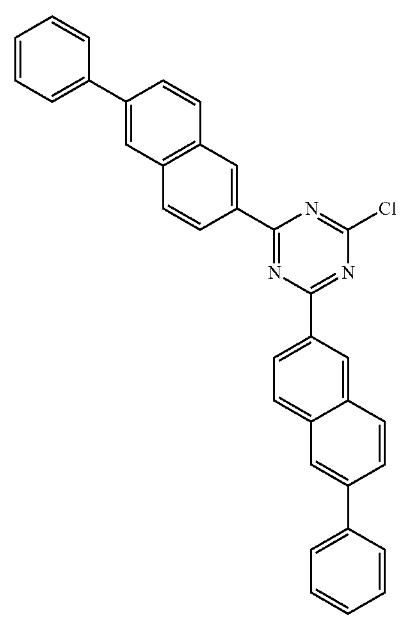

-continued
Sub2-37
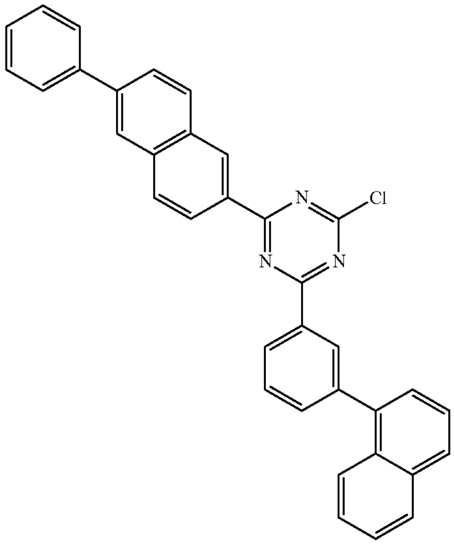
Sub2-38
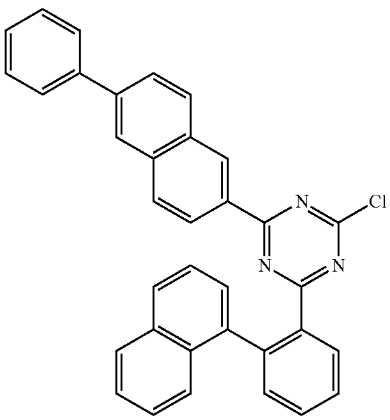
Sub2-39
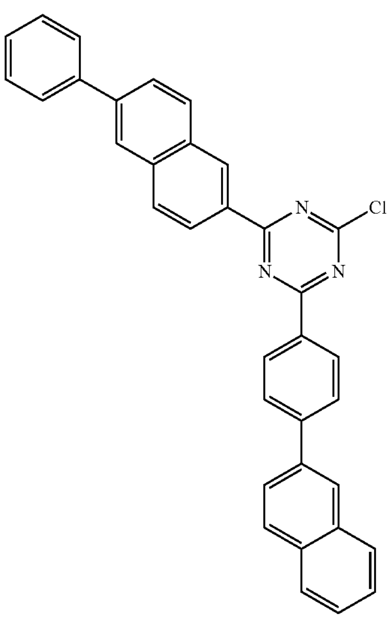
-continued
Sub2-40
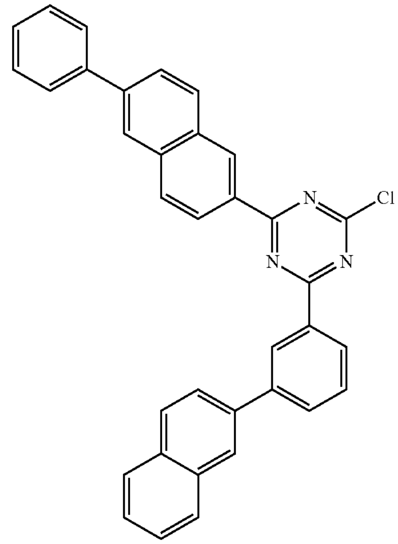
Sub2-41
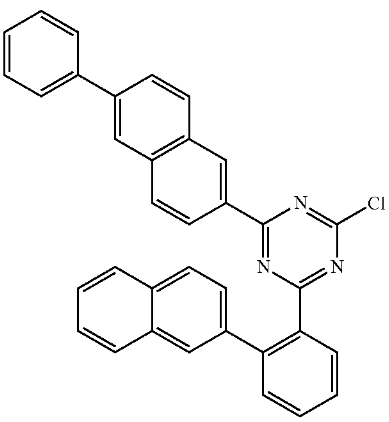
Sub2-42
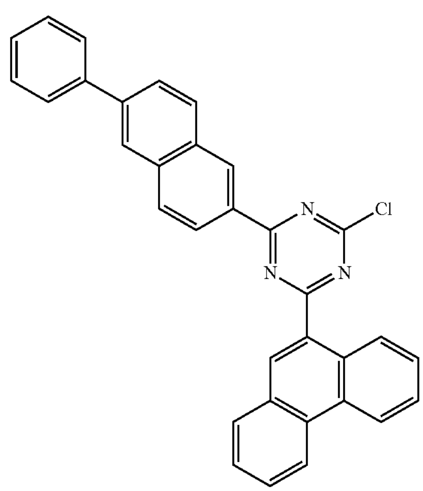

-continued
Sub2-43
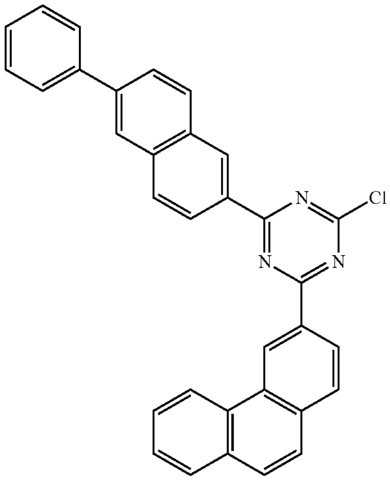
Sub2-44
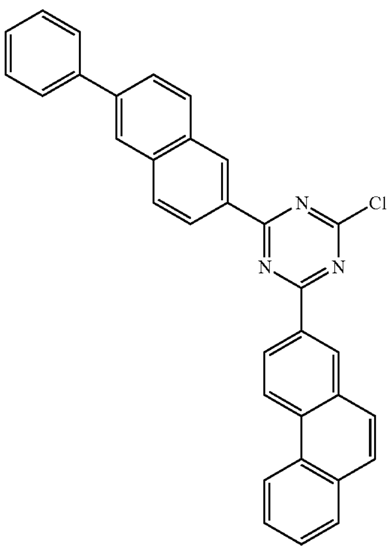
Sub2-45
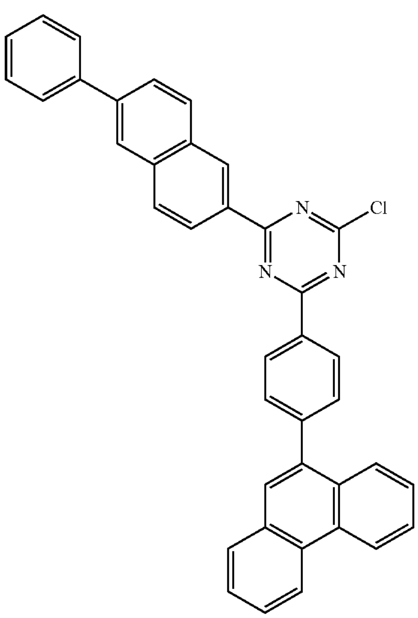
-continued
Sub2-46
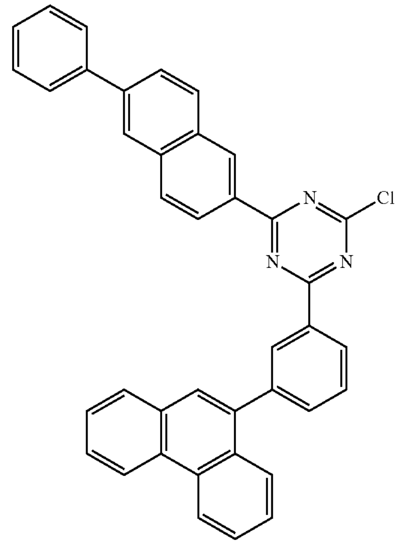
Sub2-47
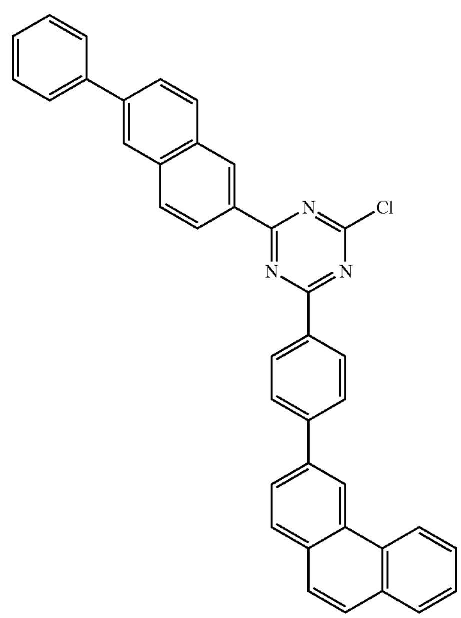

-continued
Sub2-48
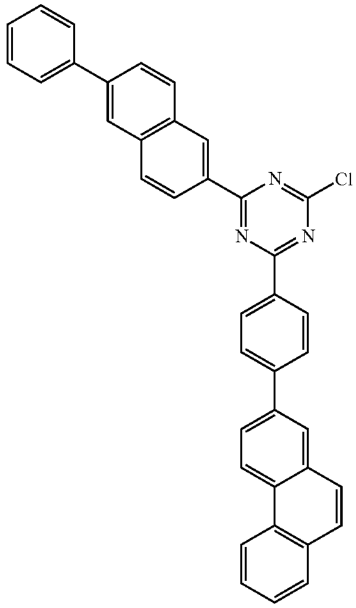
Sub2-49
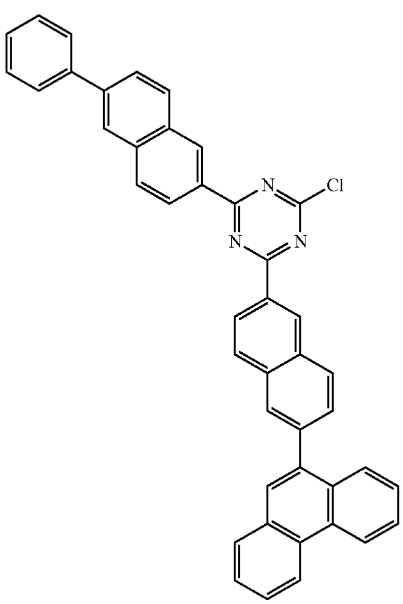
-continued
Sub2-50
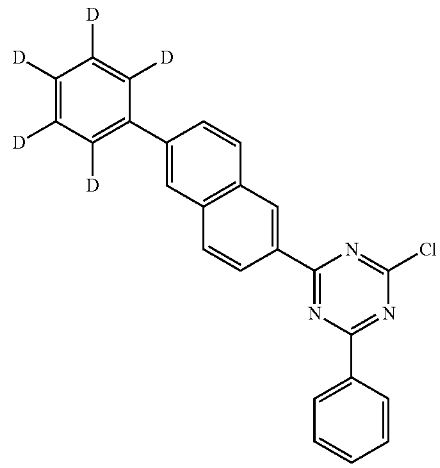
Sub2-51
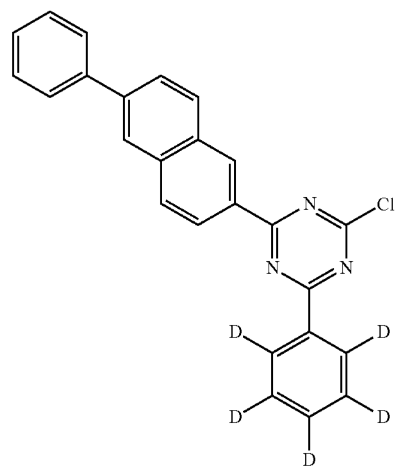
Sub2-52
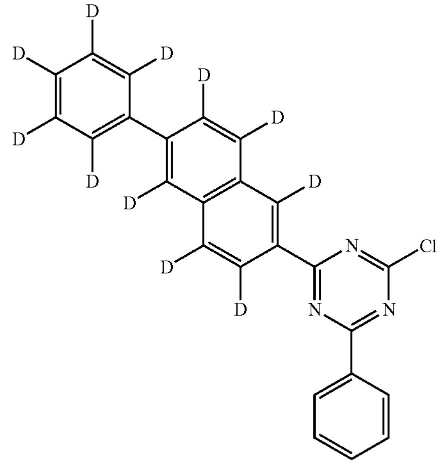

-continued

Sub2-53

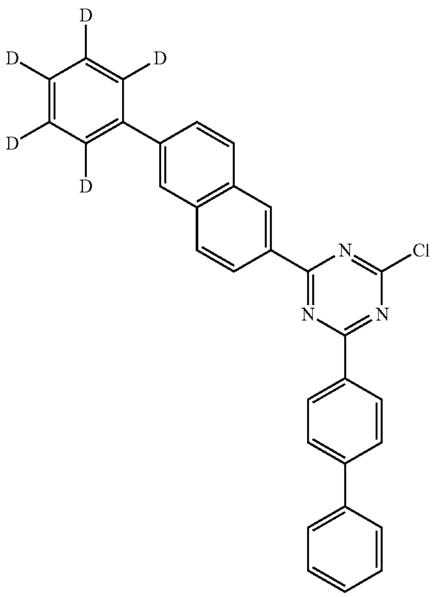

Sub2-54

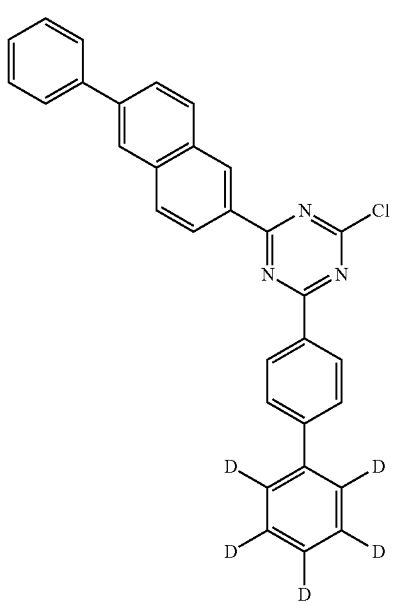

-continued

Sub2-55

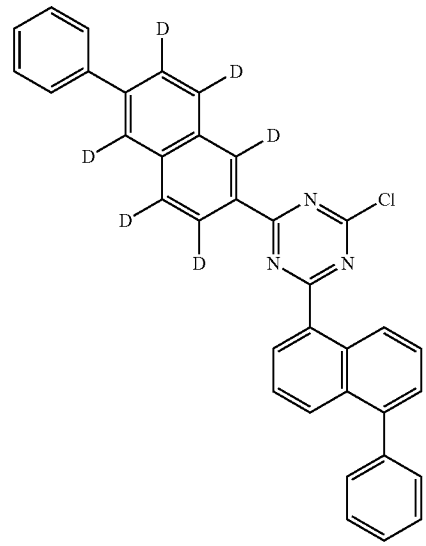

Sub2-56

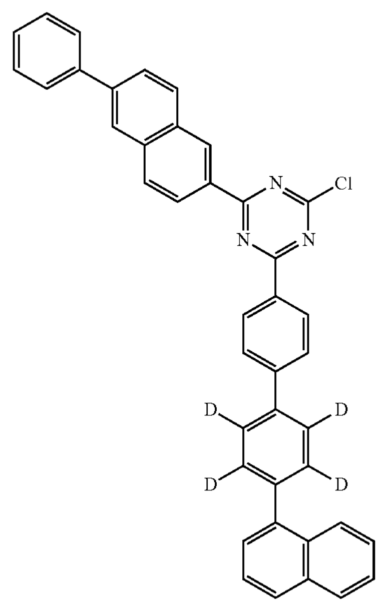

TABLE 2

| compound | FD-MS |
|---|---|
| Sub 2-1 | m/z = 469.13($C_{31}H_{20}ClN_3$ = 469.97) |
| Sub2-2 | m/z = 474.17($C_{31}H_{15}D_5ClN_3$ = 475.00) |
| Sub 2-3 | m/z = 472.15($C_{31}H_{17}D_3ClN_3$ = 472.99) |
| Sub2-4 | m/z = 474.17($C_{31}H_{15}D_5ClN_3$ = 475.00) |
| Sub 2-5 | m/z = 545.17($C_{37}H_{24}ClN_3$ = 546.07) |
| Sub2-6 | m/z = 545.17($C_{37}H_{24}ClN_3$ = 546.07) |
| Sub 2-7 | m/z = 545.17($C_{37}H_{24}ClN_3$ = 546.07) |
| Sub2-8 | m/z = 621.20($C_{43}H_{28}ClN_3$ = 622.17) |
| Sub 2-9 | m/z = 595.18($C_{41}H_{26}ClN_3$ = 596.13) |
| Sub2-10 | m/z = 595.18($C_{41}H_{26}ClN_3$ = 596.13) |
| Sub 2-11 | m/z = 645.20($C_{45}H_{28}ClN_3$ = 646.19) |
| Sub2-12 | m/z = 519.15($C_{35}H_{22}ClN_3$ = 520.03) |
| Sub 2-13 | m/z = 595.18($C_{41}H_{26}ClN_3$ = 596.13) |
| Sub2-14 | m/z = 519.15($C_{35}H_{22}ClN_3$ = 520.03) |
| Sub 2-15 | m/z = 595.18($C_{41}H_{26}ClN_3$ = 596.13) |
| Sub2-16 | m/z = 595.18($C_{41}H_{26}ClN_3$ = 596.13) |
| Sub 2-17 | m/z = 695.21($C_{49}H_{30}ClN_3$ = 696.25) |
| Sub2-18 | m/z = 569.17($C_{39}H_{24}ClN_3$ = 570.09) |

TABLE 2-continued

| compound | FD-MS |
|---|---|
| Sub 2-19 | m/z = 569.17($C_{39}H_{24}ClN_3$ = 570.09) |
| Sub2-20 | m/z = 393.10($C_{25}H_{16}ClN_3$ = 393.87) |
| Sub 2-21 | m/z = 469.13($C_{31}H_{20}ClN_3$ = 469.97) |
| Sub2-22 | m/z = 469.13($C_{31}H_{20}ClN_3$ = 469.97) |
| Sub 2-23 | m/z = 469.13($C_{31}H_{20}ClN_3$ = 469.97) |
| Sub2-24 | m/z = 545.17($C_{37}H_{24}ClN_3$ = 546.07) |
| Sub 2-25 | m/z = 545.17($C_{37}H_{24}ClN_3$ = 546.07) |
| Sub2-26 | m/z = 545.17($C_{37}H_{24}ClN_3$ = 546.07) |
| Sub 2-27 | m/z = 443.12($C_{29}H_{18}ClN_3$ = 443.93) |
| Sub2-28 | m/z = 519.15($C_{35}H_{22}ClN_3$ = 520.03) |
| Sub 2-29 | m/z = 519.15($C_{35}H_{22}ClN_3$ = 520.03) |
| Sub2-30 | m/z = 519.15($C_{35}H_{22}ClN_3$ = 520.03) |
| Sub 2-31 | m/z = 443.12($C_{29}H_{18}ClN_3$ = 443.93) |
| Sub2-32 | m/z = 519.15($C_{35}H_{22}ClN_3$ = 520.03) |
| Sub 2-33 | m/z = 519.15($C_{35}H_{22}ClN_3$ = 520.03) |
| Sub2-34 | m/z = 519.15($C_{35}H_{22}ClN_3$ = 520.03) |
| Sub 2-35 | m/z = 519.15($C_{35}H_{22}ClN_3$ = 520.03) |
| Sub2-36 | m/z = 519.15($C_{35}H_{22}ClN_3$ = 520.03) |
| Sub 2-37 | m/z = 519.15($C_{35}H_{22}ClN_3$ = 520.03) |
| Sub2-38 | m/z = 519.15($C_{35}H_{22}ClN_3$ = 520.03) |
| Sub 2-39 | m/z = 519.15($C_{35}H_{22}ClN_3$ = 520.03) |
| Sub2-40 | m/z = 519.15($C_{35}H_{22}ClN_3$ = 520.03) |
| Sub 2-41 | m/z = 519.15($C_{35}H_{22}ClN_3$ = 520.03) |
| Sub2-42 | m/z = 493.13($C_{33}H_{20}ClN_3$ = 493.99) |
| Sub 2-43 | m/z = 493.13($C_{33}H_{20}ClN_3$ = 493.99) |
| Sub2-44 | m/z = 493.13($C_{33}H_{20}ClN_3$ = 493.99) |
| Sub 2-45 | m/z = 569.17($C_{39}H_{24}ClN_3$ = 570.09) |
| Sub2-46 | m/z = 569.17($C_{39}H_{24}ClN_3$ = 570.09) |
| Sub 2-47 | m/z = 569.17($C_{39}H_{24}ClN_3$ = 570.09) |
| Sub2-48 | m/z = 569.17($C_{39}H_{24}ClN_3$ = 570.09) |
| Sub 2-49 | m/z = 619.18($C_{43}H_{26}ClN_3$ = 620.15) |
| Sub2-50 | m/z = 398.13($C_{25}H_{11}D_5ClN_3$ = 398.90) |
| Sub 2-51 | m/z = 398.13($C_{25}H_{11}D_5ClN_3$ = 398.90) |
| Sub2-52 | m/z = 404.17($C_{25}H_5D_{11}ClN_3$ = 404.94) |
| Sub 2-53 | m/z = 474.17($C_{31}H_{15}D_5ClN_3$ = 475.00) |
| Sub2-54 | m/z = 474.17($C_{31}H_{15}D_5ClN_3$ = 475.00) |
| Sub 2-55 | m/z = 525.19($C_{35}H_{16}D_6ClN_3$ = 526.07) |
| Sub2-56 | m/z = 599.21($C_{41}H_{22}D_4ClN_3$ = 600.15) |

III. Synthesis of Final Product

1. Synthesis Example of P-1

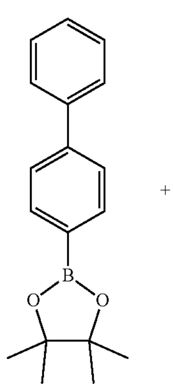

Sub1-1

-continued

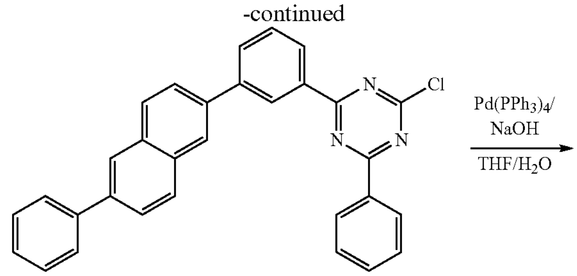

Sub2-1

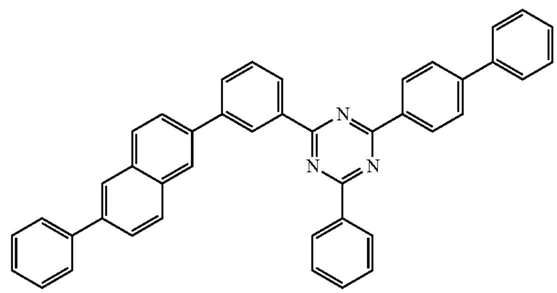

P-1

After dissolving Sus2b-1 (5.0 g, 10.7 mmol) in THF (Tetrahydrofuran) (54 mL) in a round bottom flask, Sub1-1 (3.0 g, 10.7 mmol), NaOH (1.3 g, 32.1 mmol), $Pd(PPh_3)_4$ (0.74 g, 0.64 mmol), Water (27 mL) were added and stirred at 80° C. When the reaction was completed, the reactant was extracted with $CH_2Cl_2$ and water, the organic layer was dried over $MgSO_4$ and concentrated. Afterwards, the produced compound was recrystallized by applying a silica gel column to obtain 4.8 g of product (yield 77%).

2. Synthesis Example of P-8

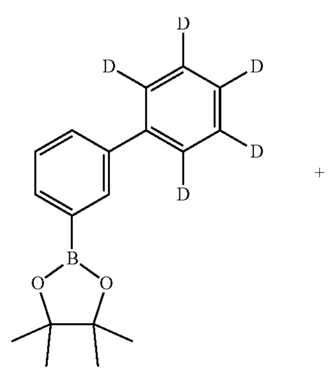

Sub1-3

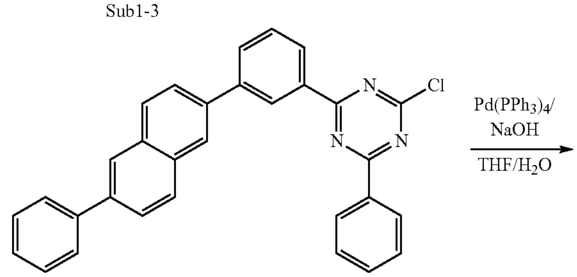

Sub2-1

-continued

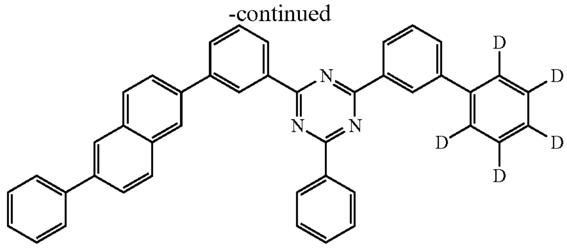

P-8

After dissolving Sub2-1 (4.9 g, 10.5 mmol) in THF (53 mL) in a round bottom flask, Sub1-3 (3.0 g, 10.5 mmol), NaOH (1.3 g, 31.6 mmol), $Pd(PPh_3)_4$ (0.73 g, 0.63 mmol), Water (26 mL) were added and 4.6 g of product (yield 74%) was obtained using the above synthesis method of P-1.

3. Synthesis Example of P-9

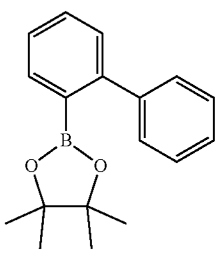

Sub1-4

+

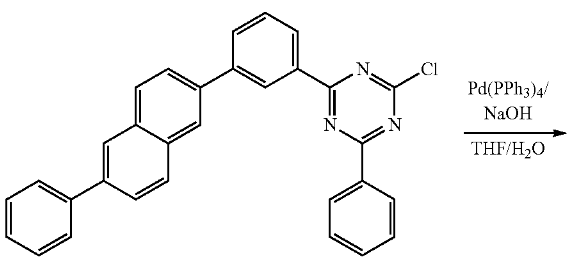

Sub2-1

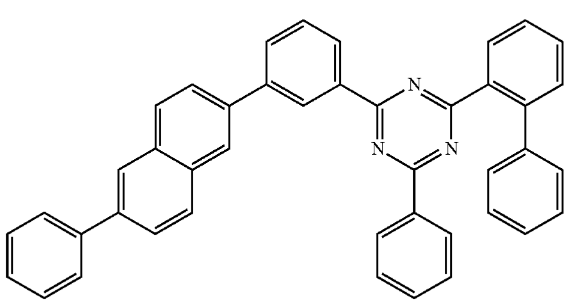

P-9

After dissolving Sub2-1 (5.0 g, 10.7 mmol) in THF (54 mL) in a round bottom flask, Sub1-4 (3.0 g, 10.7 mmol), NaOH (1.3 g, 32.1 mmol), $Pd(PPh_3)_4$ (0.74 g, 0.64 mmol), Water (27 mL) were added and 4.5 g of product (yield 71%) was obtained using the above synthesis method of P-1.

4. Synthesis Example of P-16

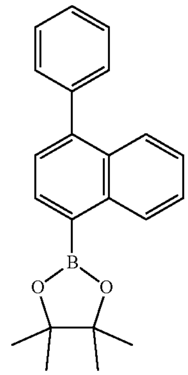

Sub1-5

+

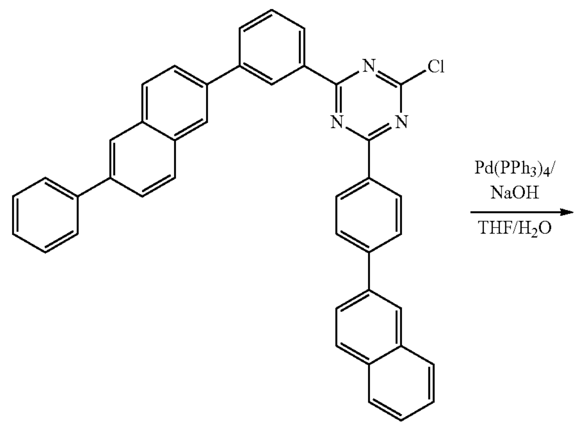

Sub2-10

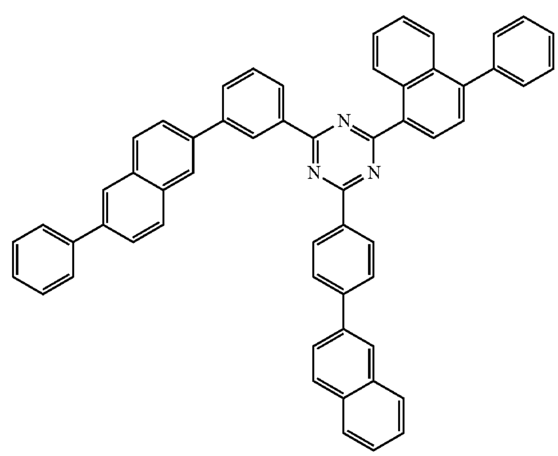

P-16

After dissolving Sub2-10 (5.4 g, 9.1 mmol) in THF (45 mL) in a round bottom flask, Sub1-5 (3.0 g, 9.1 mmol), NaOH (1.1 g, 27.3 mmol), $Pd(PPh_3)_4$ (0.63 g, 0.55 mmol), Water (23 mL) were added and 5.0 g of product (yield 72%) was obtained using the above synthesis method of P-1.

5. Synthesis Example of P-19

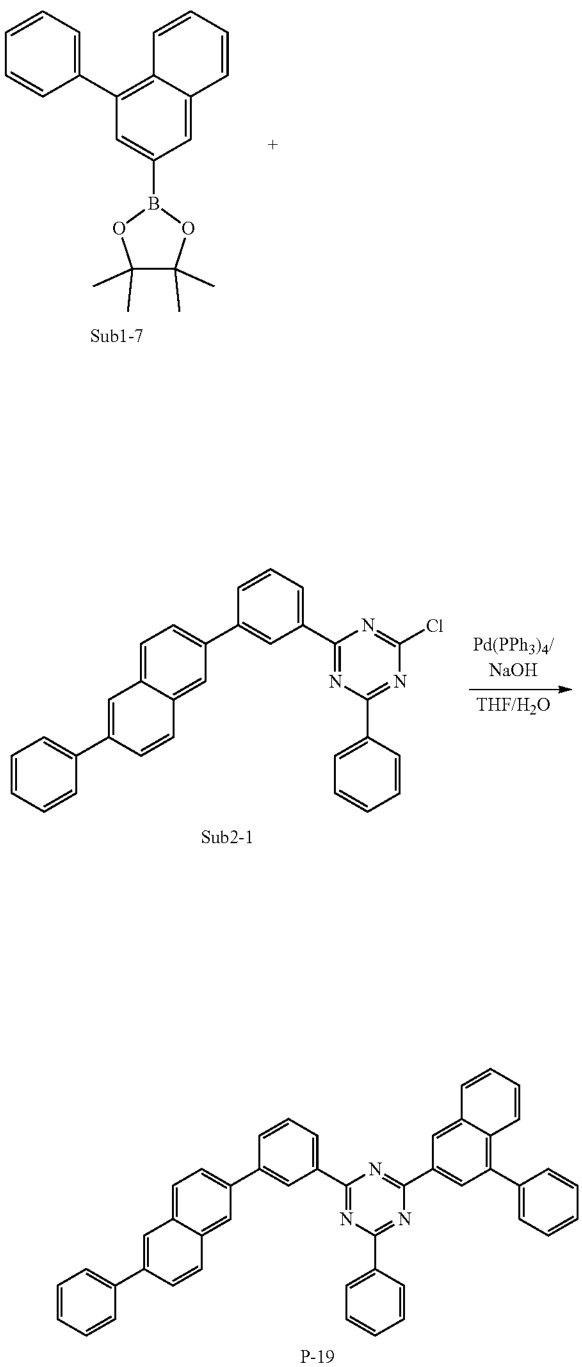

After dissolving Sub2-1 (4.3 g, 9.1 mmol) in THF (45 mL) in a round bottom flask, Sub1-7 (3.0 g, 9.1 mmol), NaOH (1.1 g, 27.3 mmol), $Pd(PPh_3)_4$ (0.63 g, 0.55 mmol), Water (23 mL) were added and 4.3 g of product (yield 75%) was obtained using the above synthesis method of P-1.

6. Synthesis Example of P-22

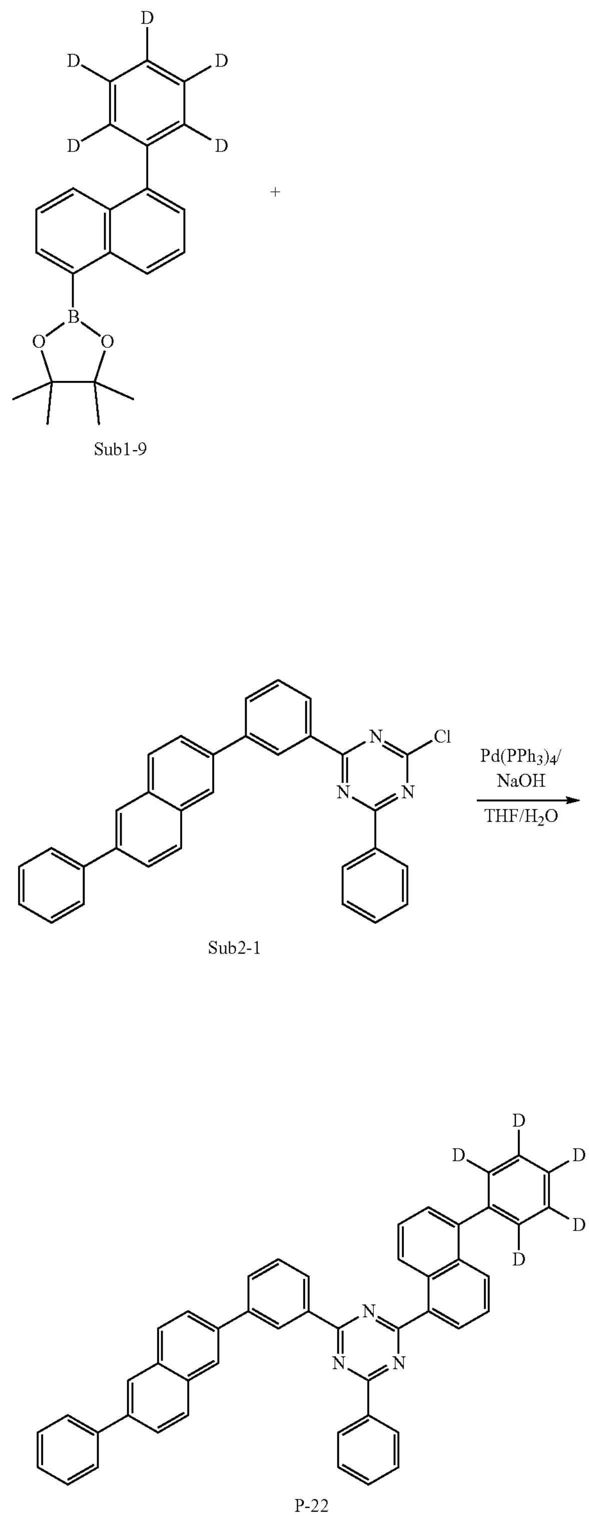

After dissolving Sub2-1 (4.2 g, 8.9 mmol) in THF (45 mL) in a round bottom flask, Sub1-9 (3.0 g, 8.9 mmol), NaOH (1.1 g, 26.8 mmol), $Pd(PPh_3)_4$ (0.62 g, 0.54 mmol), Water (22 mL) were added and 4.2 g of product (yield 73%) was obtained using the above synthesis method of P-1.

7. Synthesis Example of P-25
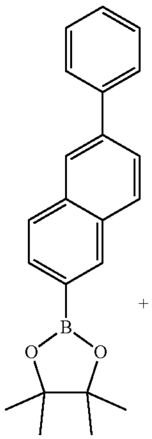
Sub1-10
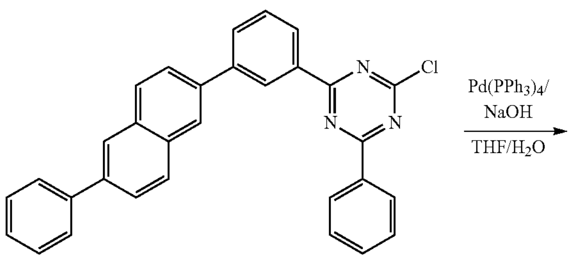
Sub2-1
-continued
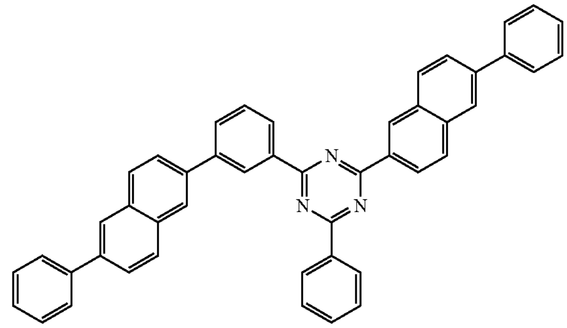
P-25
After dissolving Sub2-1 (4.3 g, 9.1 mmol) in THF (45 mL) in a round bottom flask, Sub1-10 (3.0 g, 9.1 mmol), NaOH (1.1 g, 27.3 mmol), $Pd(PPh_3)_4$ (0.63 g, 0.55 mmol), Water (23 mL) were added and 4.5 g of product (yield 77%) was obtained using the above synthesis method of P-1.
8. Synthesis Example of P-30
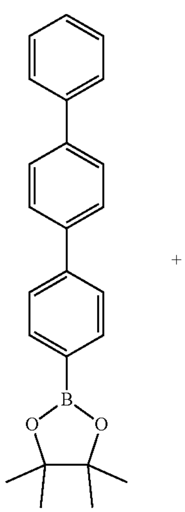
Sub1-12
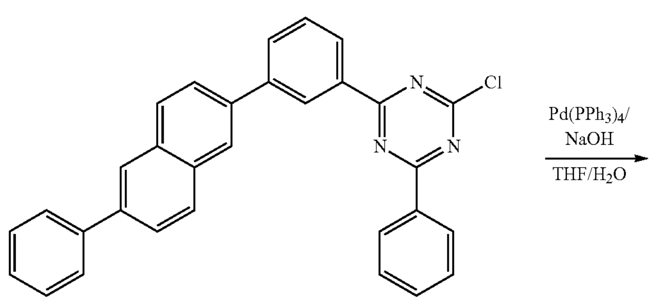
Sub2-1

-continued

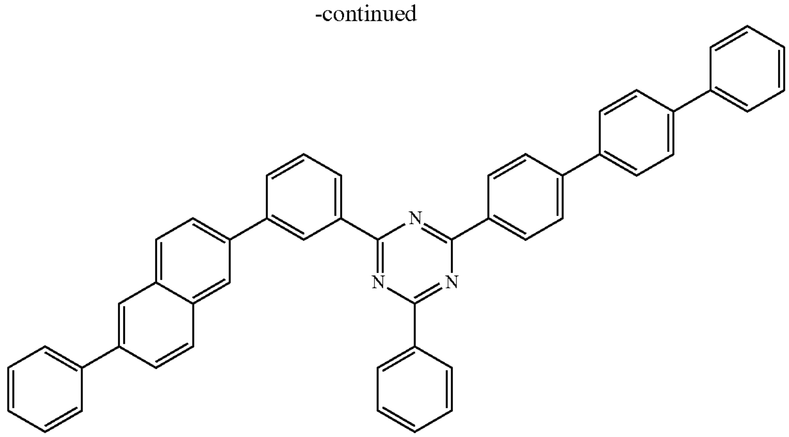

P-30

After dissolving Sub2-1 (4.0 g, 8.4 mmol) in THF (42 mL) in a round bottom flask, Sub1-12 (3.0 g, 8.4 mmol), NaOH (1.0 g, 25.3 mmol), $Pd(PPh_3)_4$ (0.58 g, 0.51 mmol), Water (21 mL) were added and 4.1 g of product (yield 74%) was obtained using the above synthesis method of P-1.

9. Synthesis Example of P-34

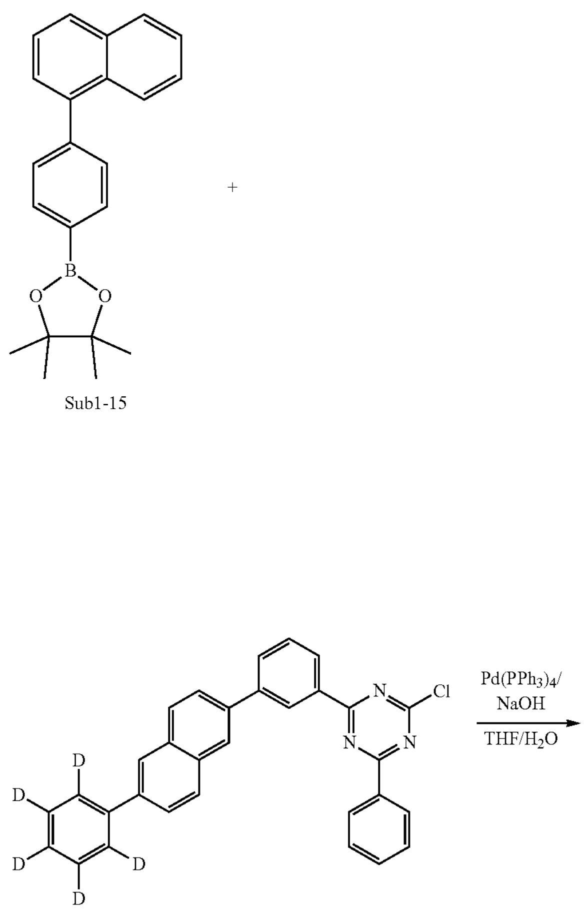

Sub1-15

Sub2-2

-continued

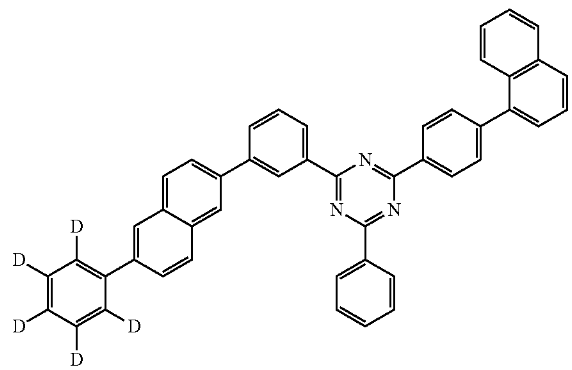

P-34

After dissolving Sub2-2 (4.3 g, 9.1 mmol) in THF (45 mL) in a round bottom flask, Sub1-15 (3.0 g, 9.1 mmol), NaOH (1.1 g, 27.3 mmol), $Pd(PPh_3)_4$ (0.63 g, 0.55 mmol), Water (23 mL) were added and 4.6 g of product (yield 78%) was obtained using the above synthesis method of P-1.

10. Synthesis Example of P-40

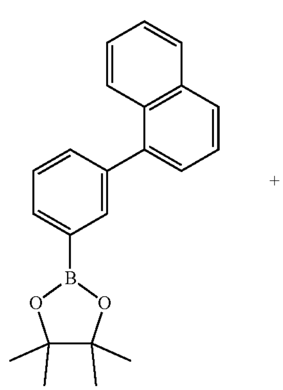

Sub1-16

-continued

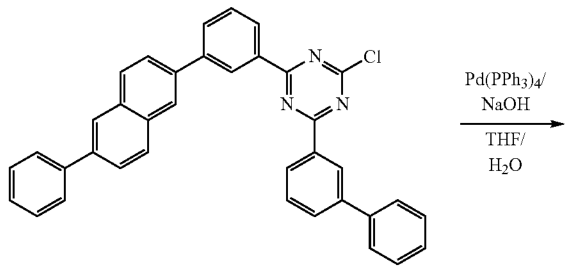

Sub2-6

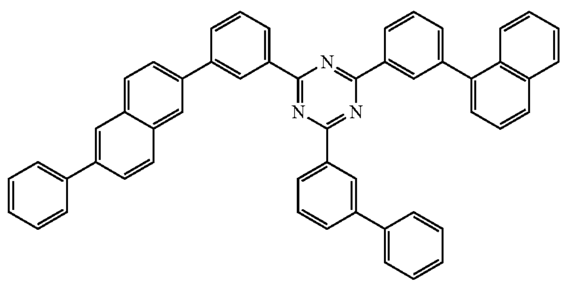

P-40

After dissolving Sub2-6 (5.0 g, 9.1 mmol) in THF (45 mL) in a round bottom flask, Sub1-16 (3.0 g, 9.1 mmol), NaOH (1.1 g, 27.3 mmol), $Pd(PPh_3)_4$ (0.63 g, 0.55 mmol), Water (23 mL) were added and 5.0 g of product (yield 77%) was obtained using the above synthesis method of P-1.

11. Synthesis Example of P-42

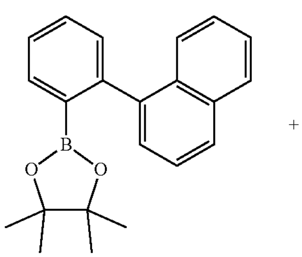

Sub1-17

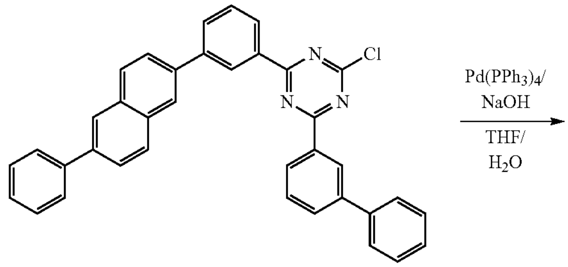

Sub2-6

-continued

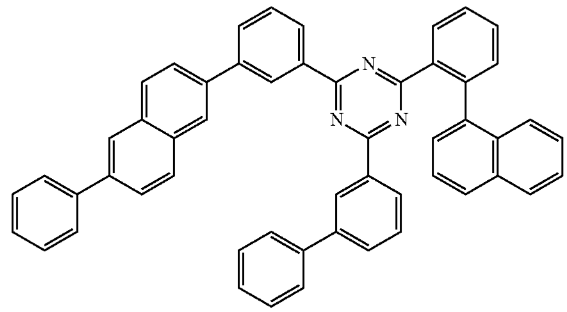

P-42

After dissolving Sub2-6 (5.0 g, 9.1 mmol) in THF (45 mL) in a round bottom flask, Sub1-17 (3.0 g, 9.1 mmol), NaOH (1.1 g, 27.3 mmol), $Pd(PPh_3)_4$ (0.63 g, 0.55 mmol), Water (23 mL) were added and 4.5 g of product (yield 70%) was obtained using the above synthesis method of P-1.

12. Synthesis Example of P-45

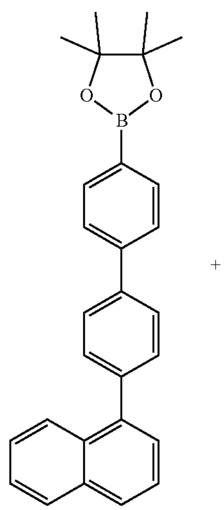

Sub1-19

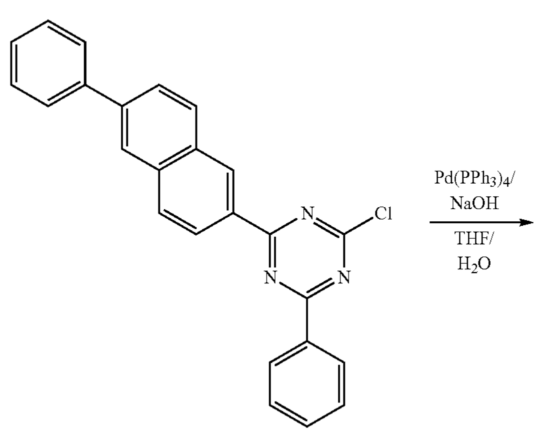

Sub2-20

-continued

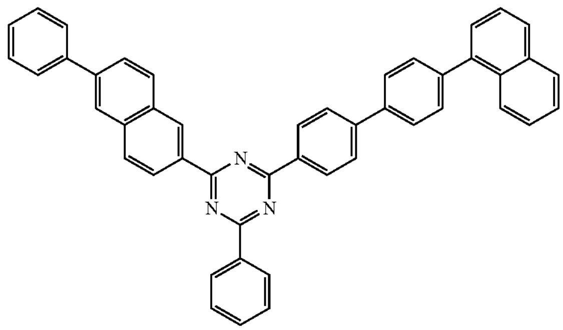

P-45

After dissolving Sub2-20 (2.9 g, 7.4 mmol) in THF (37 mL) in a round bottom flask, Sub1-19 (3.0 g, 7.4 mmol), NaOH (0.9 g, 22.1 mmol), $Pd(PPh_3)_4$ (0.51 g, 0.44 mmol), Water (18 mL) were added and 4.0 g of product (yield 76%) was obtained using the above synthesis method of P-1.

13. Synthesis Example of P-53

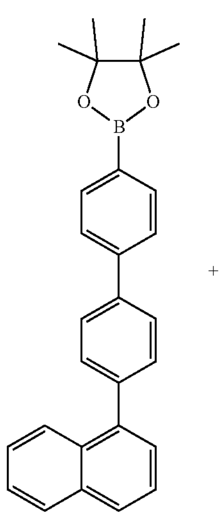

Sub1-19

-continued

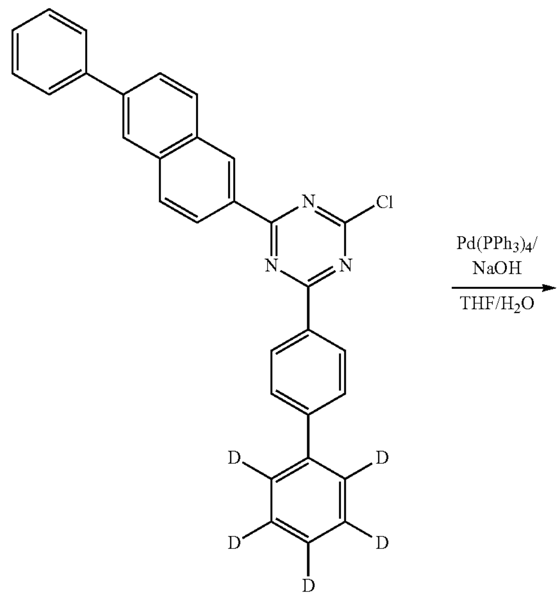

Sub2-54

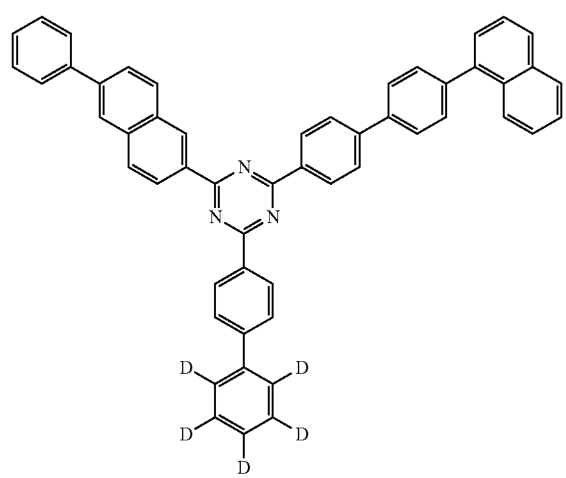

P-53

After dissolving Sub2-54 (3.5 g, 7.4 mmol) in THF (37 mL) in a round bottom flask, Sub1-19 (3.0 g, 7.4 mmol), NaOH (0.9 g, 22.1 mmol), $Pd(PPh_3)_4$ (0.51 g, 0.44 mmol), Water (18 mL) were added and 4.0 g of product (yield 76%) was obtained using the above synthesis method of P-1.

14. Synthesis Example of P-56
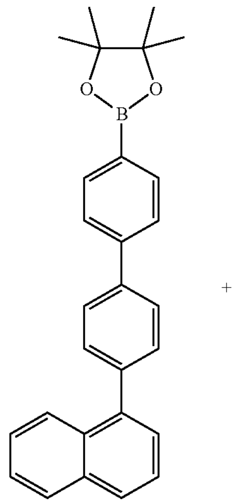
Sub1-19
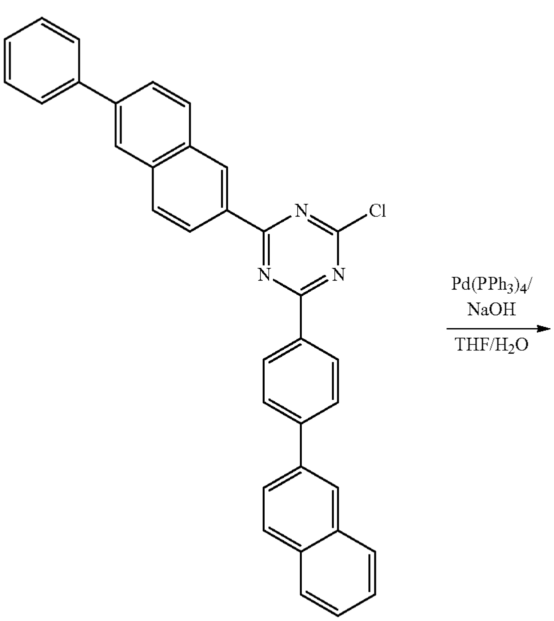
Sub2-54
-continued
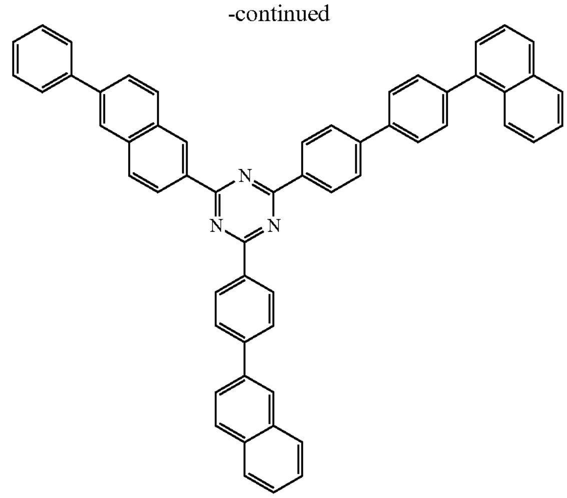
P-56
After dissolving Sub2-39 (3.8 g, 7.4 mmol) in THF (37 mL) in a round bottom flask, Sub1-19 (3.0 g, 7.4 mmol), NaOH (0.9 g, 22.1 mmol), $Pd(PPh_3)_4$ (0.51 g, 0.44 mmol), Water (18 mL) were added and 4.4 g of product (yield 78%) was obtained using the above synthesis method of P-1.
15. Synthesis Example of P-65
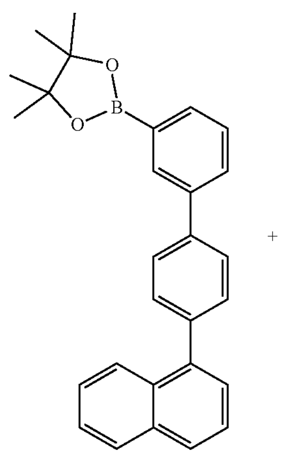
Sub1-22
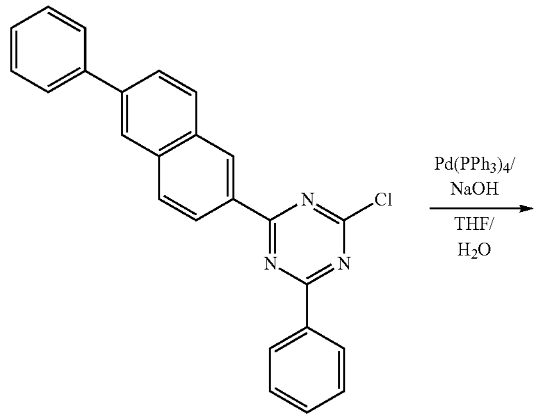
Sub2-20

-continued

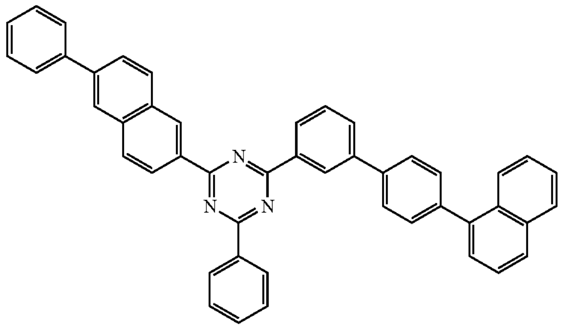

P-65

After dissolving Sub2-20 (2.9 g, 7.4 mmol) in THF (37 mL) in a round bottom flask, Sub1-22 (3.0 g, 7.4 mmol), NaOH (0.9 g, 22.1 mmol), $Pd(PPh_3)_4$ (0.51 g, 0.44 mmol), Water (18 mL) were added and 3.8 g of product (yield 80%) was obtained using the above synthesis method of P-1.

16. Synthesis Example of P-77

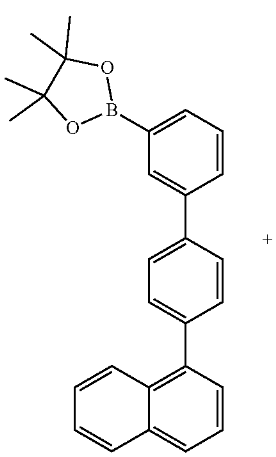

Sub1-22

-continued

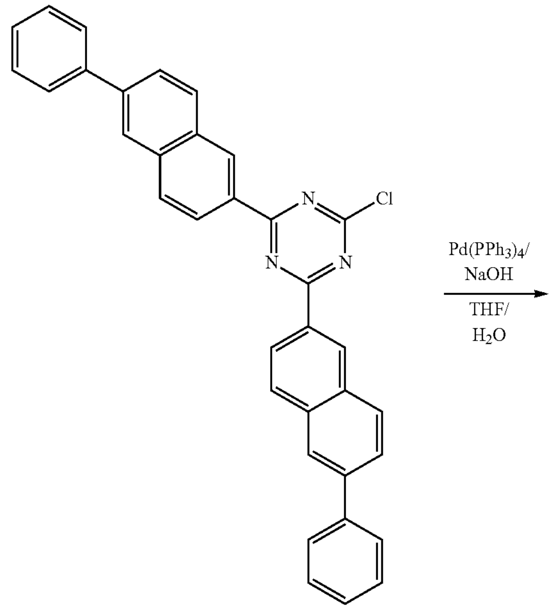

Sub2-36

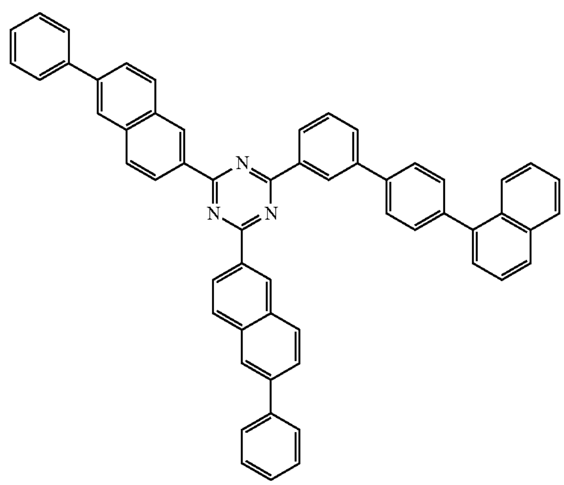

P-77

After dissolving Sub2-36 (3.8 g, 7.4 mmol) in THF (37 mL) in a round bottom flask, Sub1-22 (3.0 g, 7.4 mmol), NaOH (0.9 g, 22.1 mmol), $Pd(PPh_3)_4$ (0.51 g, 0.44 mmol), Water (18 mL) were added and 4.3 g of product (yield 77%) was obtained using the above synthesis method of P-1.

17. Synthesis Example of P-80

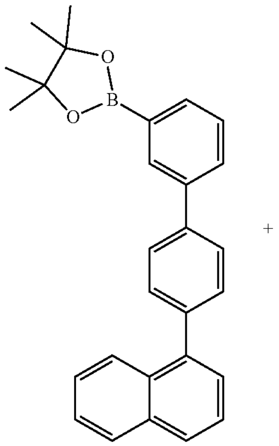

Sub1-22

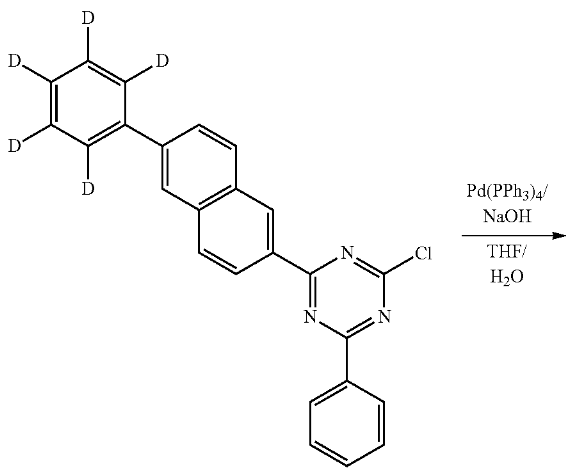

Sub2-50

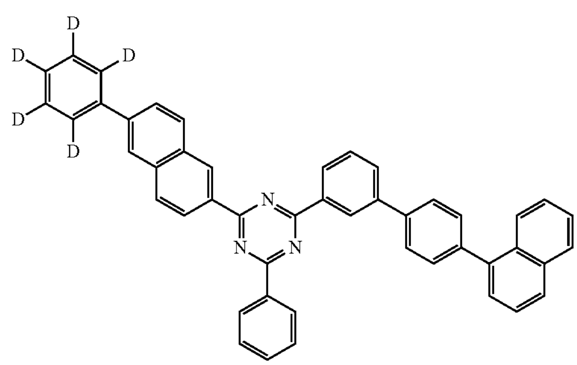

P-80

After dissolving Sub2-50 (2.9 g, 7.4 mmol) in THF (37 mL) in a round bottom flask, Sub1-22 (3.0 g, 7.4 mmol), NaOH (0.9 g, 22.1 mmol), $Pd(PPh_3)_4$ (0.51 g, 0.44 mmol), Water (18 mL) were added and 3.7 g of product (yield 78%) was obtained using the above synthesis method of P-1.

18. Synthesis Example of P-85

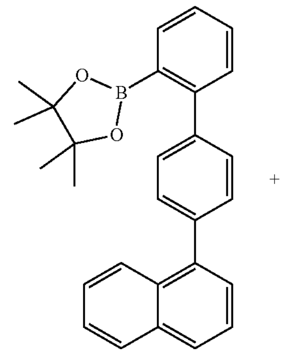

Sub1-24

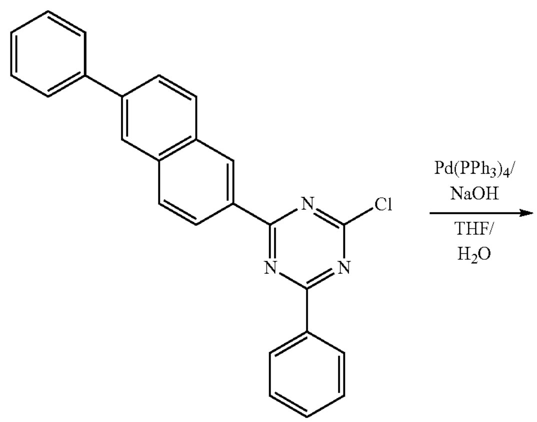

Sub2-20

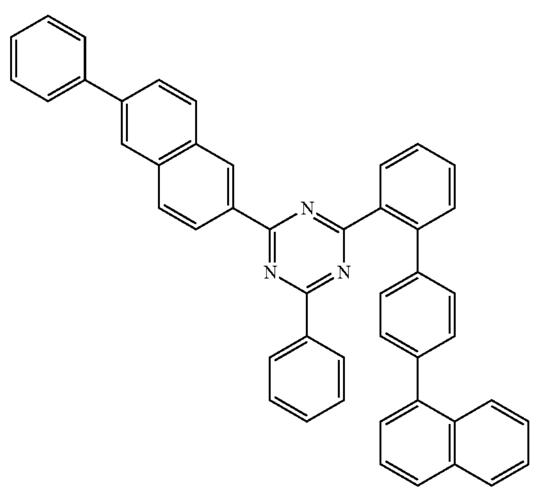

P-85

After dissolving Sub2-20 (2.9 g, 7.4 mmol) in THF (37 mL) in a round bottom flask, Sub1-24 (3.0 g, 7.4 mmol), NaOH (0.9 g, 22.1 mmol), $Pd(PPh_3)_4$ (0.51 g, 0.44 mmol), Water (18 mL) were added and 3.0 g of product (yield 63%) was obtained using the above synthesis method of P-1.

Meanwhile, the FD-MS values of compounds P-1 to P-100 of the present invention prepared according to the synthesis examples are shown in Table 3.

TABLE 3

| Compound | FD-MS |
| --- | --- |
| P-1 | m/z = 587.24($C_{43}H_{29}N_3$ = 587.73) |
| P-2 | m/z = 637.25($C_{47}H_{31}N_3$ = 637.79) |
| P-3 | m/z = 663.27($C_{49}H_{33}N_3$ = 663.82) |
| P-4 | m/z = 592.27($C_{43}H_{24}D_5N_3$ = 592.76) |
| P-5 | m/z = 587.24($C_{43}H_{29}N_3$ = 587.73) |
| P-6 | m/z = 587.24($C_{43}H_{29}N_3$ = 587.73) |
| P-7 | m/z = 663.27($C_{49}H_{33}N_3$ = 663.82) |
| P-8 | m/z = 663.27($C_{49}H_{33}N_3$ = 663.82) |
| P-9 | m/z = 587.24($C_{43}H_{29}N_3$ = 587.73) |
| P-10 | m/z = 663.27($C_{49}H_{33}N_3$ = 663.82) |
| P-11 | m/z = 637.25($C_{47}H_{31}N_3$ = 637.79) |
| P-12 | m/z = 590.25($C_{43}H_{26}D_3N_3$ = 590.74) |
| P-13 | m/z = 637.25($C_{47}H_{31}N_3$ = 637.79) |
| P-14 | m/z = 737.28($C_{55}H_{35}N_3$ = 737.91) |
| P-15 | m/z = 687.27($C_{51}H_{33}N_3$ = 687.85) |
| P-16 | m/z = 763.3($C_{57}H_{37}N_3$ = 763.94) |
| P-17 | m/z = 737.28($C_{55}H_{35}N_3$ = 737.91) |
| P-18 | m/z = 713.28($C_{53}H_{35}N_3$ = 713.88) |
| P-19 | m/z = 637.25($C_{47}H_{31}N_3$ = 637.79) |
| P-20 | m/z = 642.28($C_{47}H_{26}D_5N_3$ = 642.82) |
| P-21 | m/z = 637.25($C_{47}H_{31}N_3$ = 637.79) |
| P-22 | m/z = 642.28($C_{47}H_{26}D_5N_3$ = 642.82) |
| P-23 | m/z = 813.31($C_{61}H_{39}N_3$ = 814) |
| P-24 | m/z = 763.3($C_{57}H_{37}N_3$ = 763.94) |
| P-25 | m/z = 637.25($C_{47}H_{31}N_3$ = 637.79) |
| P-26 | m/z = 642.28($C_{47}H_{26}D_5N_3$ = 642.82) |
| P-27 | m/z = 763.3($C_{57}H_{37}N_3$ = 763.94) |
| P-28 | m/z = 713.28($C_{53}H_{35}N_3$ = 713.88) |
| P-29 | m/z = 663.27($C_{49}H_{33}N_3$ = 663.82) |
| P-30 | m/z = 667.29($C_{49}H_{29}D_4N_3$ = 667.85) |
| P-31 | m/z = 815.33($C_{61}H_{41}N_3$ = 816.02) |
| P-32 | m/z = 713.28($C_{53}H_{35}N_3$ = 713.88) |
| P-33 | m/z = 637.25($C_{47}H_{31}N_3$ = 637.79) |
| P-34 | m/z = 642.28($C_{47}H_{26}D_5N_3$ = 642.82) |
| P-35 | m/z = 713.28($C_{53}H_{35}N_3$ = 713.88) |
| P-36 | m/z = 642.28($C_{47}H_{26}D_5N_3$ = 642.82) |
| P-37 | m/z = 637.25($C_{47}H_{31}N_3$ = 637.79) |
| P-38 | m/z = 763.3($C_{57}H_{37}N_3$ = 763.94) |
| P-39 | m/z = 763.3($C_{57}H_{37}N_3$ = 763.94) |
| P-40 | m/z = 713.28($C_{53}H_{35}N_3$ = 713.88) |
| P-41 | m/z = 637.25($C_{47}H_{31}N_3$ = 637.79) |
| P-42 | m/z = 713.28($C_{53}H_{35}N_3$ = 713.88) |
| P-43 | m/z = 641.28($C_{47}H_{27}D_4N_3$ = 641.81) |
| P-44 | m/z = 863.33($C_{65}H_{41}N_3$ = 864.06) |
| P-45 | m/z = 637.25($C_{47}H_{31}N_3$ = 637.79) |
| P-46 | m/z = 687.27($C_{51}H_{33}N_3$ = 687.85) |
| P-47 | m/z = 687.27($C_{51}H_{33}N_3$ = 687.85) |
| P-48 | m/z = 713.28($C_{53}H_{35}N_3$ = 713.88) |
| P-49 | m/z = 713.28($C_{53}H_{35}N_3$ = 713.88) |
| P-50 | m/z = 713.28($C_{53}H_{35}N_3$ = 713.88) |
| P-51 | m/z = 789.31($C_{59}H_{39}N_3$ = 789.98) |
| P-52 | m/z = 763.3($C_{57}H_{37}N_3$ = 763.94) |
| P-53 | m/z = 718.31($C_{53}H_{30}D_5N_3$ = 718.91) |
| P-54 | m/z = 641.28($C_{47}H_{27}D_4N_3$ = 641.81) |
| P-55 | m/z = 763.3($C_{57}H_{37}N_3$ = 763.94) |
| P-56 | m/z = 763.3($C_{57}H_{37}N_3$ = 763.94) |
| P-57 | m/z = 763.3($C_{57}H_{37}N_3$ = 763.94) |
| P-58 | m/z = 763.3($C_{57}H_{37}N_3$ = 763.94) |
| P-59 | m/z = 769.34($C_{57}H_{31}D_6N_3$ = 769.98) |
| P-60 | m/z = 763.3($C_{57}H_{37}N_3$ = 763.94) |
| P-61 | m/z = 863.33($C_{65}H_{41}N_3$ = 864.06) |
| P-62 | m/z = 813.31($C_{61}H_{39}N_3$ = 814) |
| P-63 | m/z = 847.38($C_{63}H_{33}D_8N_3$ = 848.09) |
| P-64 | m/z = 789.31($C_{59}H_{39}N_3$ = 789.98) |
| P-65 | m/z = 637.25($C_{47}H_{31}N_3$ = 637.79) |
| P-66 | m/z = 713.28($C_{53}H_{35}N_3$ = 713.88) |
| P-67 | m/z = 713.28($C_{53}H_{35}N_3$ = 713.88) |
| P-68 | m/z = 713.28($C_{53}H_{35}N_3$ = 713.88) |
| P-69 | m/z = 642.28($C_{47}H_{26}D_5N_3$ = 642.82) |
| P-70 | m/z = 687.27($C_{51}H_{33}N_3$ = 687.85) |
| P-71 | m/z = 687.27($C_{51}H_{33}N_3$ = 687.85) |
| P-72 | m/z = 737.28($C_{55}H_{35}N_3$ = 737.91) |
| P-73 | m/z = 763.3($C_{57}H_{37}N_3$ = 763.94) |
| P-74 | m/z = 763.3($C_{57}H_{37}N_3$ = 763.94) |
| P-75 | m/z = 813.31($C_{61}H_{39}N_3$ = 814) |
| P-76 | m/z = 763.3($C_{57}H_{37}N_3$ = 763.94) |
| P-77 | m/z = 763.3($C_{57}H_{37}N_3$ = 763.94) |
| P-78 | m/z = 737.28($C_{55}H_{35}N_3$ = 737.91) |
| P-79 | m/z = 763.3($C_{57}H_{37}N_3$ = 763.94) |
| P-80 | m/z = 642.28($C_{47}H_{26}D_5N_3$ = 642.82) |
| P-81 | m/z = 763.3($C_{57}H_{37}N_3$ = 763.94) |
| P-82 | m/z = 813.31($C_{61}H_{39}N_3$ = 814) |
| P-83 | m/z = 718.31($C_{53}H_{30}D_5N_3$ = 718.91) |
| P-84 | m/z = 640.27($C_{47}H_{28}D_3N_3$ = 640.8) |
| P-85 | m/z = 637.25($C_{47}H_{31}N_3$ = 637.79) |
| P-86 | m/z = 713.28($C_{53}H_{35}N_3$ = 713.88) |
| P-87 | m/z = 713.28($C_{53}H_{35}N_3$ = 713.88) |
| P-88 | m/z = 763.3($C_{57}H_{37}N_3$ = 763.94) |
| P-89 | m/z = 813.31($C_{61}H_{39}N_3$ = 814) |
| P-90 | m/z = 687.27($C_{51}H_{33}N_3$ = 687.85) |
| P-91 | m/z = 687.27($C_{51}H_{33}N_3$ = 687.85) |
| P-92 | m/z = 763.3($C_{57}H_{37}N_3$ = 763.94) |
| P-93 | m/z = 737.28($C_{55}H_{35}N_3$ = 737.91) |
| P-94 | m/z = 763.3($C_{57}H_{37}N_3$ = 763.94) |
| P-95 | m/z = 763.3($C_{57}H_{37}N_3$ = 763.94) |
| P-96 | m/z = 642.28($C_{47}H_{26}D_5N_3$ = 642.82) |
| P-97 | m/z = 648.32($C_{47}H_{20}D_{11}N_3$ = 648.85) |
| P-98 | m/z = 641.28($C_{47}H_{27}D_4N_3$ = 641.81) |
| P-99 | m/z = 789.31($C_{59}H_{39}N_3$ = 789.98) |
| P-100 | m/z = 763.3($C_{57}H_{37}N_3$ = 763.94) |

Synthesis Example 2

1. Synthesis Example of N-12

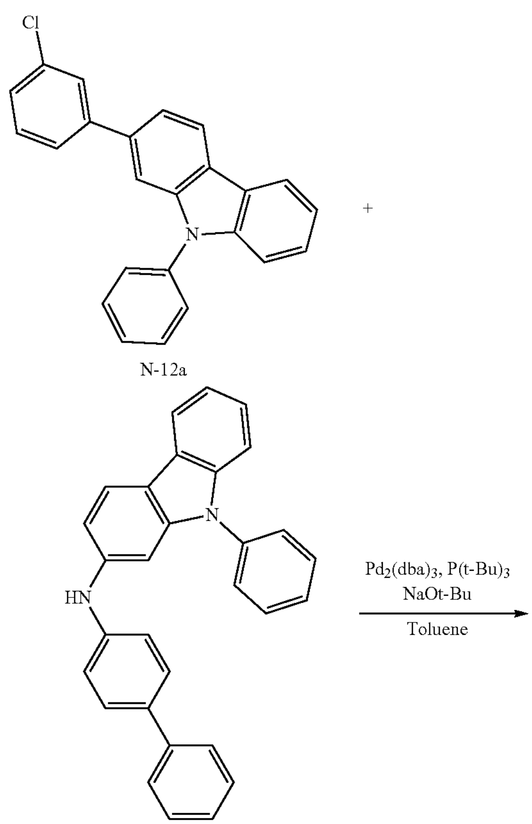

N-12a

N-12b

-continued

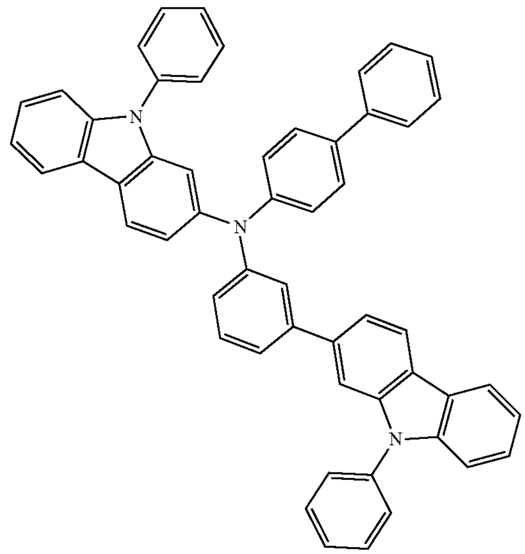

N-12

N-12a (30 g, 0.08 mol), N-12b (34.8 g, 0.08 mol), $Pd_2(dba)_3$ (2.3 g, 0.003 mol), NaOt-Bu (24.5 g, 0.25 mol), $P(t\text{-}Bu)_3$ (2.1 g, 0.005 mol), Toluene (170 mL) were added and reacted at 135° C. for 6 hours. When the reaction was completed, 53 g (85.8%) of product N-12 was obtained using the separation method of P-1 described above.

2. Synthesis Example of N-19

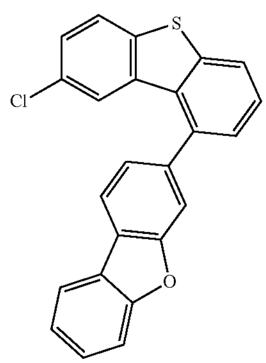

N-19a

+

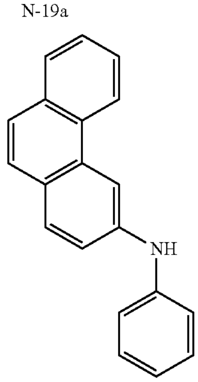

N-19b

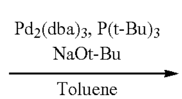

-continued

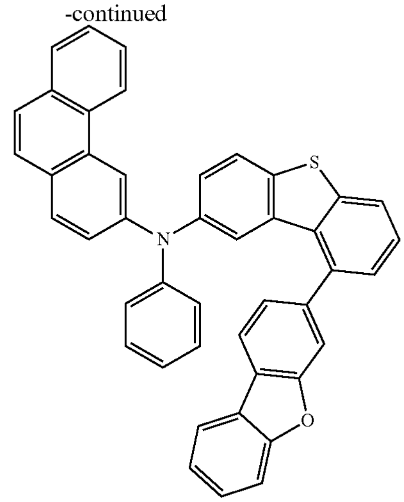

N-19

N-19a (50 g, 0.13 mol), N-19b (35 g, 0.13 mol), $Pd_2(dba)_3$ (3.6 g, 0.004 mol), NaOt-Bu (37.6 g, 0.40 mol), $P(t\text{-}Bu)_3$ (3.2 g, 0.008 mol), Toluene (260 mL) were added and reacted at 135° C. for 6 hours. When the reaction was completed, 67 g (83.4%) of product N-19 was obtained using the separation method of P-1 described above.

3. Synthesis Example of S-32

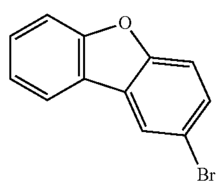

S-32a

+

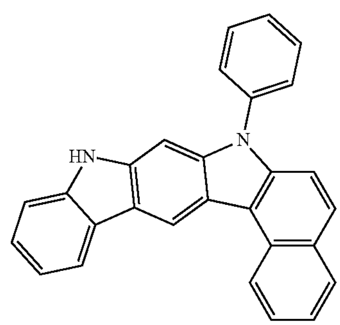

S-32b

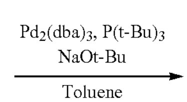

-continued

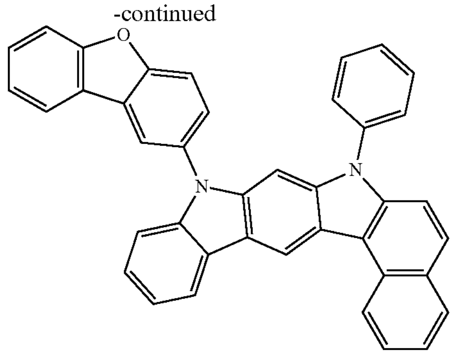

S-32

S-32a (10 g, 0.04 mol), S-32b (15.6 g, 0.04 mol), $Pd_2(dba)_3$ (1.1 g, 0.001 mol), NaOt-Bu (11.7 g, 0.12 mol), $P(t\text{-}Bu)_3$ (1.0 g, 0.002 mol), Toluene (80 mL) were added and reacted at 135° C. for 6 hours. When the reaction was completed, 18 g (80.8%) of product S-32 was obtained using the separation method of P-1 described above.

4. Synthesis Example of S-74

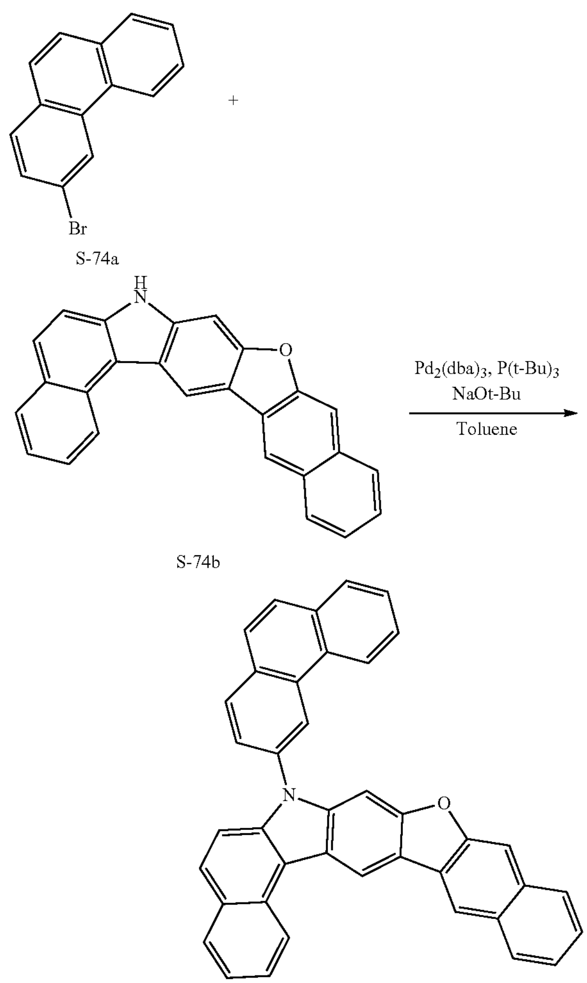

S-74a S-74b S-74

S-74a (15 g, 0.06 mol), S-74b (20.9 g, 0.06 mol), $Pd_2(dba)_3$ (1.6 g, 0.002 mol), NaOt-Bu (16.9 g, 0.18 mol), $P(t\text{-}Bu)_3$ (1.4 g, 0.004 mol), Toluene (120 mL) were added and reacted at 135° C. for 6 hours. When the reaction was completed, 27 g (86.4%) of product S-74 was obtained using the separation method of P-1 described above.

5. Synthesis Example of S-104

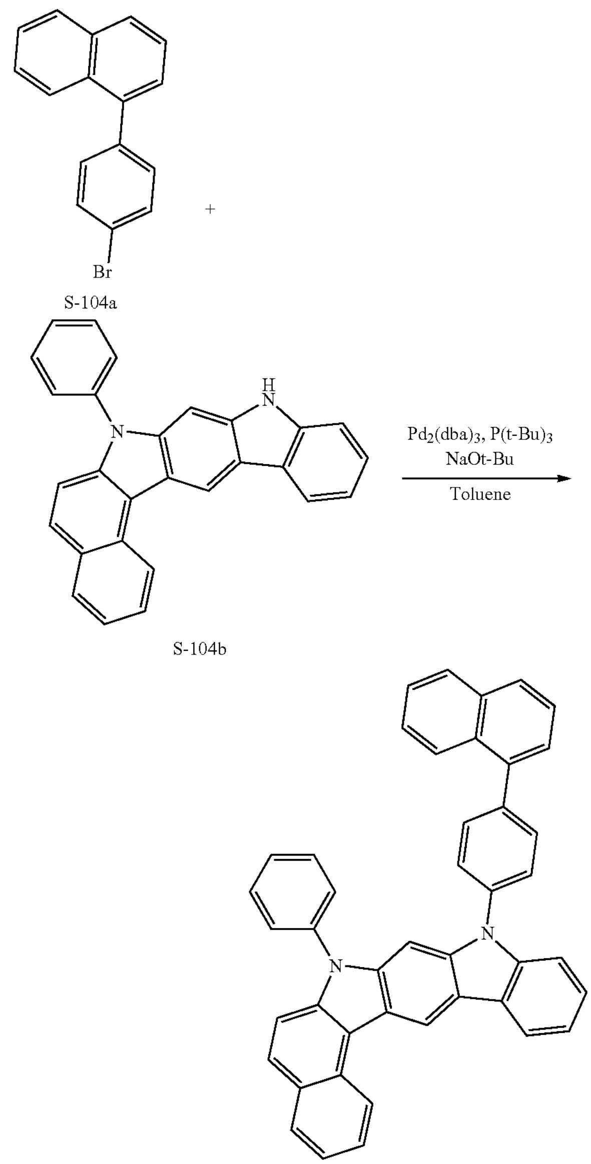

S-104a S-104b S-104

S-104a (30 g, 0.13 mol), S-104b (48.2.9 g, 0.13 mol), $Pd_2(dba)_3$ (3.5 g, 0.004 mol), NaOt-Bu (36.4 g, 0.38 mol), $P(t\text{-}Bu)_3$(3.1 g, 0.008 mol), Toluene (250 mL) were added and reacted at 135° C. for 6 hours. When the reaction was completed, 60 g (81.5%) of product S-104 was obtained using the separation method of P-1 described above.

Meanwhile, the FD-MS values of compounds N-1 to N-96 and S-1 to S-108 of the present invention prepared according to the synthesis examples are shown in Tables 4 and 5.

TABLE 4

| Compound | FD-MS |
|---|---|
| N-1 | m/z = 487.19($C_{36}H_{25}NO$ = 487.6) |
| N-2 | m/z = 553.19($C_{40}H_{27}NS$ = 553.72) |
| N-3 | m/z = 563.26($C_{43}H_{33}N$ = 563.74) |
| N-4 | m/z = 602.27($C_{45}H_{34}N_2$ = 602.78) |
| N-5 | m/z = 517.15($C_{36}H_{23}NOS$ = 517.65) |
| N-6 | m/z = 603.2($C_{44}H_{29}NS$ = 603.78) |
| N-7 | m/z = 735.29($C_{57}H_{37}N$ = 735.93) |
| N-8 | m/z = 562.24($C_{42}H_{30}N_2$ = 562.72) |
| N-9 | m/z = 565.17($C_{40}H_{23}NO_3$ = 565.63) |
| N-10 | m/z = 581.14($C_{40}H_{23}NO_2S$ = 581.69) |
| N-11 | m/z = 823.24($C_{59}H_{37}NS_2$ = 824.07) |
| N-12 | m/z = 727.3($C_{54}H_{37}N_3$ = 727.91) |
| N-13 | m/z = 627.22($C_{46}H_{29}NO_2$ = 627.74) |
| N-14 | m/z = 633.16($C_{44}H_{27}NS_2$ = 633.83) |
| N-15 | m/z = 675.29($C_{52}H_{37}N$ = 675.88) |
| N-16 | m/z = 678.3($C_{51}H_{38}N_2$ = 678.88) |
| N-17 | m/z = 669.21($C_{48}H_{31}NOS$ = 669.84) |
| N-18 | m/z = 785.22($C_{56}H_{35}NS_2$ = 786.02) |
| N-19 | m/z = 617.18($C_{44}H_{27}NOS$ = 617.77) |
| N-20 | m/z = 601.2($C_{44}H_{27}NO_2$ = 601.71) |
| N-21 | m/z = 779.32($C_{59}H_{41}NO$ = 779.98) |
| N-22 | m/z = 583.23($C_{42}H_{33}NS$ = 583.79) |
| N-23 | m/z = 679.32($C_{52}H_{41}N$ = 679.91) |
| N-24 | m/z = 726.27($C_{54}H_{34}N_2O$ = 726.88) |
| N-25 | m/z = 593.18($C_{42}H_{27}NOS$ = 593.74) |
| N-26 | m/z = 774.22($C_{54}H_{34}N_2S_2$ = 775) |
| N-27 | m/z = 557.24($C_{40}H_{31}NO_2$ = 557.69) |
| N-28 | m/z = 652.25($C_{48}H_{32}N_2O$ = 652.8) |
| N-29 | m/z = 619.29($C_{46}H_{37}NO$ = 619.81) |
| N-30 | m/z = 603.2($C_{44}H_{29}NS$ = 603.78) |
| N-31 | m/z = 813.3($C_{62}H_{39}NO$ = 814) |
| N-32 | m/z = 784.29($C_{57}H_{40}N_2S$ = 785.02) |
| N-33 | m/z = 577.2($C_{42}H_{27}NO_2$ = 577.68) |
| N-34 | m/z = 607.14($C_{42}H_{25}NS_2$ = 607.79) |
| N-35 | m/z = 801.34($C_{62}H_{43}N$ = 802.03) |
| N-36 | m/z = 575.24($C_{42}H_{29}N_3$ = 575.72) |
| N-37 | m/z = 577.2($C_{42}H_{27}NO_2$ = 577.68) |
| N-38 | m/z = 607.14($C_{42}H_{25}NS_2$ = 607.79) |
| N-39 | m/z = 801.34($C_{62}H_{43}N$ = 802.03) |
| N-40 | m/z = 575.24($C_{42}H_{29}N_3$ = 575.72) |
| N-41 | m/z = 601.2($C_{44}H_{27}NO_2$ = 601.71) |
| N-42 | m/z = 471.11($C_{31}H_{21}NS_2$ = 471.64) |
| N-43 | m/z = 675.29($C_{52}H_{37}N$ = 675.88) |
| N-44 | m/z = 727.3($C_{54}H_{37}N_3$ = 727.91) |
| N-45 | m/z = 603.2($C_{44}H_{29}NS$ = 603.78) |
| N-46 | m/z = 561.16($C_{38}H_{27}NS_2$ = 561.76) |
| N-47 | m/z = 799.32($C_{62}H_{41}N$ = 800.02) |
| N-48 | m/z = 702.27($C_{52}H_{34}N_2O$ = 702.86) |
| N-49 | m/z = 729.27($C_{54}H_{35}NO_2$ = 729.88) |
| N-50 | m/z = 785.22($C_{56}H_{35}NS_2$ = 786.02) |
| N-51 | m/z = 812.32($C_{62}H_{40}N_2$ = 813.02) |
| N-52 | m/z = 681.22($C_{48}H_{31}N_3S$ = 681.86) |
| N-53 | m/z = 615.18($C_{44}H_{25}NO_3$ = 615.69) |
| N-54 | m/z = 763.15($C_{52}H_{29}NS_3$ = 763.99) |
| N-55 | m/z = 593.31($C_{45}H_{39}N$ = 593.81) |
| N-56 | m/z = 840.33($C_{62}H_{40}N_4$ = 841.03) |
| N-57 | m/z = 657.18($C_{46}H_{27}NO_2S$ = 657.79) |
| N-58 | m/z = 824.23($C_{58}H_{36}N_2S_2$ = 825.06) |
| N-59 | m/z = 1195.42($C_{91}H_{57}NS$ = 1196.52) |
| N-60 | m/z = 656.19($C_{46}H_{28}N_2OS$ = 656.8) |
| N-61 | m/z = 607.16($C_{42}H_{25}NO_2S$ = 607.73) |
| N-62 | m/z = 773.2($C_{54}H_{31}NO_3S$ = 773.91) |
| N-63 | m/z = 1013.4($C_{79}H_{51}N$ = 1014.28) |
| N-64 | m/z = 758.24($C_{54}H_{34}N_2OS$ = 758.94) |
| N-65 | m/z = 623.14($C_{42}H_{25}NOS_2$ = 623.79) |
| N-66 | m/z = 763.16($C_{52}H_{29}NO_2S_2$ = 763.93) |
| N-67 | m/z = 799.2($C_{56}H_{33}NOS_2$ = 800.01) |
| N-68 | m/z = 743.23($C_{54}H_{33}NOS$ = 743.92) |
| N-69 | m/z = 872.25($C_{62}H_{36}N_2O_2S$ = 873.04) |
| N-70 | m/z = 772.22($C_{54}H_{32}N_2O_2S$ = 772.92) |
| N-71 | m/z = 830.28($C_{61}H_{38}N_2S$ = 831.05) |
| N-72 | m/z = 808.25($C_{58}H_{33}FN_2O_2$ = 808.91) |
| N-73 | m/z = 929.21($C_{64}H_{35}NO_3S_2$ = 930.11) |
| N-74 | m/z = 963.27($C_{68}H_{41}N_3S_2$ = 964.22) |
| N-75 | m/z = 809.24($C_{58}H_{35}NO_2S$ = 809.98) |
| N-76 | m/z = 893.29($C_{66}H_{39}NO_3$ = 894.04) |
| N-77 | m/z = 794.28($C_{58}H_{38}N_2S$ = 795.02) |
| N-78 | m/z = 900.26($C_{64}H_{40}N_2S_2$ = 901.16) |
| N-79 | m/z = 758.28($C_{55}H_{38}N_2S$ = 758.98) |
| N-80 | m/z = 1082.37($C_{81}H_{50}N_2S$ = 1083.37) |
| N-81 | m/z = 573.25($C_{44}H_{31}N$ = 573.74) |
| N-82 | m/z = 649.28($C_{50}H_{35}N$ = 649.84) |
| N-83 | m/z = 699.29($C_{54}H_{37}N$ = 699.9) |
| N-84 | m/z = 699.29($C_{54}H_{37}N$ = 699.9) |
| N-85 | m/z = 673.28($C_{52}H_{35}N$ = 673.86) |
| N-86 | m/z = 649.28($C_{50}H_{35}N$ = 649.84) |
| N-87 | m/z = 625.28($C_{48}H_{35}N$ = 625.82) |
| N-88 | m/z = 673.28($C_{52}H_{35}N$ = 673.86) |
| N-89 | m/z = 773.31($C_{60}H_{39}N$ = 773.98) |
| N-90 | m/z = 749.31($C_{58}H_{39}N$ = 749.96) |
| N-91 | m/z = 699.29($C_{54}H_{37}N$ = 699.9) |
| N-92 | m/z = 599.26($C_{46}H_{33}N$ = 599.78) |
| N-93 | m/z = 639.26($C_{48}H_{33}NO$ = 639.8) |
| N-94 | m/z = 765.25($C_{57}H_{35}NS$ = 765.97) |
| N-95 | m/z = 677.31($C_{52}H_{39}N$ = 677.89) |
| N-96 | m/z = 727.3($C_{54}H_{37}N_3$ = 727.91) |

TABLE 5

| Compound | FD-MS |
|---|---|
| S-1 | m/z = 408.16($C_{30}H_{20}N_2$ = 408.5) |
| S-2 | m/z = 534.21($C_{40}H_{26}N_2$ = 534.66) |
| S-3 | m/z = 560.23($C_{42}H_{28}N_2$ = 560.7) |
| S-4 | m/z = 584.23($C_{44}H_{28}N_2$ = 584.72) |
| S-5 | m/z = 560.23($C_{42}H_{28}N_2$ = 560.7) |
| S-6 | m/z = 634.24($C_{48}H_{30}N_2$ = 634.78) |
| S-7 | m/z = 610.24($C_{46}H_{30}N_2$ = 610.76) |
| S-8 | m/z = 498.17($C_{36}H_{22}N_2O$ = 498.59) |
| S-9 | m/z = 574.2($C_{42}H_{26}N_2O$ = 574.68) |
| S-10 | m/z = 660.26($C_{50}H_{32}N_2$ = 660.82) |
| S-11 | m/z = 686.27($C_{52}H_{34}N_2$ = 686.86) |
| S-12 | m/z = 620.14($C_{42}H_{24}N_2S_2$ = 620.79) |
| S-13 | m/z = 640.2($C_{46}H_{28}N_2S$ = 640.8) |
| S-14 | m/z = 560.23($C_{42}H_{28}N_2$ = 560.7) |
| S-15 | m/z = 558.21($C_{42}H_{26}N_2$ = 558.68) |
| S-16 | m/z = 548.19($C_{40}H_{24}N_2O$ = 548.65) |
| S-17 | m/z = 573.22($C_{42}H_{27}N_3$ = 573.7) |
| S-18 | m/z = 564.17($C_{40}H_{24}N_2S$ = 564.71) |
| S-19 | m/z = 574.2($C_{42}H_{26}N_2O$ = 574.68) |
| S-20 | m/z = 564.17($C_{40}H_{24}N_2S$ = 564.71) |
| S-21 | m/z = 564.17($C_{40}H_{24}N_2S$ = 564.71) |
| S-22 | m/z = 813.31($C_{61}H_{39}N_3$ = 814) |
| S-23 | m/z = 696.26($C_{53}H_{32}N_2$ = 696.85) |
| S-24 | m/z = 691.23($C_{49}H_{29}N_3O_2$ = 691.79) |
| S-25 | m/z = 710.27($C_{54}H_{34}N_2$ = 710.88) |
| S-26 | m/z = 610.24($C_{46}H_{30}N_2$ = 610.76) |
| S-27 | m/z = 670.15($C_{46}H_{26}N_2S_2$ = 670.85) |
| S-28 | m/z = 640.29($C_{48}H_{36}N_2$ = 640.83) |
| S-29 | m/z = 598.2($C_{44}H_{26}N_2O$ = 598.71) |
| S-30 | m/z = 623.24($C_{46}H_{29}N_3$ = 623.76) |
| S-31 | m/z = 458.18($C_{34}H_{22}N_2$ = 458.56) |
| S-32 | m/z = 548.19($C_{40}H_{24}N_2O$ = 548.65) |
| S-33 | m/z = 508.19($C_{38}H_{24}N_2$ = 508.62) |
| S-34 | m/z = 508.19($C_{38}H_{24}N_2$ = 508.62) |
| S-35 | m/z = 623.24($C_{46}H_{29}N_3$ = 623.76) |
| S-36 | m/z = 564.17($C_{40}H_{24}N_2S$ = 564.71) |
| S-37 | m/z = 627.2($C_{46}H_{29}NS$ = 627.81) |
| S-38 | m/z = 505.1($C_{34}H_{19}NS_2$ = 505.65) |
| S-39 | m/z = 514.15($C_{36}H_{22}N_2S$ = 514.65) |
| S-40 | m/z = 575.17($C_{42}H_{25}NS$ = 575.73) |
| S-41 | m/z = 642.21($C_{46}H_{30}N_2S$ = 642.82) |
| S-42 | m/z = 575.17($C_{42}H_{25}NS$ = 575.73) |
| S-43 | m/z = 606.18($C_{42}H_{26}N_2OS$ = 606.74) |
| S-44 | m/z = 575.17($C_{42}H_{25}NS$ = 575.73) |
| S-45 | m/z = 551.17($C_{40}H_{25}NS$ = 551.71) |
| S-46 | m/z = 607.14($C_{42}H_{25}NS_2$ = 607.79) |
| S-47 | m/z = 525.16($C_{38}H_{23}NS$ = 525.67) |
| S-48 | m/z = 642.21($C_{46}H_{30}N_2S$ = 642.82) |
| S-49 | m/z = 548.19($C_{40}H_{24}N_2O$ = 548.65) |
| S-50 | m/z = 473.14($C_{34}H_{19}NO_2$ = 473.53) |
| S-51 | m/z = 566.15($C_{39}H_{22}N_2OS$ = 566.68) |
| S-52 | m/z = 459.16($C_{34}H_{21}NO$ = 459.55) |

TABLE 5-continued

| Compound | FD-MS |
|---|---|
| S-53 | m/z = 473.14($C_{34}H_{19}NO_2$ = 473.53) |
| S-54 | m/z = 523.16($C_{38}H_{21}NO_2$ = 523.59) |
| S-55 | m/z = 539.13($C_{38}H_{21}NOS$ = 539.65) |
| S-56 | m/z = 548.19($C_{40}H_{24}N_2O$ = 548.65) |
| S-57 | m/z = 489.12($C_{34}H_{19}NOS$ = 489.59) |
| S-58 | m/z = 545.09($C_{36}H_{19}NOS_2$ = 545.67) |
| S-59 | m/z = 549.17($C_{40}H_{23}NO_2$ = 549.63) |
| S-60 | m/z = 565.15($C_{40}H_{23}NOS$ = 565.69) |
| S-61 | m/z = 523.16($C_{38}H_{21}NO_2$ = 523.59) |
| S-62 | m/z = 598.2($C_{44}H_{26}N_2O$ = 598.71) |
| S-63 | m/z = 539.13($C_{38}H_{21}NOS$ = 539.65) |
| S-64 | m/z = 589.15($C_{42}H_{23}NOS$ = 589.71) |
| S-65 | m/z = 498.17($C_{36}H_{22}N_2O$ = 498.59) |
| S-66 | m/z = 509.18($C_{38}H_{23}NO$ = 509.61) |
| S-67 | m/z = 548.19($C_{40}H_{24}N_2O$ = 548.65) |
| S-68 | m/z = 549.17($C_{40}H_{23}NO_2$ = 549.63) |
| S-69 | m/z = 449.12($C_{32}H_{19}NS$ = 449.57) |
| S-70 | m/z = 439.1($C_{30}H_{17}NOS$ = 439.53) |
| S-71 | m/z = 647.22($C_{49}H_{29}NO$ = 647.78) |
| S-72 | m/z = 717.28($C_{52}H_{35}N_3O$ = 717.87) |
| S-73 | m/z = 459.16($C_{34}H_{21}NO$ = 459.55) |
| S-74 | m/z = 533.18($C_{40}H_{23}NO$ = 533.63) |
| S-75 | m/z = 525.16($C_{38}H_{23}NS$ = 525.67) |
| S-76 | m/z = 564.17($C_{40}H_{24}N_2S$ = 564.71) |
| S-77 | m/z = 575.19($C_{42}H_{25}NO_2$ = 575.67) |
| S-78 | m/z = 663.22($C_{49}H_{29}NO_2$ = 663.78) |
| S-79 | m/z = 647.22($C_{49}H_{29}NO$ = 647.78) |
| S-80 | m/z = 496.16($C_{36}H_{20}N_2O$ = 496.57) |
| S-81 | m/z = 565.15($C_{40}H_{23}NOS$ = 565.69) |
| S-82 | m/z = 505.1($C_{34}H_{19}NS_2$ = 505.65) |
| S-83 | m/z = 765.25($C_{56}H_{35}NOSi$ = 765.99) |
| S-84 | m/z = 615.17($C_{44}H_{25}NOS$ = 615.75) |
| S-85 | m/z = 603.17($C_{43}H_{25}NOS$ = 603.74) |
| S-86 | m/z = 772.29($C_{59}H_{36}N_2$ = 772.95) |
| S-87 | m/z = 802.33($C_{61}H_{42}N_2$ = 803.02) |
| S-88 | m/z = 607.23($C_{47}H_{29}N$ = 607.76) |
| S-89 | m/z = 524.23($C_{39}H_{28}N_2$ = 524.67) |
| S-90 | m/z = 665.22($C_{49}H_{31}NS$ = 665.85) |
| S-91 | m/z = 633.25($C_{49}H_{31}N$ = 633.79) |
| S-92 | m/z = 775.29($C_{59}H_{37}NO$ = 775.95) |
| S-93 | m/z = 535.23($C_{41}H_{29}N$ = 535.69) |
| S-94 | m/z = 623.22($C_{47}H_{29}NO$ = 623.76) |
| S-95 | m/z = 687.2($C_{51}H_{29}NS$ = 687.86) |
| S-96 | m/z = 735.29($C_{57}H_{37}N$ = 735.93) |
| S-97 | m/z = 611.26($C_{47}H_{33}N$ = 611.79) |
| S-98 | m/z = 679.23($C_{50}H_{33}NS$ = 679.88) |
| S-99 | m/z = 787.32($C_{61}H_{41}N$ = 788.01) |
| S-100 | m/z = 743.33($C_{55}H_{41}N_3$ = 743.95) |
| S-101 | m/z = 485.21($C_{37}H_{27}N$ = 485.63) |
| S-102 | m/z = 471.2($C_{36}H_{25}N$ = 471.6) |
| S-103 | m/z = 571.19($C_{43}H_{25}NO$ = 571.68) |
| S-104 | m/z = 584.23($C_{44}H_{28}N_2$ = 584.72) |
| S-105 | m/z = 539.24($C_{40}H_{21}D_5N_2$ = 539.69) |
| S-106 | m/z = 453.15($C_{32}H_{15}NS$ = 471.6) |
| S-107 | m/z = 563.26($C_{43}H_{26}D_4NO$ = 563.74) |
| S-108 | m/z = 589.26($C_{44}H_{23}D_5N_2$ = 584.72) |

Otherwise, the synthesis examples of the present invention represented by Formula 1 to Formula 3 have been described, but these are all based on the Buchwald-Hartwig cross coupling reaction, Miyaura boration reaction, Suzuki cross-coupling reaction, Intramolecular acid-induced cyclization reaction (*J. mater. Chem.*1999, 9, 2095.), Pd(II)-catalyzed oxidative cyclization reaction (*Org. Lett.*2011, 13, 5504), and $PPh_3$-mediated reductive cyclization reaction (*J. Org. Chem.* 2005, 70, 5014.), and those skilled in the art will easily understand that the reaction proceeds even when other substituents defined in Formula 1 to Formula 3 are bonded in addition to the substituents specified in the specific synthesis examples.

Manufacturing Evaluation of Organic Electronic Elements

[Example 1] Red Organic Light Emitting Device (Phosphorescent Host)

An organic electroluminescent device was manufactured according to a conventional method using the compound obtained through synthesis as a light-emitting host material for the emitting layer.

First, a 60 nm thick hole injection layer was formed by vacuum depositing a N1-(naphthalen-2-yl)-N4, N4-bis(4-(naphthalen-2-yl(phenyl)amino)phenyl)-N1-phenylbenzene-1,4-diamine (hereinafter abbreviated as 2-TNATA) film on the ITO layer (anode) formed on the glass substrate. A hole transport layer was formed by vacuum depositing 4,4-bis[N-(1-naphthyl)-N-phenylamino]biphenyl (hereinafter abbreviated as—NPD) to a thickness of 50 nm as a hole transport compound on the hole injection layer. As an emitting auxiliary layer material, tris(4-(9H-carbazol-9-yl)phenyl)amine (hereinafter, TCTA) was vacuum deposited to a thickness of 10 nm on the top of the hole transport layer to form an emitting auxiliary layer. After forming the emitting auxiliary layer, the present invention compound P-1 represented by Formula 1 and the present invention compound N-14 represented by Formula 2 were used as a host on the top of the emitting auxiliary layer in a weight ratio (5:5), and an emitting layer was deposited to a thickness of 30 nm by doping $(piq)_2Ir(acac)$ at a weight ratio of 95:5 as a dopant material. Next, (1,1'-bisphenyl)-4-oleato)bis(2-methyl-8-quinolineoleato)aluminum (hereinafter, BAlq) was vacuum deposited to a thickness of 10 nm as a hole blocking layer, and bis(10-hydroxybenzo[h]quinolinato)beryllium (hereinafter, BeBq2) was formed into a 25 nm thick film as an electron transport layer. Afterwards, LiF, an alkali metal halide, was deposited to a thickness of 0.2 nm as an electron injection layer, and then Al was deposited to a thickness of 150 nm and used as a cathode to manufacture an organic electroluminescent device.

[Example 2] to [Example 156]

An organic light emitting device was manufactured in the same manner as in Example 1, except that the compounds of the present invention shown in Table 6 were used as the host material of the emitting layer instead of the compounds P-1 and N-14 of the present invention.

[Comparative Example 1] to [Comparative Example 10]

An organic light emitting device was manufactured in the same manner as in Example 1, except that the compounds shown in Table 6 were used as the host material of the emitting layer instead of the compounds P-1 and N-14 of the present invention.

[Comparative Compound A]
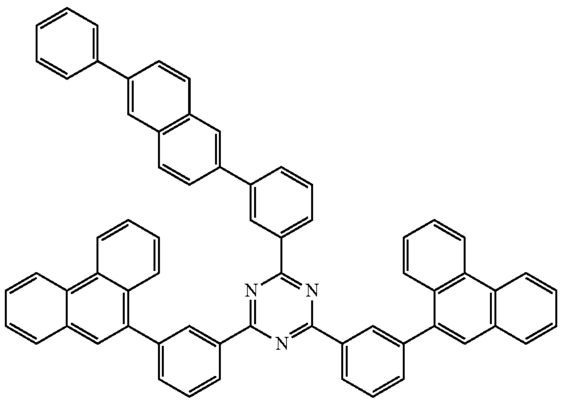
[Comparative Compound B]
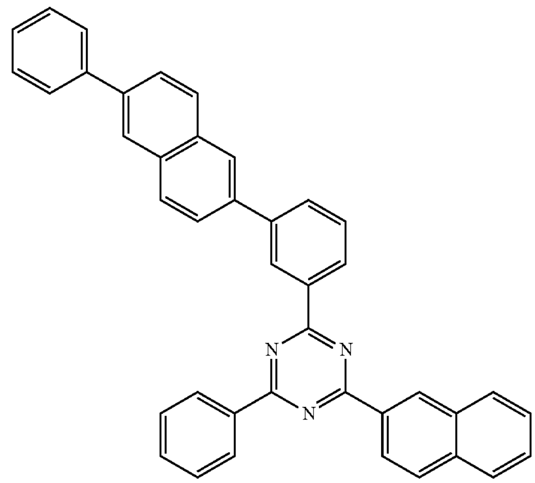
[Comparative Compound C]
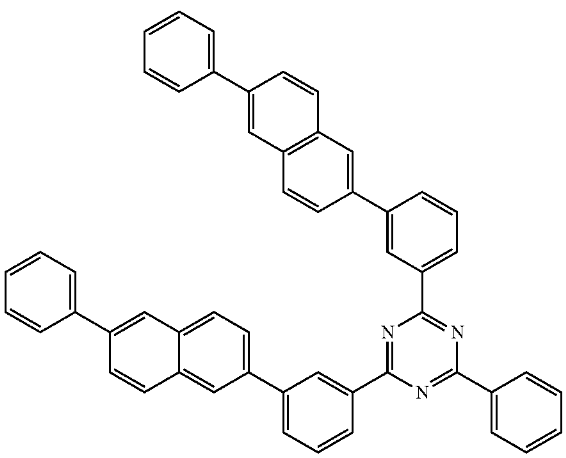
[Comparative Compound D]
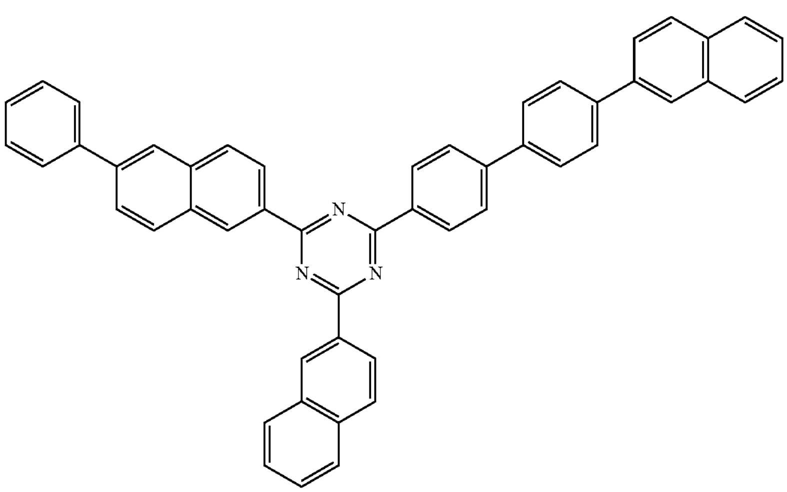

-continued

[Comparative Compound E]

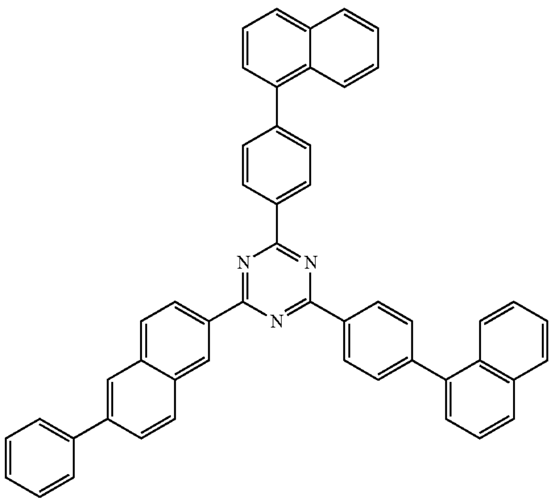

[Comparative Compound F]

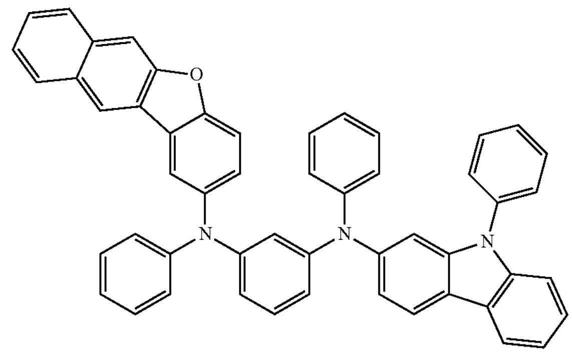

To the organic electroluminescent device manufactured by Examples 1 to 156, Comparative Examples 1 to 10, Electroluminescence (EL) characteristics were measured with a PR-650 of Photoresearch Co., by applying a forward bias DC voltage. As a result of the measurement, T95 life was measured at a standard luminance of 2500 cd/m 2 through life measuring apparatus manufactured by McScience. Table 6 shows the results of device fabrication and evaluation.

The measuring apparatus is unaffected by possible daily fluctuations in deposition rate, vacuum quality or other parameters, and can evaluate the performance of a new material compared to a comparative compound under the same conditions. In the evaluation, since one batch contains four identically prepared OLEDs containing the comparative compound, and since the performance of a total of 12 OLEDs is evaluated in three batches, the values of the experimental results obtained in this way show statistical significance.

TABLE 6

| | First compound | Second compound | Voltage | Current Density ($mA/cm^2$) | Brightness ($cd/m^2$) | Efficiency (cd/A) | T(95) |
|---|---|---|---|---|---|---|---|
| Comparative example 1 | Comparative compound B | Comparative compound F | 5.2 | 15.2 | 2500 | 16.5 | 88.3 |
| Comparative example 2 | Comparative compound C | Comparative compound F | 5.3 | 15.4 | 2500 | 16.2 | 89.4 |
| Comparative example 3 | Comparative compound D | Comparative compound F | 5.2 | 14.6 | 2500 | 17.1 | 90.6 |
| Comparative example 4 | Comparative compound E | Comparative compound F | 5.2 | 15.0 | 2500 | 16.7 | 91.2 |
| Comparative example 5 | Comparative compound A | Compound (N-75) | 5.6 | 14.9 | 2500 | 16.8 | 95.7 |
| Comparative example 6 | Comparative compound A | Compound (S-104) | 5.7 | 14.5 | 2500 | 17.2 | 96.5 |
| Comparative example 7 | Comparative compound D | Compound (N-75) | 5.3 | 13.7 | 2500 | 18.3 | 103.5 |
| Comparative example 8 | Comparative compound D | Compound (S-104) | 5.5 | 13.5 | 2500 | 18.5 | 104.1 |
| Comparative example 9 | Comparative compound E | Compound (N-75) | 5.4 | 14.6 | 2500 | 17.1 | 97.1 |
| Comparative example 10 | Comparative compound E | Compound (S-104) | 5.6 | 14.4 | 2500 | 17.4 | 97.8 |
| Example 1 | Compound (P-1) | Compound (N-14) | 4.8 | 8.3 | 2500 | 30.0 | 123.4 |
| Example 2 | Compound (P-1) | Compound (N-16) | 4.9 | 8.4 | 2500 | 29.7 | 122.2 |
| Example 3 | Compound (P-1) | Compound (N-17) | 4.8 | 8.0 | 2500 | 31.4 | 125.1 |
| Example 4 | Compound (P-1) | Compound (N-75) | 4.7 | 8.6 | 2500 | 29.1 | 121.6 |
| Example 5 | Compound (P-1) | Compound (N-86) | 5.0 | 8.5 | 2500 | 29.4 | 124.6 |
| Example 6 | Compound (P-1) | Compound (N-95) | 4.9 | 8.1 | 2500 | 30.9 | 122.8 |

TABLE 6-continued

| | First compound | Second compound | Voltage | Current Density (mA/cm$^2$) | Brightness (cd/m$^2$) | Efficiency (cd/A) | T(95) |
|---|---|---|---|---|---|---|---|
| Example 7 | Compound (P-1) | Compound (S-5) | 5.0 | 7.9 | 2500 | 31.8 | 127.1 |
| Example 8 | Compound (P-1) | Compound (S-8) | 5.0 | 7.7 | 2500 | 32.3 | 125.8 |
| Example 9 | Compound (P-1) | Compound (S-21) | 4.9 | 7.8 | 2500 | 32.0 | 123.9 |
| Example 10 | Compound (P-1) | Compound (S-32) | 4.7 | 7.7 | 2500 | 32.4 | 128.8 |
| Example 11 | Compound (P-1) | Compound (S-66) | 5.0 | 8.2 | 2500 | 30.4 | 127.7 |
| Example 12 | Compound (P-1) | Compound (S-104) | 4.9 | 8.2 | 2500 | 30.6 | 129.5 |
| Example 13 | Compound (P-5) | Compound (N-14) | 4.8 | 10.3 | 2500 | 24.2 | 122.2 |
| Example 14 | Compound (P-5) | Compound (N-16) | 4.9 | 10.4 | 2500 | 24.0 | 120.9 |
| Example 15 | Compound (P-5) | Compound (N-17) | 4.9 | 9.8 | 2500 | 25.4 | 124.0 |
| Example 16 | Compound (P-5) | Compound (N-75) | 4.7 | 10.6 | 2500 | 23.5 | 120.3 |
| Example 17 | Compound (P-5) | Compound (N-86) | 5.0 | 10.5 | 2500 | 23.7 | 123.4 |
| Example 18 | Compound (P-5) | Compound (N-95) | 5.0 | 10.0 | 2500 | 25.0 | 121.5 |
| Example 19 | Compound (P-5) | Compound (S-5) | 5.0 | 9.7 | 2500 | 25.6 | 125.7 |
| Example 20 | Compound (P-5) | Compound (S-8) | 5.0 | 9.6 | 2500 | 26.1 | 124.6 |
| Example 21 | Compound (P-5) | Compound (S-21) | 5.0 | 9.7 | 2500 | 25.9 | 122.7 |
| Example 22 | Compound (P-5) | Compound (S-32) | 4.7 | 9.6 | 2500 | 26.1 | 127.7 |
| Example 23 | Compound (P-5) | Compound (S-66) | 5.0 | 10.2 | 2500 | 24.6 | 126.3 |
| Example 24 | Compound (P-5) | Compound (S-104) | 4.9 | 10.1 | 2500 | 24.7 | 128.3 |
| Example 25 | Compound (P-9) | Compound (N-14) | 4.9 | 10.8 | 2500 | 23.1 | 119.7 |
| Example 26 | Compound (P-9) | Compound (N-16) | 5.0 | 11.0 | 2500 | 22.8 | 118.6 |
| Example 27 | Compound (P-9) | Compound (N-17) | 4.9 | 10.3 | 2500 | 24.2 | 121.4 |
| Example 28 | Compound (P-9) | Compound (N-75) | 4.8 | 11.2 | 2500 | 22.4 | 117.9 |
| Example 29 | Compound (P-9) | Compound (N-86) | 5.1 | 11.1 | 2500 | 22.6 | 120.9 |
| Example 30 | Compound (P-9) | Compound (N-95) | 5.0 | 10.5 | 2500 | 23.8 | 119.2 |
| Example 31 | Compound (P-9) | Compound (S-5) | 5.1 | 10.2 | 2500 | 24.4 | 123.3 |
| Example 32 | Compound (P-9) | Compound (S-8) | 5.1 | 10.1 | 2500 | 24.8 | 122.2 |
| Example 33 | Compound (P-9) | Compound (S-21) | 5.0 | 10.2 | 2500 | 24.6 | 120.4 |
| Example 34 | Compound (P-9) | Compound (S-32) | 4.8 | 10.0 | 2500 | 24.9 | 125.0 |
| Example 35 | Compound (P-9) | Compound (S-66) | 5.0 | 10.7 | 2500 | 23.4 | 123.9 |
| Example 36 | Compound (P-9) | Compound (S-104) | 4.9 | 10.6 | 2500 | 23.5 | 125.6 |
| Example 37 | Compound (P-13) | Compound (N-14) | 4.8 | 10.1 | 2500 | 24.7 | 128.1 |
| Example 38 | Compound (P-13) | Compound (N-16) | 4.9 | 10.2 | 2500 | 24.5 | 126.9 |
| Example 39 | Compound (P-13) | Compound (N-17) | 4.8 | 9.7 | 2500 | 25.9 | 130.1 |
| Example 40 | Compound (P-13) | Compound (N-75) | 4.7 | 10.4 | 2500 | 23.9 | 126.3 |
| Example 41 | Compound (P-13) | Compound (N-86) | 5.0 | 10.3 | 2500 | 24.2 | 129.4 |
| Example 42 | Compound (P-13) | Compound (N-95) | 5.0 | 9.8 | 2500 | 25.4 | 127.5 |
| Example 43 | Compound (P-13) | Compound (S-5) | 5.0 | 9.6 | 2500 | 26.1 | 132.0 |
| Example 44 | Compound (P-13) | Compound (S-8) | 5.0 | 9.4 | 2500 | 26.6 | 130.7 |

TABLE 6-continued

| | First compound | Second compound | Voltage | Current Density (mA/cm$^2$) | Brightness (cd/m$^2$) | Efficiency (cd/A) | T(95) |
|---|---|---|---|---|---|---|---|
| Example 45 | Compound (P-13) | Compound (S-21) | 4.9 | 9.5 | 2500 | 26.4 | 128.7 |
| Example 46 | Compound (P-13) | Compound (S-32) | 4.7 | 9.4 | 2500 | 26.7 | 133.7 |
| Example 47 | Compound (P-13) | Compound (S-66) | 5.0 | 10.0 | 2500 | 25.0 | 132.7 |
| Example 48 | Compound (P-13) | Compound (S-104) | 4.9 | 9.9 | 2500 | 25.2 | 134.4 |
| Example 49 | Compound (P-18) | Compound (N-14) | 4.8 | 10.4 | 2500 | 24.0 | 124.6 |
| Example 50 | Compound (P-18) | Compound (N-16) | 4.9 | 10.5 | 2500 | 23.8 | 123.4 |
| Example 51 | Compound (P-18) | Compound (N-17) | 4.8 | 9.9 | 2500 | 25.2 | 126.3 |
| Example 52 | Compound (P-18) | Compound (N-75) | 4.7 | 10.7 | 2500 | 23.3 | 122.7 |
| Example 53 | Compound (P-18) | Compound (N-86) | 5.0 | 10.6 | 2500 | 23.5 | 125.8 |
| Example 54 | Compound (P-18) | Compound (N-95) | 5.0 | 10.1 | 2500 | 24.7 | 123.9 |
| Example 55 | Compound (P-18) | Compound (S-5) | 5.0 | 9.9 | 2500 | 25.4 | 128.3 |
| Example 56 | Compound (P-18) | Compound (S-8) | 5.0 | 9.7 | 2500 | 25.9 | 126.9 |
| Example 57 | Compound (P-18) | Compound (S-21) | 4.9 | 9.8 | 2500 | 25.6 | 125.2 |
| Example 58 | Compound (P-18) | Compound (S-32) | 4.7 | 9.7 | 2500 | 25.9 | 130.0 |
| Example 59 | Compound (P-18) | Compound (S-66) | 5.0 | 10.3 | 2500 | 24.4 | 128.8 |
| Example 60 | Compound (P-18) | Compound (S-104) | 4.9 | 10.2 | 2500 | 24.5 | 130.7 |
| Example 61 | Compound (P-22) | Compound (N-14) | 4.7 | 9.9 | 2500 | 25.1 | 125.8 |
| Example 62 | Compound (P-22) | Compound (N-16) | 4.8 | 10.0 | 2500 | 24.9 | 124.5 |
| Example 63 | Compound (P-22) | Compound (N-17) | 4.8 | 9.5 | 2500 | 26.4 | 127.6 |
| Example 64 | Compound (P-22) | Compound (N-75) | 4.6 | 10.2 | 2500 | 24.4 | 123.9 |
| Example 65 | Compound (P-22) | Compound (N-86) | 5.0 | 10.1 | 2500 | 24.6 | 127.0 |
| Example 66 | Compound (P-22) | Compound (N-95) | 4.9 | 9.6 | 2500 | 25.9 | 125.2 |
| Example 67 | Compound (P-22) | compound(S-5) | 4.9 | 9.4 | 2500 | 26.6 | 129.5 |
| Example 68 | Compound (P-22) | Compound (S-8) | 5.0 | 9.2 | 2500 | 27.1 | 128.2 |
| Example 69 | Compound (P-22) | Compound (S-21) | 4.9 | 9.3 | 2500 | 26.9 | 126.5 |
| Example 70 | Compound (P-22) | Compound (S-32) | 4.6 | 9.2 | 2500 | 27.2 | 131.3 |
| Example 71 | Compound (P-22) | Compound (S-66) | 4.9 | 9.8 | 2500 | 25.5 | 130.1 |
| Example 72 | Compound (P-22) | Compound (S-104) | 4.8 | 9.7 | 2500 | 25.7 | 131.9 |
| Example 73 | Compound (P-25) | Compound (N-14) | 4.7 | 8.2 | 2500 | 30.4 | 133.0 |
| Example 74 | Compound (P-25) | Compound (N-16) | 4.8 | 8.3 | 2500 | 30.2 | 131.7 |
| Example 75 | Compound (P-25) | Compound (N-17) | 4.8 | 7.8 | 2500 | 32.0 | 134.9 |
| Example 76 | Compound (P-25) | Compound (N-75) | 4.6 | 8.5 | 2500 | 29.5 | 131.0 |
| Example 77 | Compound (P-25) | Compound (N-86) | 5.0 | 8.4 | 2500 | 29.9 | 134.1 |
| Example 78 | Compound (P-25) | Compound (N-95) | 4.9 | 8.0 | 2500 | 31.4 | 132.2 |
| Example 79 | Compound (P-25) | Compound (S-5) | 4.9 | 7.8 | 2500 | 32.2 | 137.0 |
| Example 80 | Compound (P-25) | Compound (S-8) | 4.9 | 7.6 | 2500 | 32.8 | 135.7 |
| Example 81 | Compound (P-25) | Compound (S-21) | 4.9 | 7.7 | 2500 | 32.6 | 133.7 |
| Example 82 | Compound (P-25) | Compound (S-32) | 4.6 | 7.6 | 2500 | 32.9 | 138.9 |

TABLE 6-continued

| | First compound | Second compound | Voltage | Current Density (mA/cm$^2$) | Brightness (cd/m$^2$) | Efficiency (cd/A) | T(95) |
|---|---|---|---|---|---|---|---|
| Example 83 | Compound (P-25) | Compound (S-66) | 4.9 | 8.1 | 2500 | 30.9 | 137.5 |
| Example 84 | Compound (P-25) | Compound (S-104) | 4.8 | 8.1 | 2500 | 31.0 | 139.5 |
| Example 85 | Compound (P-32) | Compound (N-14) | 4.8 | 9.6 | 2500 | 26.1 | 121.0 |
| Example 86 | Compound (P-32) | Compound (N-16) | 4.9 | 9.7 | 2500 | 25.8 | 119.7 |
| Example 87 | Compound (P-32) | Compound (N-17) | 4.8 | 9.2 | 2500 | 27.3 | 122.7 |
| Example 88 | Compound (P-32) | Compound (N-75) | 4.7 | 9.9 | 2500 | 25.3 | 119.1 |
| Example 89 | Compound (P-32) | Compound (N-86) | 5.0 | 9.8 | 2500 | 25.6 | 122.2 |
| Example 90 | Compound (P-32) | Compound (N-95) | 4.9 | 9.3 | 2500 | 26.9 | 120.5 |
| Example 91 | Compound (P-32) | Compound (S-5) | 5.0 | 9.1 | 2500 | 27.6 | 124.6 |
| Example 92 | Compound (P-32) | Compound (S-8) | 5.0 | 8.9 | 2500 | 28.1 | 123.4 |
| Example 93 | Compound (P-32) | Compound (S-21) | 4.9 | 9.0 | 2500 | 27.9 | 121.5 |
| Example 94 | Compound (P-32) | Compound (S-32) | 4.7 | 8.9 | 2500 | 28.1 | 126.3 |
| Example 95 | Compound (P-32) | Compound (S-66) | 4.9 | 9.5 | 2500 | 26.4 | 125.2 |
| Example 96 | Compound (P-32) | Compound (S-104) | 4.9 | 9.4 | 2500 | 26.6 | 127.0 |
| Example 97 | Compound (P-34) | Compound (N-14) | 4.8 | 8.7 | 2500 | 28.6 | 130.6 |
| Example 98 | Compound (P-34) | Compound (N-16) | 4.9 | 8.8 | 2500 | 28.4 | 129.3 |
| Example 99 | Compound (P-34) | Compound (N-17) | 4.8 | 8.3 | 2500 | 30.0 | 132.4 |
| Example 100 | Compound (P-34) | Compound (N-75) | 4.7 | 9.0 | 2500 | 27.7 | 128.5 |
| Example 101 | Compound (P-34) | Compound (N-86) | 5.0 | 8.9 | 2500 | 28.1 | 131.9 |
| Example 102 | Compound (P-34) | Compound (N-95) | 4.9 | 8.5 | 2500 | 29.5 | 129.8 |
| Example 103 | Compound (P-34) | Compound (S-5) | 5.0 | 8.3 | 2500 | 30.3 | 134.5 |
| Example 104 | Compound (P-34) | Compound (S-8) | 5.0 | 8.1 | 2500 | 30.8 | 133.1 |
| Example 105 | Compound (P-34) | Compound (S-21) | 4.9 | 8.2 | 2500 | 30.6 | 131.1 |
| Example 106 | Compound (P-34) | Compound (S-32) | 4.7 | 8.1 | 2500 | 30.9 | 136.3 |
| Example 107 | Compound (P-34) | Compound (S-66) | 4.9 | 8.6 | 2500 | 29.0 | 135.1 |
| Example 108 | Compound (P-34) | Compound (S-104) | 4.9 | 8.6 | 2500 | 29.2 | 137.0 |
| Example 109 | Compound (P-40) | Compound (N-14) | 4.8 | 9.3 | 2500 | 26.8 | 128.1 |
| Example 110 | Compound (P-40) | Compound (N-16) | 4.9 | 9.4 | 2500 | 26.5 | 126.9 |
| Example 111 | Compound (P-40) | Compound (N-17) | 4.8 | 8.9 | 2500 | 28.1 | 130.1 |
| Example 112 | Compound (P-40) | Compound (N-75) | 4.7 | 9.6 | 2500 | 26.0 | 126.3 |
| Example 113 | Compound (P-40) | Compound (N-86) | 5.0 | 9.5 | 2500 | 26.2 | 129.4 |
| Example 114 | Compound (P-40) | Compound (N-95) | 4.9 | 9.1 | 2500 | 27.6 | 127.6 |
| Example 115 | Compound (P-40) | Compound (S-5) | 5.0 | 8.8 | 2500 | 28.3 | 132.0 |
| Example 116 | Compound (P-40) | Compound (S-8) | 5.0 | 8.7 | 2500 | 28.8 | 130.6 |
| Example 117 | Compound (P-40) | Compound (S-21) | 4.9 | 8.7 | 2500 | 28.6 | 128.7 |
| Example 118 | Compound (P-40) | Compound (S-32) | 4.7 | 8.7 | 2500 | 28.9 | 133.8 |
| Example 119 | Compound (P-40) | Compound (S-66) | 5.0 | 9.2 | 2500 | 27.2 | 132.6 |
| Example 120 | Compound (P-40) | Compound (S-104) | 4.9 | 9.2 | 2500 | 27.3 | 134.4 |

TABLE 6-continued

| | First compound | Second compound | Voltage | Current Density (mA/cm$^2$) | Brightness (cd/m$^2$) | Efficiency (cd/A) | T(95) |
|---|---|---|---|---|---|---|---|
| Example 121 | Compound ( P-45) | Compound (N-14) | 4.6 | 9.9 | 2500 | 25.4 | 126.9 |
| Example 122 | Compound (P-45) | Compound (N-16) | 4.7 | 10.0 | 2500 | 25.1 | 125.8 |
| Example 123 | Compound (P-45) | Compound (N-17) | 4.6 | 9.4 | 2500 | 26.6 | 128.7 |
| Example 124 | Compound (P-45) | Compound (N-75) | 4.5 | 10.1 | 2500 | 24.6 | 125.2 |
| Example 125 | Compound (P-45) | Compound (N-86) | 4.8 | 10.1 | 2500 | 24.9 | 128.2 |
| Example 126 | Compound (P-45) | Compound (N-95) | 4.8 | 9.6 | 2500 | 26.1 | 126.3 |
| Example 127 | Compound (P-45) | Compound (S-5) | 4.8 | 9.3 | 2500 | 26.8 | 130.7 |
| Example 128 | Compound (P-45) | Compound (S-8) | 4.8 | 9.1 | 2500 | 27.4 | 129.4 |
| example 1 29 | Compound (P-45) | Compound (S-21) | 4.7 | 9.2 | 2500 | 27.1 | 127.6 |
| Example 130 | Compound (P-45) | Compound (S-32) | 4.5 | 9.1 | 2500 | 27.4 | 132.7 |
| Example 131 | Compound (P-45) | Compound (S-66) | 4.8 | 9.7 | 2500 | 25.8 | 131.3 |
| Example 132 | Compound (P-45) | Compound (S-104) | 4.7 | 9.7 | 2500 | 25.9 | 133.2 |
| Example 133 | Compound (P-65) | Compound (N-14) | 4.7 | 8.1 | 2500 | 30.9 | 135.3 |
| Example 134 | Compound (P-65) | Compound (N-16) | 4.8 | 8.2 | 2500 | 30.6 | 134.0 |
| Example 135 | Compound (P-65) | Compound (N-17) | 4.7 | 7.7 | 2500 | 32.4 | 137.3 |
| Example 136 | Compound (P-65) | Compound (N-75) | 4.6 | 8.3 | 2500 | 30.0 | 133.3 |
| Example 137 | Compound (P-65) | Compound (N-86) | 4.9 | 8.3 | 2500 | 30.3 | 136.7 |
| Example 138 | Compound (P-65) | compound (N-95) | 4.9 | 7.8 | 2500 | 31.9 | 134.7 |
| Example 139 | Compound (P-65) | Compound (S-5) | 4.9 | 7.6 | 2500 | 32.7 | 139.3 |
| Example 140 | Compound (P-65) | Compound (S-8) | 4.9 | 7.5 | 2500 | 33.3 | 137.9 |
| Example 141 | Compound (P-65) | Compound (S-21) | 4.8 | 7.6 | 2500 | 33.0 | 136.1 |
| Example 142 | Compound (P-65) | Compound (S-32) | 4.6 | 7.5 | 2500 | 33.3 | 141.4 |
| Example 143 | Compound (P-65) | Compound (S-66) | 4.9 | 8.0 | 2500 | 31.4 | 140.0 |
| Example 144 | Compound (P-65) | Compound (S-104) | 4.8 | 7.9 | 2500 | 31.5 | 141.9 |
| Example 145 | Compound (P-80) | Compound (N-14) | 4.7 | 8.0 | 2500 | 31.1 | 139.0 |
| Example 146 | Compound (P-80) | Compound (N-16) | 4.8 | 8.1 | 2500 | 30.8 | 137.6 |
| Example 147 | Compound (P-80) | Compound (N-17) | 4.7 | 7.7 | 2500 | 32.7 | 140.9 |
| Example 148 | Compound (P-80) | Compound (N-75) | 4.6 | 8.3 | 2500 | 30.3 | 137.0 |
| Example 149 | Compound (P-80) | Compound (N-86) | 4.9 | 8.2 | 2500 | 30.5 | 140.3 |
| Example 150 | Compound (P-80) | Compound (N-95) | 4.9 | 7.8 | 2500 | 32.1 | 138.4 |
| Example 151 | Compound (P-80) | Compound (S-5) | 4.9 | 7.6 | 2500 | 32.9 | 143.0 |
| Example 152 | Compound (P-80) | Compound (S-8) | 4.9 | 7.5 | 2500 | 33.5 | 141.7 |
| Example 153 | Compound (P-80) | Compound (S-21 | 4.8 | 7.5 | 2500 | 33.3 | 139.6 |
| Example 154 | Compound (P-80) | Compound (S-32) | 4.6 | 7.4 | 2500 | 33.6 | 145.1 |
| Example 155 | Compound (P-80) | Compound (S-66) | 4.9 | 7.9 | 2500 | 31.6 | 143.6 |
| Example 156 | Compound (P-80) | Compound (S-104) | 4.8 | 7.9 | 2500 | 31.8 | 145.8 |

As can be seen in Table 6, when the compound of the present invention is used as the emitting layer host material, it can be seen that the performance of the device is greatly improved compared to Comparative Examples 1 to 10. In the case of Comparative Examples 5 to 10 using Comparative Compound A, Comparative Compound D or Comparative Compound E as the first compound and using compound N-75 or S-104 as the second compound, the improvements in efficiency and lifespan can be seen compared to Comparative Examples 1 to 4 in which Comparative Compounds B to E were used as the first compound and Comparative Compound F was used as the second compound.

Moreover, compared to Comparative Examples 5 to 10, it can be seen that Examples 1 to 156 using the compound of the present invention represented by Formula 1 as the first compound exhibit significantly superior properties in terms of efficiency and lifespan, so it can be seen that the performance of the device varies depending on the composition of the compound. As a result, it can be confirmed that the compound of the present invention represented by Formula 1 has superior device performance than other comparative compounds not described in this specification.

That is, when comparing the compound of the present invention represented by Formula 1 and Comparative Compound A or Comparative Compound E, the types of substituents bonded to triazine are different, and mobility varies depending on the type of substituent. That is, the drive, efficiency, and lifespan are determined by the ease of injection of holes and electrons into the dopant. It is judged that when the ratio of holes and electrons (charge balance) is properly maintained, the efficiency and lifespan are dramatically increased. This is expected to affect charge balance depending on the degree of mobility of the first compound and the second compound. Therefore, it is believed that the synergistic effect of the compound of the present invention represented by Formula 2 or Formula 3 and the compound of the present invention represented by Formula 1 results in high efficiency and long lifespan. In other words, in terms of overall characteristics, the compounds of the present invention represented by Formula 1 have high electronic stability, and thus exhibit high electrical stability and long lifespan compared to comparative compounds. Comparing the compounds of the present invention, it can be seen that device performance is determined depending on the components of the compounds. In terms of driving voltage, it is highly dependent on the overall EOD and HOD, and it can be seen that this mobility is determined by the type of substituent the compound has, and the efficiency aspect is determined by the balance of electrons and holes of heterogeneous compounds. As a result, the performance of the device is greatly affected depending on the type and bonding position of the substituent substituted within the same skeleton.

Although exemplary embodiments of the present invention have been described for illustrative purposes, those skilled in the art will appreciate that various modifications, additions and substitutions are possible, without departing from the scope and spirit of the invention as disclosed in the accompanying claims. Therefore, the embodiment disclosed in the present invention is intended to illustrate the scope of the technical idea of the present invention, and the scope of the present invention is not limited by the embodiment. The scope of the present invention shall be construed on the basis of the accompanying claims, and it shall be construed that all of the technical ideas included within the scope equivalent to the claims belong to the present invention.

INDUSTRIAL APPLICABILITY

According to the present invention, it is possible to manufacture an organic device with excellent device characteristics such as high brightness, high luminescence, and long lifespan, and thus has industrial applicability.

What is claimed:

1. An organic electronic element comprising a first electrode, a second electrode, and an organic material layer formed between the first electrode and the second electrode, wherein the organic material layer comprises an emitting layer, and wherein the emitting layer comprises a compound represented by Formula 1;

and a compound represented by Formula 2 or Formula 3;

<Formula 1>

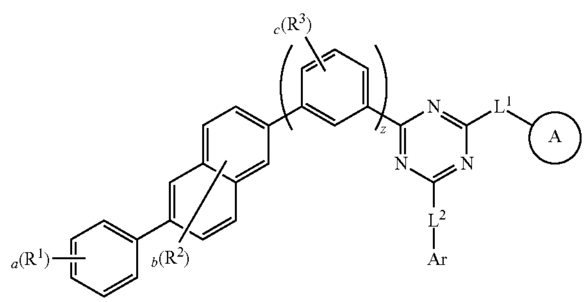

<Formula 2>

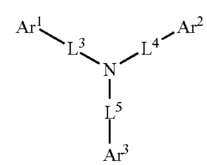

<Formula 3>

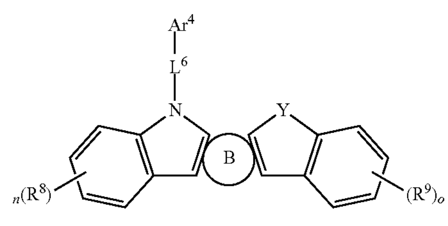

wherein:

1) $L^1$ is a substituent represented by any of Formulas L-1 to L-4:

<Formula L-1>

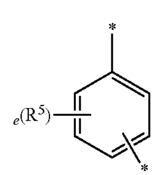

-continued

<Formula L-2>

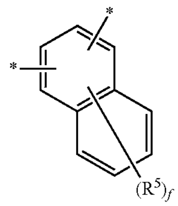

<Formula L-3>

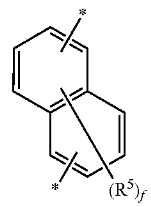

<Formula L-4>

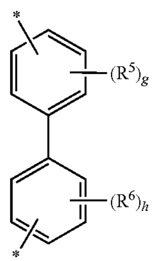

2) $L^2$ is a single bond; or a $C_6$-$C_{60}$ arylene group;

3) $L^3$, $L^4$, $L^5$ and $L^6$ are each independently selected from the group consisting of a single bond; or a $C_6$-$C_{60}$ arylene group; fluorenylene group; a $C_2$-$C_{60}$ heterocyclic group including at least one hetero atom of O, N, S, Si or F; a fused ring group of a $C_3$-$C_{60}$ aliphatic ring and a $C_6$-$C_{60}$ aromatic ring;

4) Ar is an $C_6$-$C_{60}$ aryl group,

5) $Ar^1$, $Ar^2$ and $Ar^3$ are each independently selected from the group consisting of a $C_6$-$C_{60}$ aryl group; a fluorenyl group; a $C_2$-$C_{60}$ heterocyclic group including at least one hetero atom of O, N, S, Si or F; and a fused ring group of a $C_3$-$C_{60}$ aliphatic ring and a $C_6$-$C_{60}$ aromatic ring;

6) $Ar^4$ is each independently selected from the group consisting of a $C_6$-$C_{60}$ aryl group; a fluorenyl group; a $C_2$-$C_{60}$ heterocyclic group including at least one hetero atom of O, N, S, Si or F; and a fused ring group of a $C_3$-$C_{60}$ aliphatic ring and a $C_6$-$C_{60}$ aromatic ring; and -L'-$NR^bR^b$, 7) L' is each independently selected from the group consisting of a single bond; and a $C_6$-$C_{60}$ arylene group; a $C_2$-$C_{60}$ heterocyclic group including at least one hetero atom of O, N, S, Si or F;

8) $R^a$ and $R^b$ are each independently selected from the group consisting of a $C_6$-$C_{60}$ aryl group; a fluorenyl group; a fused ring group of a $C_3$-$C_{60}$ aliphatic ring and a $C_6$-$C_{60}$ aromatic ring; a $C_2$-$C_{60}$ heterocyclic group including at least one hetero atom of O, N, S, Si or F; a $C_1$-$C_{50}$ alkyl group; a $C_2$-$C_{20}$ alkenyl group; a $C_2$-$C_{20}$ alkynyl group; a $C_1$-$C_{30}$ alkoxy group; and a $C_6$-$C_{30}$ aryloxy group;

9) Ring A is a substituent represented by the following Formula a or Formula b;

<Formula a>

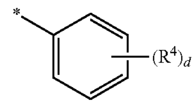

<Formula b>

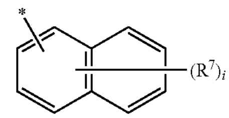

10) Ring B is a $C_6$-$C_{20}$ aryl group;

11) $R^1$, $R^2$, $R^3$, $R^4$, $R^5$, $R^6$ and $R^7$ are each same or different, and each independently hydrogen; or deuterium;

12) $R^8$ and $R^9$ are each the same or different, and each independently selected from the group consisting of hydrogen; deuterium; halogen; cyano group; nitro group; a $C_6$-$C_{60}$ aryl group; fluorenyl group; a $C_2$-$C_{60}$ heterocyclic group including at least one heteroatom of O, N, S, Si or F; a fused ring group of a $C_3$-$C_{60}$ aliphatic ring and a $C_6$-$C_{60}$ aromatic ring; a $C_1$-$C_{60}$ alkyl group; a $C_2$-$C_{60}$ alkenyl group; a $C_2$-$C_{60}$ alkynyl group; a $C_1$-$C_{60}$ alkoxy group; and a $C_6$-$C_{60}$ aryloxy group; or an adjacent plurality of $R^8$ or a plurality of $R^9$ may be bonded to each other to form a ring, 13) A and d are each independently an integer of 0 to 5, b and f are each independently an integer of 0 to 6, c, e, g, h, n and o are each independently an integer of 0 to 4, i is an integer of 0 to 7, 14) Z is 0 or 1, provided that when z is 0, $L^1$ is a substituent represented by Formula L-4, 15) Y is O, S, CR'R" or $NR^a$, 16) wherein R' and R" are each independently selected from the group consisting of hydrogen; deuterium; a $C_6$-$C_{60}$ aryl group; fluorenyl group; a $C_2$-$C_{60}$ heterocyclic group including at least one heteroatom of O, N, S, Si or F; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; and a $C_6$-$C_{30}$ aryloxy group; or R' and R" may be bonded to each other to form a spiro, 17) $R^a$ is a $C_6$-$C_{60}$ aryl group; or a $C_2$-$C_{60}$ heterocyclic group including at least one hetero atom of O, N, S, Si or F;

18) * denotes a position to be bonded, 19) wherein the aryl group, arylene group, heterocyclic group, fluorenyl group, fluorenylene group, fused ring group, alkyl group, alkenyl group, alkynyl group, alkoxy group and aryloxy group may be substituted with one or more substituents selected from the group consisting of deuterium; halogen; silane group; siloxane group; boron group; germanium group; cyano group; nitro group; $C_1$-$C_{20}$ alkylthio group; $C_1$-$C_{20}$ alkoxyl group; $C_1$-$C_{20}$ alkyl group; $C_2$-$C_{20}$ alkenyl group; $C_2$-$C_{20}$ alkynyl group; $C_6$-$C_{20}$ aryl group; $C_6$-$C_{20}$ aryl group substituted with deuterium; a fluorenyl group; $C_2$-020 heterocyclic group; $C_3$-$C_{20}$ cycloalkyl group; $C_7$-$C_{20}$ arylalkyl group; and $C_8$-$C_{20}$ arylalkenyl group; also the substituents may be bonded to each other to form a saturated or unsaturated ring, wherein the term 'ring' means a $C_3$-$C_{60}$ aliphatic ring or a $C_6$-$C_{60}$ aromatic ring or a $C_2$-$C_{60}$ heterocyclic group or a fused ring formed by the combination thereof.

2. The compound of claim 1, wherein Formula 1 is represented by Formula 1-1 or Formula 1-2:
<Formula 1-1>
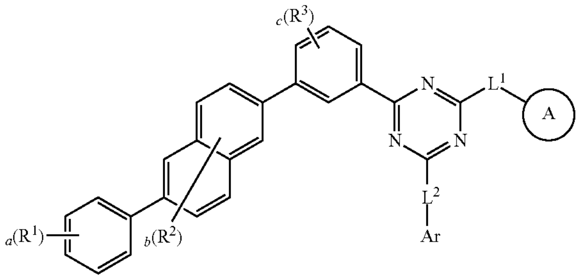
-continued
<Formula 1-2>
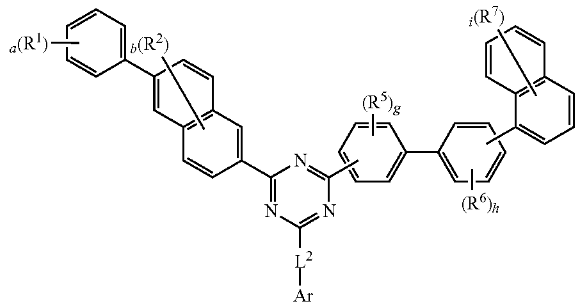
wherein, $R^1$, $R^2$, $R^3$, $R^4$, $R^5$, $R^6$, $R^7$, $L^1$, $L^2$, Ar, a, b, c, d, g, h and i are the same as defined in claim 1.
3. The compound of claim 1, wherein Formula 1 is represented by Formula 1-1-a or Formula 1-1-b:
<Formula 1-1-a>
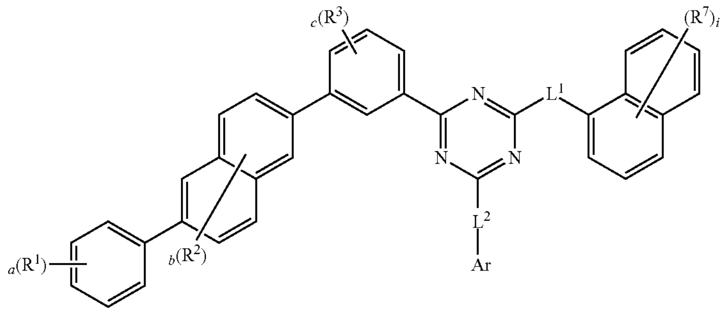
<Formula 1-1-b>
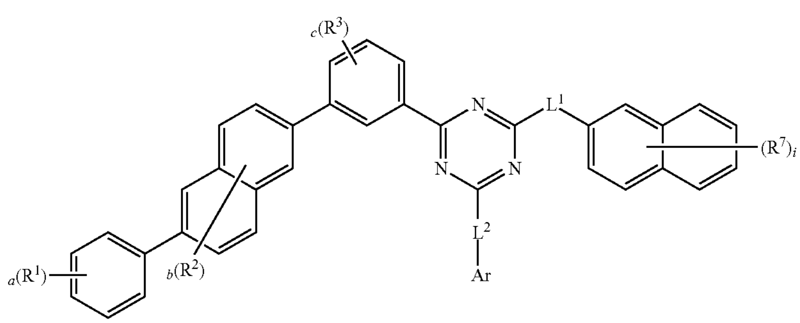

wherein, $R^1$, $R^2$, $R^3$, $R^7$, $L^1$, $L^2$, Ar, a, b, c and i are the same as defined in claim 1.
4. The compound of claim 1, wherein Formula 1 is represented by any of Formulas 1-1-1 to 1-1-5:
<Formula 1-1-1>
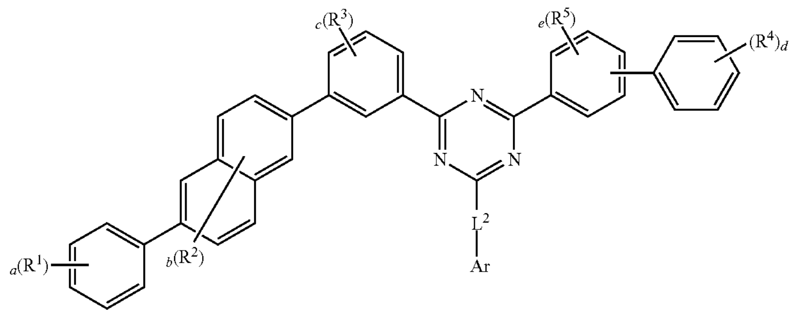
<Formula 1-1-2>
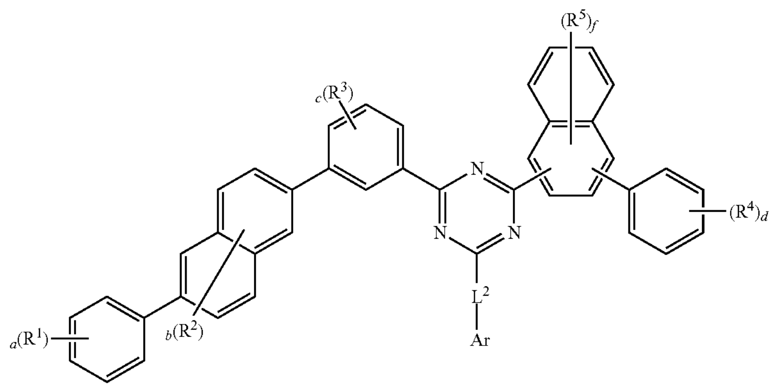
<Formula 1-1-3>
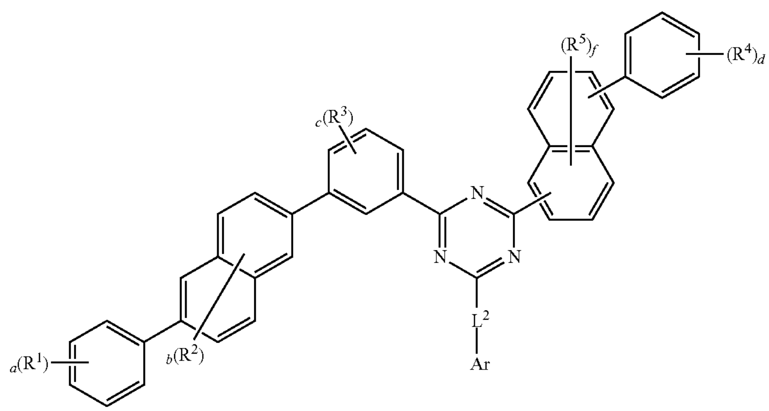
<Formula 1-1-4>
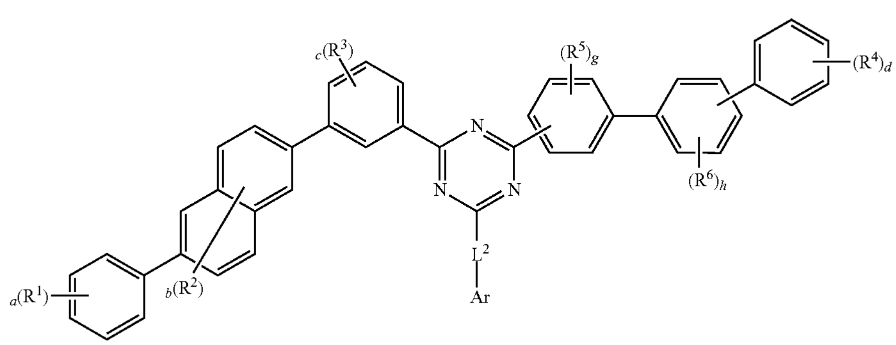

-continued

<Formula 1-1-5>

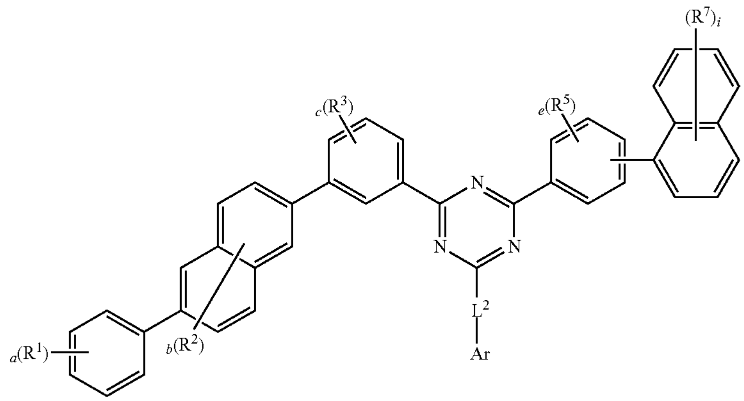

wherein, $R^1$, $R^2$, $R^3$, $R^4$, $R^5$, $R^6$, $R^7$, $L^2$, Ar, a, b, c, d, e, f, g, h and i are the same as defined in claim 1.

5. The compound of claim 1, wherein Formula 1 is represented by Formula 1-2-a:

<Formula 1-2-a>

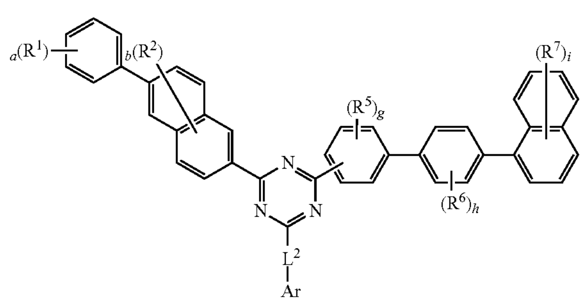

wherein $R^1$, $R^2$, $R^5$, $R^6$, $R^7$, $L^2$, Ar, a, b, g, h and i are the same as defined in claim 1.

6. The compound of claim 1, wherein Formula 1 is represented by any of Formulas 1-2-b to 1-2-d:

<Formula 1-2-b>

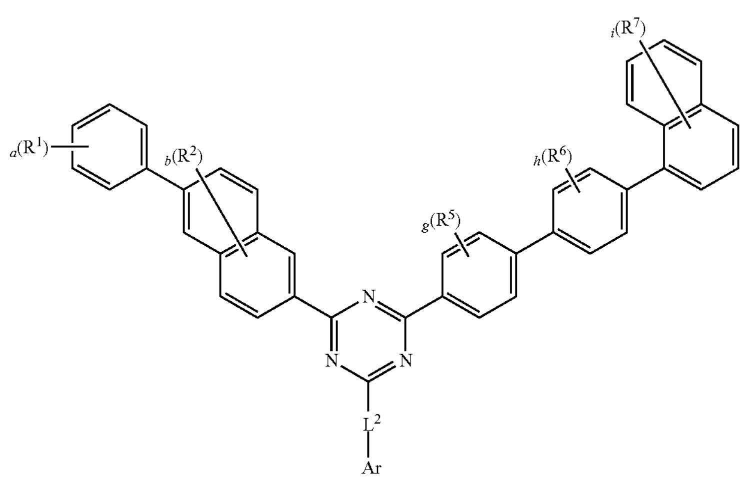

-continued

<Formula 1-2-c>

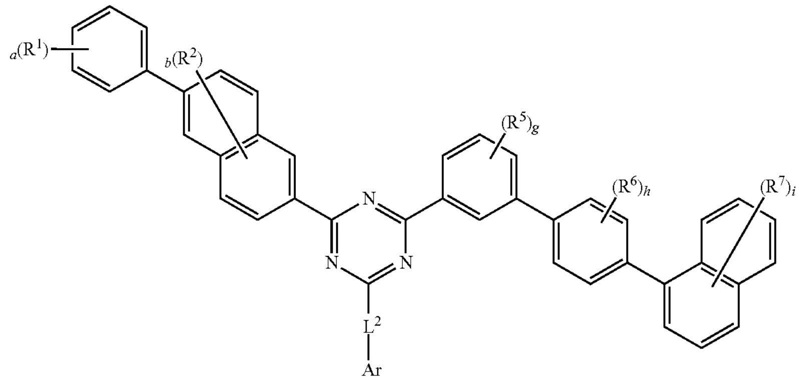

<Formula 1-2-d>

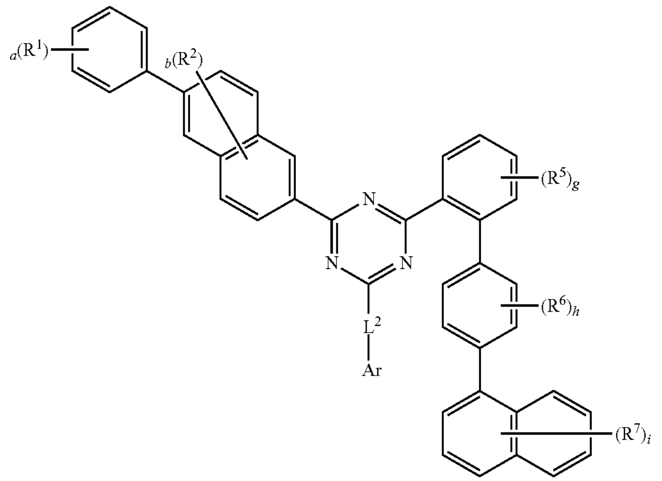

wherein, $R^1$, $R^2$, $R^5$, $R^6$, $R^7$, $L^2$, Ar, a, b, g, h and i are the smae as defined in claim 1.

7. The compound of claim 1, wherein Formula 2 is represented by any of Formulas 2-1 to 2-3:

<Formula 2-1>

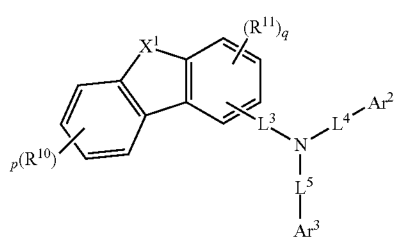

<Formula 2-2>

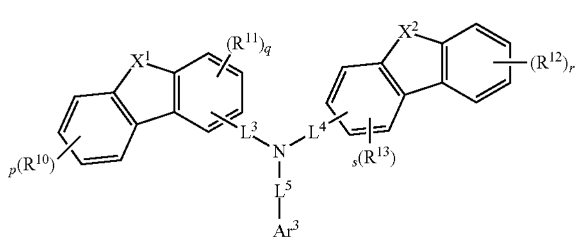

-continued

<Formula 2-3>

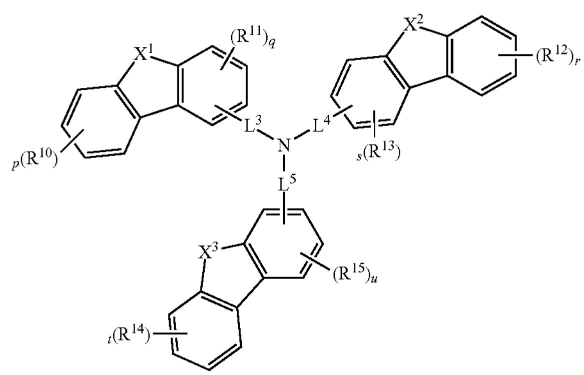

wherein:

1) $L^3$, $L^4$, $L^5$, $Ar^2$ and $Ar^3$ are the same as defined in claim 1, 2) $X^1$, $X^2$ and $X^3$ are the same as the definition of Y of claim 1, 3) $R^{10}$, $R^{11}$, $R^{12}$, $R^{13}$, $R^{14}$ and $R^{15}$ are the same as the definition of $R^8$ of claim 1, 4) P, r and t are each independently an integer of 0 to 4, and 5) q, s and u are each independently an integer of 0 to 3.

8. The compound of claim 1, wherein Formula 3 is represented by any of Formulas 3-1 to 3-6:

<Formula 3-1>

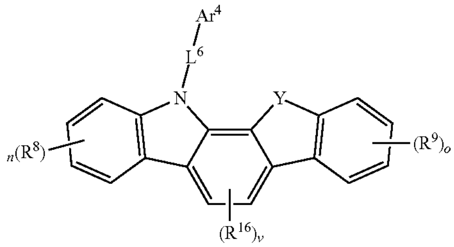

<Formula 3-2>

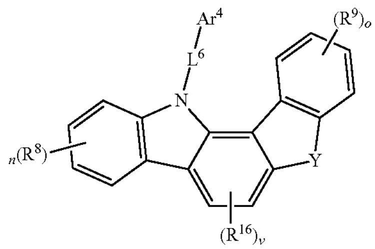

<Formula 3-3>

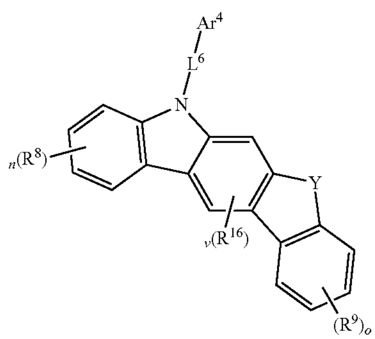

<Formula 3-4>

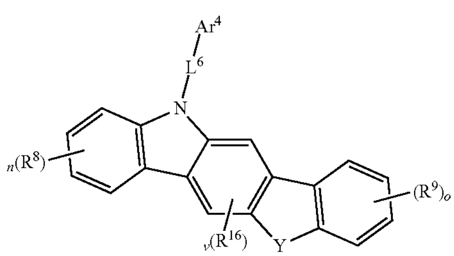

<Formula 3-5>

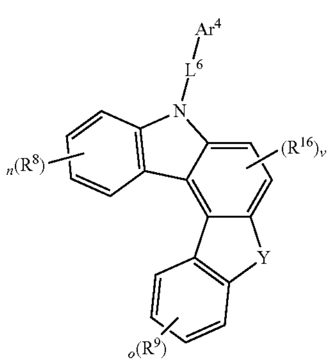

-continued

<Formula 3-6>

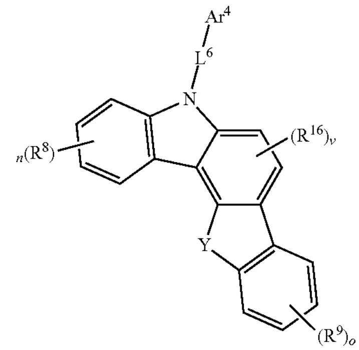

wherein:

1) Y, $R^8$, $R^9$, $L^6$, $Ar^4$, n and o are the same as defined in claim 1, 2) $R^{16}$ is the same as the definition of $R^8$ of claim 1, and 3) v is an integer of 0 to 2.

9. The compound of claim 1, wherein Formula 3 is represented by any of Formulas 3-7 to 3-9:

<Formula 3-7>

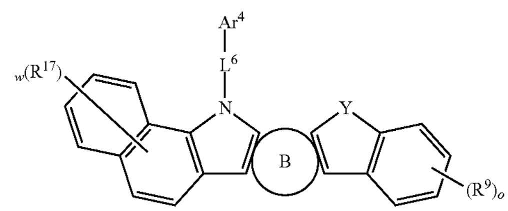

<Formula 3-8>

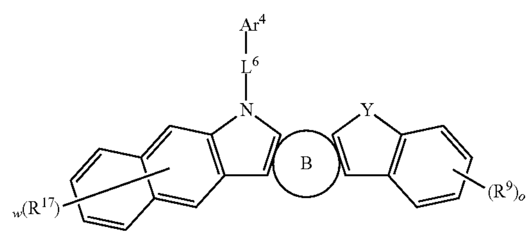

<Formula 3-9>

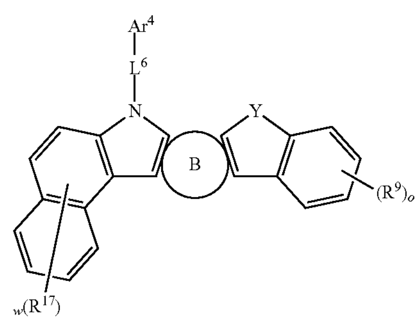

wherein:

1) Y, Ring B, $R^9$, $L^6$, $Ar^4$ and o are as the same as defined in claim 1, 2) $R^{17}$ is selected from the group consisting of hydrogen; deuterium; halogen;

cyano group; nitro group; a $C_6$-$C_{60}$ aryl group; fluorenyl group; a $C_2$-$C_{60}$ heterocyclic group including at least one heteroatom of O, N, S, Si or a fused ring group of a $C_3$-$C_{60}$ aliphatic ring and a $C_6$-$C_{60}$ aromatic ring; a $C_1$-$C_{60}$ alkyl group; a $C_2$-$C_{60}$ alkenyl group; a $C_2$-$C_{60}$ alkynyl group; a $C_1$-$C_{60}$ alkoxy group; and a $C_6$-$C_{60}$ aryloxy group, and 3) W is an integer of 0 to 6.

10. The compound of claim 1, wherein Formula 3 is represented by any of Formulas 3-10 to 3-12:

<Formula 3-10>

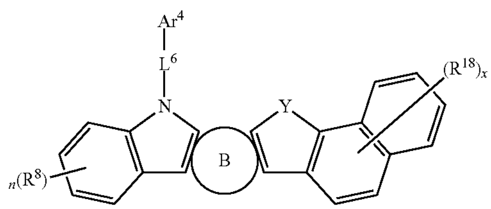

<Formula 3-11>

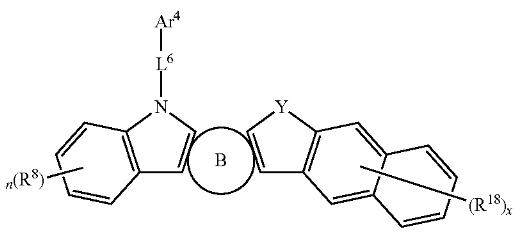

<Formula 3-12>

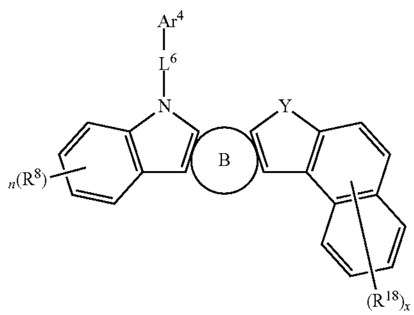

wherein:

1) Y, Ring B, $R^8$, $L^6$, $Ar^4$ and n are the same as defined in claim 1, 2) $R^{18}$ is the same as the definition of $R^{17}$ of claim 9, and 3) x is an integer of 0 to 6.

11. The compound of claim 1, wherein Formula 3 is represented by any of Formulas 3-13 to 3-18:

<Formula 3-13>

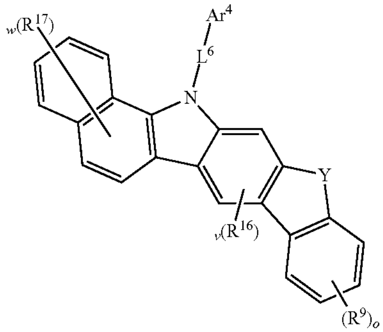

-continued

<Formula 3-14>

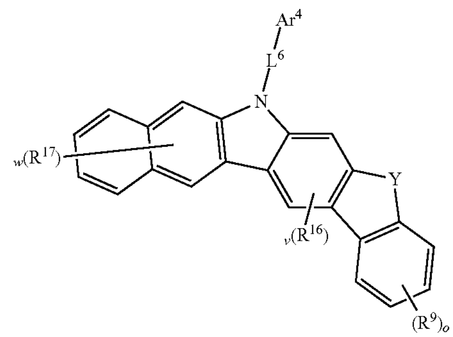

<Formula 3-15>

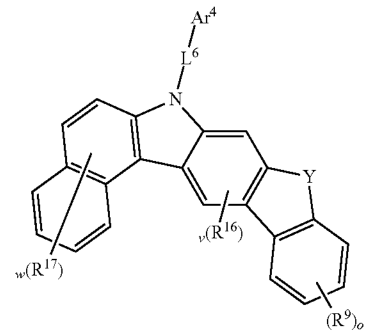

<Formula 3-16>

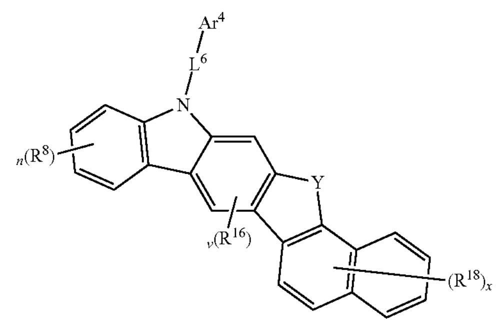

<Formula 3-17>

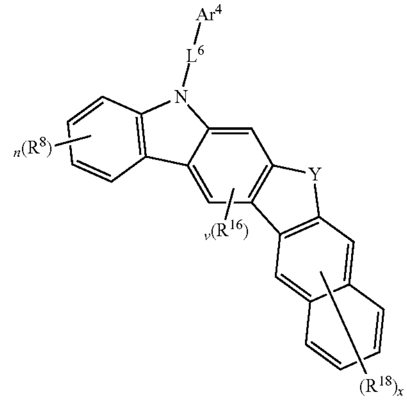

-continued

<Formula 3-18>

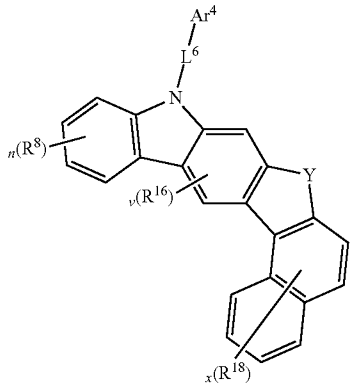

wherein:

1) Y, $L^6$, $Ar^4$, $R^8$, $R^9$, n and o are the same as defined in claim 1,
2) $R^{16}$ is the same as the definition of $R^8$ of claim 1,
3) $R^{17}$ and $R^{18}$ are each the same or different, and each independently selected from the group consisting of hydrogen; deuterium; halogen; cyano group; nitro group; a $C_6$-$C_{60}$ aryl group; fluorenyl group; a $C_2$-$C_{60}$ heterocyclic group including at least one heteroatom of O, N, S, Si or a fused ring group of a $C_3$-$C_{60}$ aliphatic ring and a $C_6$-$C_{60}$ aromatic ring; a $C_1$-$C_{60}$ alkyl group; a $C_2$-$C_{60}$ alkenyl group; a $C_2$-$C_{60}$ alkynyl group; a $C_1$-$C_{60}$ alkoxy group; and a $C_6$-$C_{60}$ aryloxy group, and
4) V is an integer of 0 to 2, w and x are each independently an integer of 0 to 6.

12. The compound of claim 1, wherein Formula 3 is represented by Formula 19:

<Formula 19>

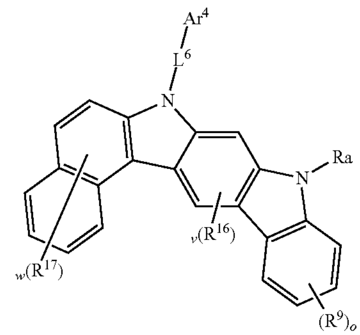

wherein:

1) $L^6$, $Ar^4$, $R^a$, $R^9$ and o are the same as defined in claim 1,
2) $R^{16}$ is the same as the definition of $R^8$ of claim 1,
3) $R^{17}$ is the same as defined in claim 9, and
4) v is an integer of 0 to 2, w is an integer of 0 to 6.

13. The compound of claim 1, wherein the compound represented by Formula 1 may be any one of Compounds P-1 to P-100:

P-1

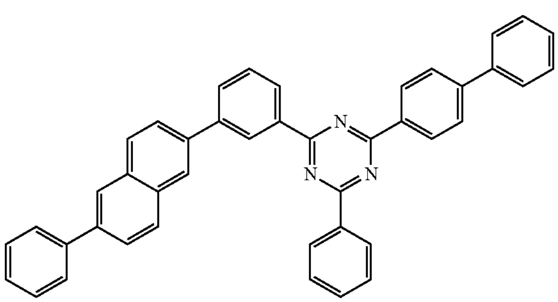

P-2

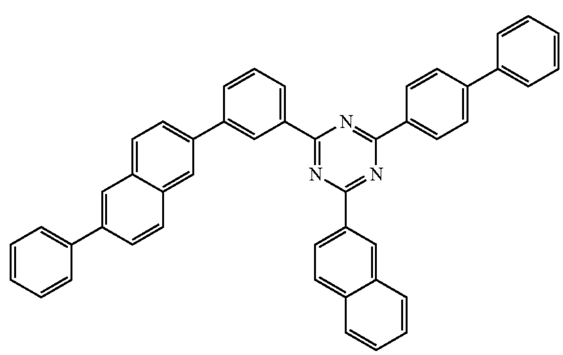

P-3

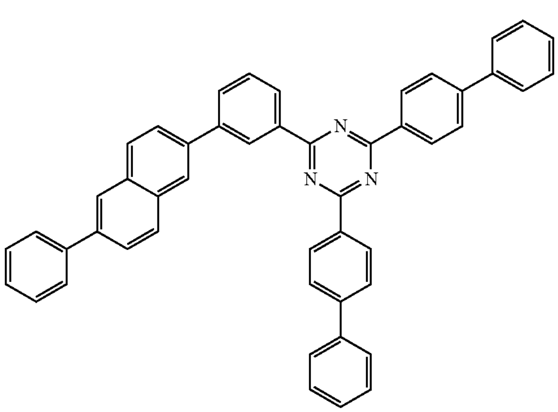

P-4

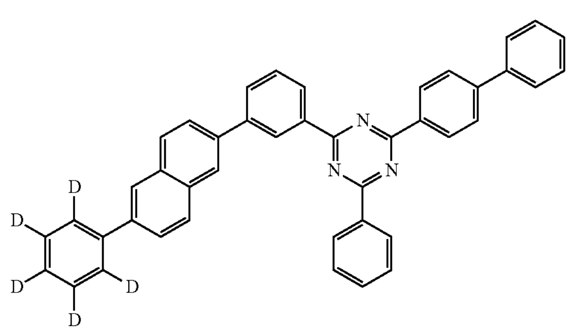

-continued
P-5
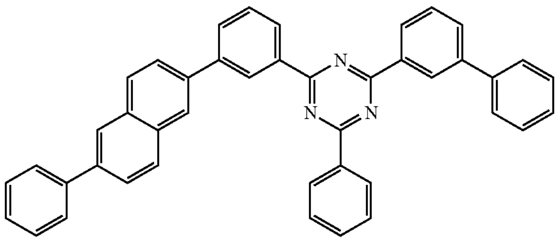
P-6
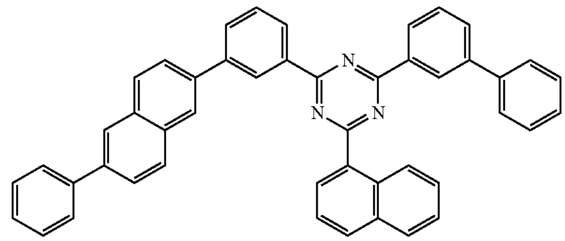
P-7
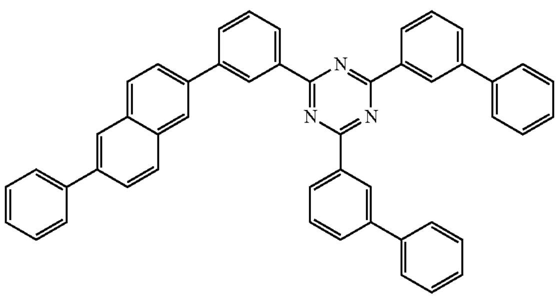
P-8
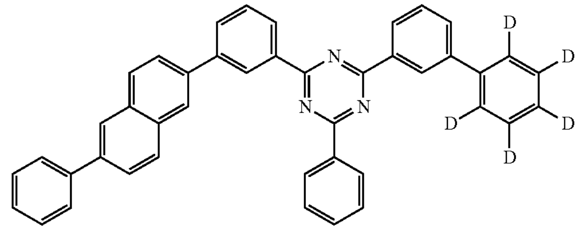
P-9
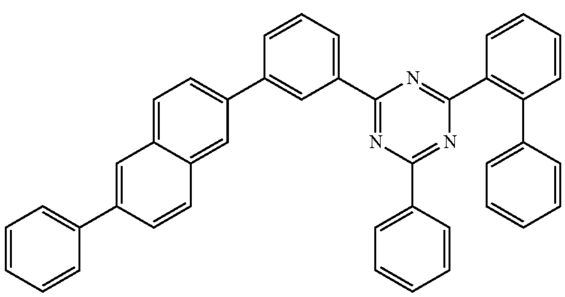
P-10
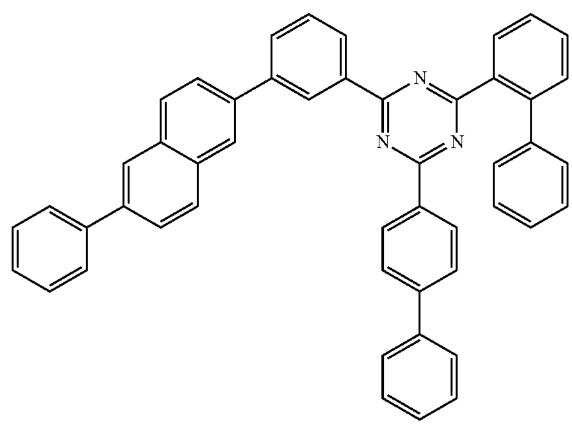
P-11
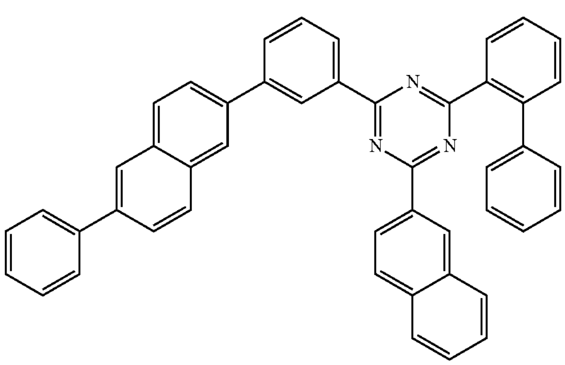
P-12
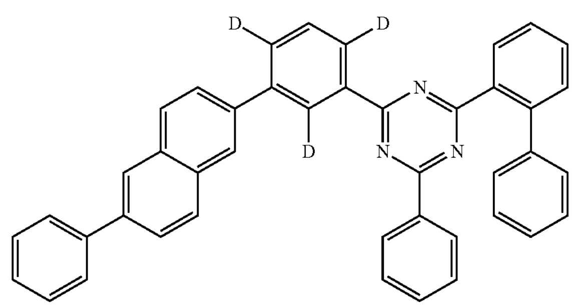

-continued
P-13
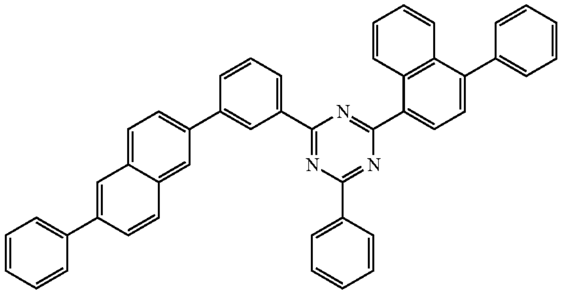
P-14
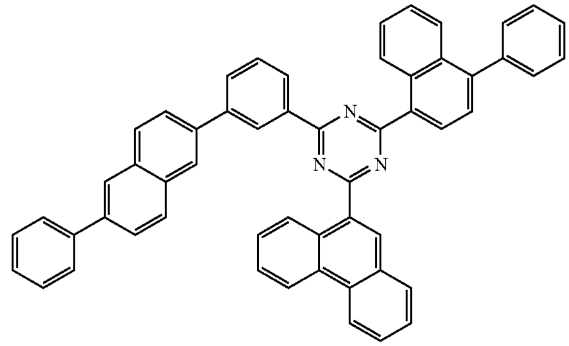
P-15
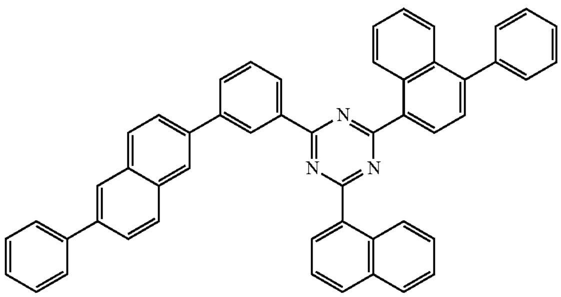
P-16
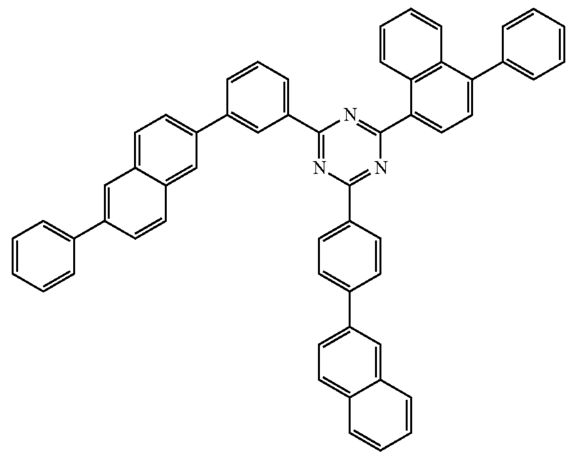
P-17
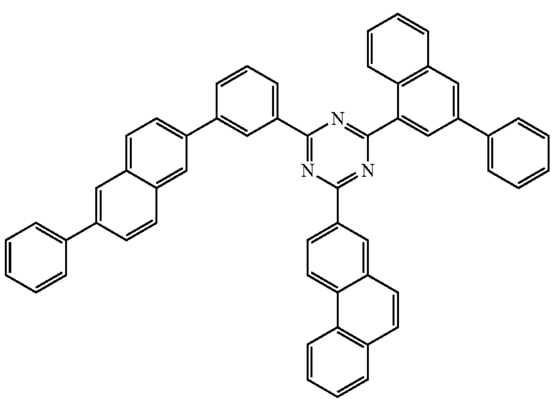
P-18
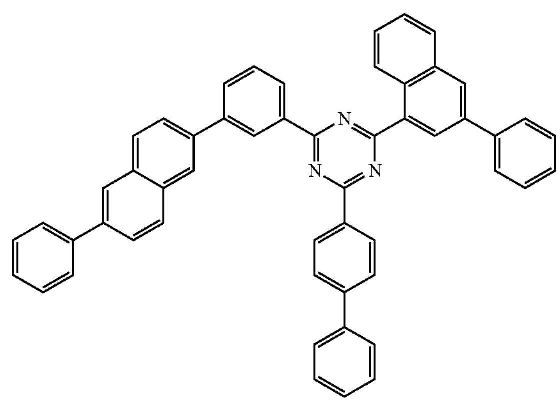
P-19
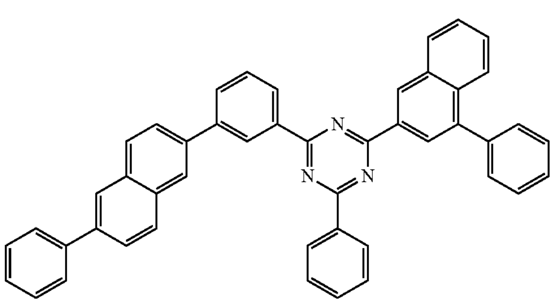
P-20
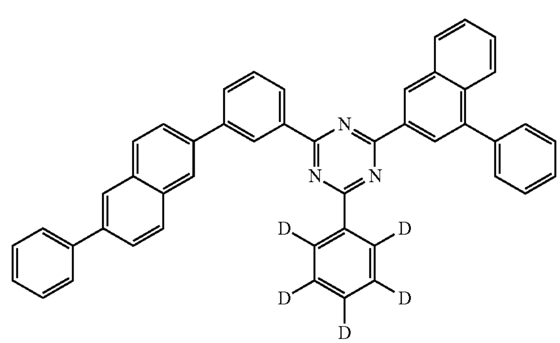

-continued
P-21
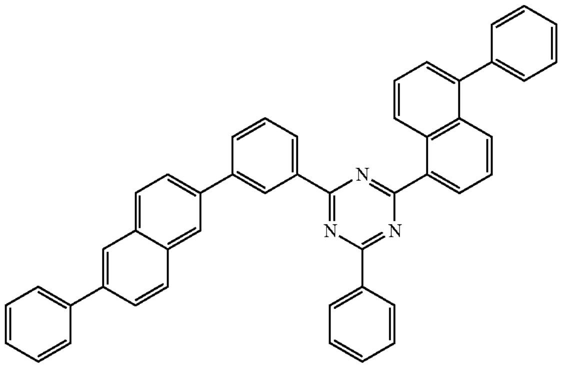
P-22
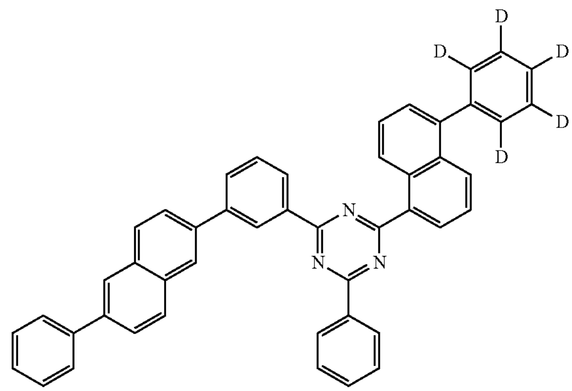
P-23
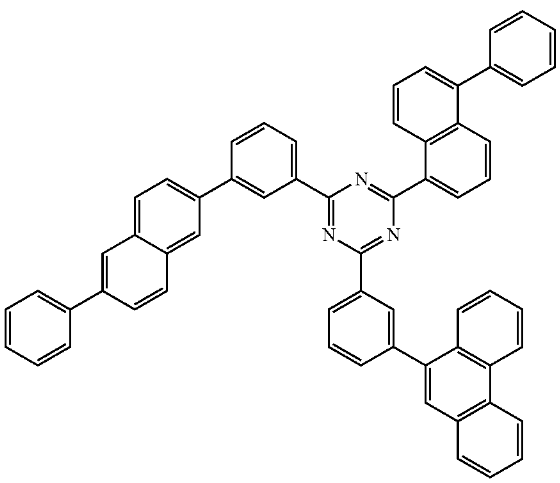
P-24
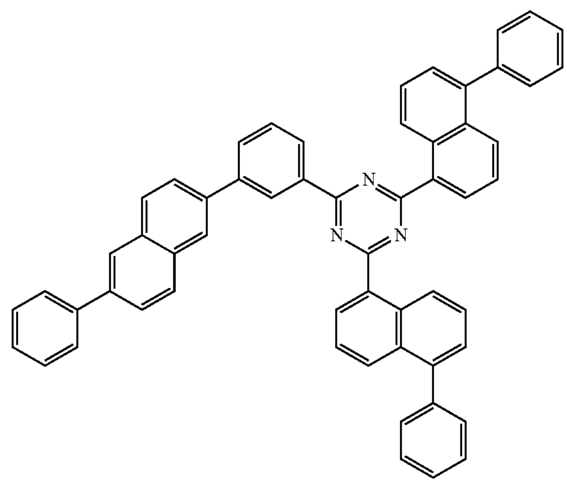
P-25
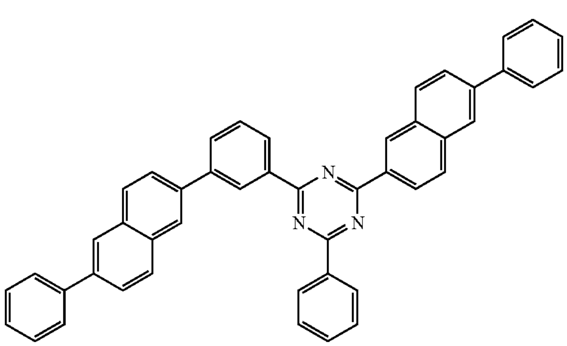
P-26
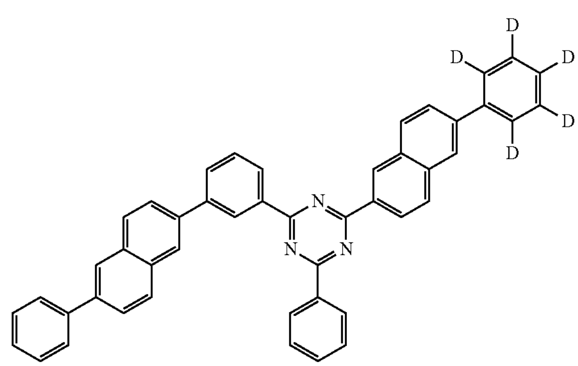

-continued
P-27
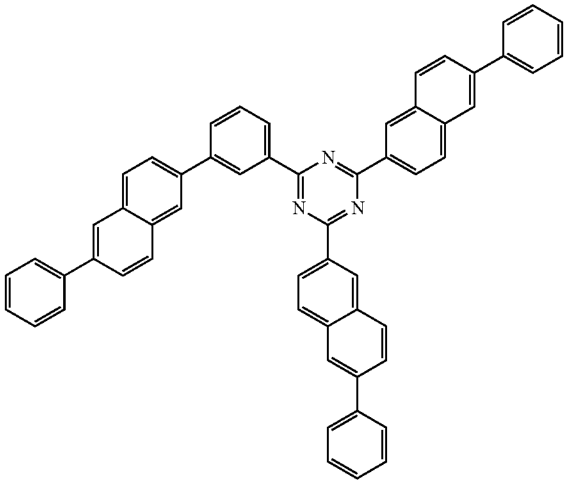
P-28
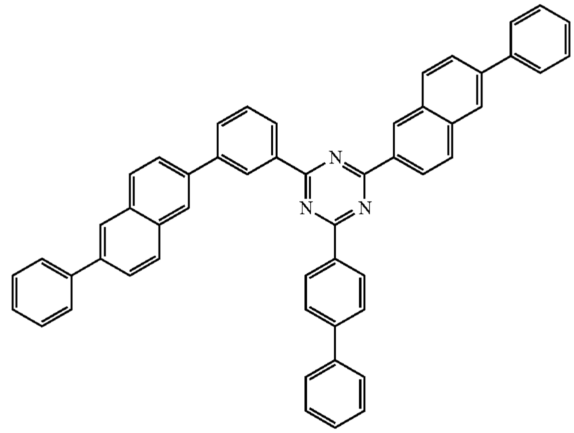
P-29
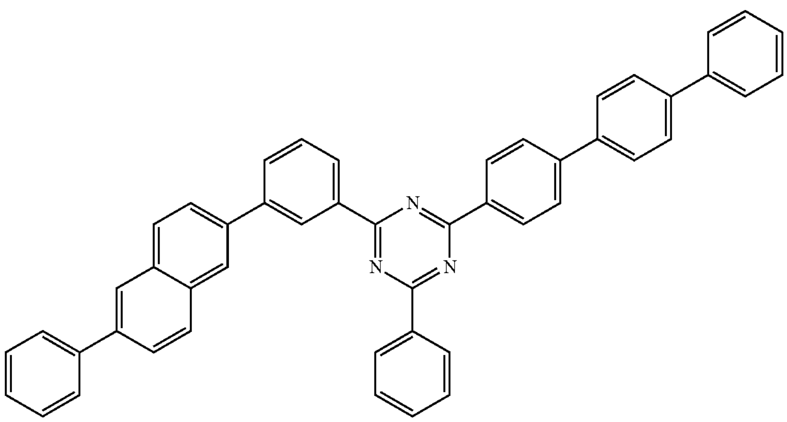
P-30
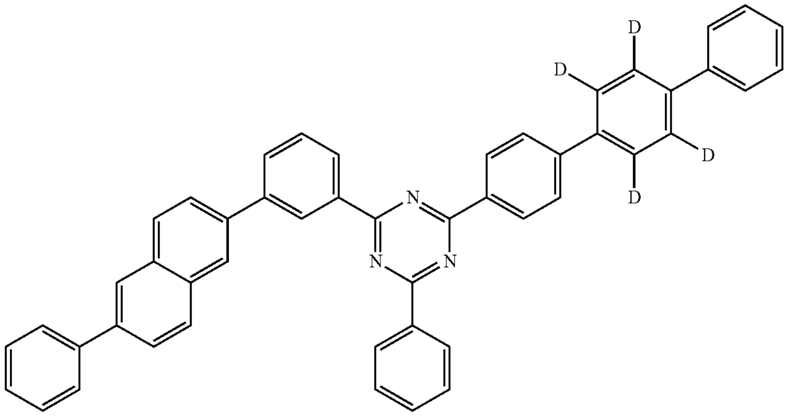

-continued
P-31
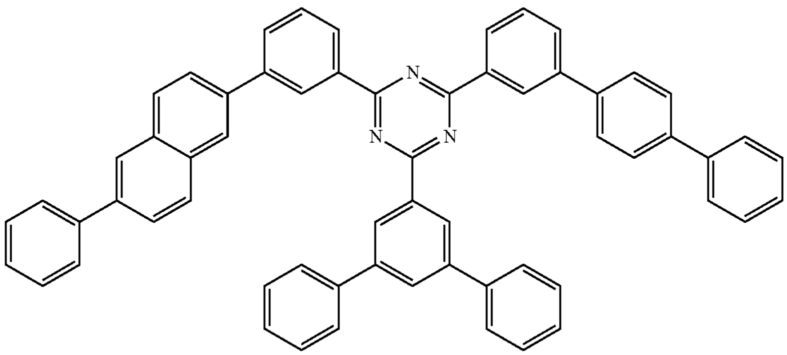
P-32
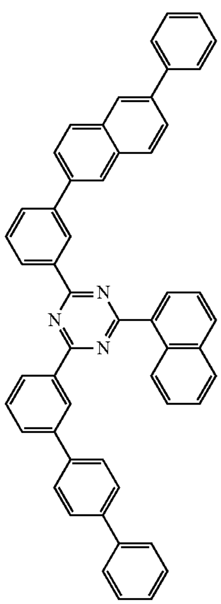
P-33
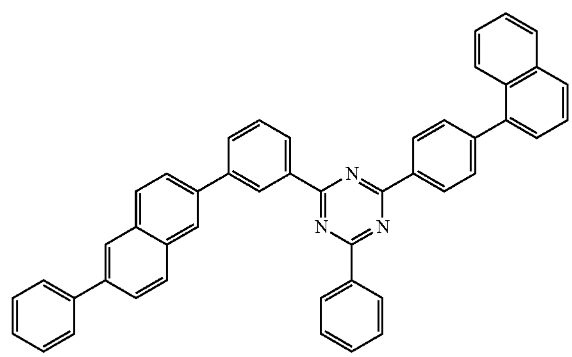
P-34
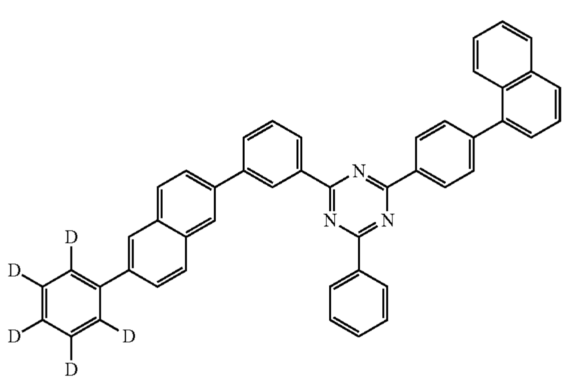
P-35
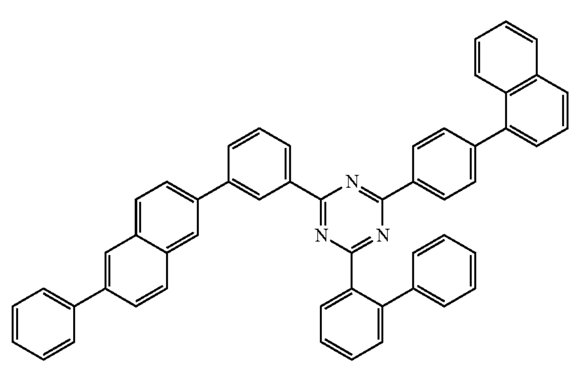

-continued
P-36
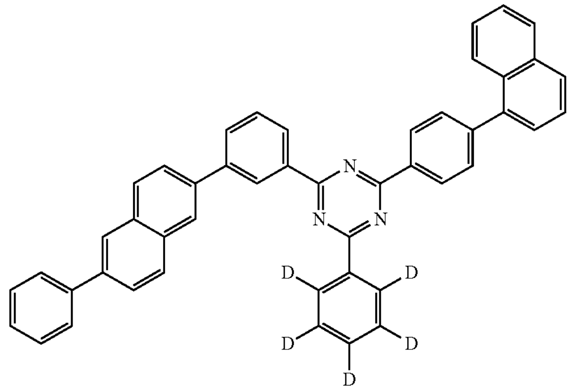
P-37
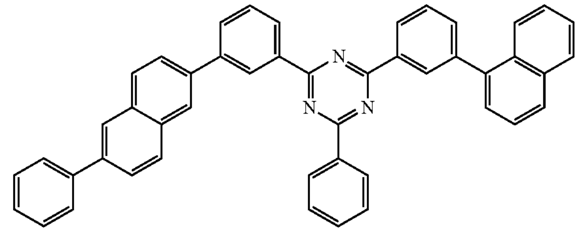
P-38
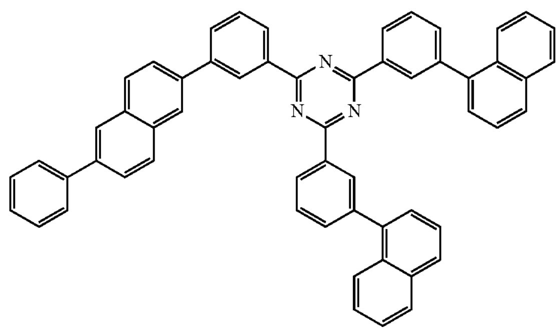
P-39
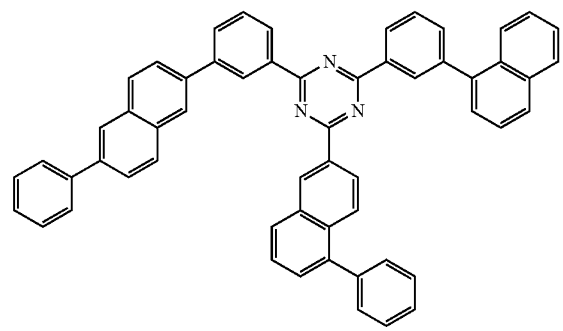
P-40
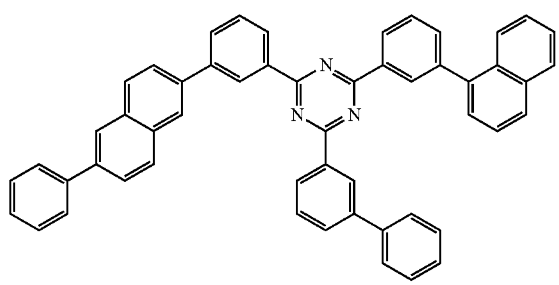
P-41
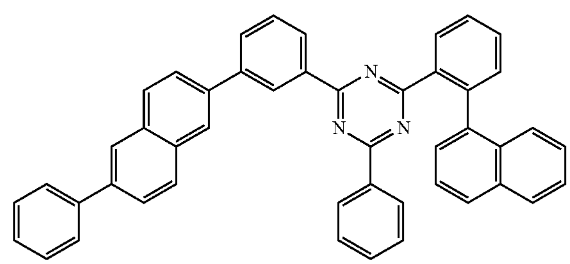
P-43
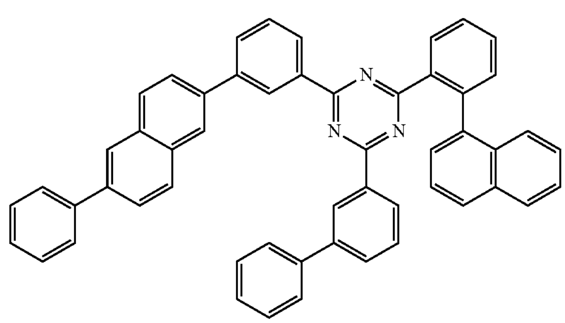
P-42
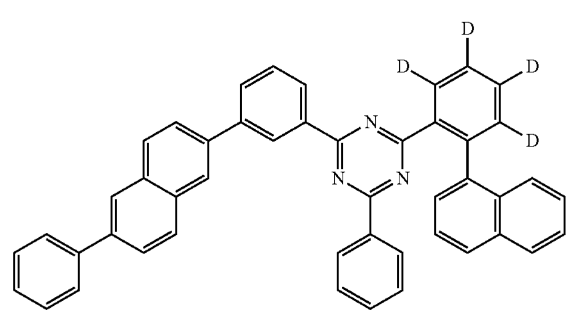

-continued
P-44
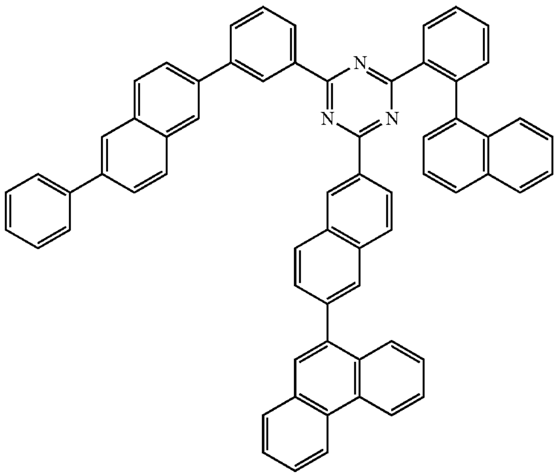
P-45
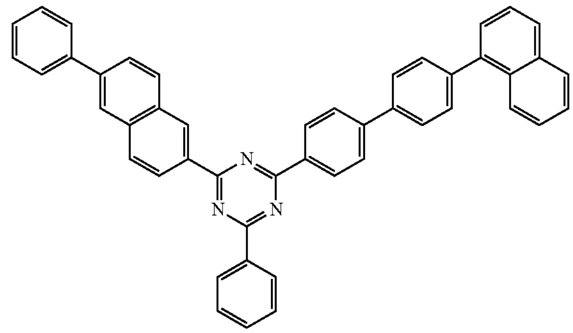
P-46
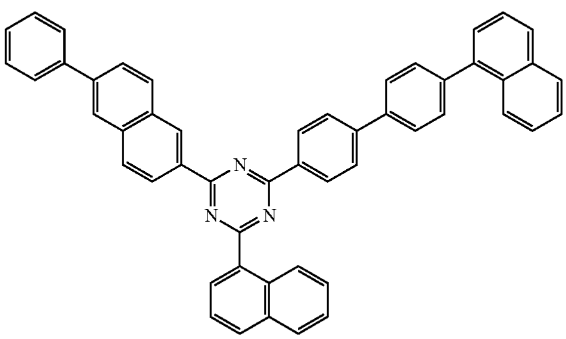
P-47
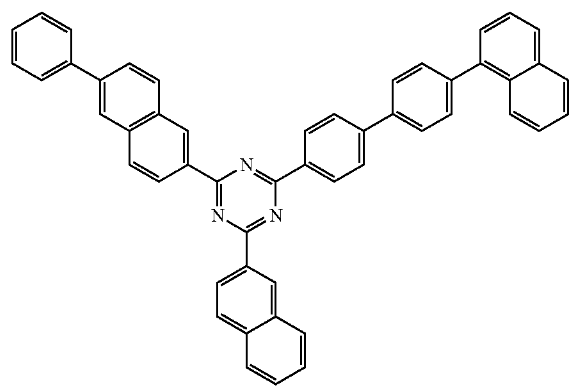
P-48
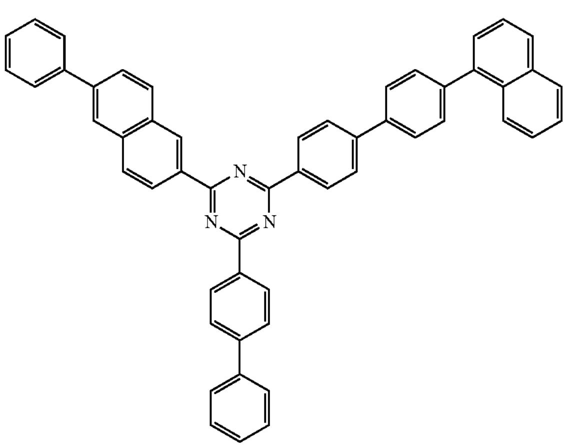
P-49
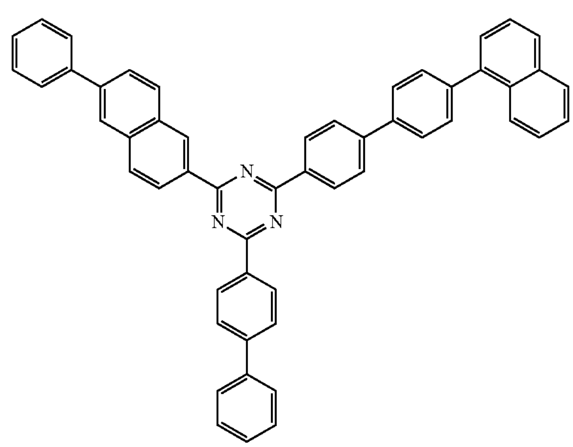

-continued
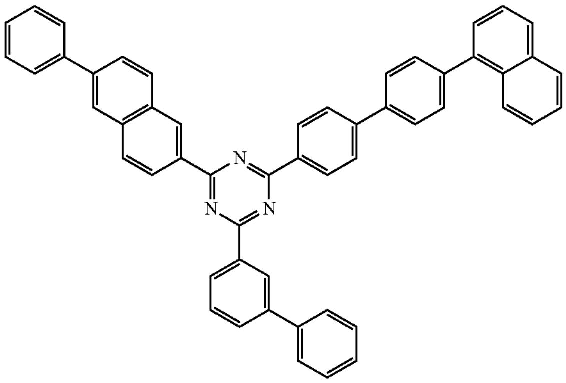
P-50
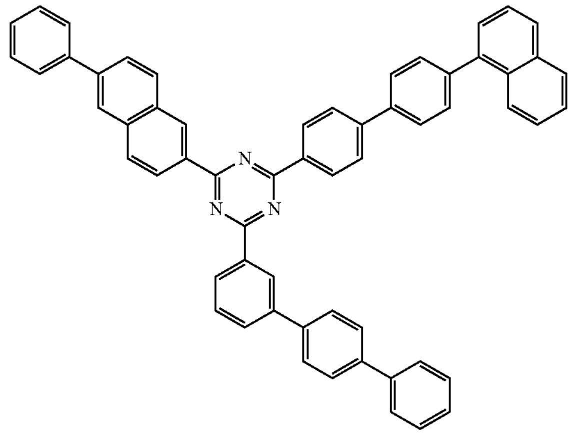
P-51
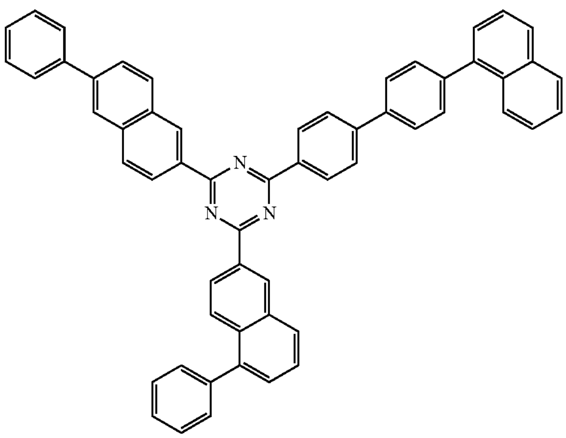
P-52
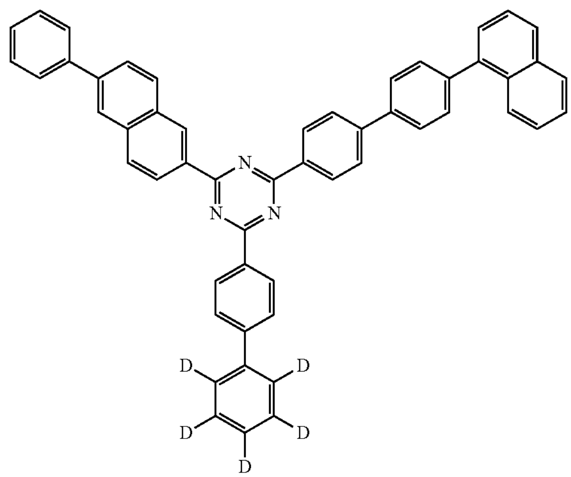
P-53
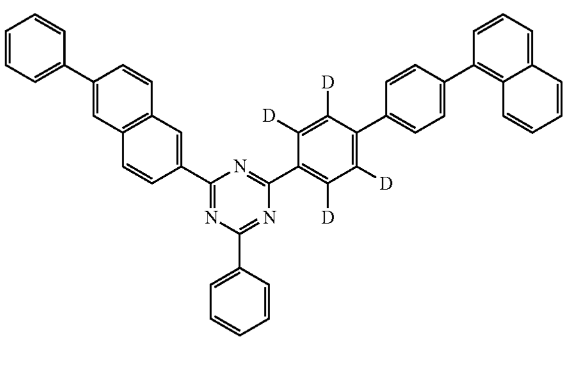
P-54
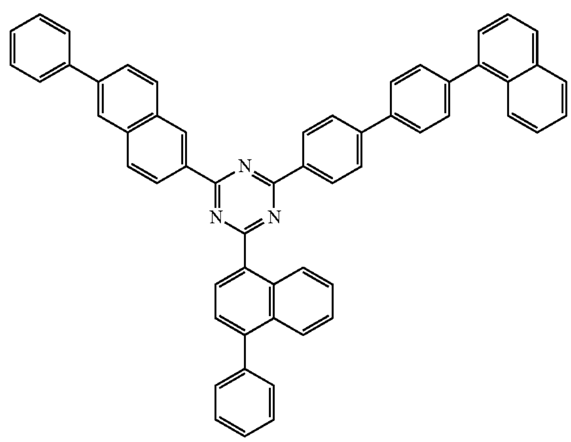
P-55

-continued
P-56
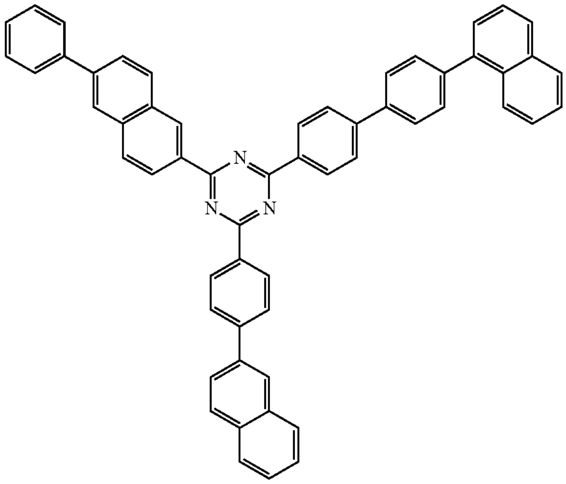
P-57
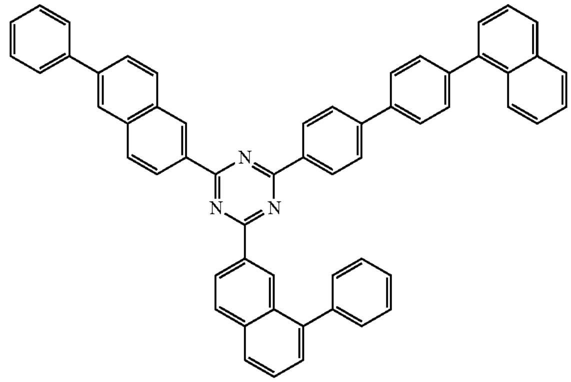
P-58
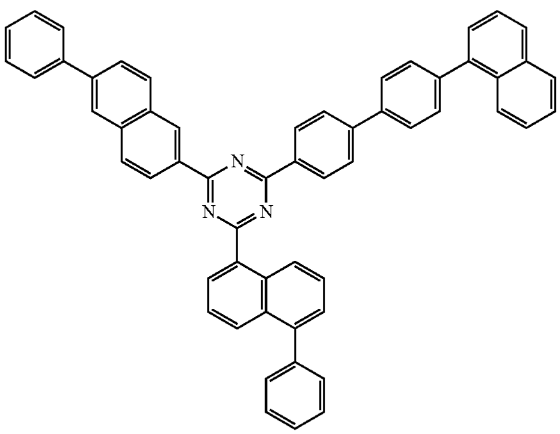
P-59
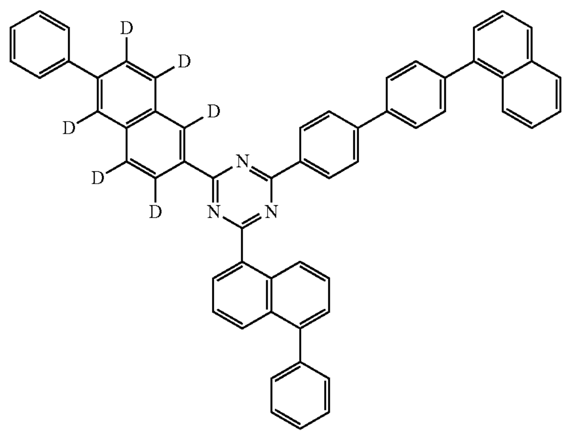
P-60
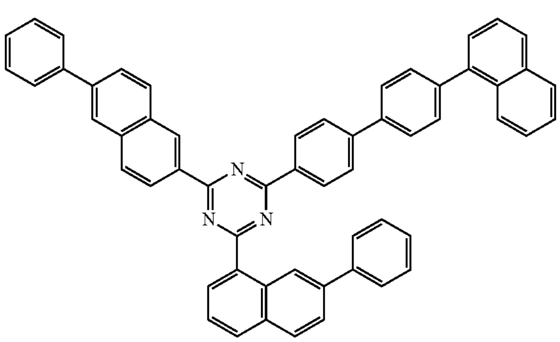
P-61
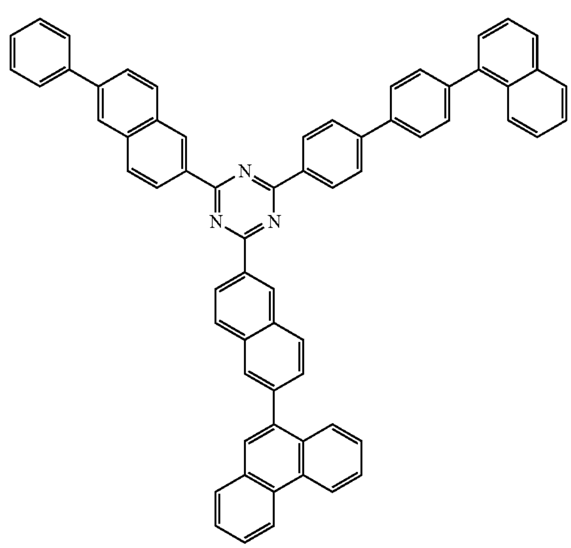

-continued
P-62
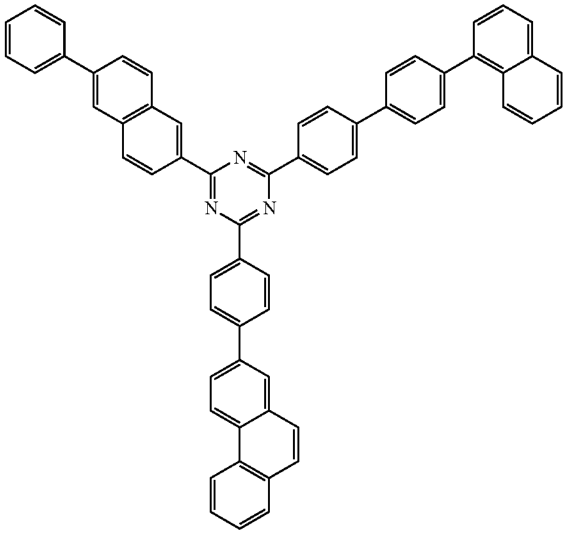
P-63
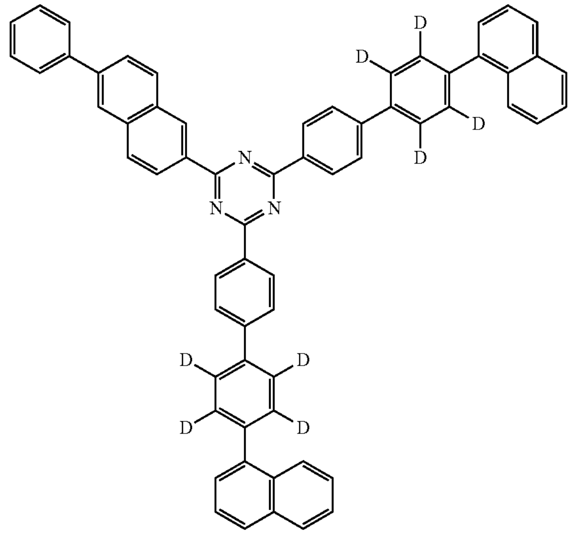
P-64
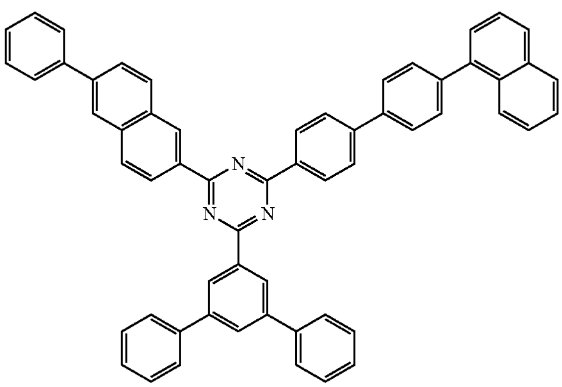
P-65
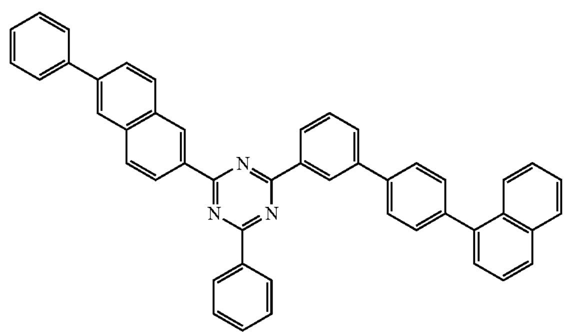
P-66
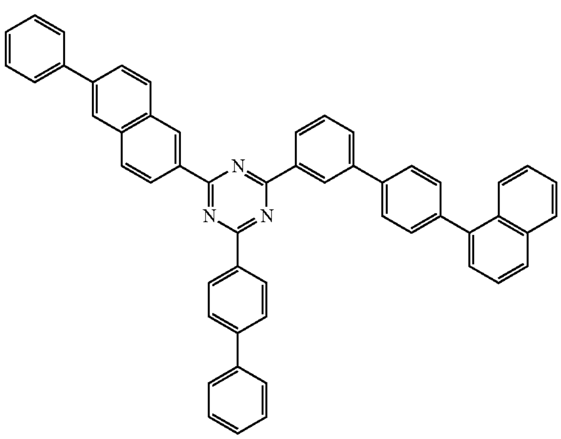
P-67
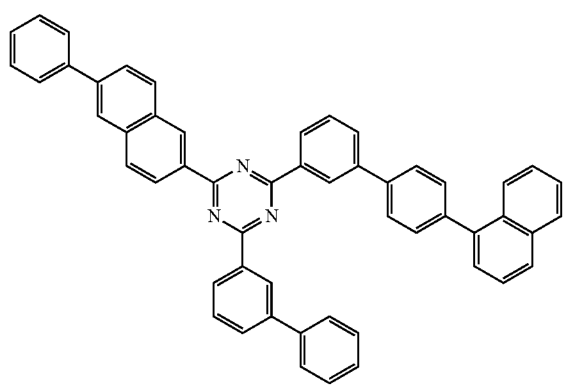

-continued
P-68
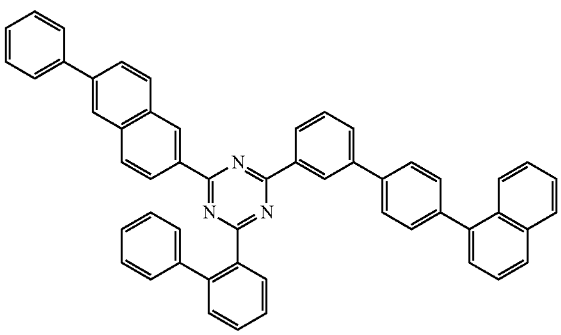
P-69
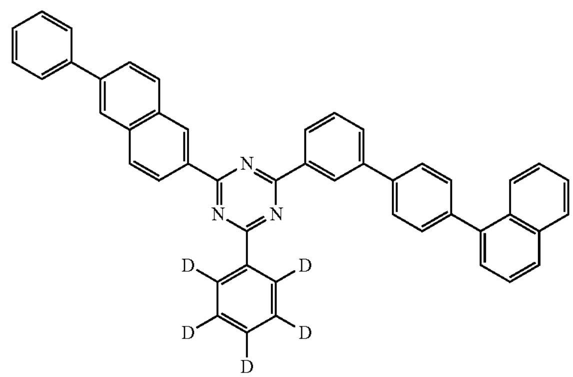
P-70
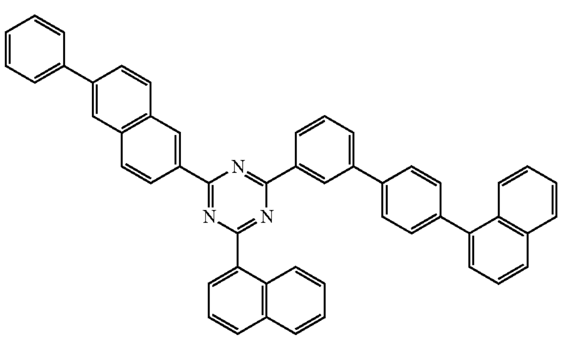
P-71
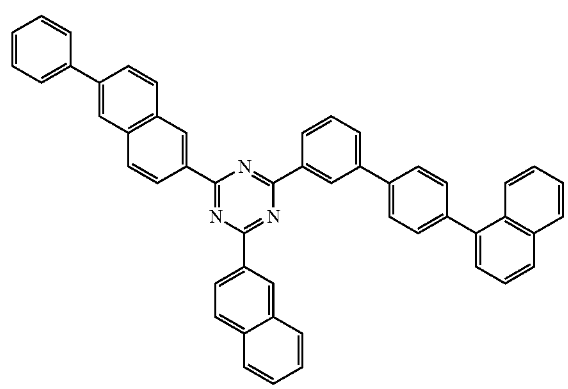
P-72
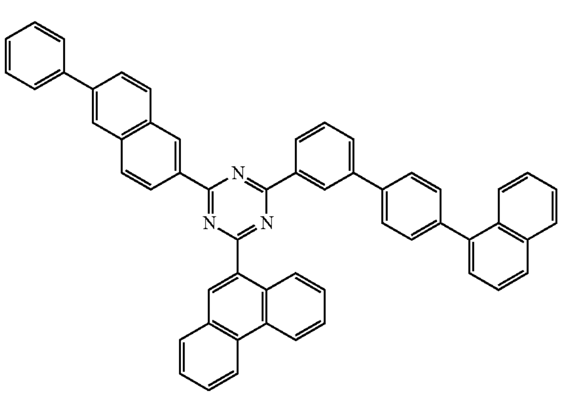
P-73
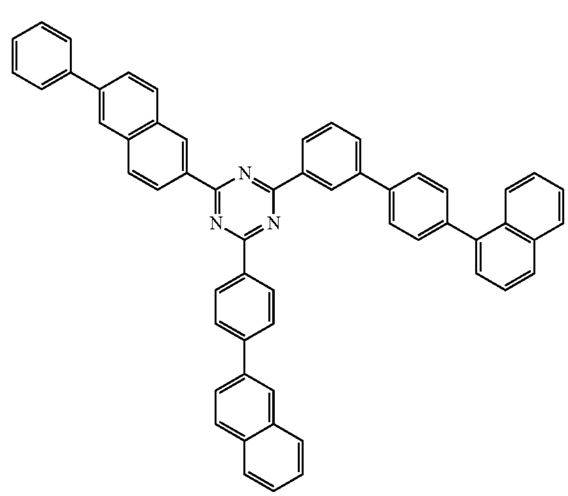

-continued
P-74
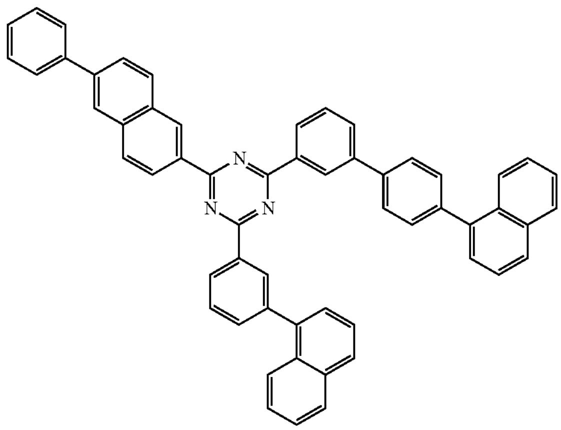
P-75
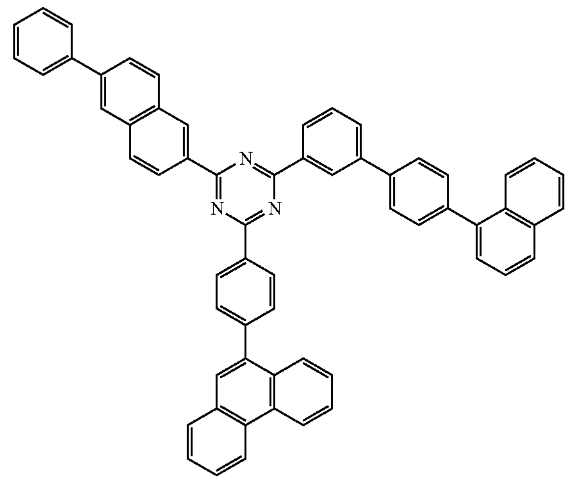
P-76
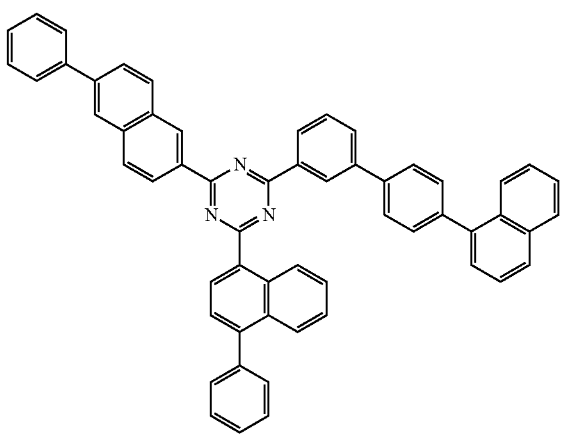
P-77
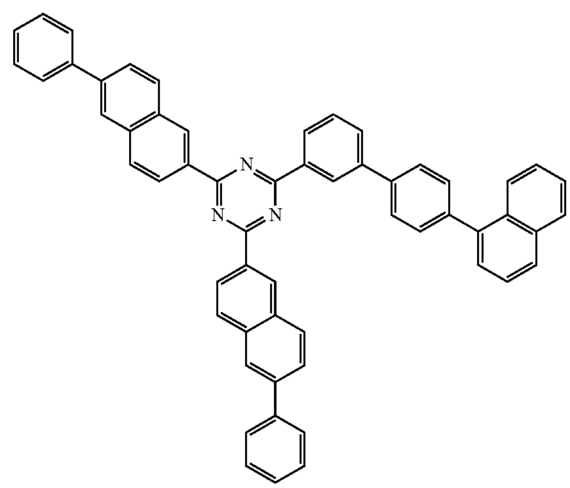
P-78
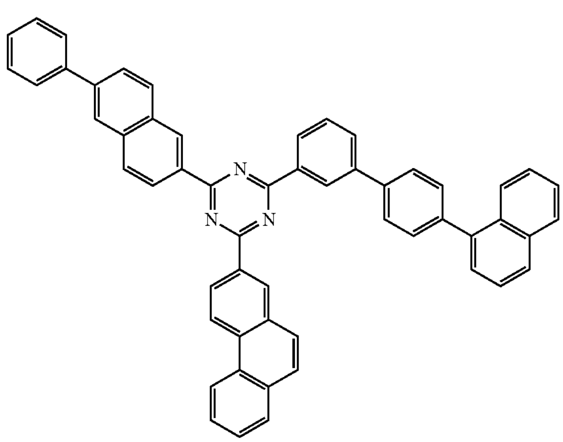
P-79
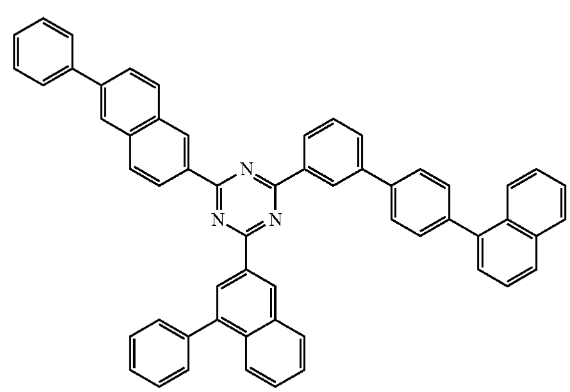

-continued
P-80
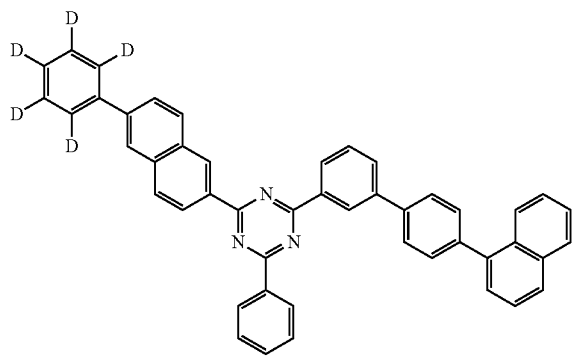
P-81
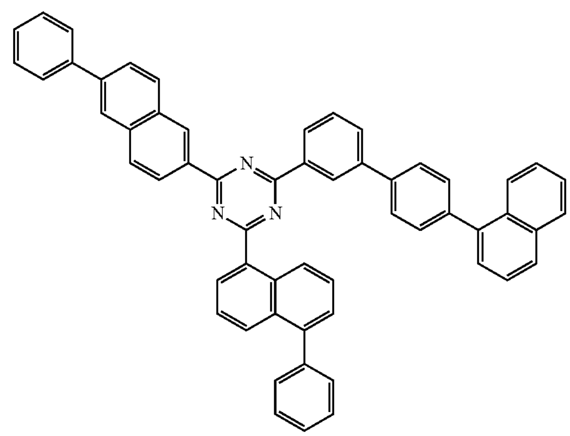
P-82
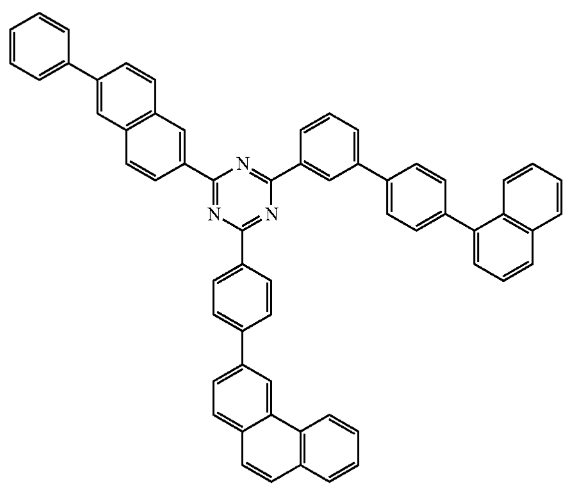
P-83
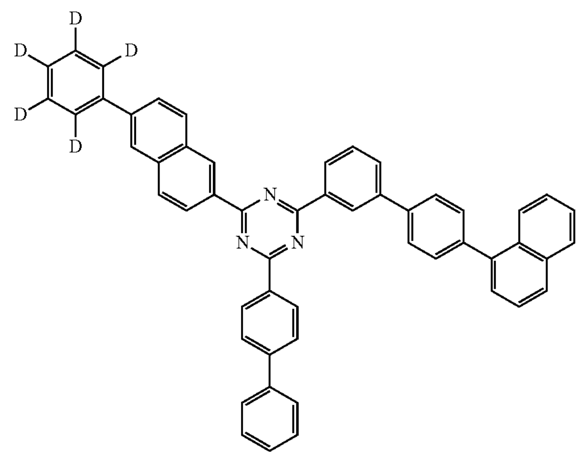
P-84
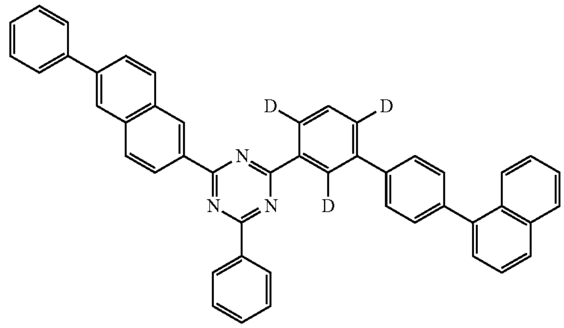
P-85
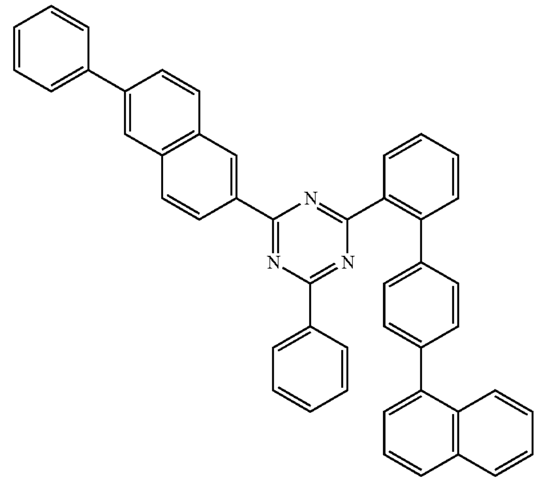

-continued
P-86
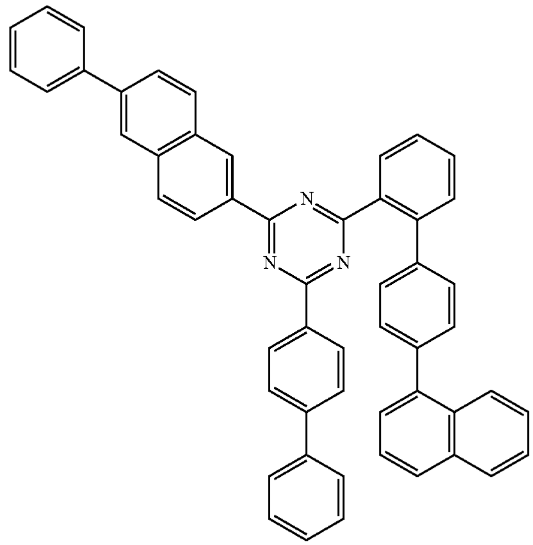
P-87
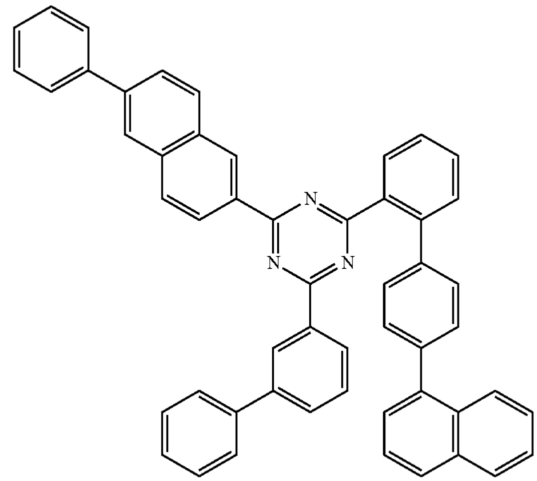
P-88
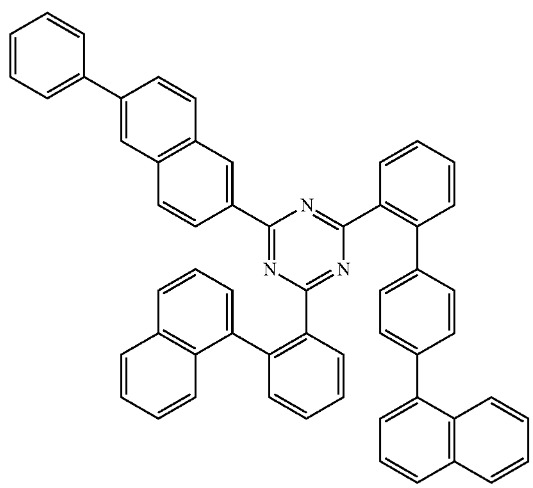
P-89
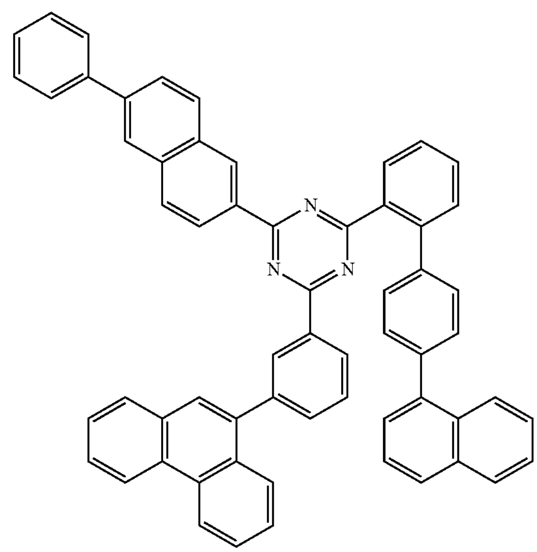
P-90
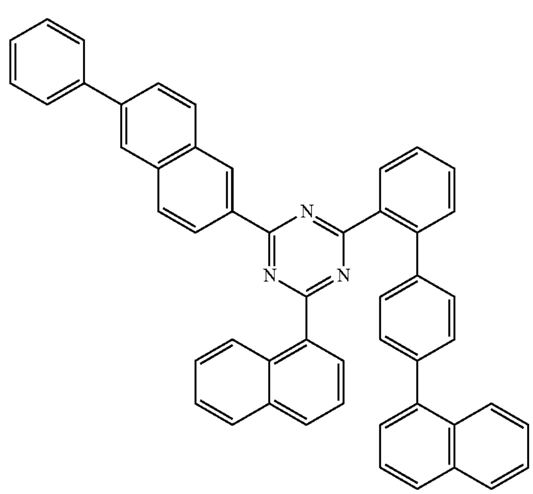
P-91
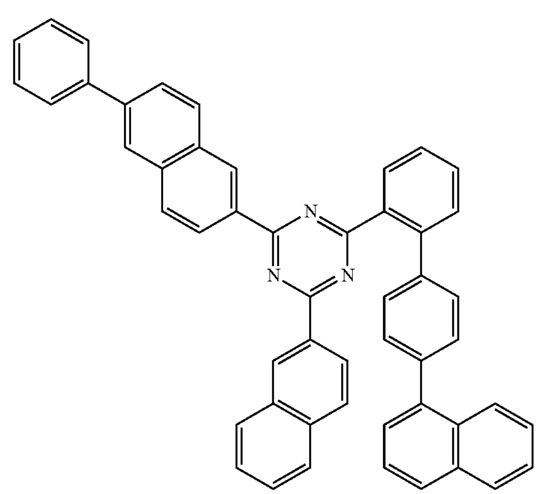

-continued
P-92
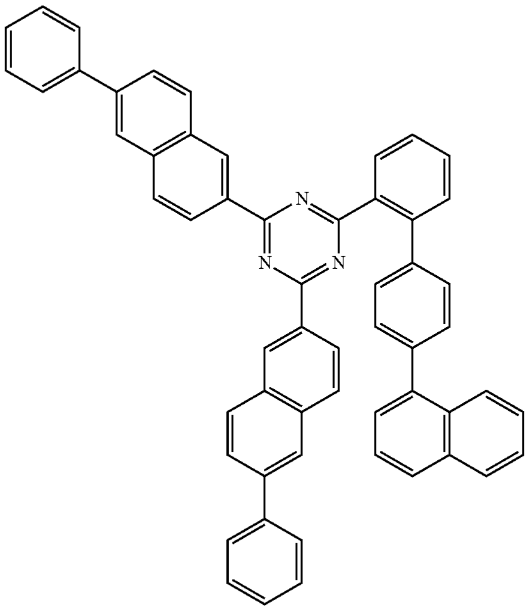
P-93
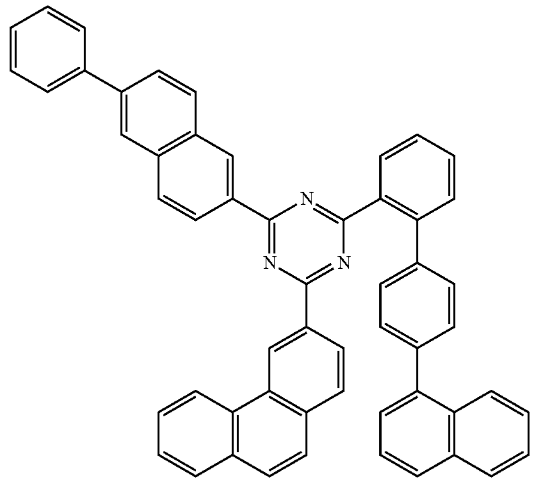
P-94
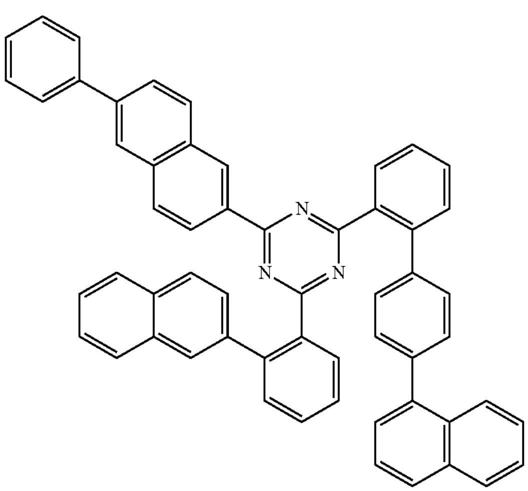
P-95
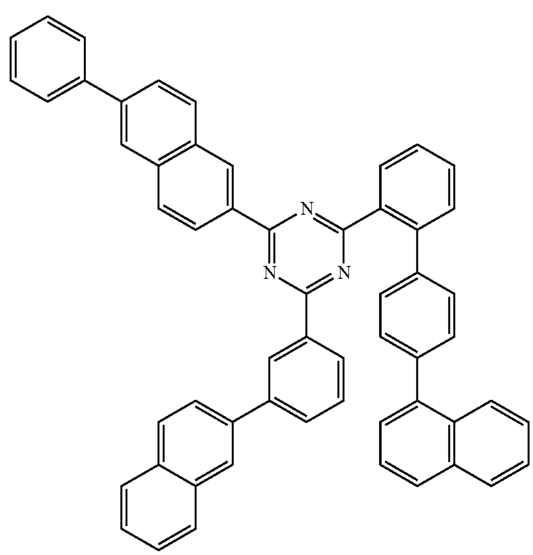

-continued
P-96
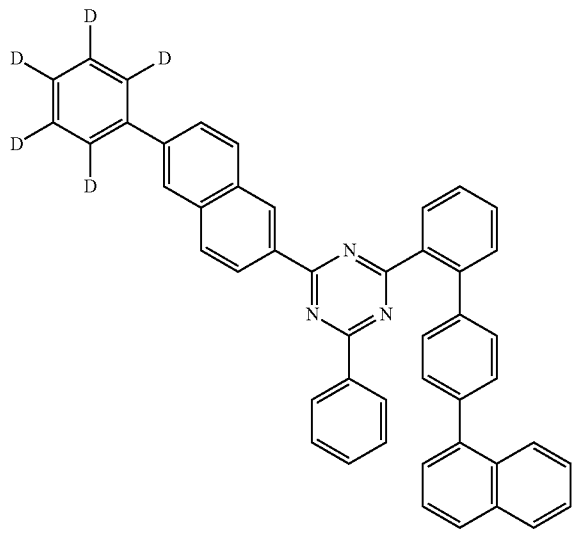
P-97
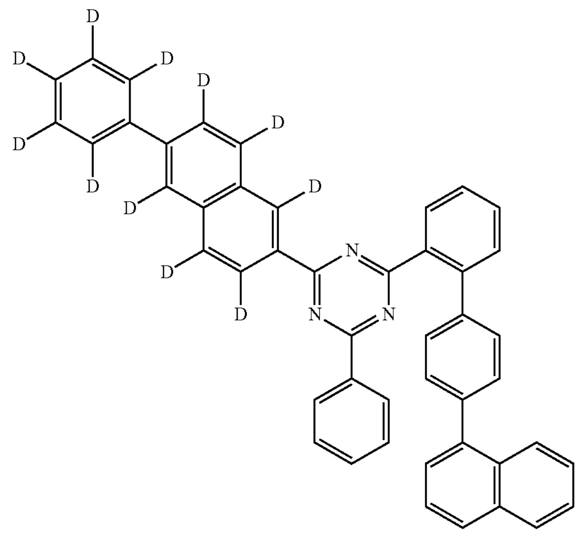
P-98
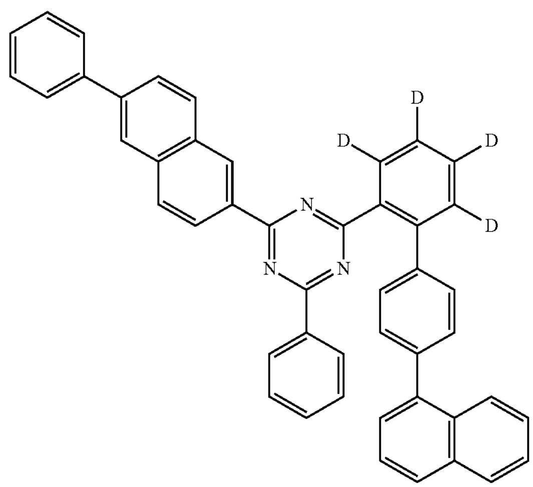
P-99
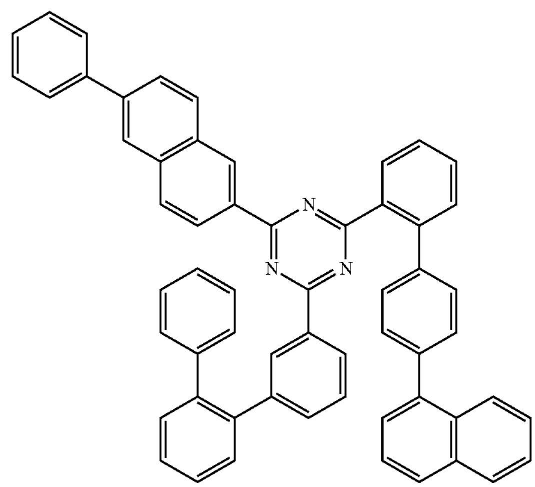
P-100
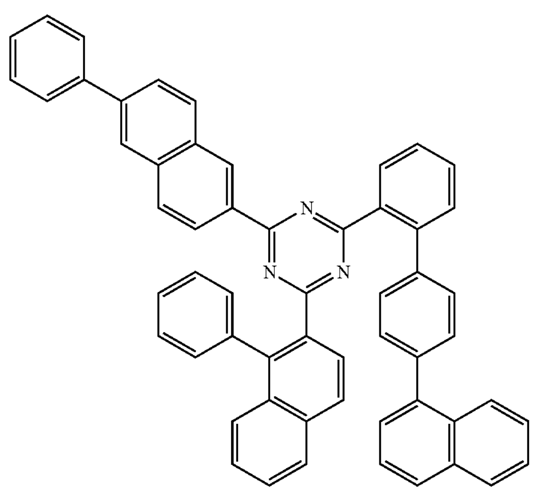

14. The compound of claim 1, wherein the compound represented by Formula 2 may be any one of the following compounds N-1 to N-96:
N-1
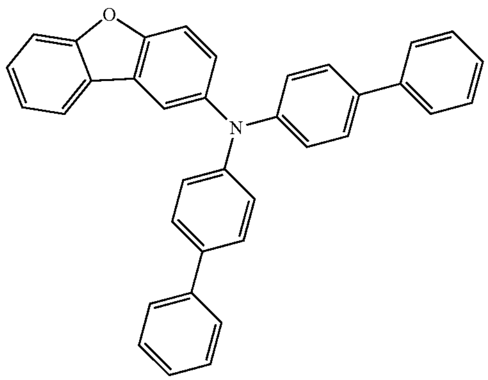
N-2
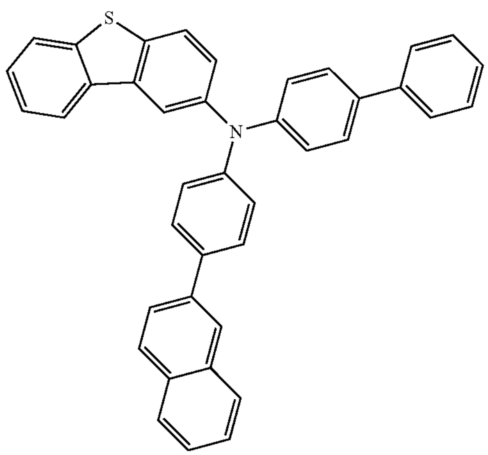
N-3
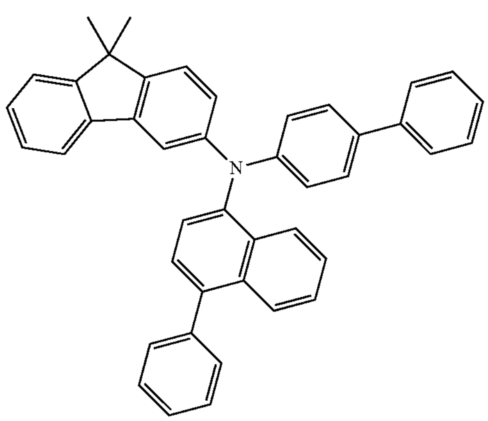
-continued
N-4
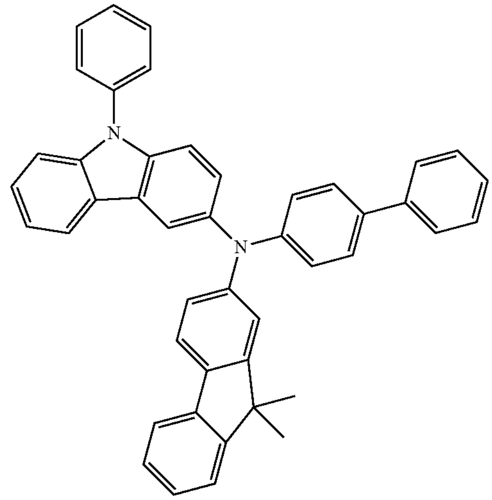
N-5
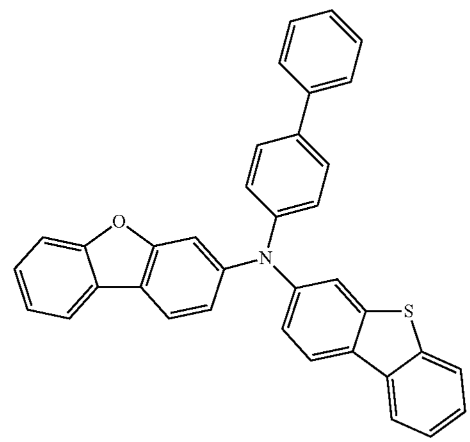
N-6
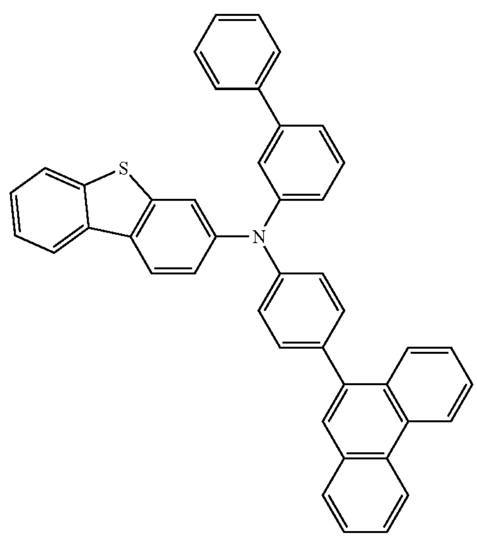

-continued
N-7
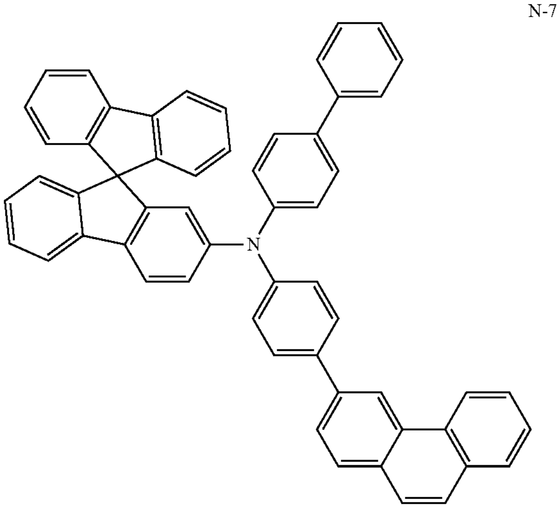
N-8
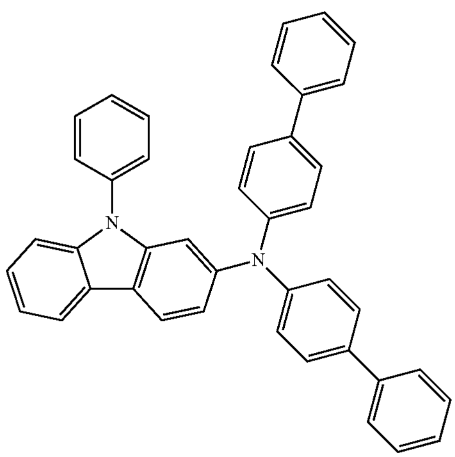
N-9
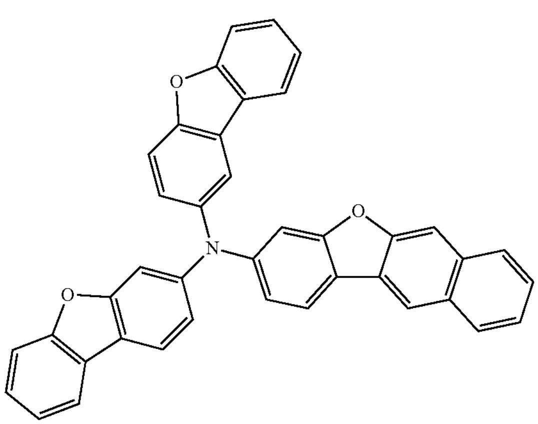
-continued
N-10
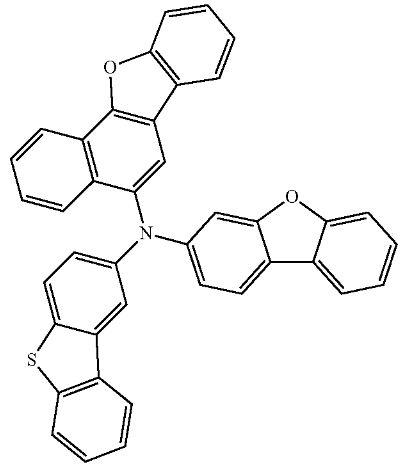
N-11
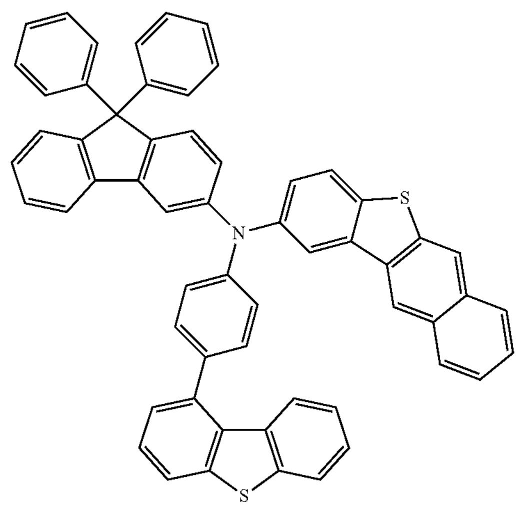
N-12
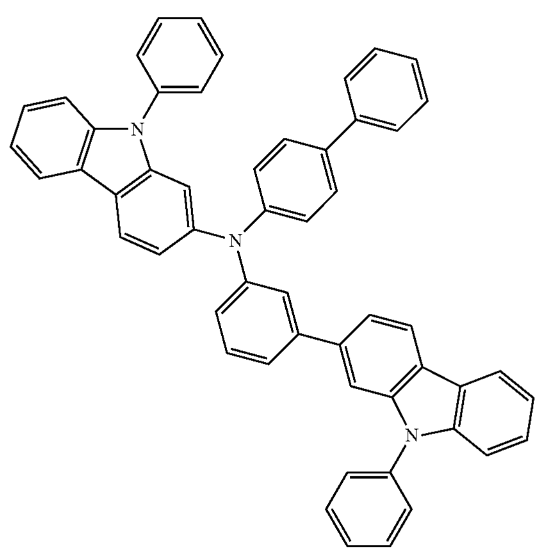

-continued
N-13
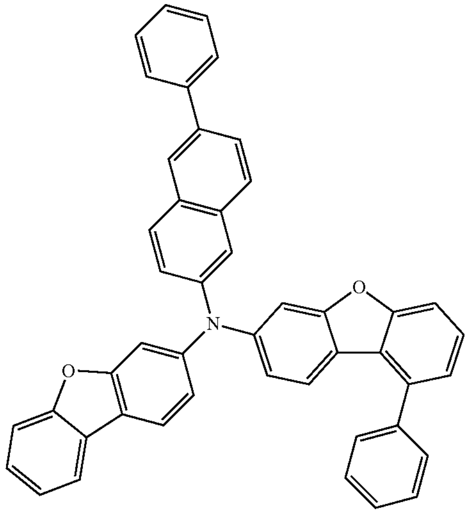
N-14
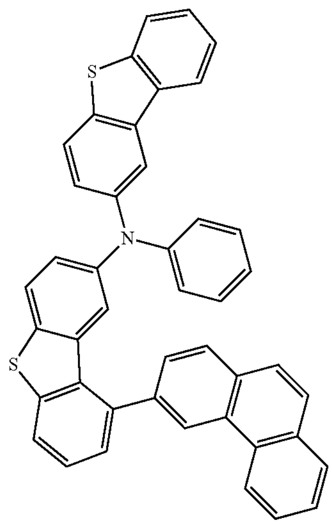
N-15
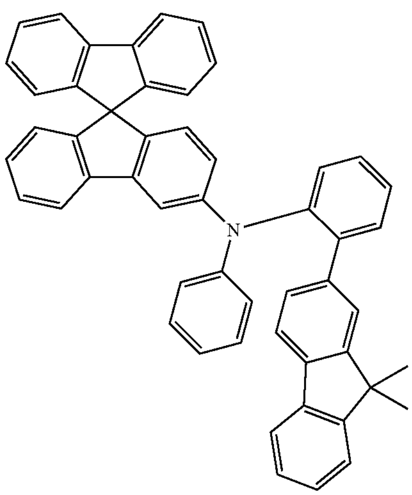
-continued
N-16
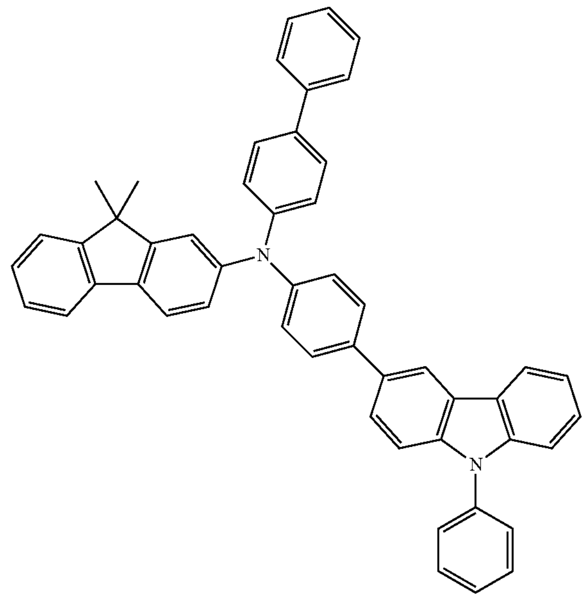
N-17
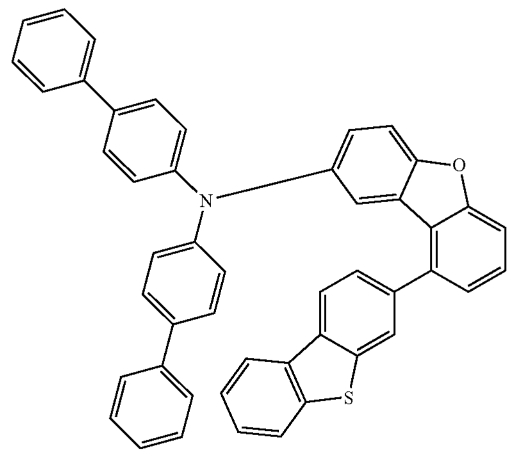
N-18
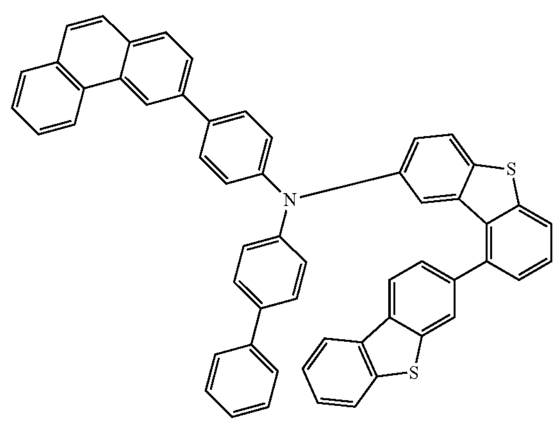

-continued
N-19
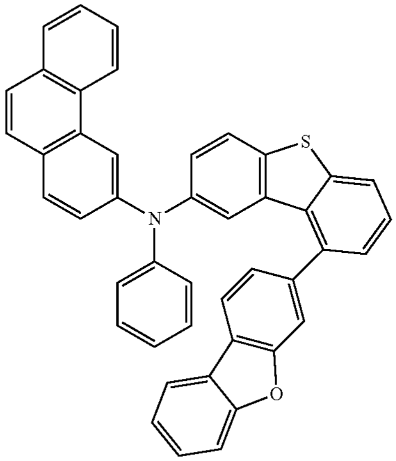
N-20
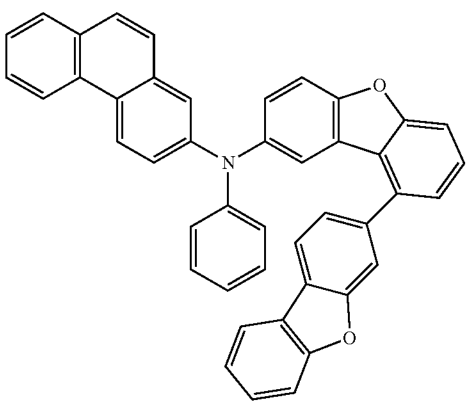
N-21
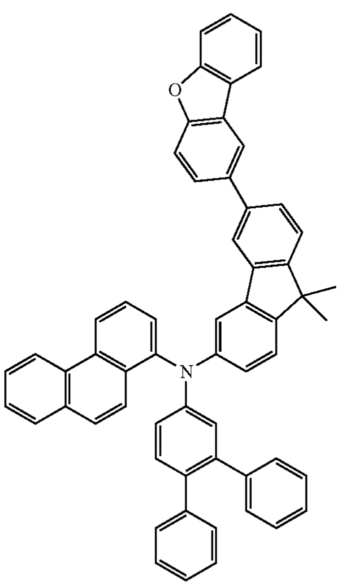
-continued
N-22
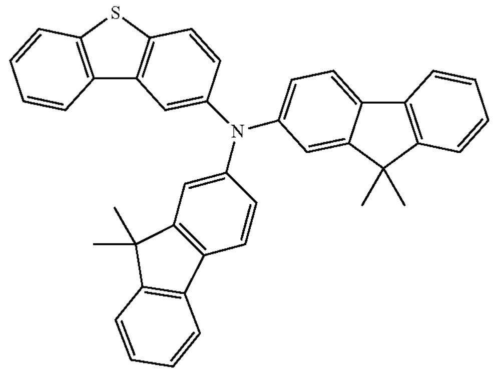
N-23
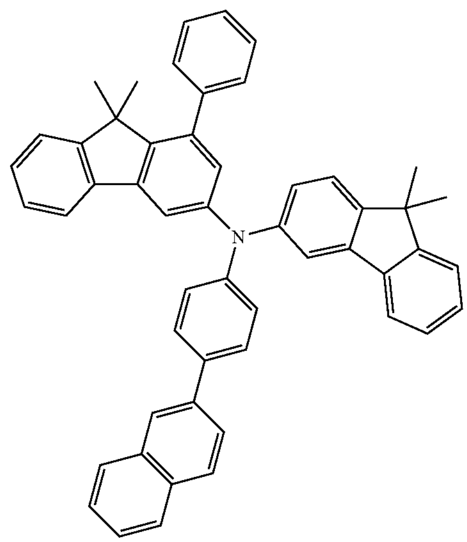
N-24
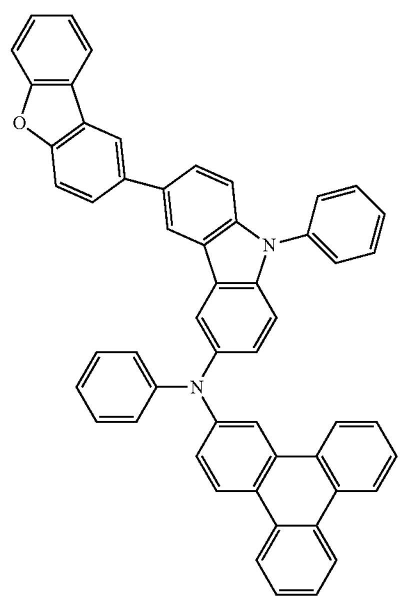

-continued
N-25
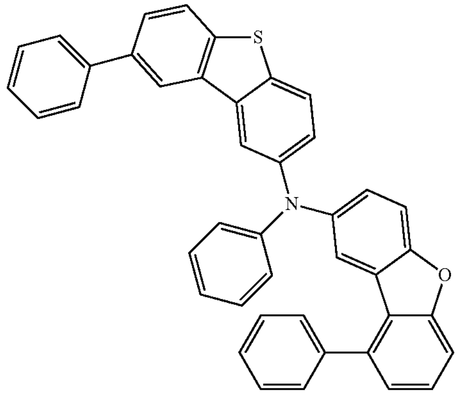
N-26
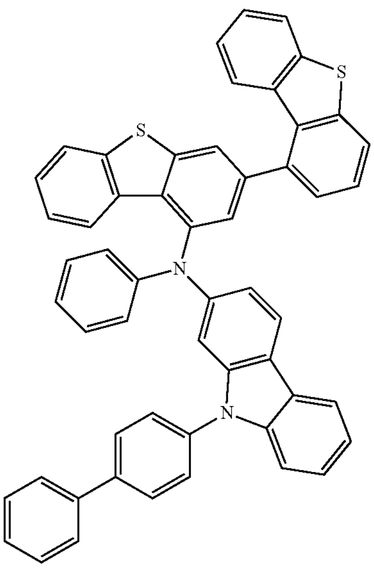
N-27
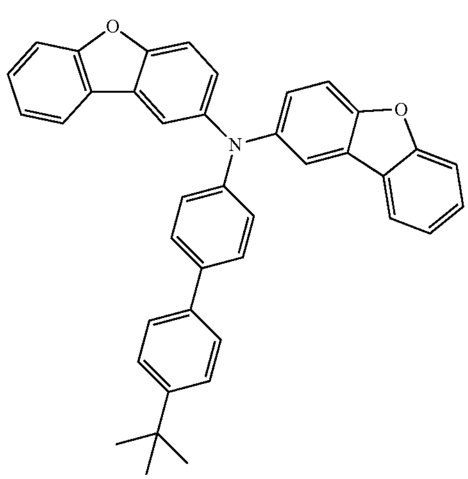
-continued
N-28
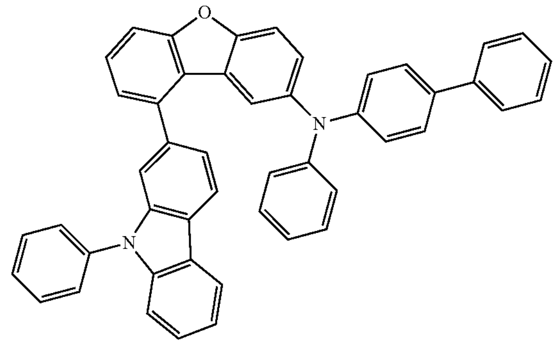
N-29
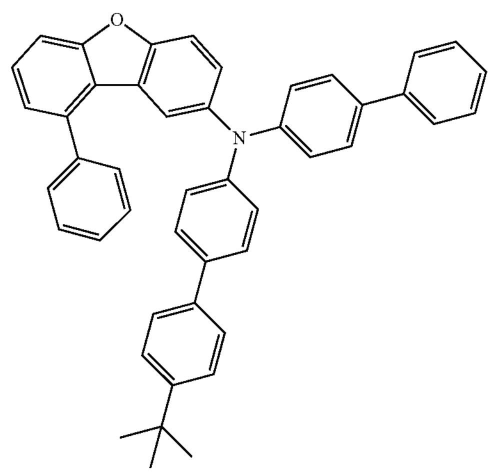
N-30
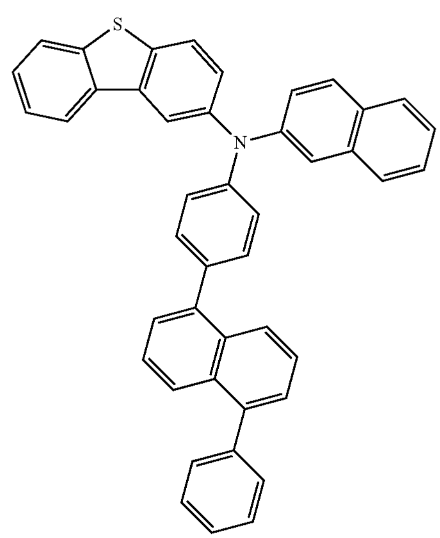

-continued
N-31
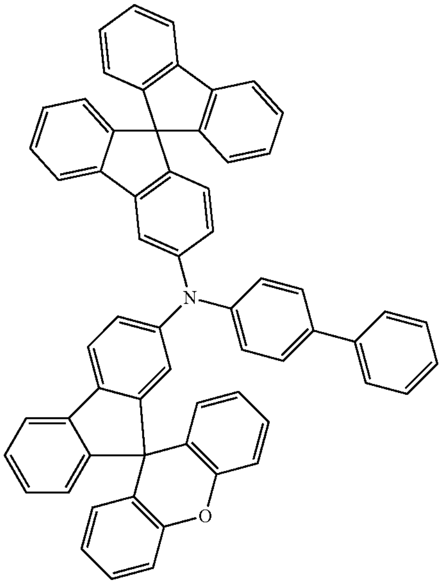
N-32
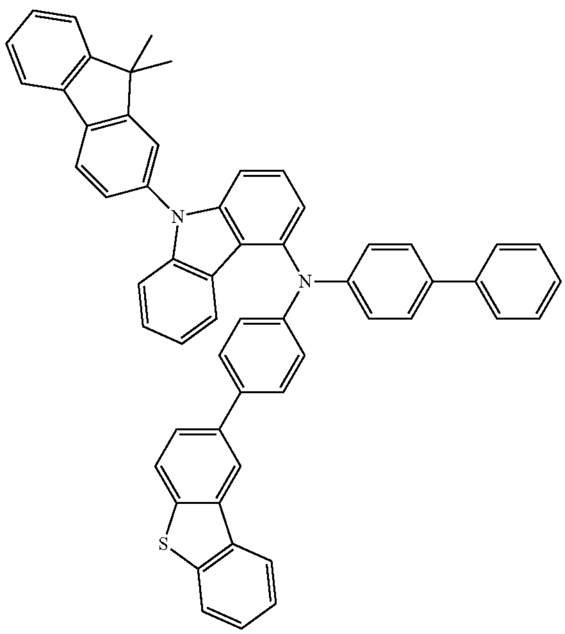
N-33
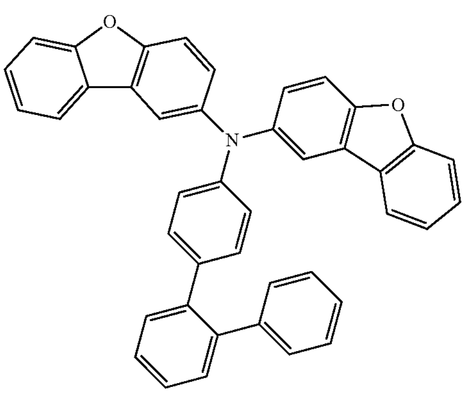
-continued
N-34
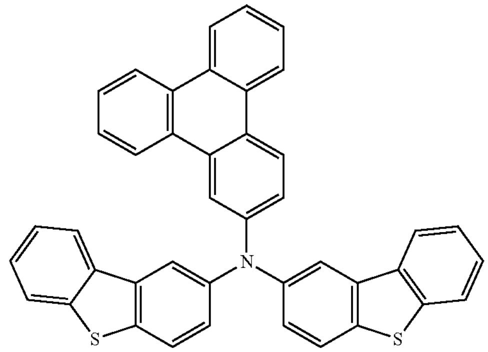
N-35
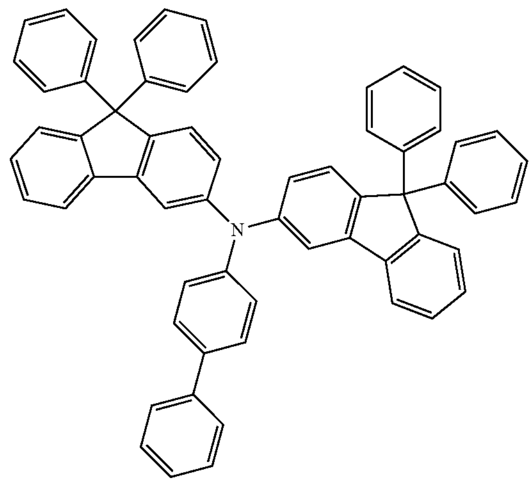
N-36
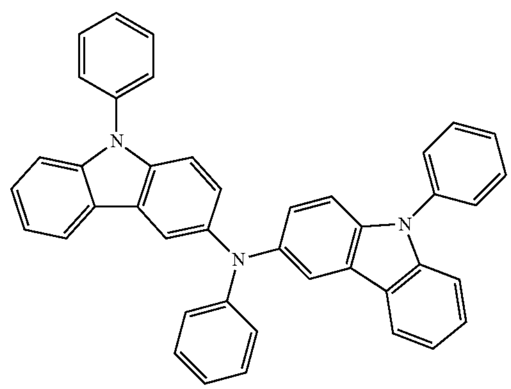
N-37
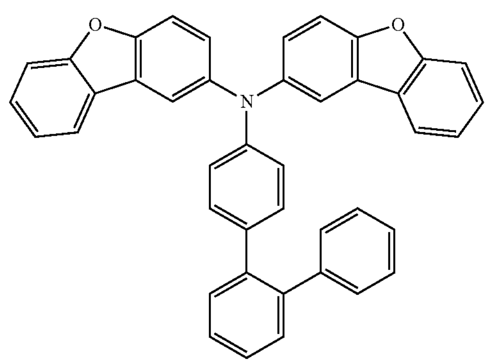

N-38
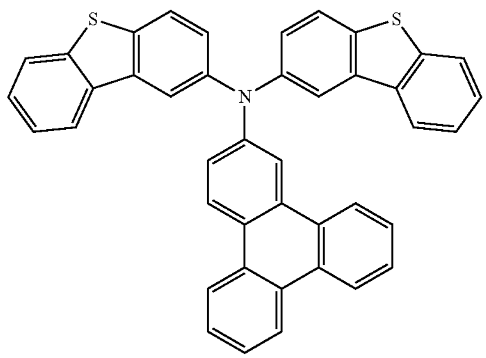
N-39
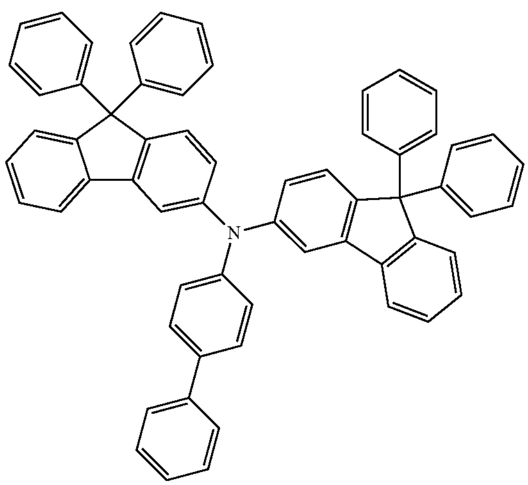
N-40
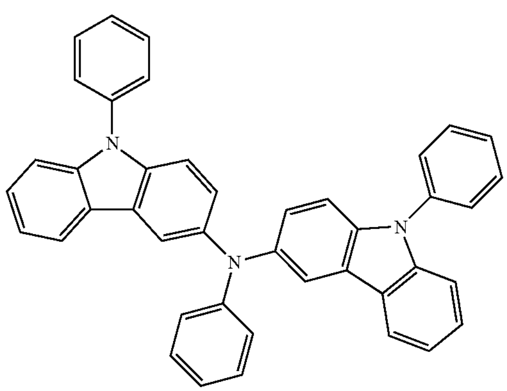
N-41
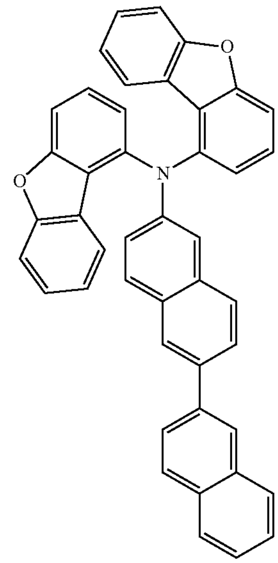
N-42
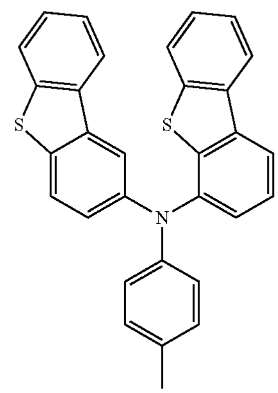
N-43
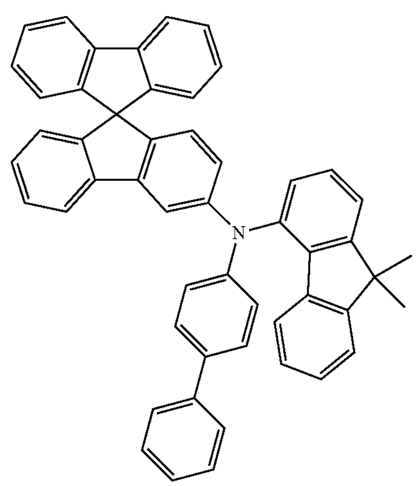

-continued
N-44
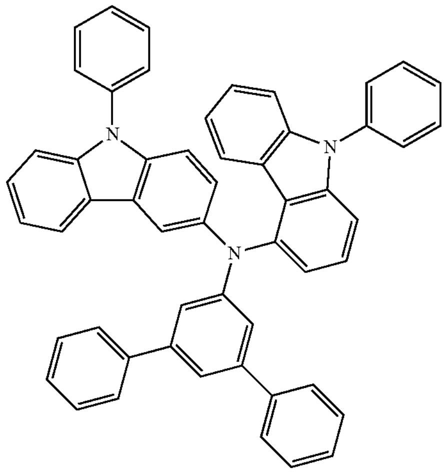
N-45
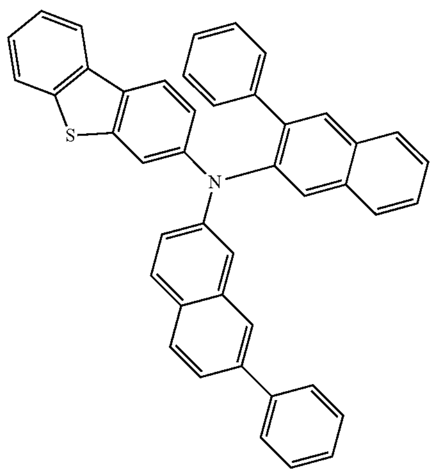
N-46
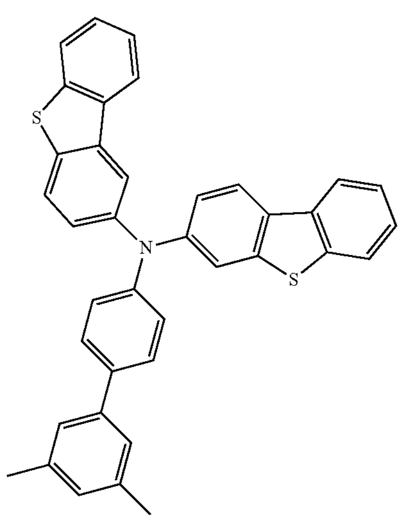
-continued
N-47
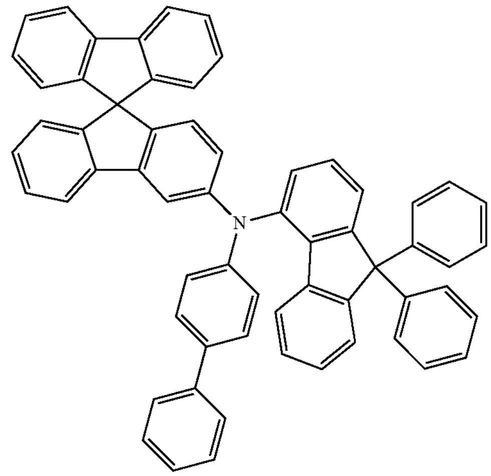
N-48
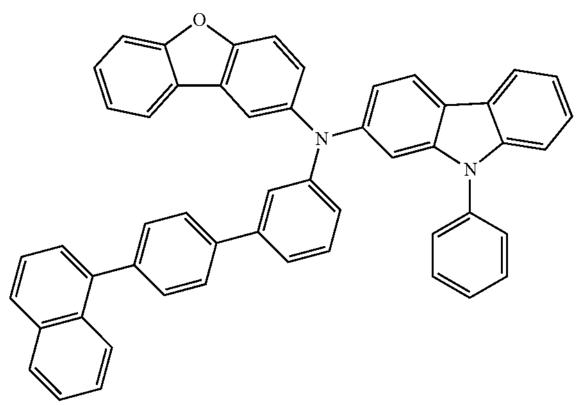
N-49
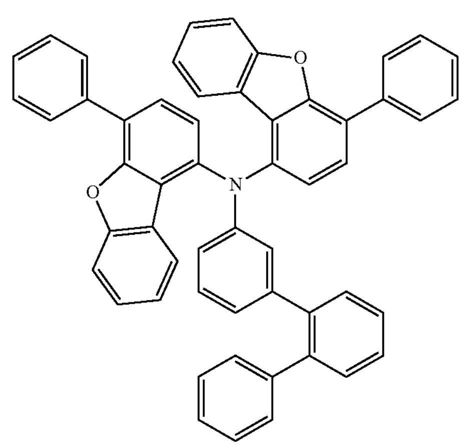

-continued
N-50
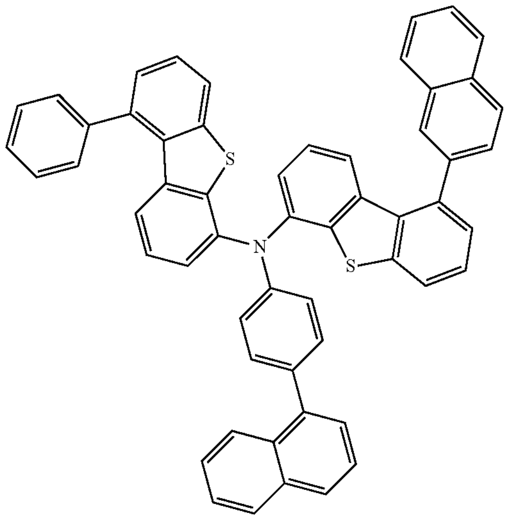
N-51
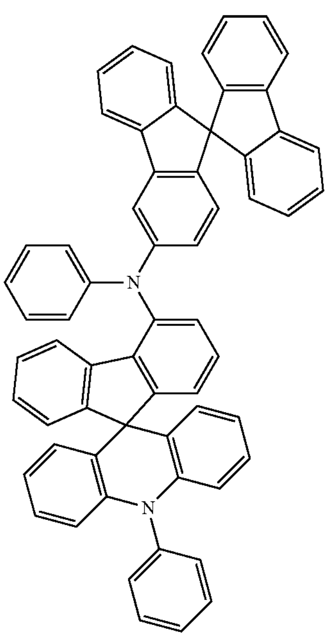
-continued
N-52
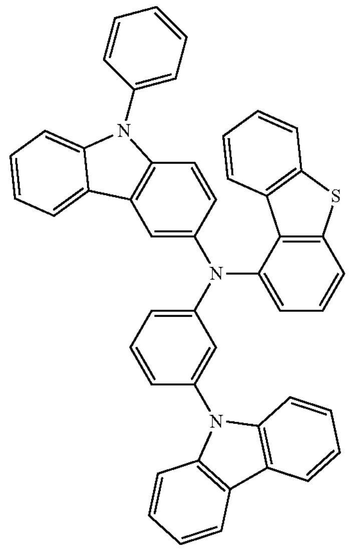
N-53
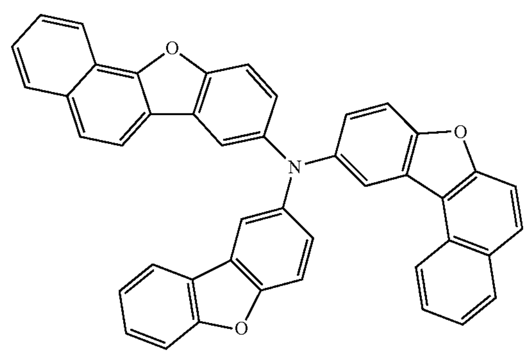
N-54
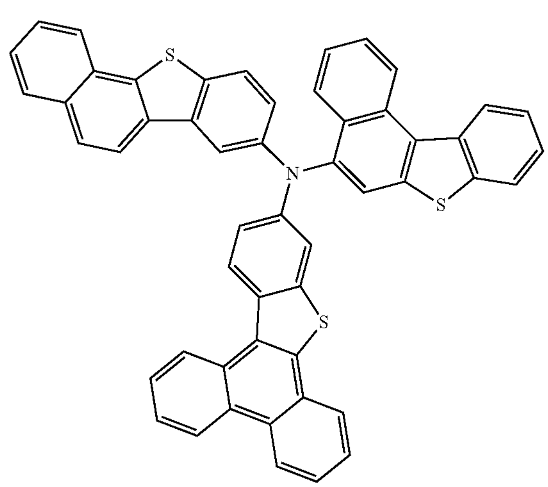

-continued
N-55
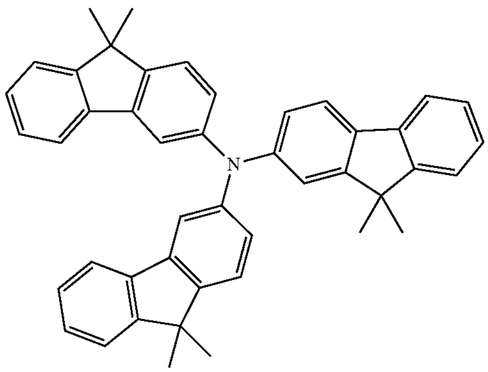
N-56
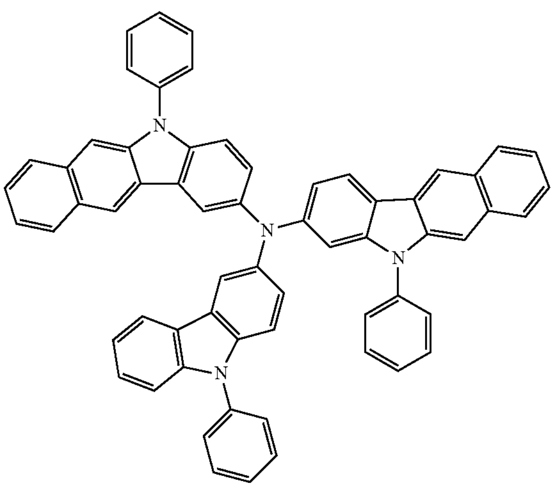
N-57
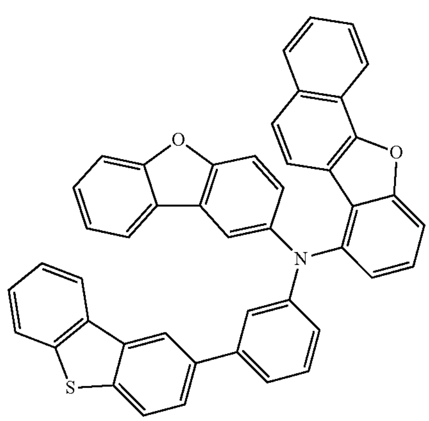
-continued
N-58
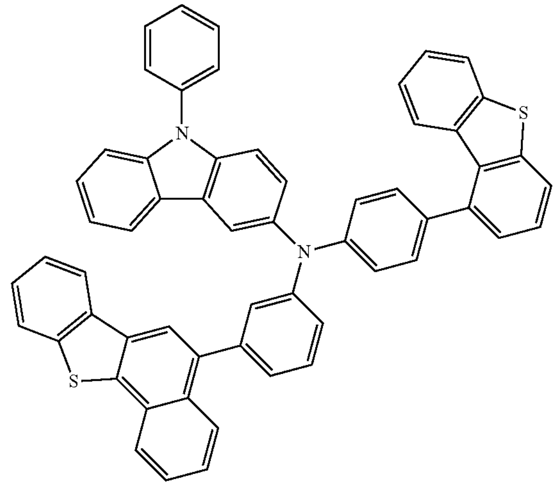
N-59
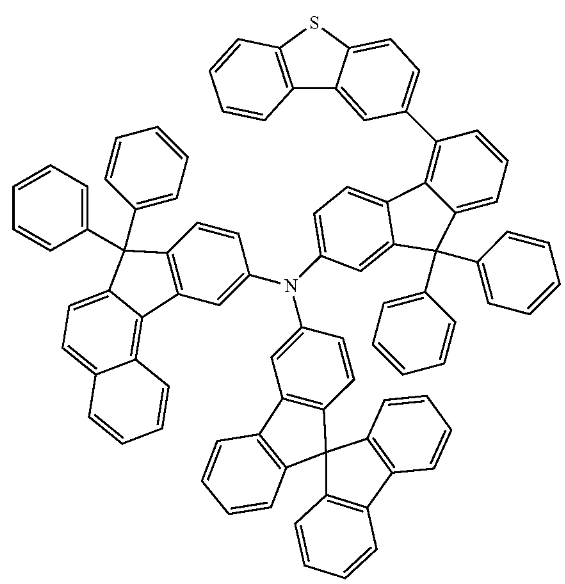
N-60
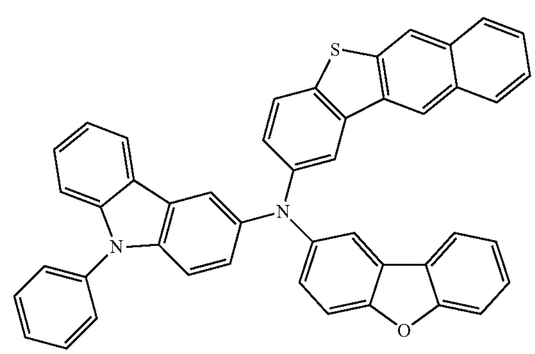

-continued
N-61
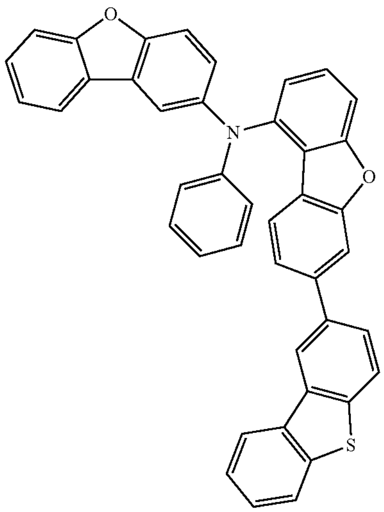
N-62
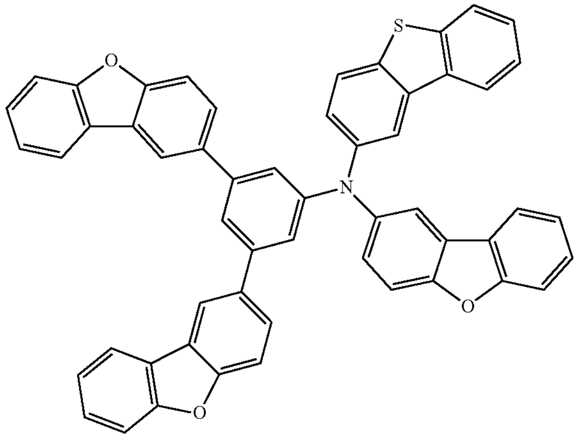
N-63
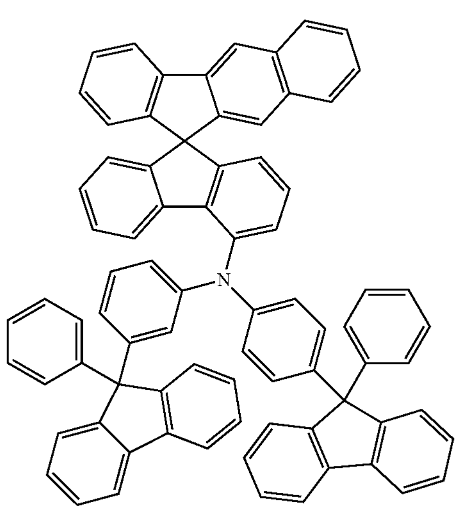
-continued
N-64
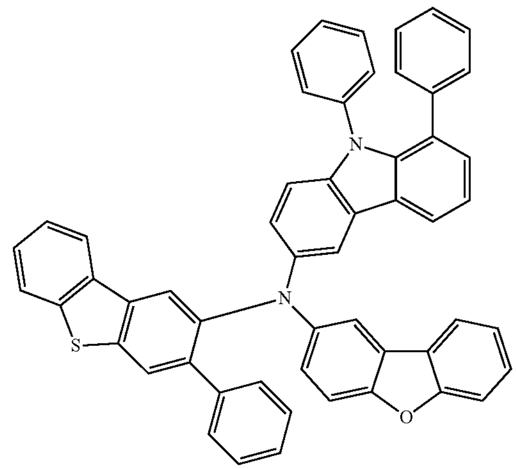
N-65
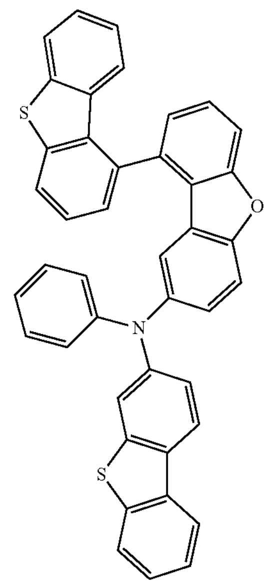
N-66
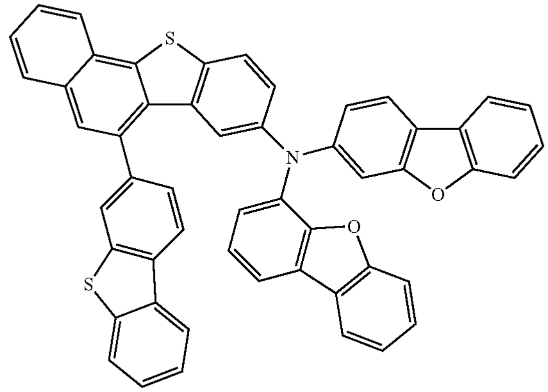

N-67
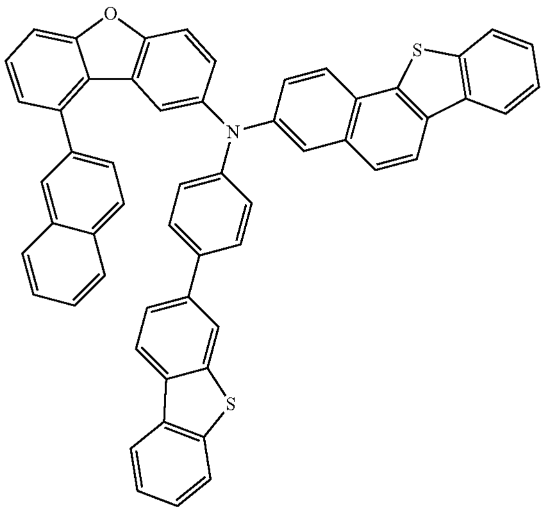
N-68
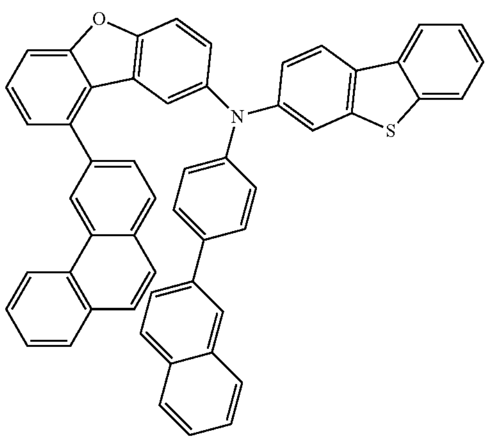
N-69
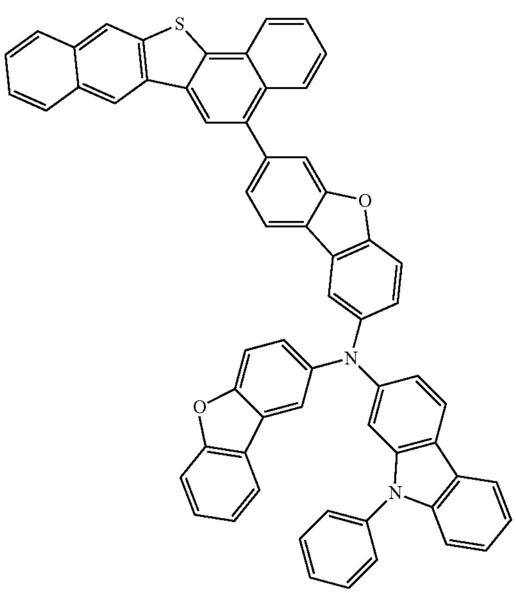
N-70
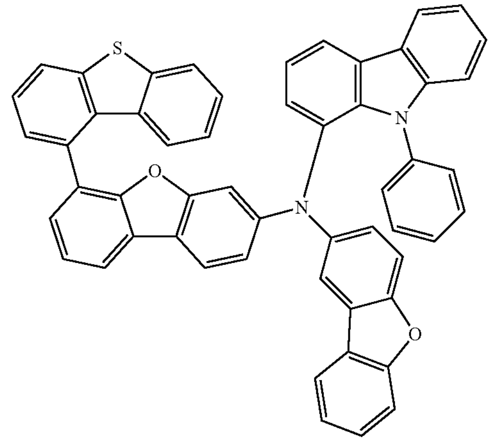
N-71
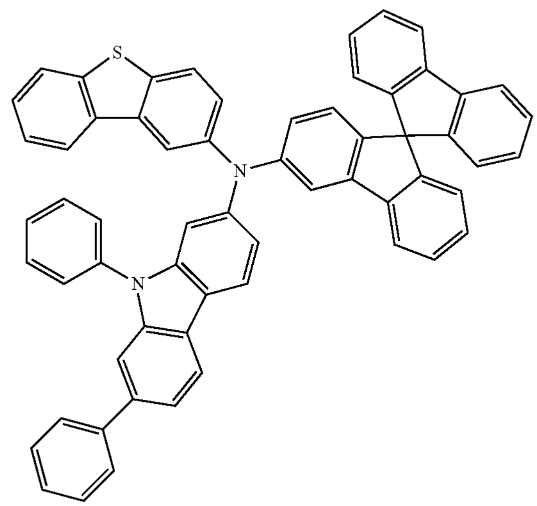
N-72
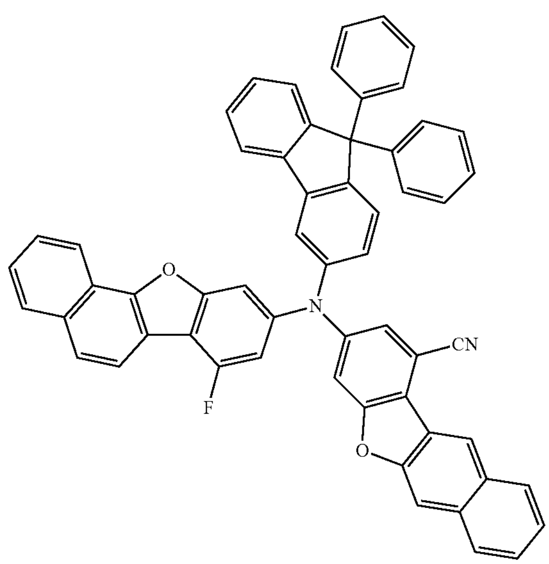

N-73
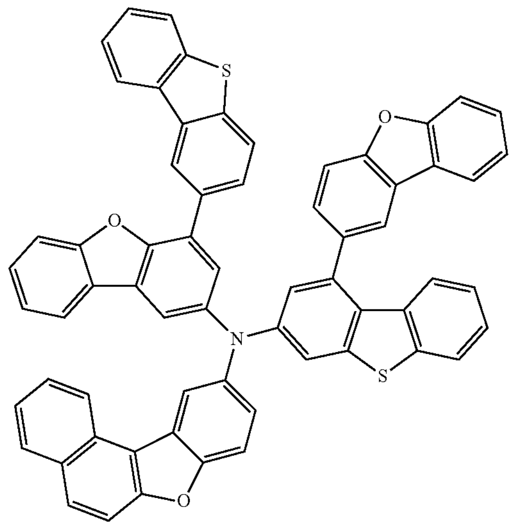
N-74
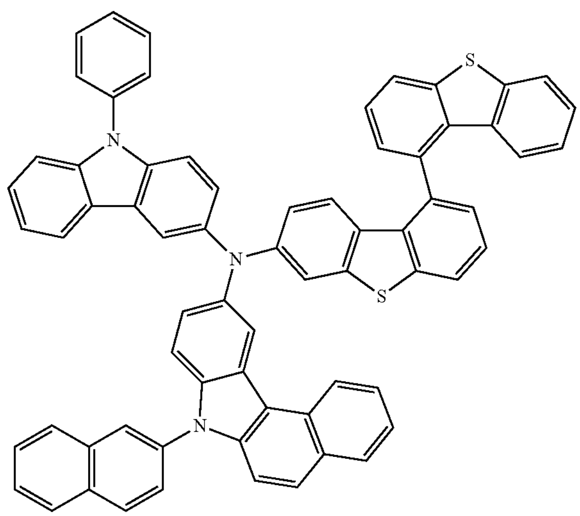
N-75
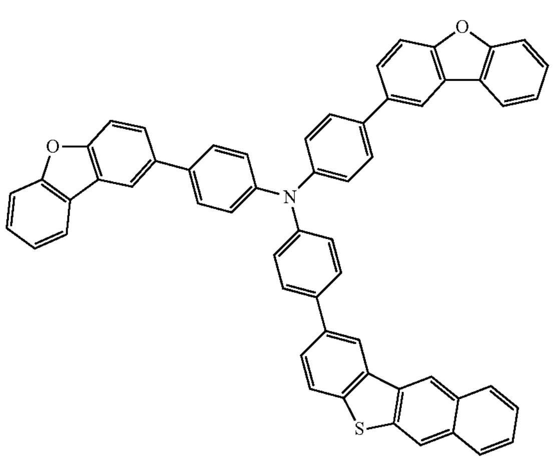
N-76
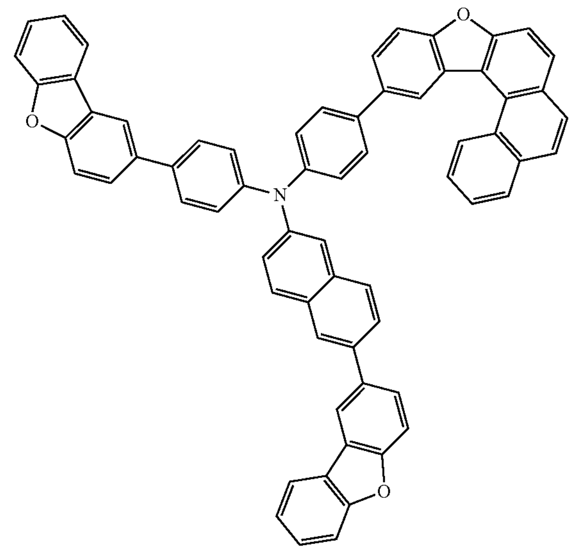
N-77
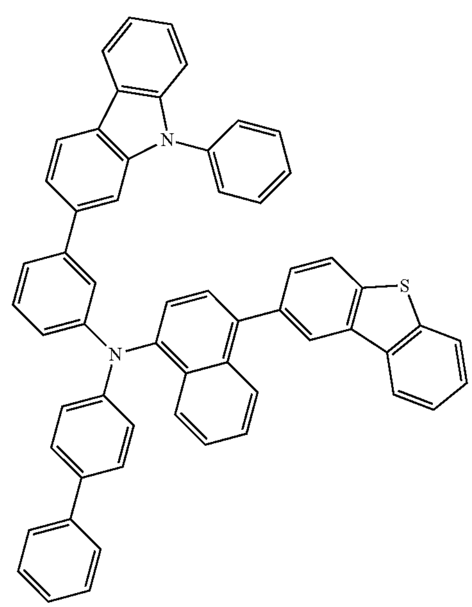

-continued
N-78
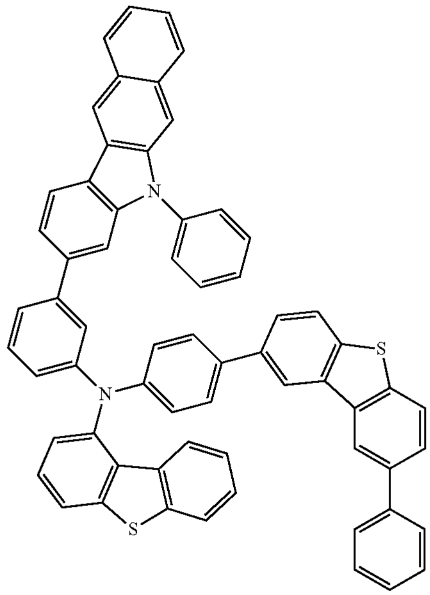
N-79
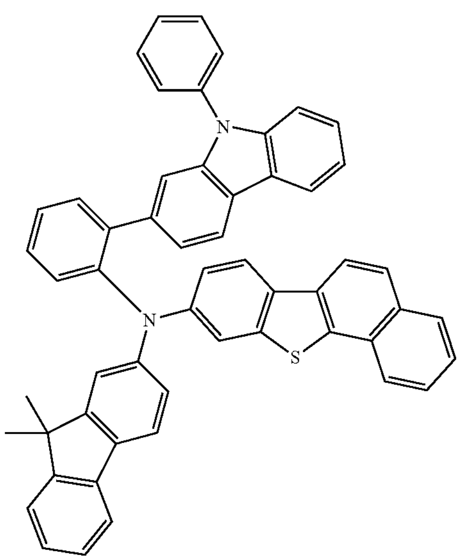
-continued
N-80
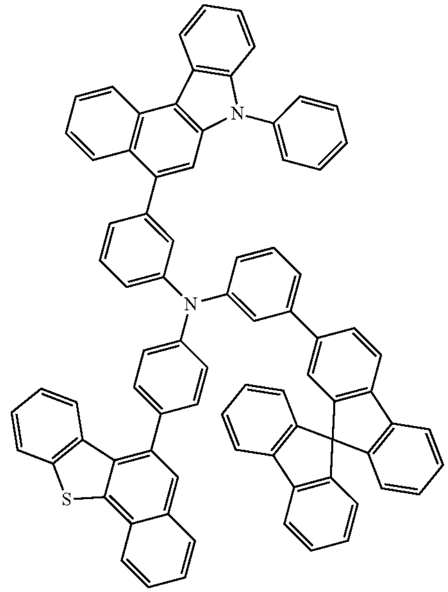
N-81
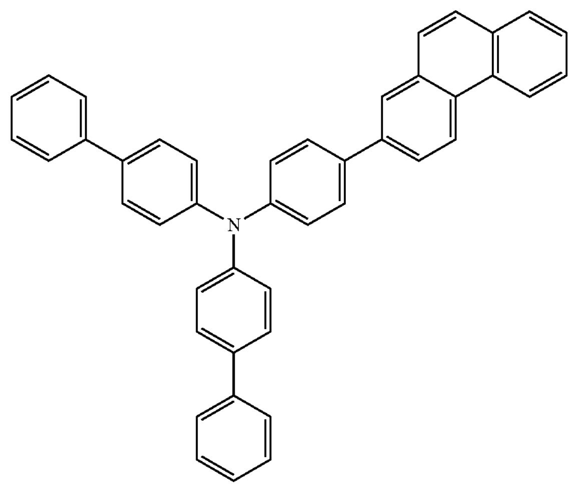
N-82
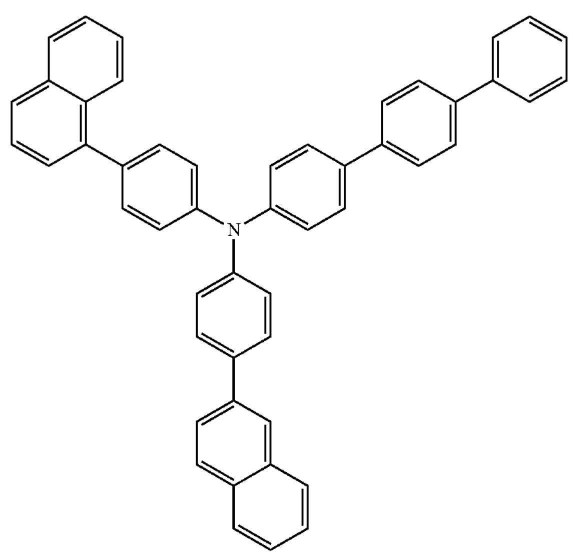

-continued
N-83
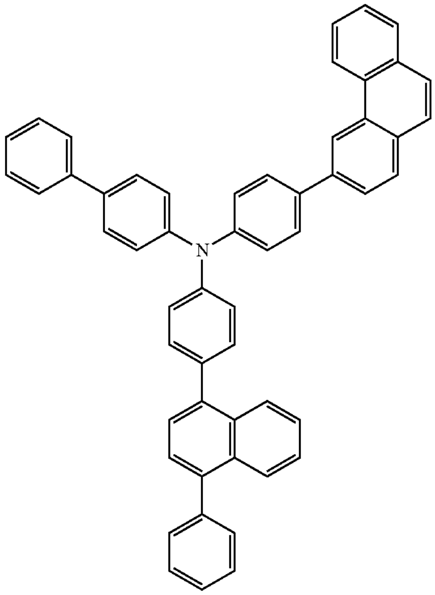
N-84
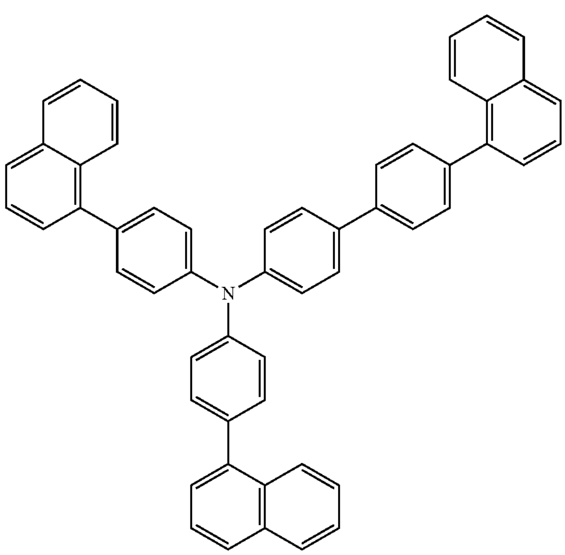
-continued
N-85
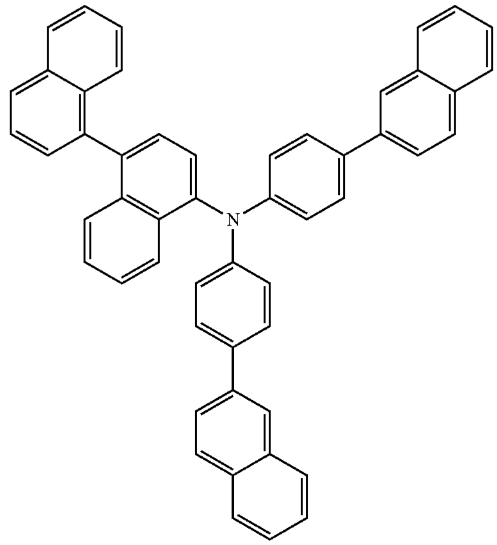
N-86
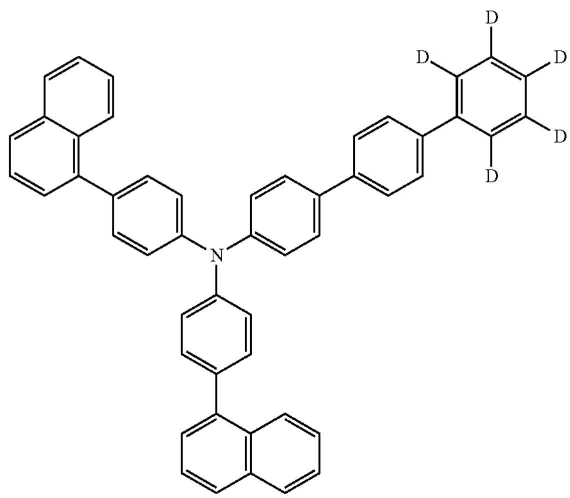
N-87
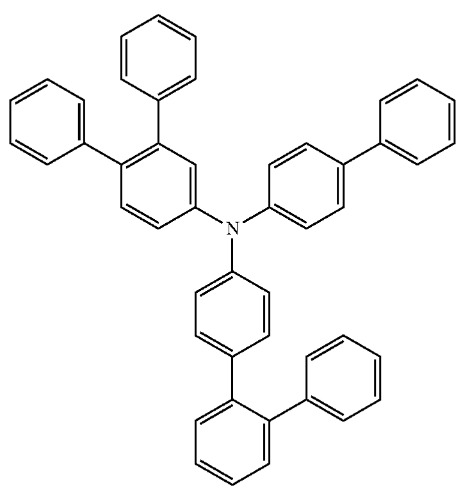

-continued
N-88
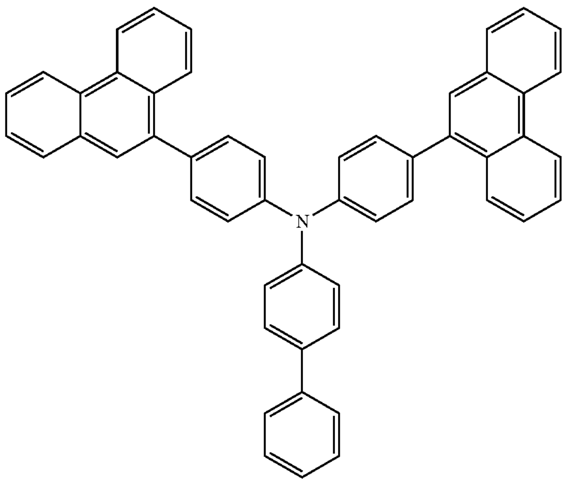
N-89
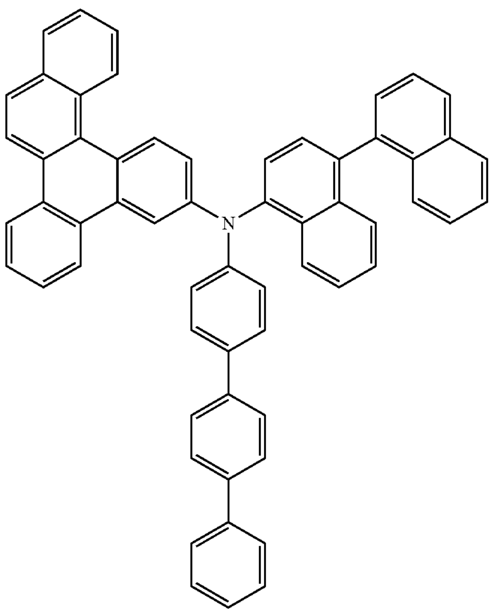
N-90
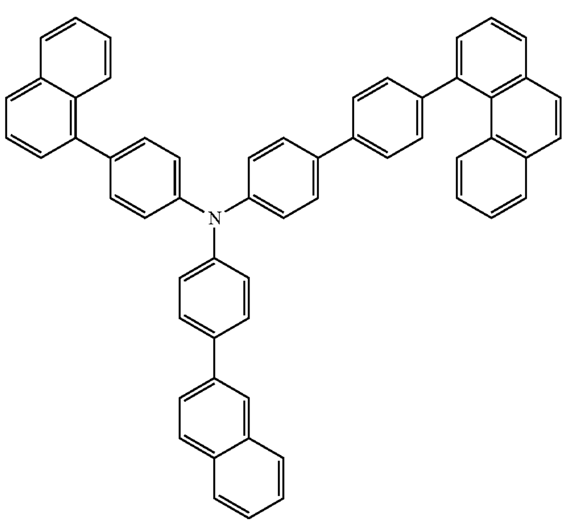
-continued
N-91
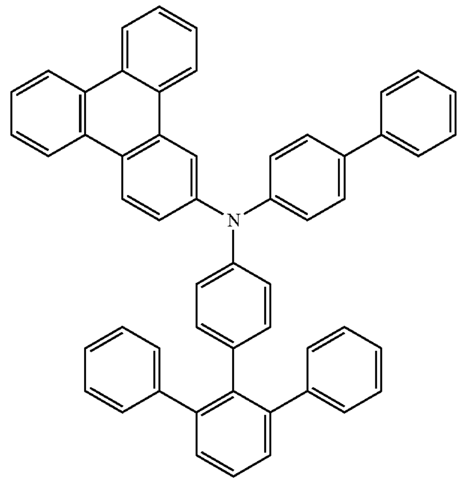
N-92
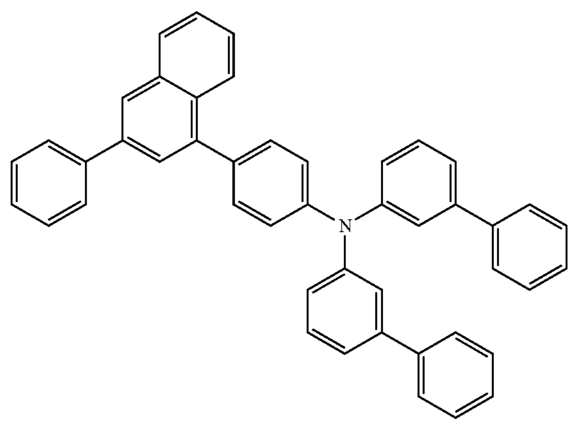
N-93
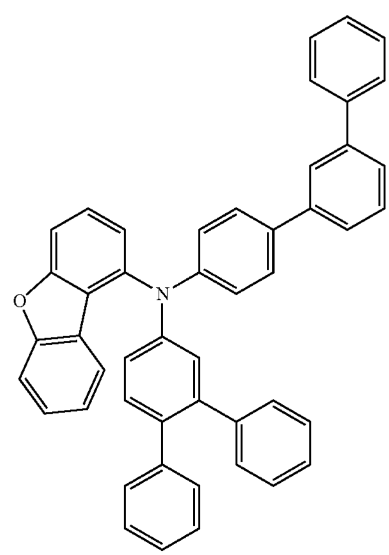

-continued
N-94
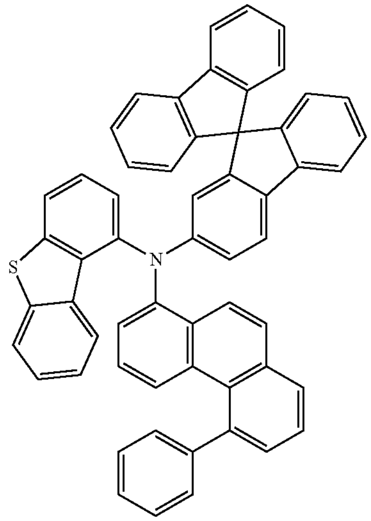
N-95
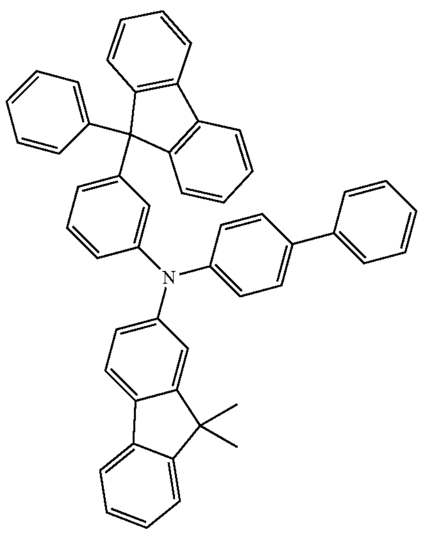
N-96
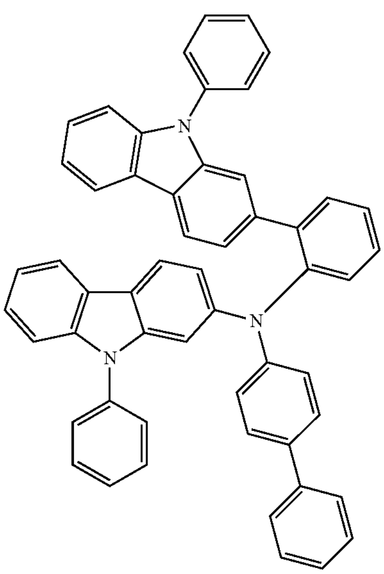
15. The compound of claim 1, wherein the compound represented by Formula 3 may be any one of the following compounds S-1 to S-108:
S-1
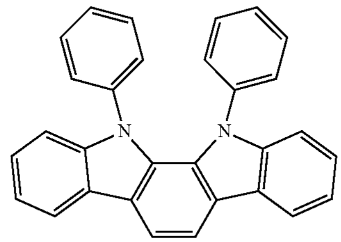
S-2
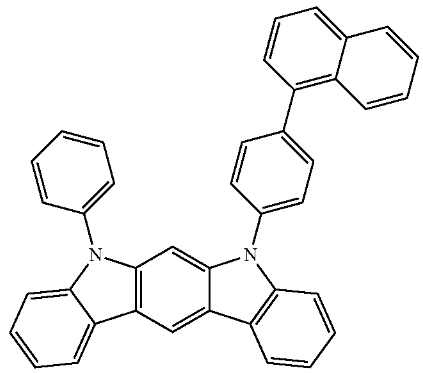
S-3
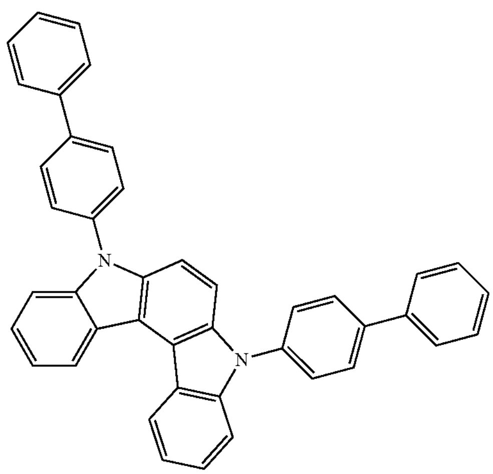
S-4
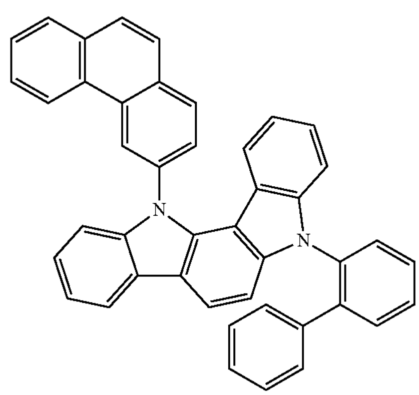

-continued
S-5
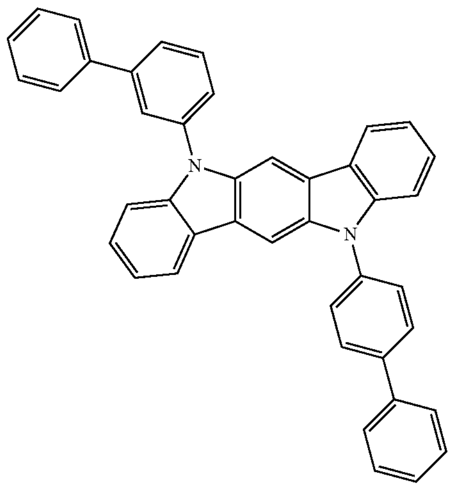
S-6
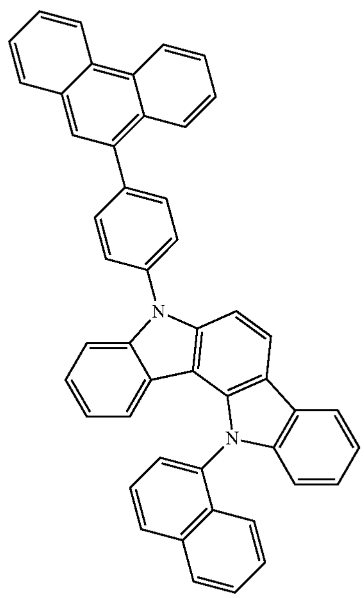
S-7
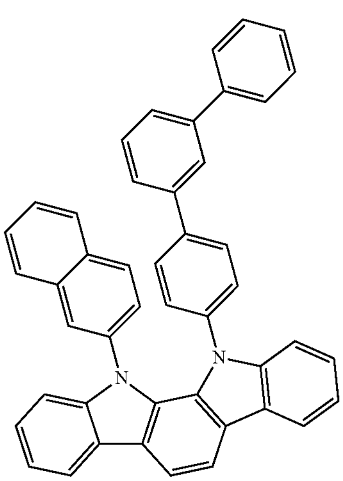
-continued
S-8
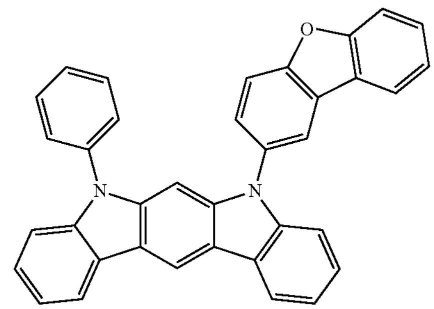
S-9
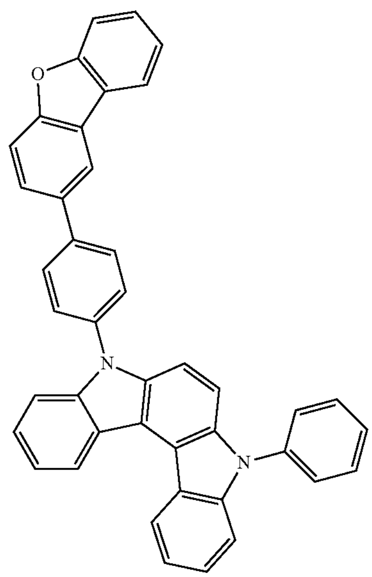
S-10
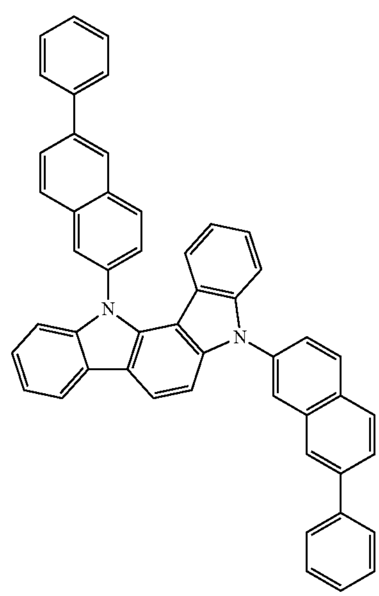

-continued
S-11
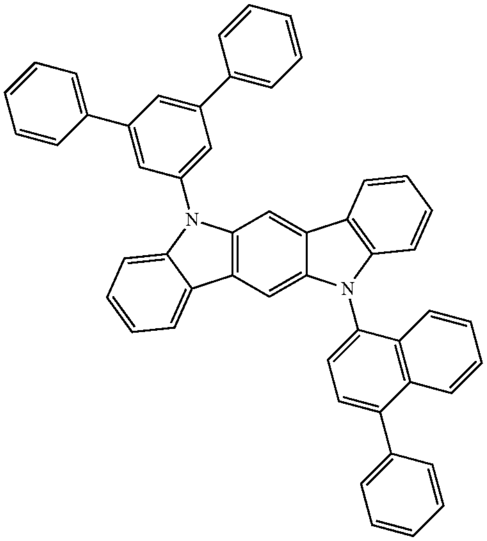
S-12
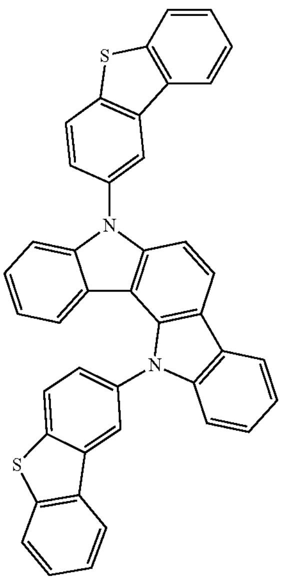
S-13
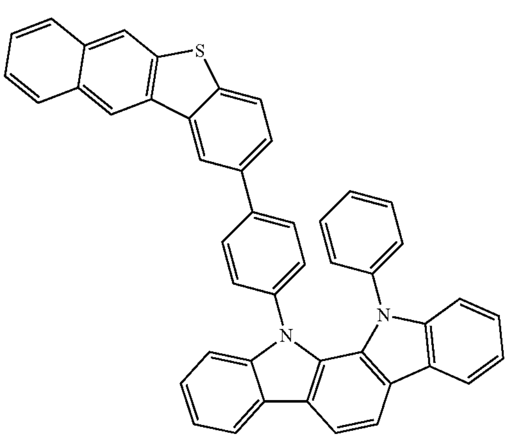
-continued
S-14
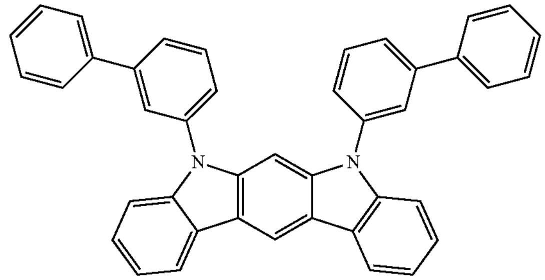
S-15
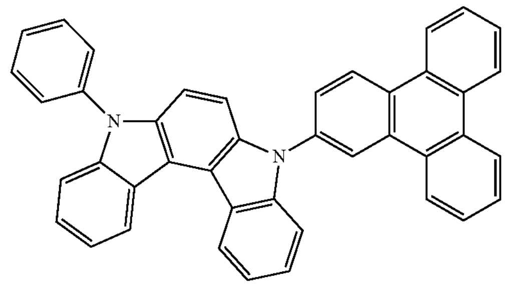
S-16
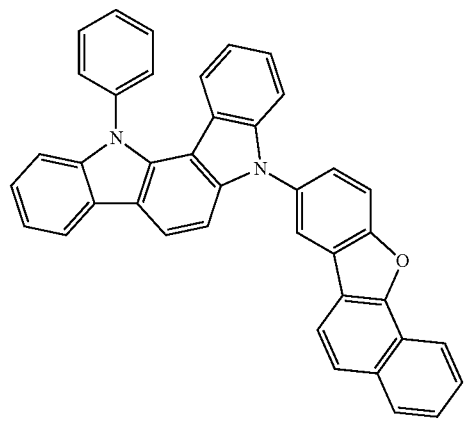
S-17
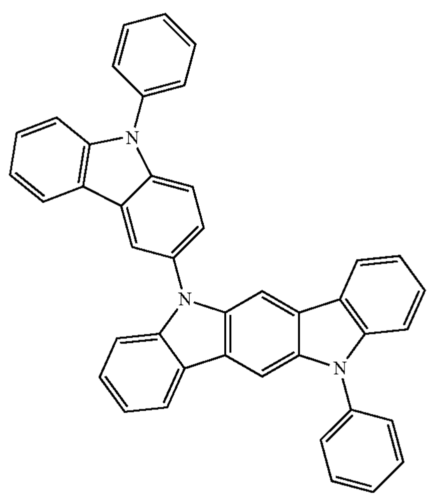

-continued
S-18
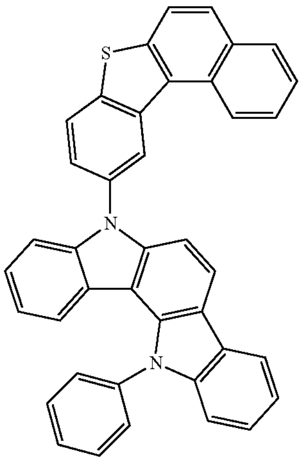
S-19
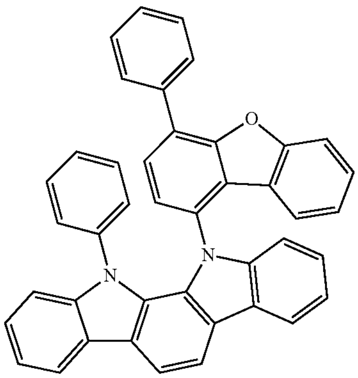
S-20
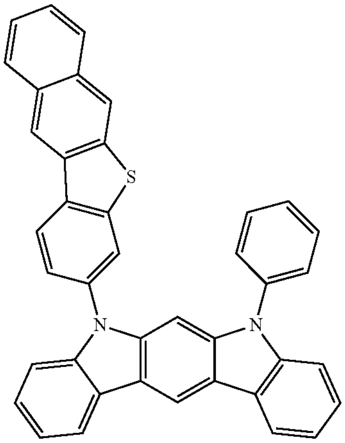
-continued
S-21
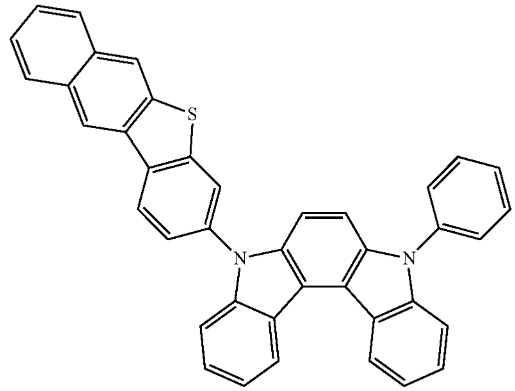
S-22
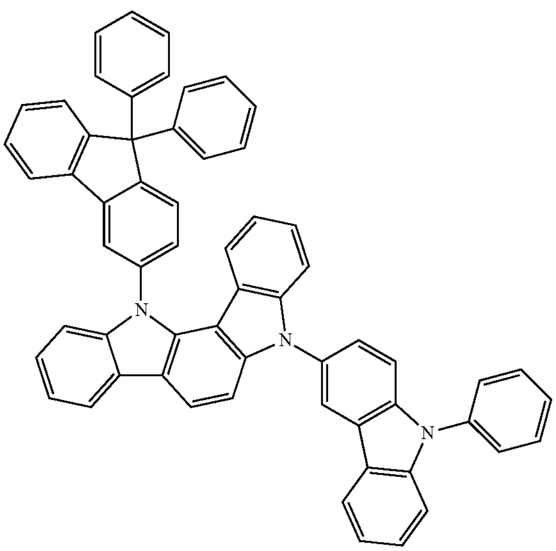
S-23
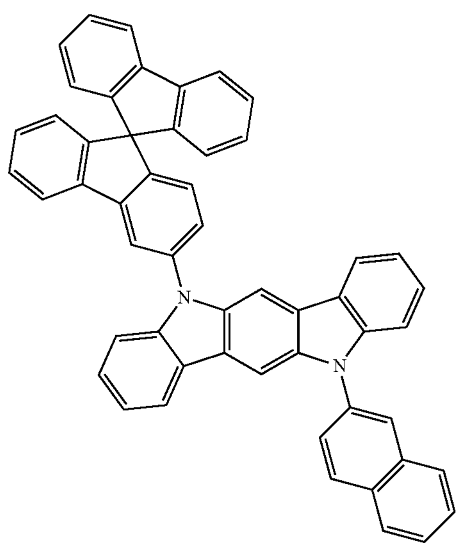

S-24
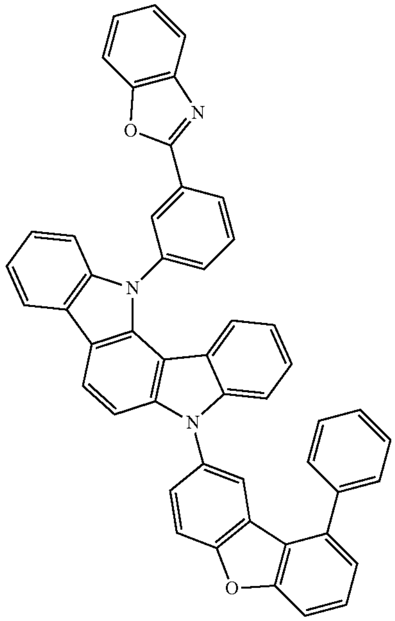
S-25
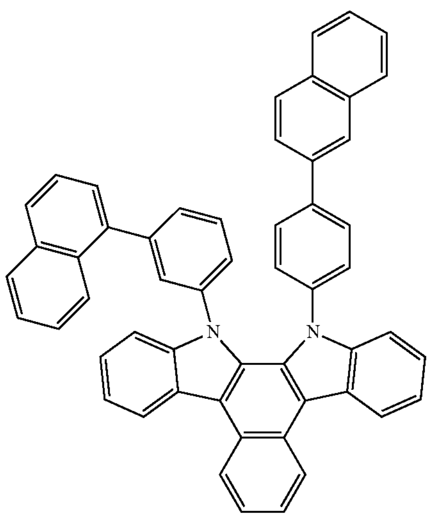
S-26
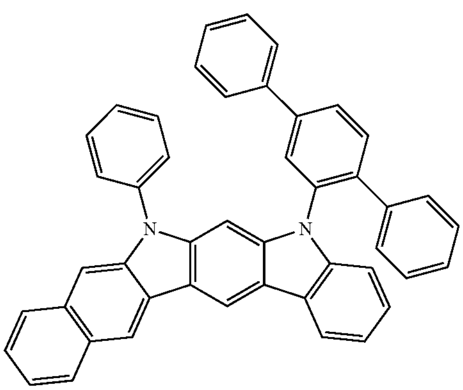
S-27
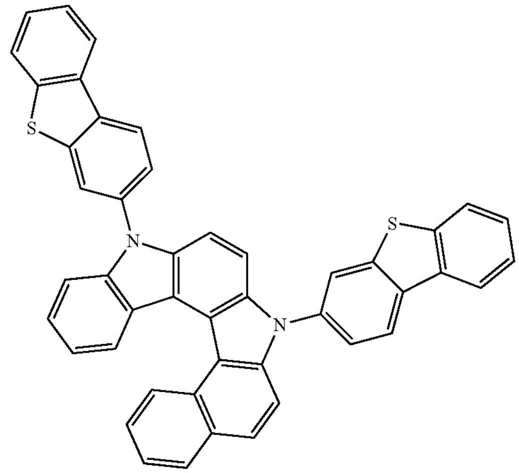
S-28
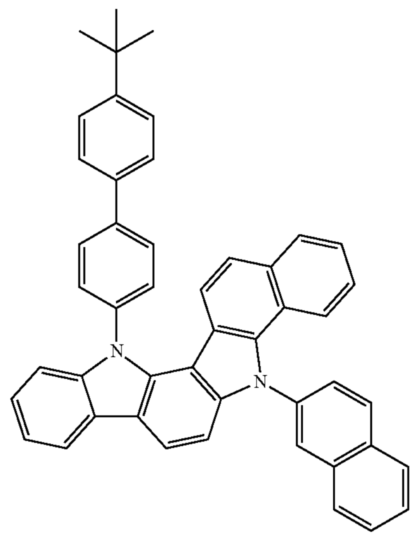
S-29
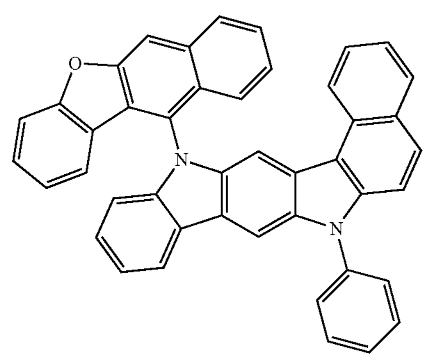

-continued
S-30
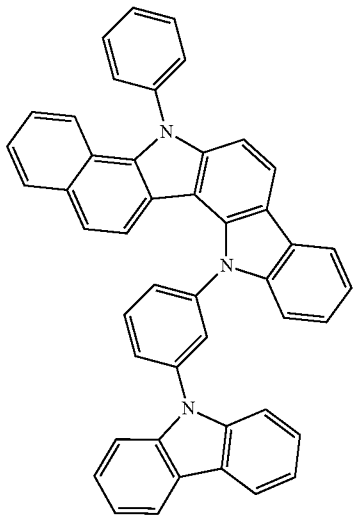
S-31
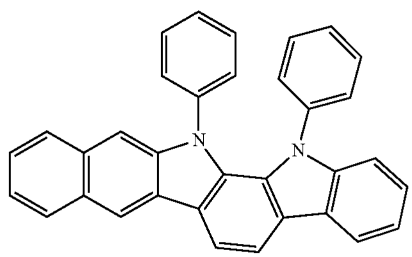
S-32
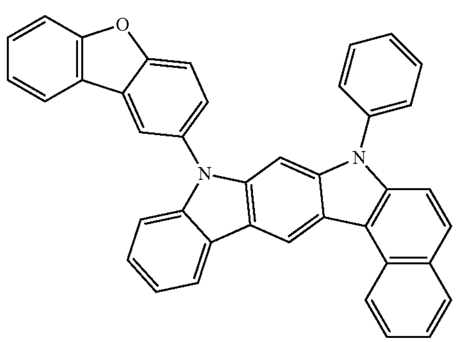
S-33
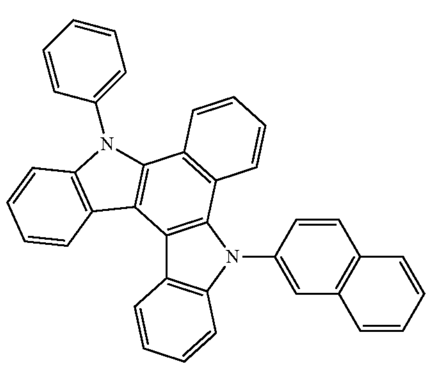
-continued
S-34
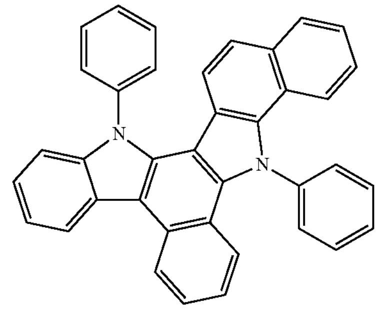
S-35
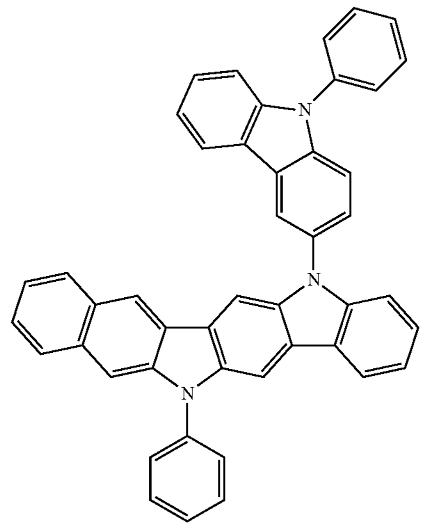
S-36
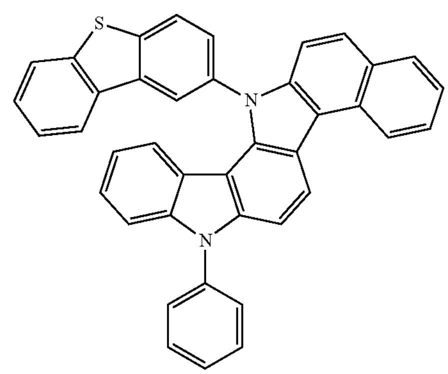
S-37
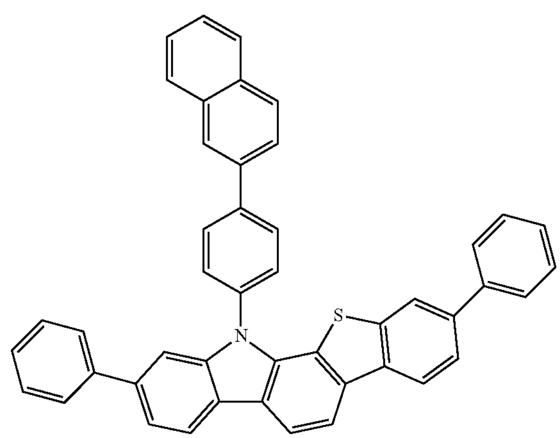

-continued
S-38
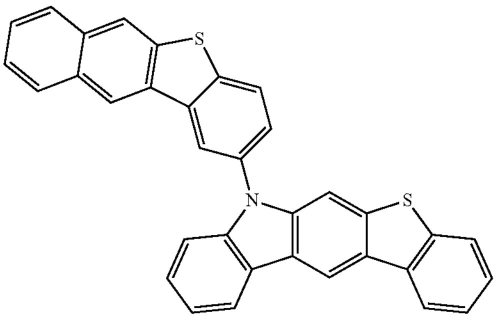
S-39
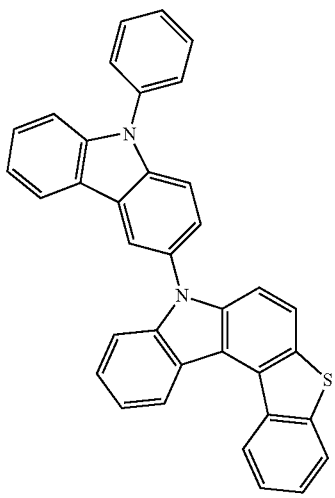
S-40
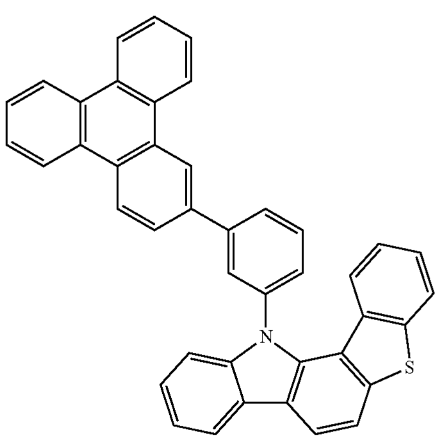
-continued
S-41
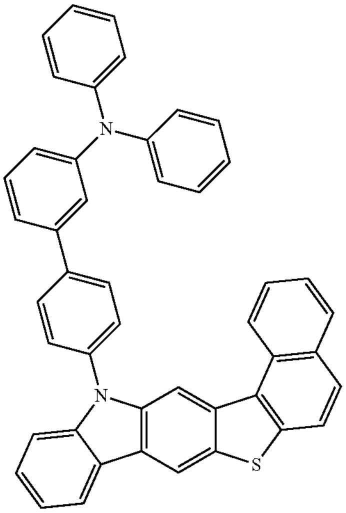
S-42
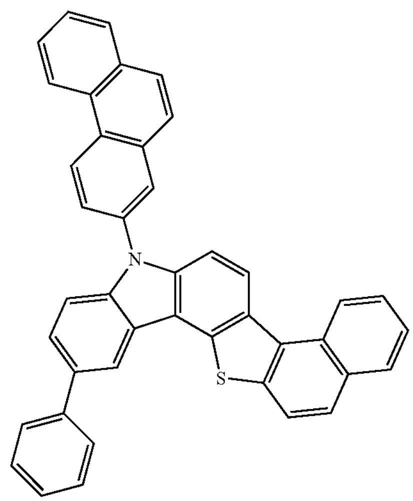
S-43
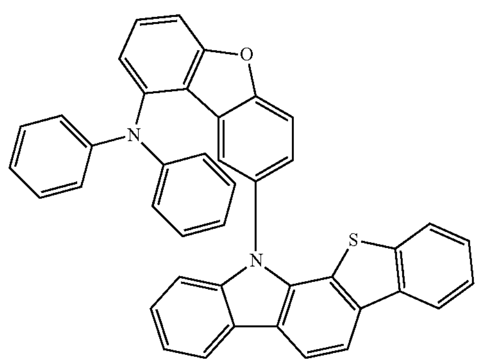

-continued
S-44
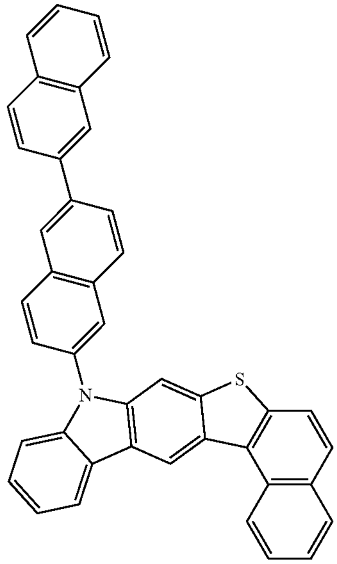
S-45
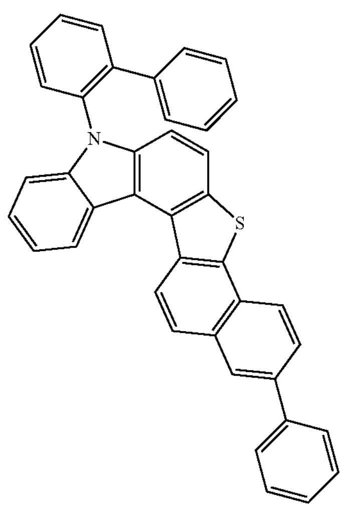
S-46
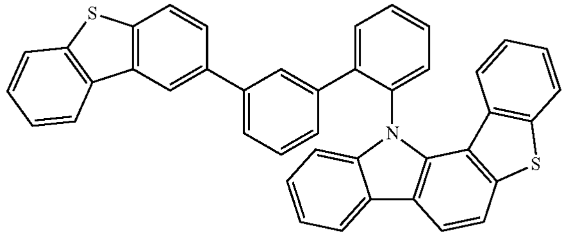
-continued
S-47
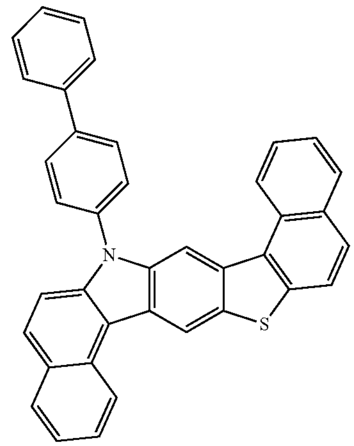
S-48
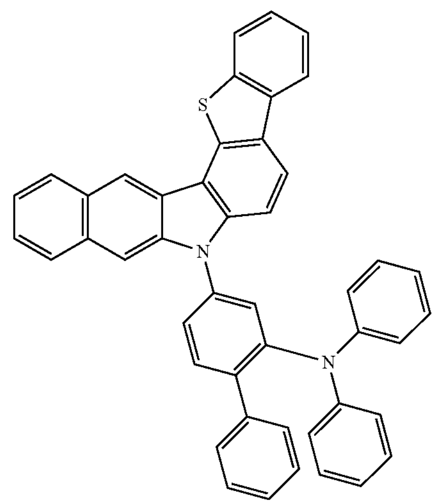
S-49
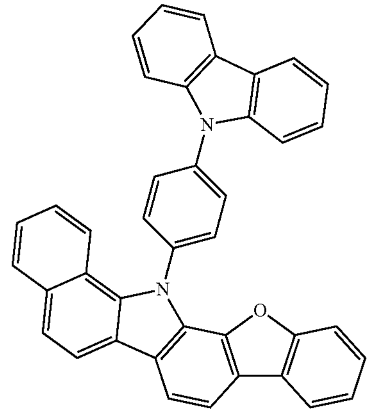

-continued
S-50
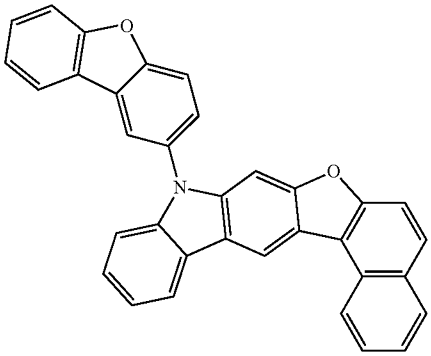
S-51
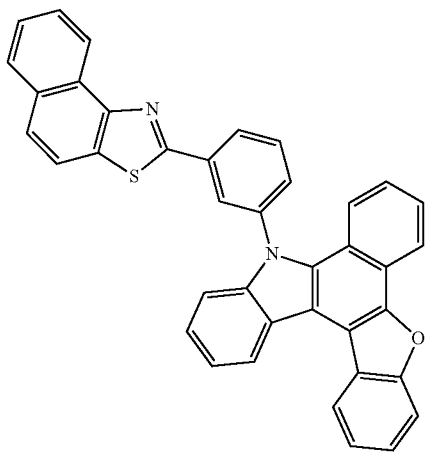
S-52
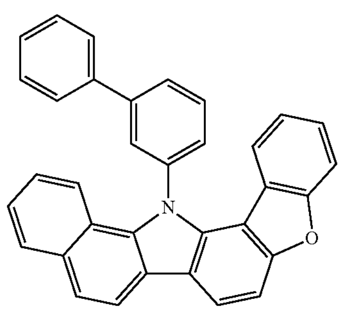
S-53
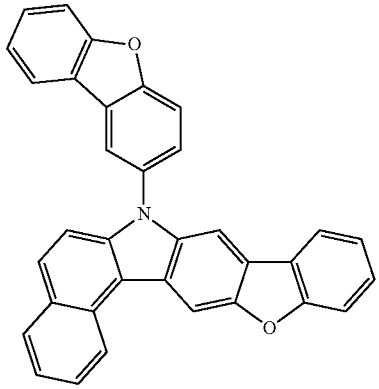
-continued
S-54
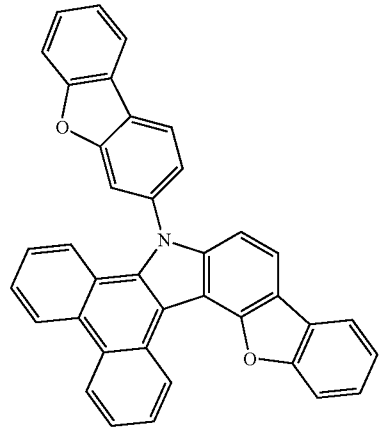
S-55
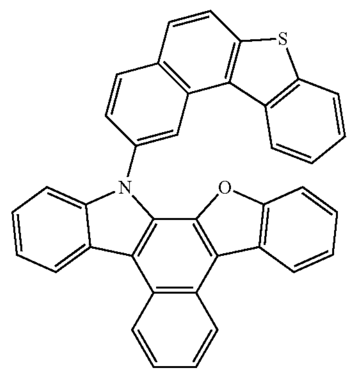
S-56
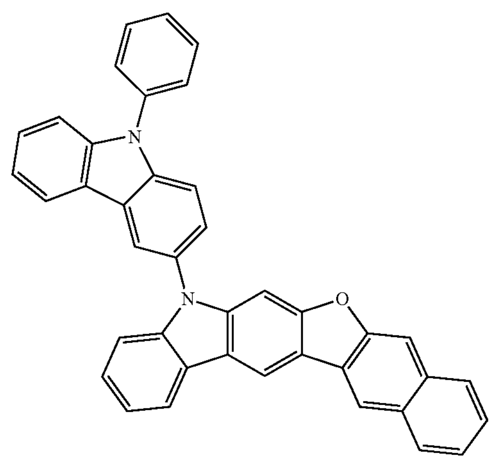
S-57
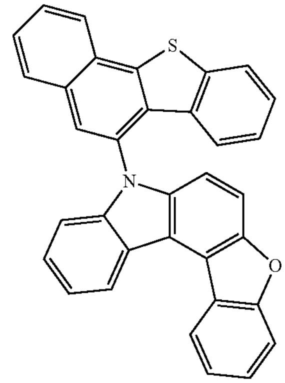

-continued
S-58
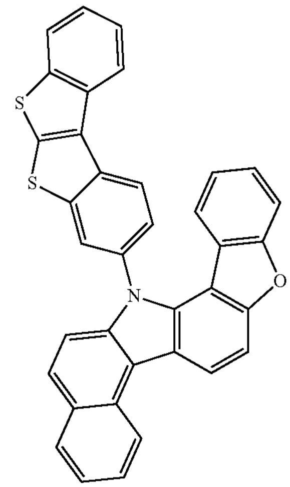
S-59
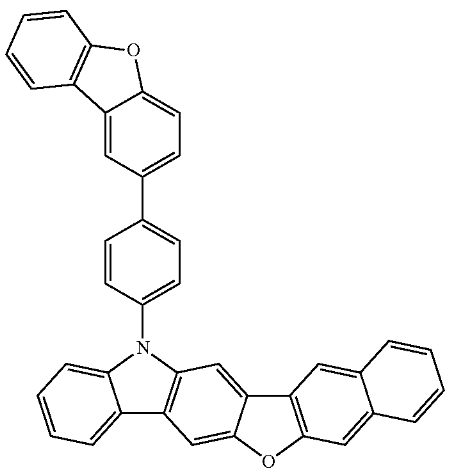
S-60
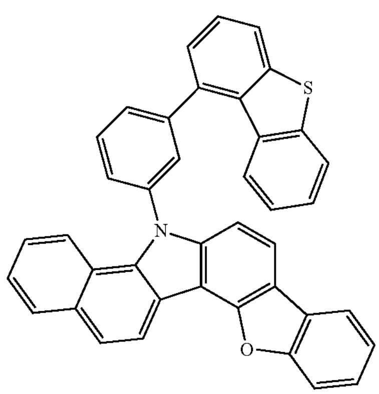
-continued
S-61
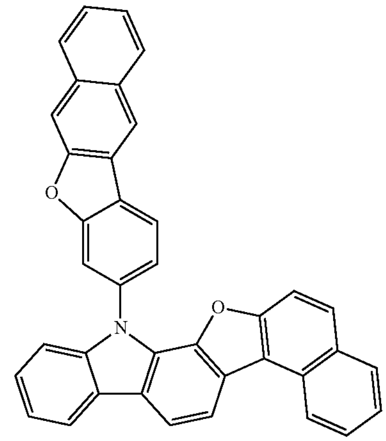
S-62
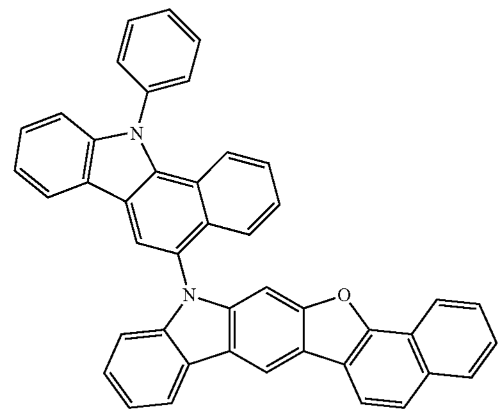
S-63
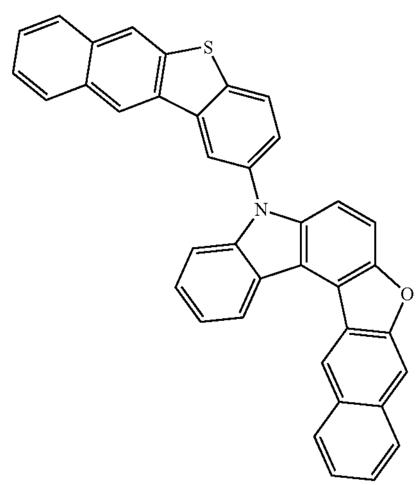

-continued
S-64
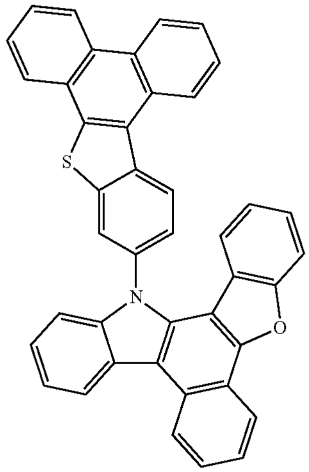
S-65
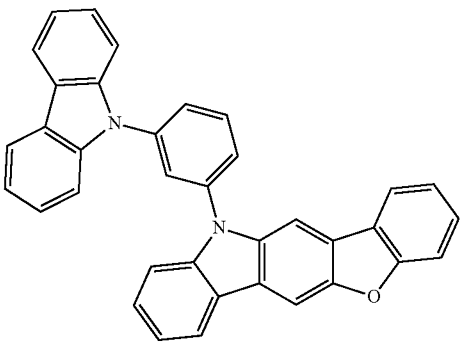
S-66
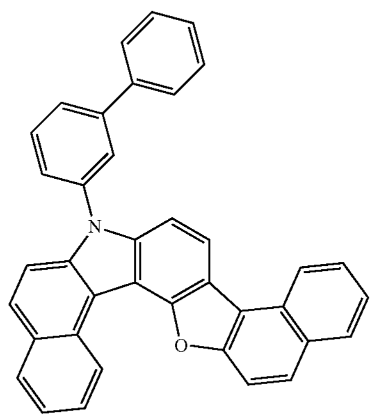
S-67
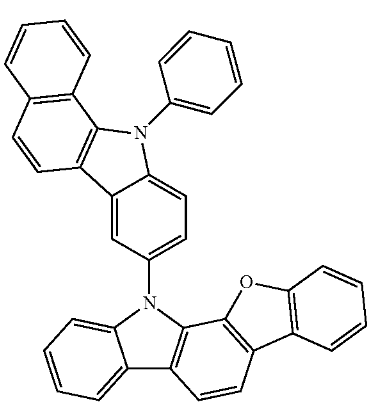
-continued
S-68
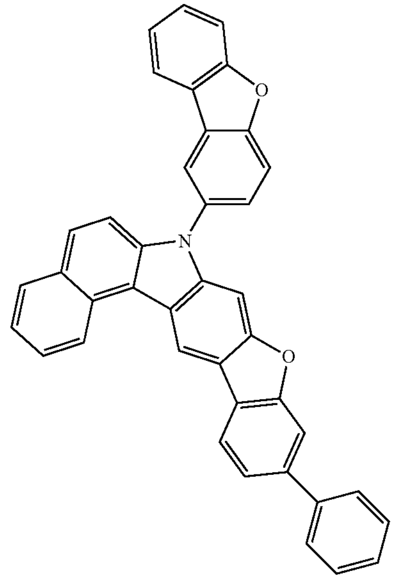
S-69
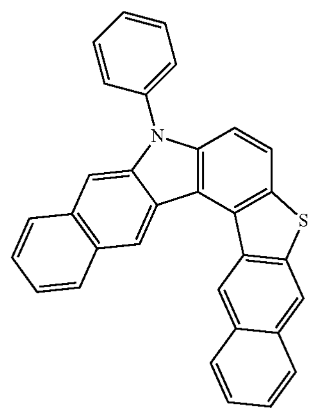
S-70
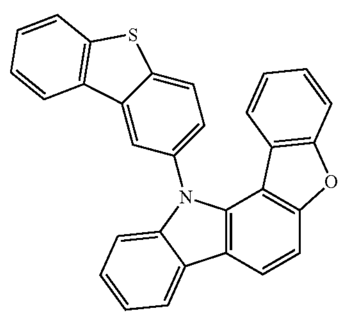

S-71
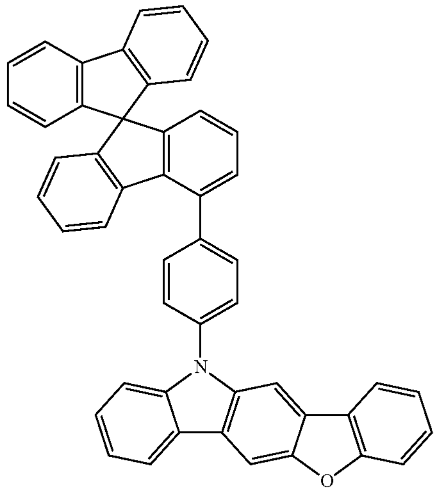
S-72
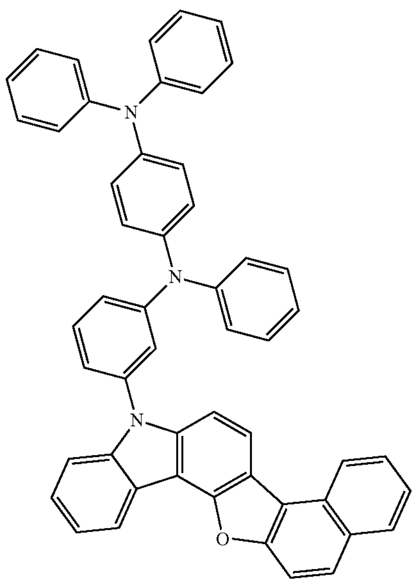
S-73
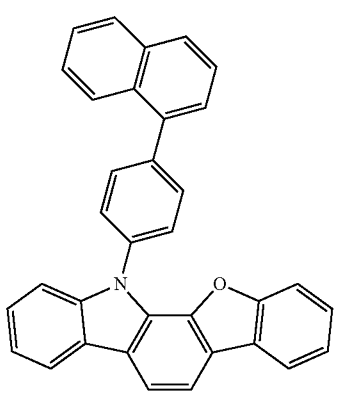
S-74
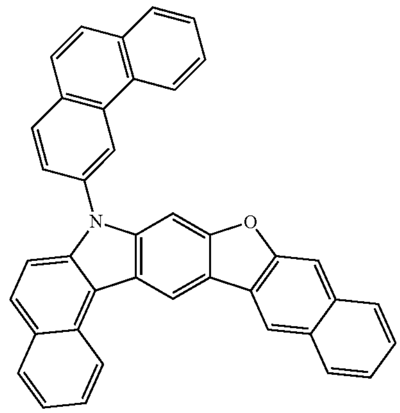
S-75
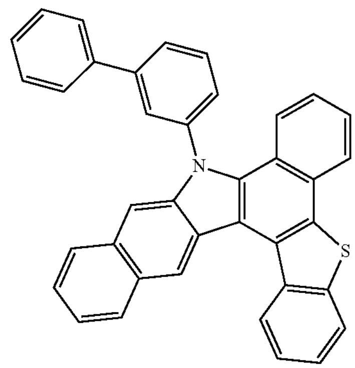
S-76
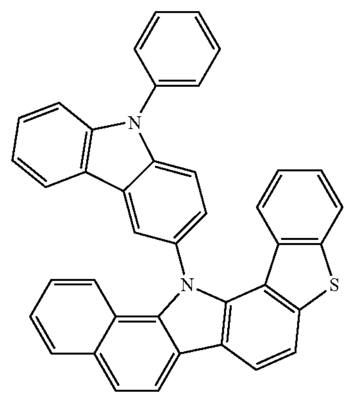
S-77
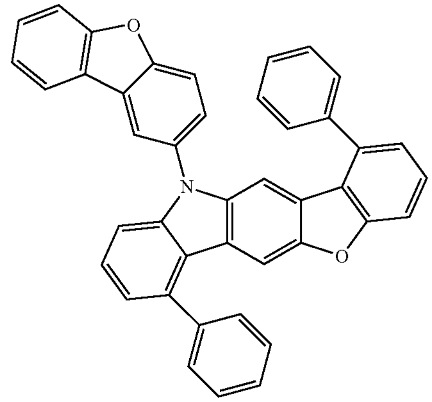

S-78
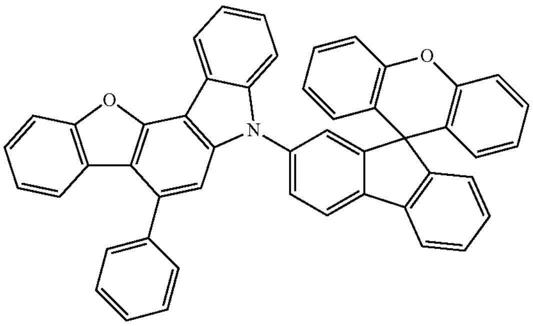
S-79
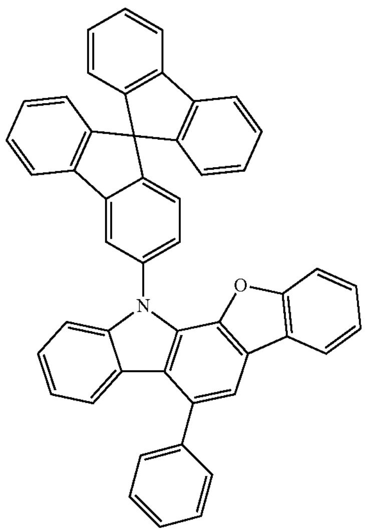
S-80
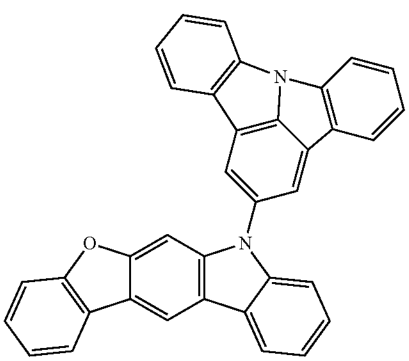
S-81
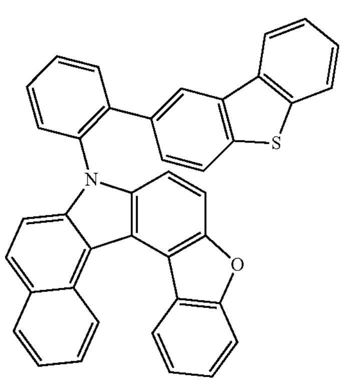
S-82
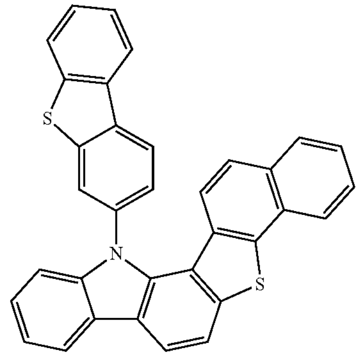
S-83
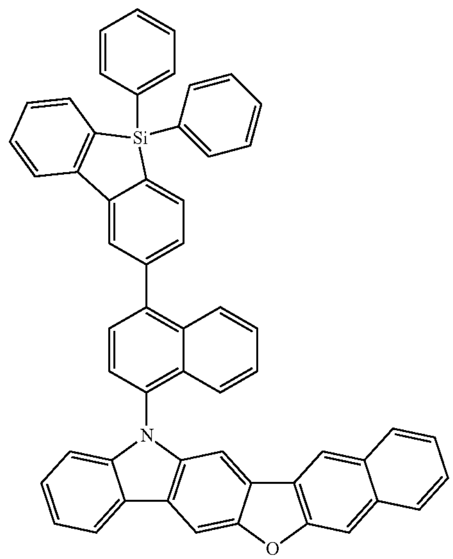
S-84
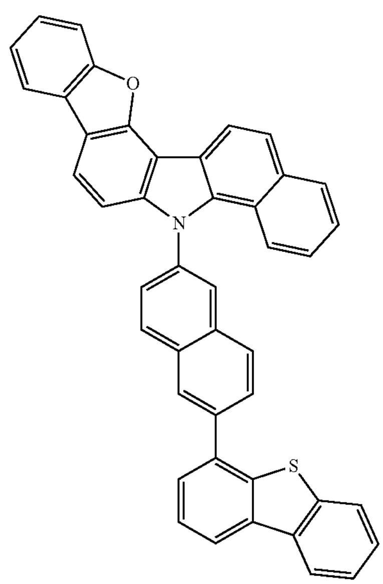

-continued
S-85
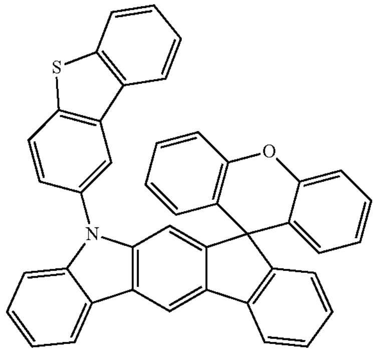
S-86
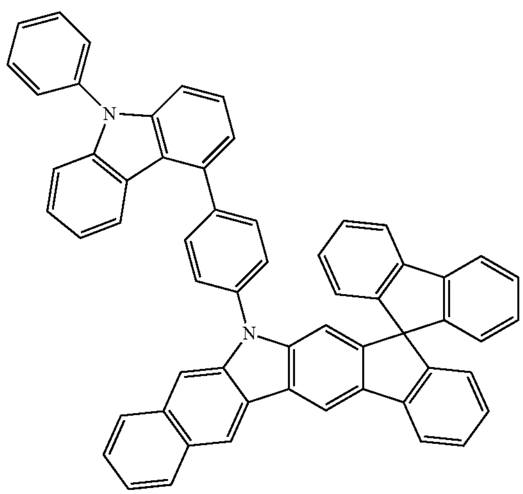
S-87
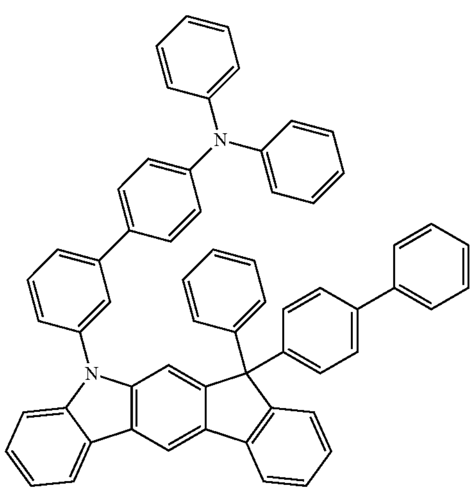
-continued
S-88
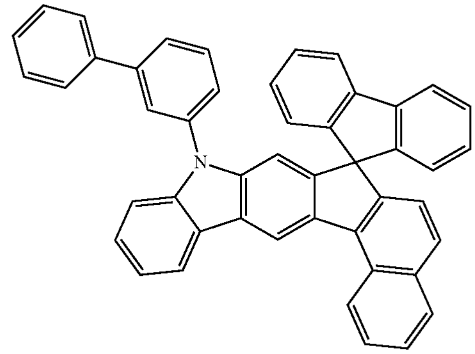
S-89
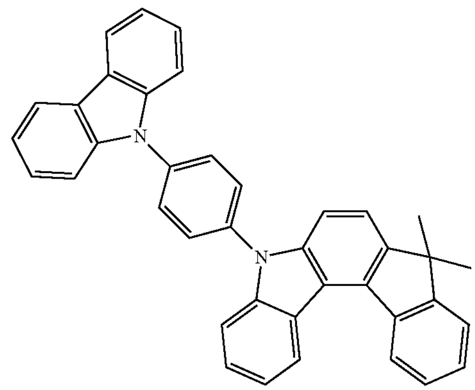
S-90
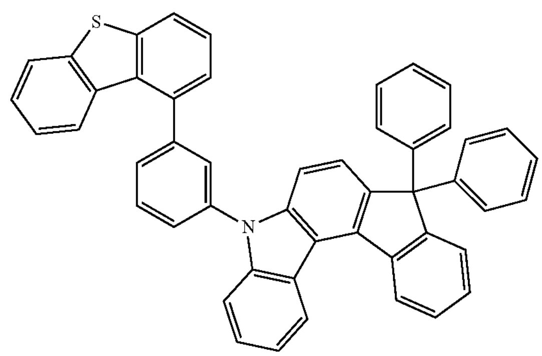
S-91
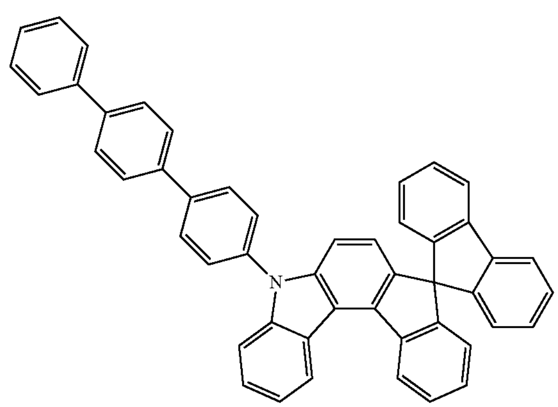

-continued
S-92
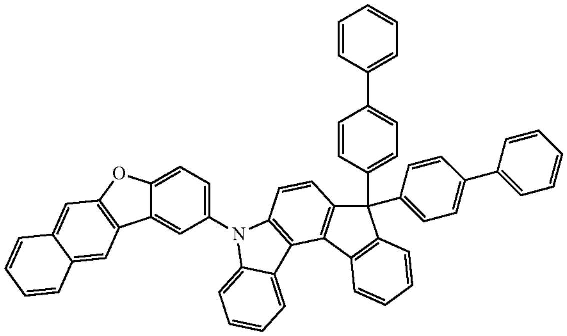
S-93
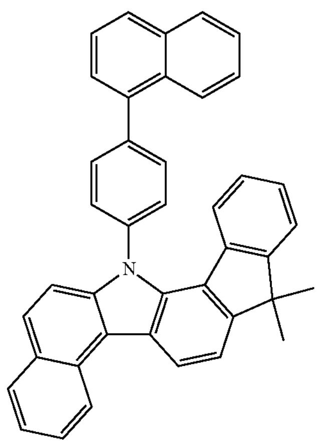
S-94
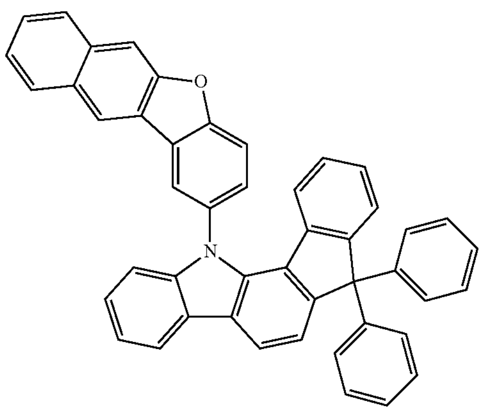
S-95
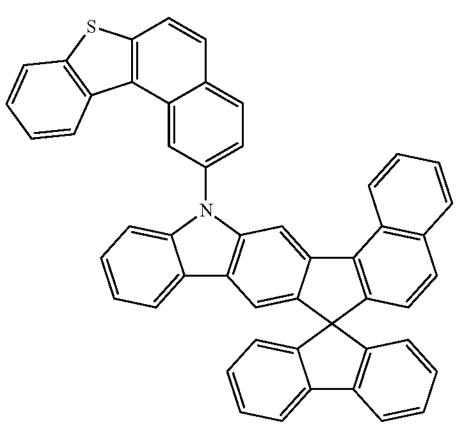
-continued
S-96
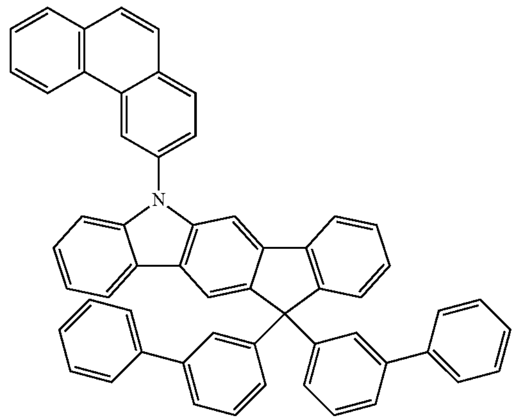
S-97
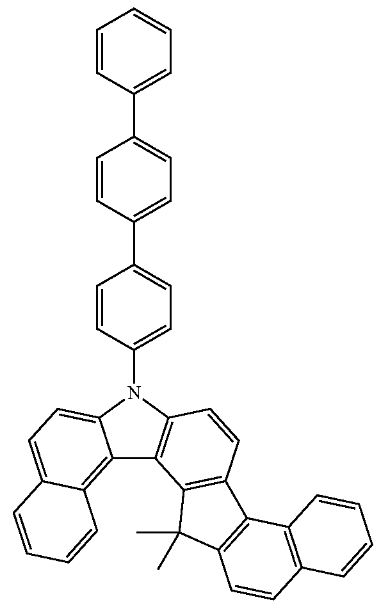
S-98
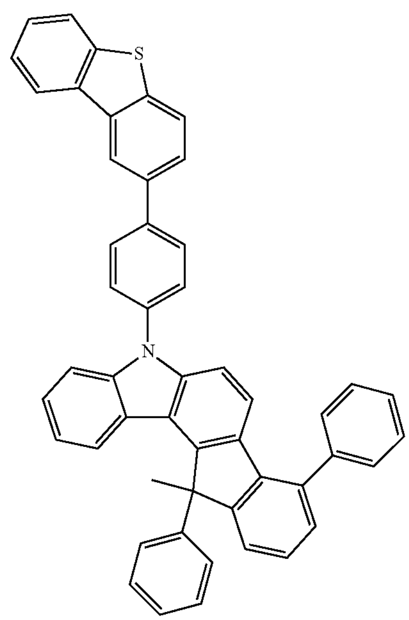

S-99
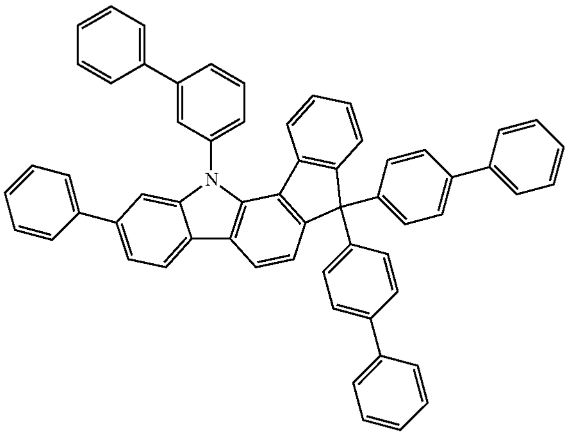
S-100
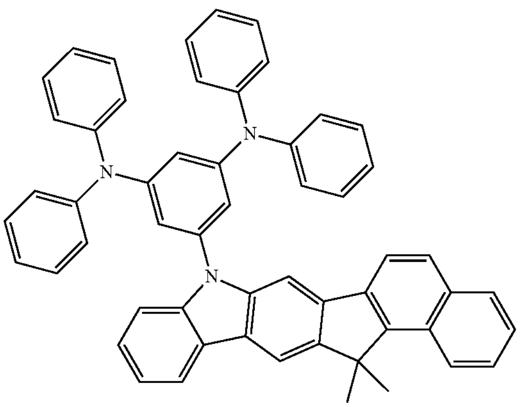
S-101
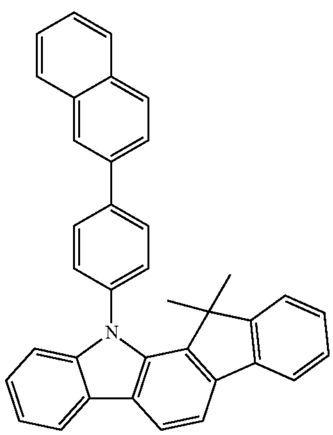
S-102
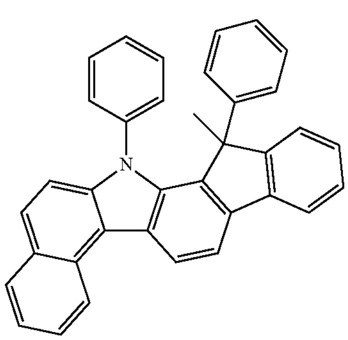
S-103
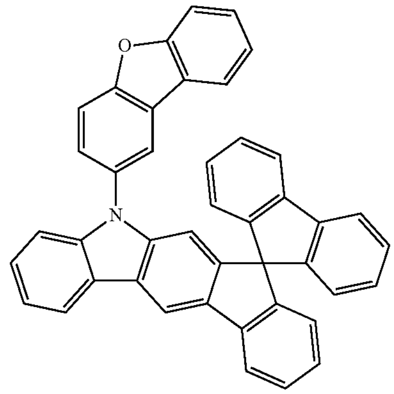
S-104
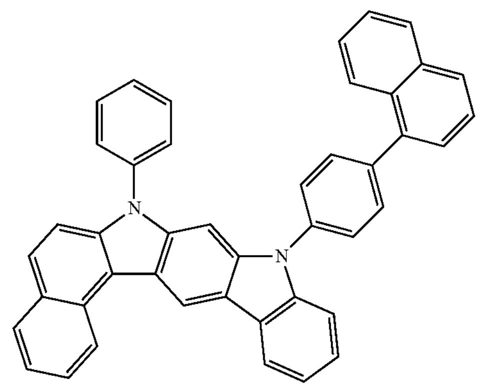
S-105
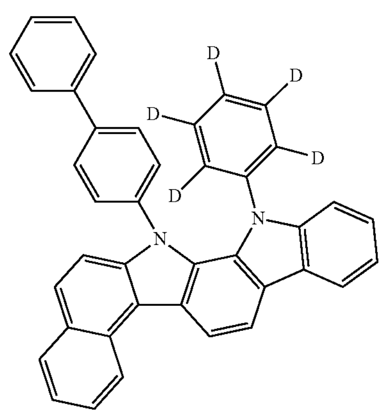

-continued

S-106

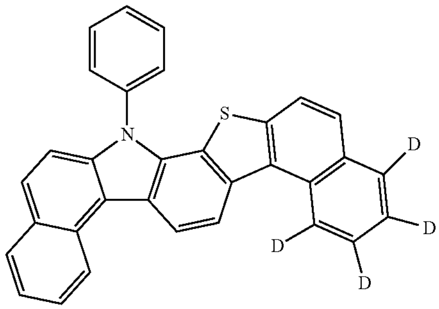

S-107

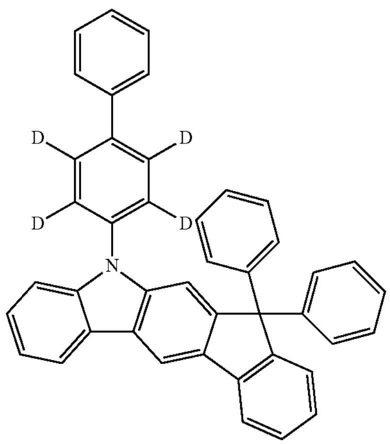

-continued

S-108

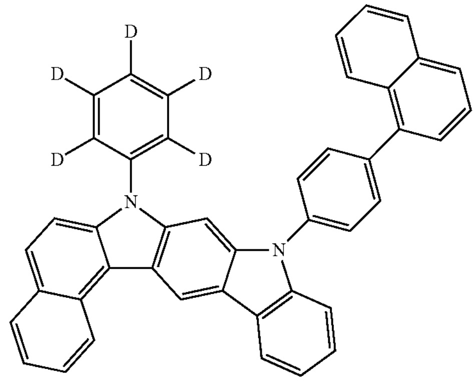

16. The organic electronic element of claim 1, wherein the organic electronic element further comprises a light efficiency enhancing layer formed on at least one surface of the first electrode and the second electrode, the surface being opposite to the organic material layer.

17. The organic electronic element of claim 1, wherein the organic material layer comprises 2 or more stacks comprising a hole transport layer, an emitting layer, and an electron transport layer sequentially formed on the first electrode.

18. The organic electronic element of claim 17, wherein the organic material layer further comprises a charge generation layer formed between the 2 or more stacks.

19. An electronic device comprising a display device comprising the organic electronic element of claim 1; and a control unit for driving the display device.

20. An electronic device according to claim 19, wherein the organic electronic element is at least one of an OLED, an organic solar cell, an organic photo conductor(OPC), organic transistor (organic TFT) and an element for monochromic or white illumination.

* * * * *